United States Patent
David et al.

(10) Patent No.: US 10,139,056 B2
(45) Date of Patent: Nov. 27, 2018

(54) LED LAMPS WITH IMPROVED QUALITY OF LIGHT

(71) Applicant: SORAA, INC., Fremont, CA (US)

(72) Inventors: Aurelien J. F. David, San Francisco, CA (US); Troy A. Trottier, Fremont, CA (US); Michael R. Krames, Mountain View, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 15/618,236

(22) Filed: Jun. 9, 2017

(65) Prior Publication Data

US 2017/0276301 A1 Sep. 28, 2017

Related U.S. Application Data

(63) Continuation of application No. 15/154,581, filed on May 13, 2016, now Pat. No. 9,677,723, which is a
(Continued)

(51) Int. Cl.
| | |
|---|---|
| *H05B 37/02* | (2006.01) |
| *F21K 9/64* | (2016.01) |
| *F21K 9/23* | (2016.01) |
| *F21V 9/30* | (2018.01) |
| *F21V 3/00* | (2015.01) |
| *H01L 25/075* | (2006.01) |

(Continued)

(52) U.S. Cl.
CPC ............. *F21K 9/64* (2016.08); *F21K 9/23* (2016.08); *F21K 9/232* (2016.08); *F21K 9/233* (2016.08); *F21K 9/27* (2016.08); *F21K 9/62* (2016.08); *F21V 3/00* (2013.01); *F21V 7/04* (2013.01); *F21V 9/30* (2018.02); *F21V 13/08* (2013.01); *F21V 23/02* (2013.01); *F21V 23/04* (2013.01); *F21V 29/70* (2015.01); *H01L 25/0753* (2013.01); *H01L 27/153* (2013.01); *H01L 33/32* (2013.01); *H01L 33/483* (2013.01); *H01L 33/502* (2013.01); *H01L 33/504* (2013.01); *H01L 33/505* (2013.01); *H01L 33/60* (2013.01); *F21Y 2101/00* (2013.01); *F21Y 2113/13* (2016.08); *F21Y 2115/10* (2016.08); *H01L 33/20* (2013.01); *H01L 2924/0002* (2013.01)

(58) Field of Classification Search
CPC ... F21K 9/64; F21K 9/233; F21K 9/23; F21K 9/62; F21K 9/232; F21K 9/27; F21V 29/70; F21V 3/00; F21V 7/04; F21V 9/16; F21V 13/08; F21V 23/02; F21V 23/04; F21Y 2113/13; H01L 25/0753; H01L 27/153; H01L 33/32; H01L 33/483; H01L 33/502; H01L 33/504
USPC ........ 315/151–153, 185 R, 186, 209 R, 291, 315/307, 308, 312
See application file for complete search history.

(56) References Cited

U.S. PATENT DOCUMENTS

| | | | |
|---|---|---|---|
| 9,844,115 B2 * | 12/2017 | Beck ................. | H05B 33/0863 |
| 2010/0182294 A1 * | 7/2010 | Roshan .................... | G01J 1/32 345/207 |

FOREIGN PATENT DOCUMENTS

| | | |
|---|---|---|
| EP | 2432037 A1 | 3/2012 |
| WO | 2011035265 A1 | 3/2011 |

* cited by examiner

*Primary Examiner* — Jimmy Vu
(74) *Attorney, Agent, or Firm* — FisherBroyles LLP

(57) ABSTRACT

LED lamp systems having improved light quality are disclosed. The lamps emit more than 500 lm and more than 2% of the power in the spectral power distribution is emitted within a wavelength range from about 390 nm to about 430 nm.

17 Claims, 87 Drawing Sheets

Related U.S. Application Data continuation of application No. 14/698,574, filed on Apr. 28, 2015, now Pat. No. 9,368,695, which is a continuation of application No. 14/528,876, filed on Oct. 30, 2014, now Pat. No. 9,046,227, which is a continuation of application No. 14/310,957, filed on Jun. 20, 2014, now Pat. No. 8,933,644, which is a continuation-in-part of application No. 14/040,379, filed on Sep. 27, 2013, now Pat. No. 9,293,644, which is a continuation-in-part of application No. 13/931,359, filed on Jun. 28, 2013, now Pat. No. 8,686,458, said application No. 13/931,359 is a continuation of application No. 12/936,238, filed as application No. PCT/US2010/049531 on Sep. 20, 2010, now Pat. No. 8,502,465, said application No. 14/310,957 is a continuation of application No. 13/211,145, filed on Aug. 16, 2011, now Pat. No. 9,293,667, said application No. 14/310,957 is a continuation-in-part of application No. 13/886,547, filed on May 3, 2013, now abandoned.

(60) Provisional application No. 61/783,888, filed on Mar. 14, 2013, provisional application No. 61/642,984, filed on May 4, 2012, provisional application No. 61/778,002, filed on Mar. 12, 2013, provisional application No. 61/243,988, filed on Sep. 18, 2009, provisional application No. 61/502,212, filed on Jun. 28, 2011, provisional application No. 61/375,097, filed on Aug. 19, 2010.

(51) Int. Cl.

| | |
|---|---|
| *H01L 33/50* | (2010.01) |
| *H01L 33/60* | (2010.01) |
| *F21V 29/70* | (2015.01) |
| *H01L 27/15* | (2006.01) |
| *F21K 9/232* | (2016.01) |
| *F21K 9/233* | (2016.01) |
| *F21K 9/62* | (2016.01) |
| *F21K 9/27* | (2016.01) |
| *F21V 7/04* | (2006.01) |
| *F21V 13/08* | (2006.01) |
| *F21V 23/02* | (2006.01) |
| *F21V 23/04* | (2006.01) |
| *H01L 33/32* | (2010.01) |
| *H01L 33/48* | (2010.01) |
| *H01L 33/20* | (2010.01) |
| *F21Y 101/00* | (2016.01) |
| *F21Y 115/10* | (2016.01) |
| *F21Y 113/13* | (2016.01) |

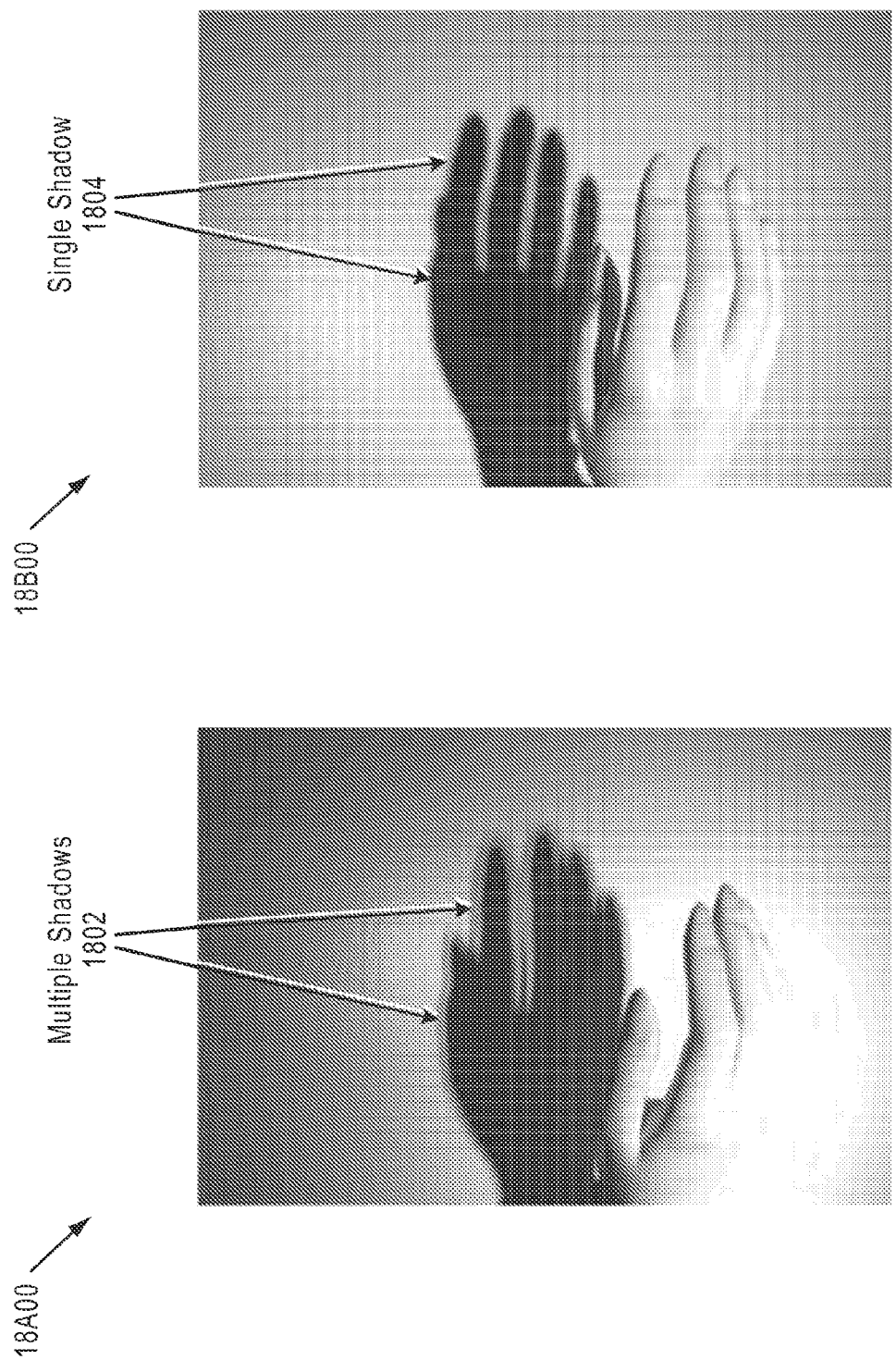

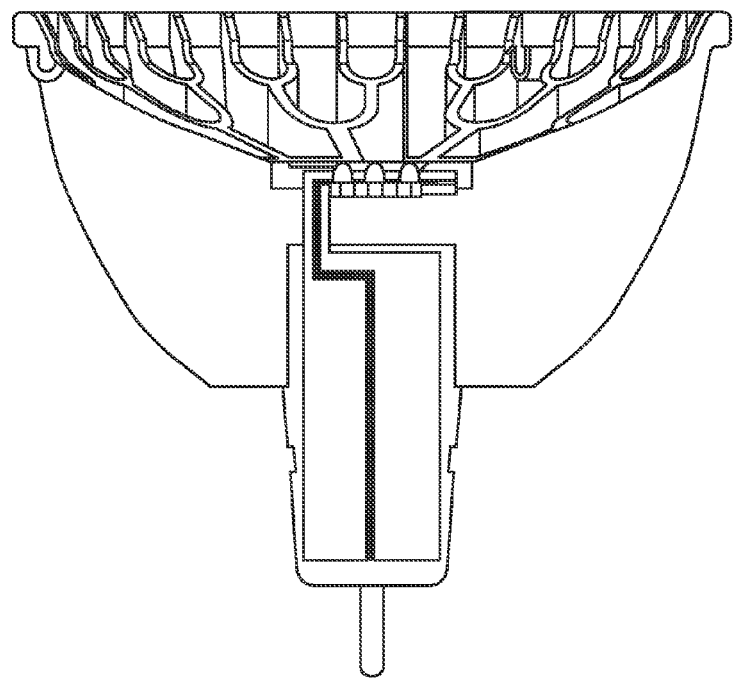
FIG. 19A1
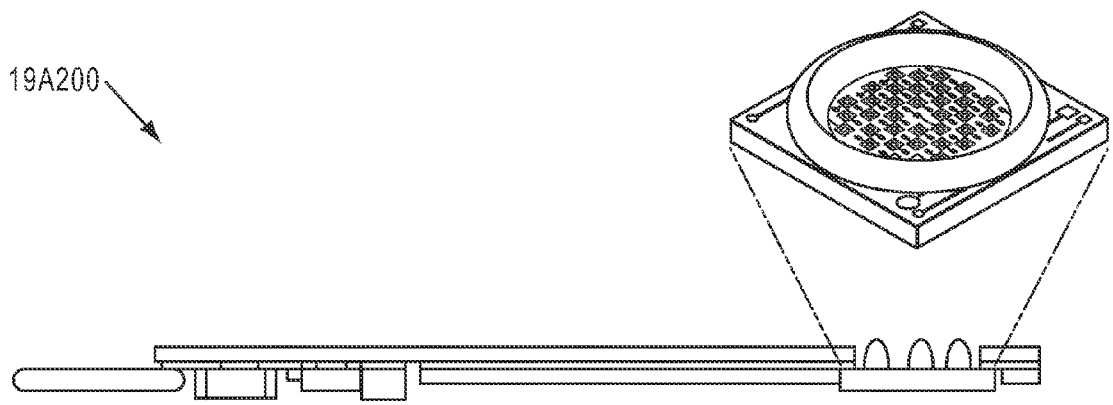
FIG. 19A2

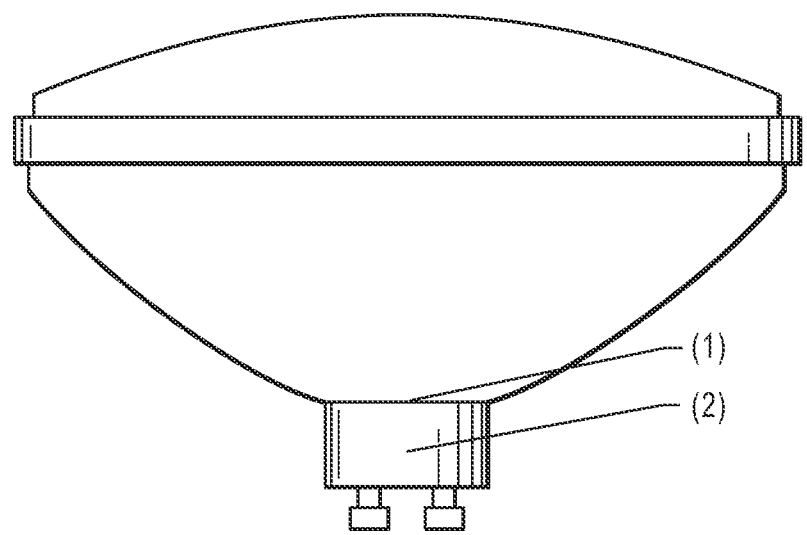
FIG. 19C1
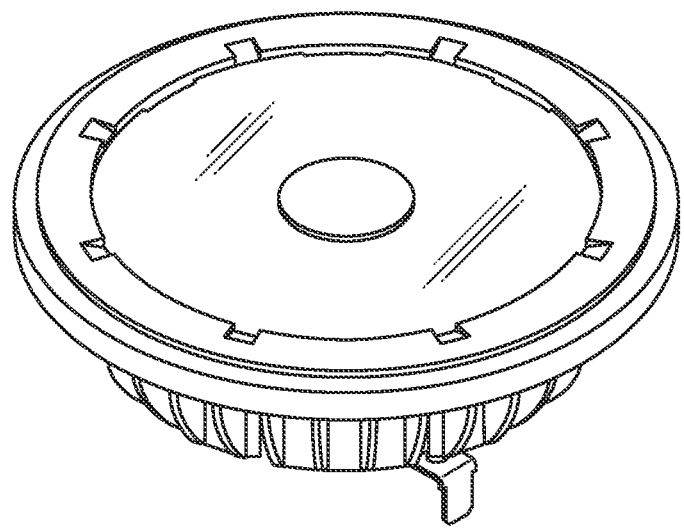
FIG. 19C2

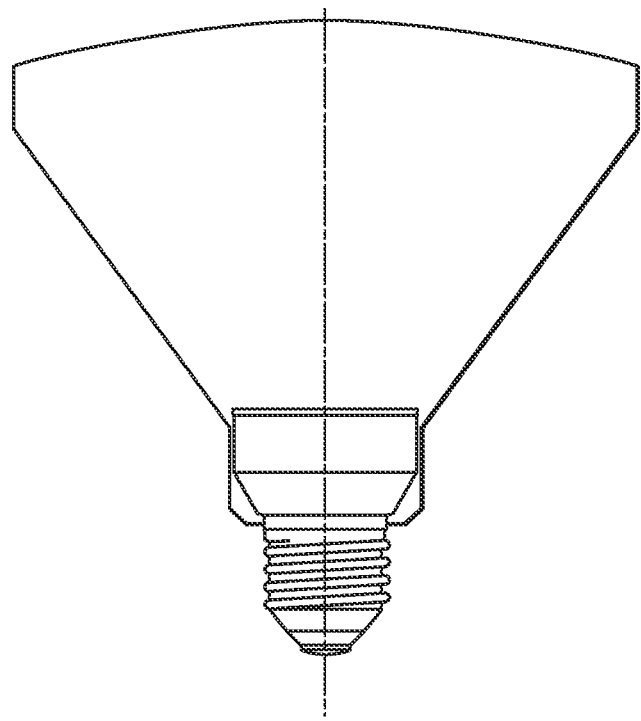
FIG. 19D1
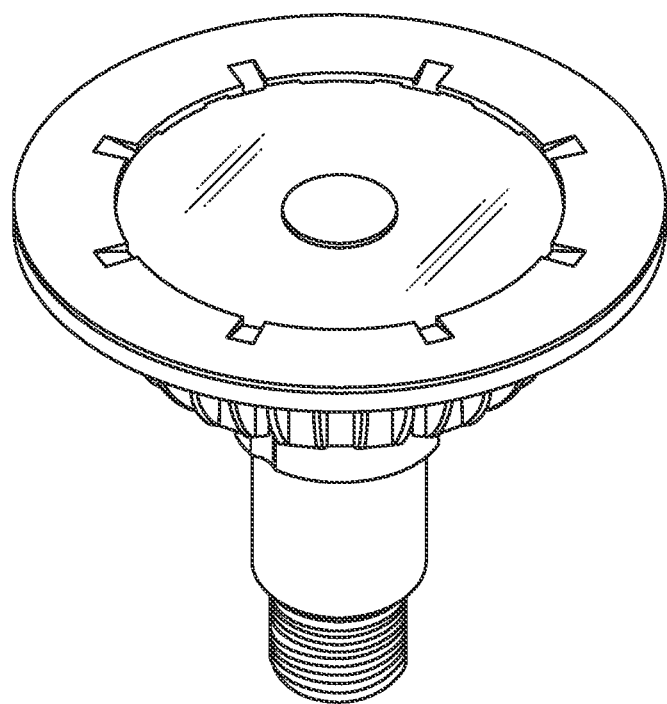
FIG. 19D2

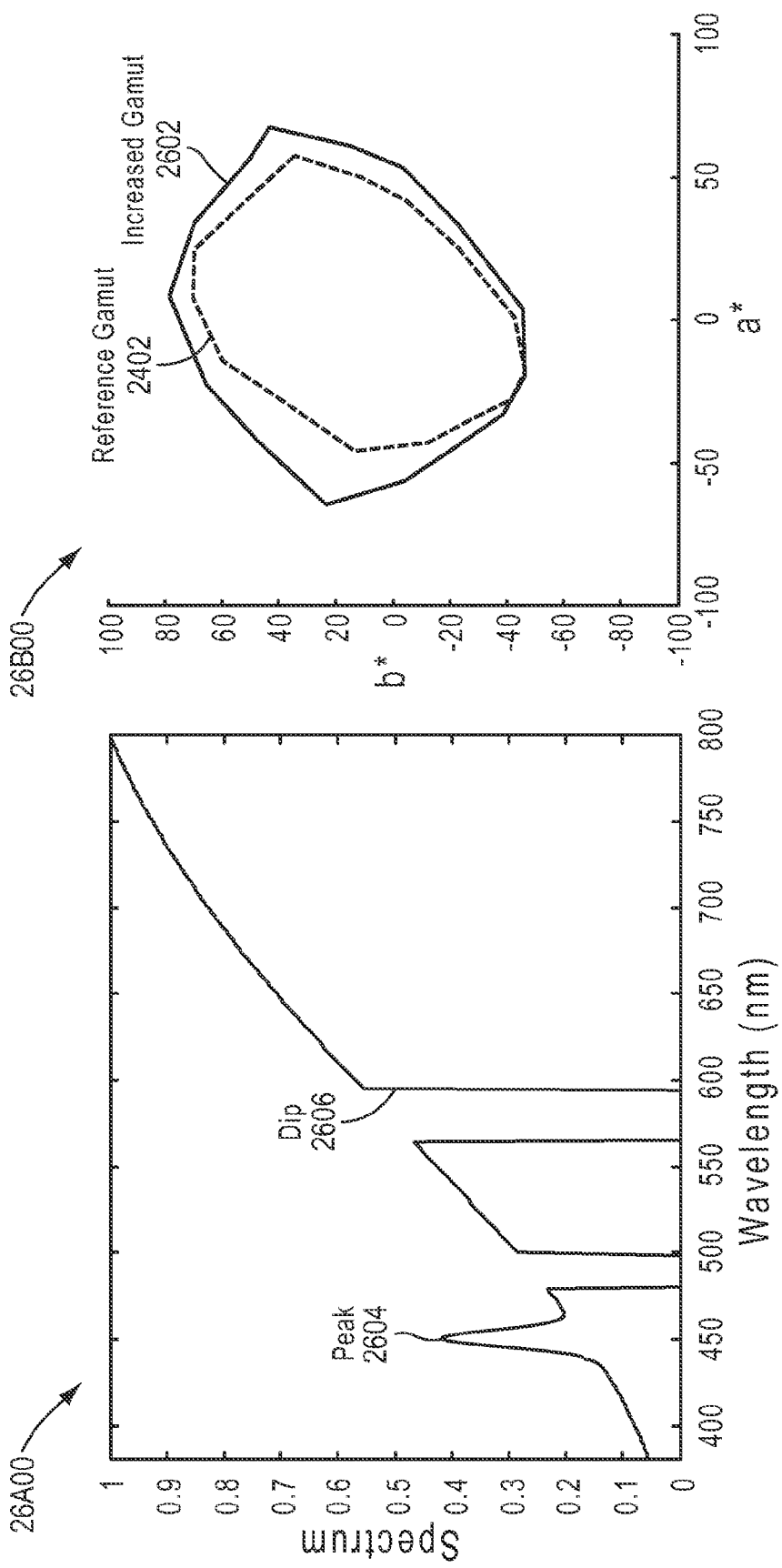

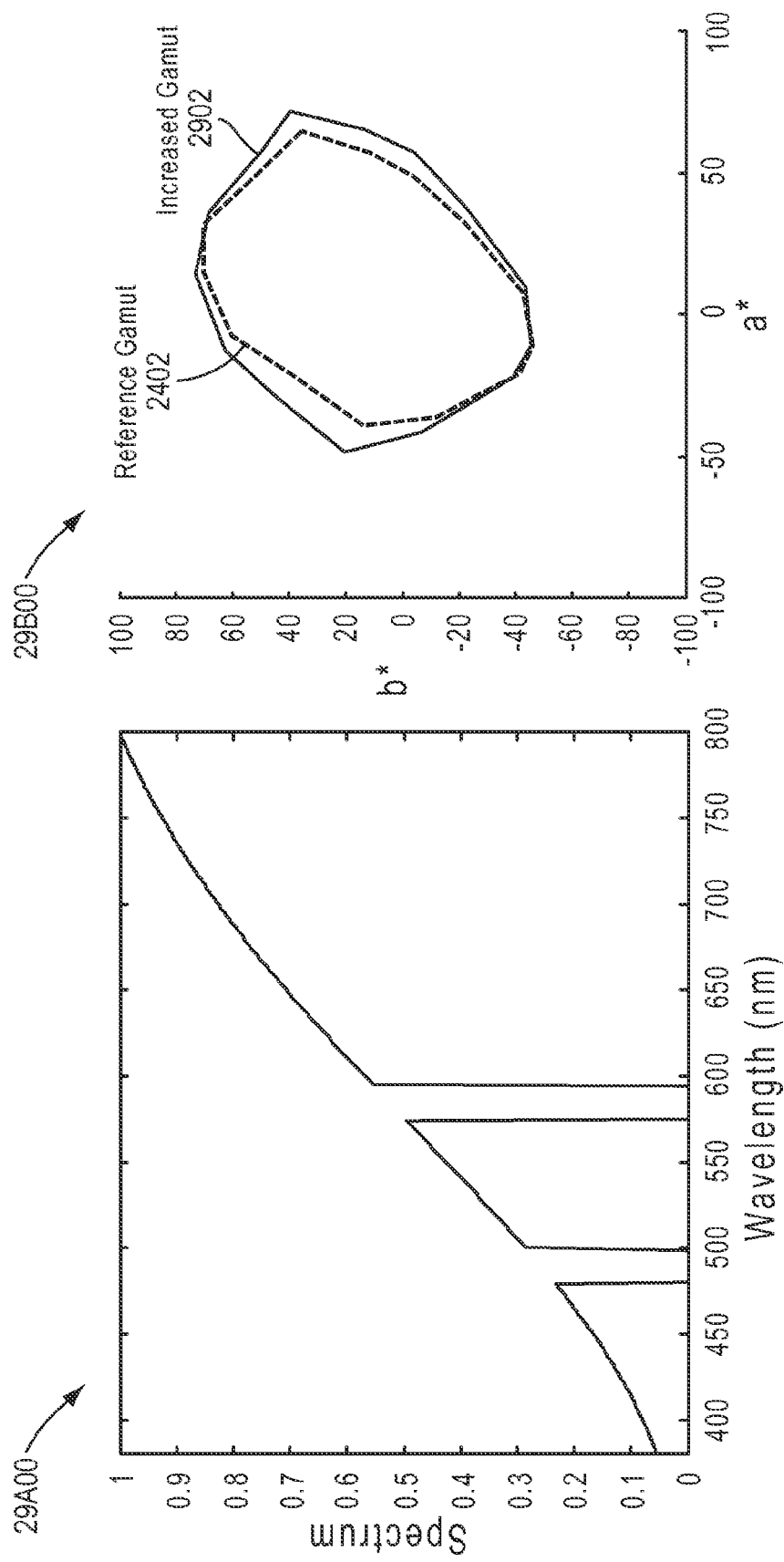

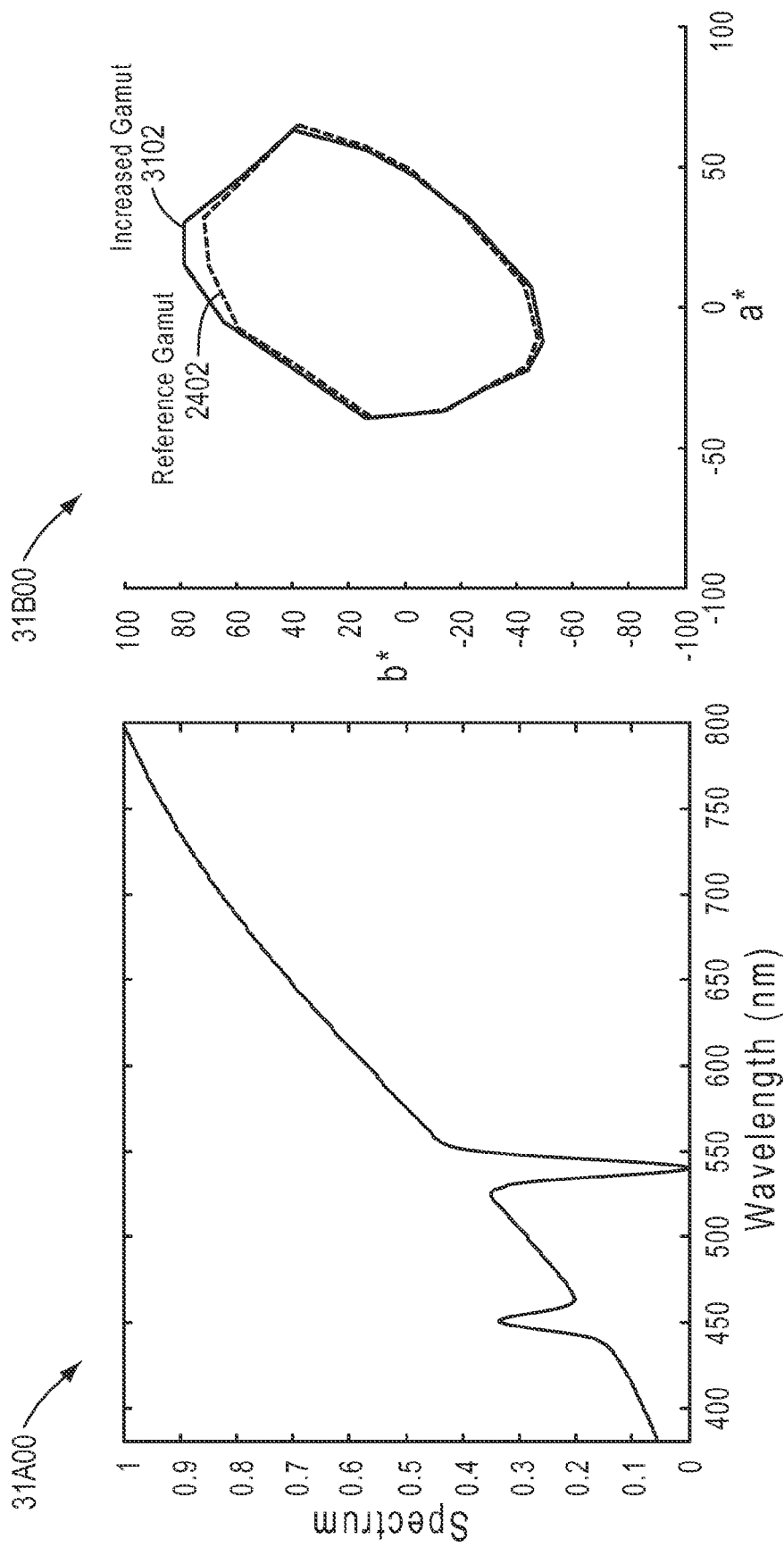

63B00

|  | 4% | 5% | 6^ |
|---|---|---|---|
| x | 0.466 | 0.464 | 0.462 |
| y | 0.421 | 0.419 | 0.416 |
| CCT[K] | 2695.385 | 2701.813 | 2708.297 |
| Duv | 0.003 | 0.003 | 0.002 |
| CRI (Ra) | 83.157 | 83.291 | 83.377 |
| LER [lm/W] | 304.833 | 302.776 | 300.748 |
|  |  |  |  |
|  |  |  |  |
| R1 | 97.818 | 97.698 | 97.567 |
| R2 | 91.112 | 91.132 | 91.125 |
| R3 | 75.120 | 75.337 | 75.528 |
| R4 | 90.018 | 90.643 | 91.078 |
| R5 | 90.785 | 90.530 | 90.259 |
| R6 | 73.158 | 73.136 | 73.104 |
| R7 | 79.979 | 80.331 | 80.608 |
| R8 | 67.268 | 67.518 | 67.749 |
| R9 | 36.008 | 36.469 | 36.938 |
| R10 | 71.359 | 71.291 | 71.199 |
| R11 | 75.511 | 75.429 | 75.292 |
| R12 | 49.258 | 47.448 | 45.739 |
| R13 | 94.652 | 94.529 | 94.389 |
| R14 | 85.554 | 85.673 | 85.780 |
|  |  |  |  |
|  |  |  |  |
|  |  |  |  |
| u' | 0.262 | 0.262 | 0.262 |
| v | 0.532 | 0.531 | 0.530 |

FIG. 63B

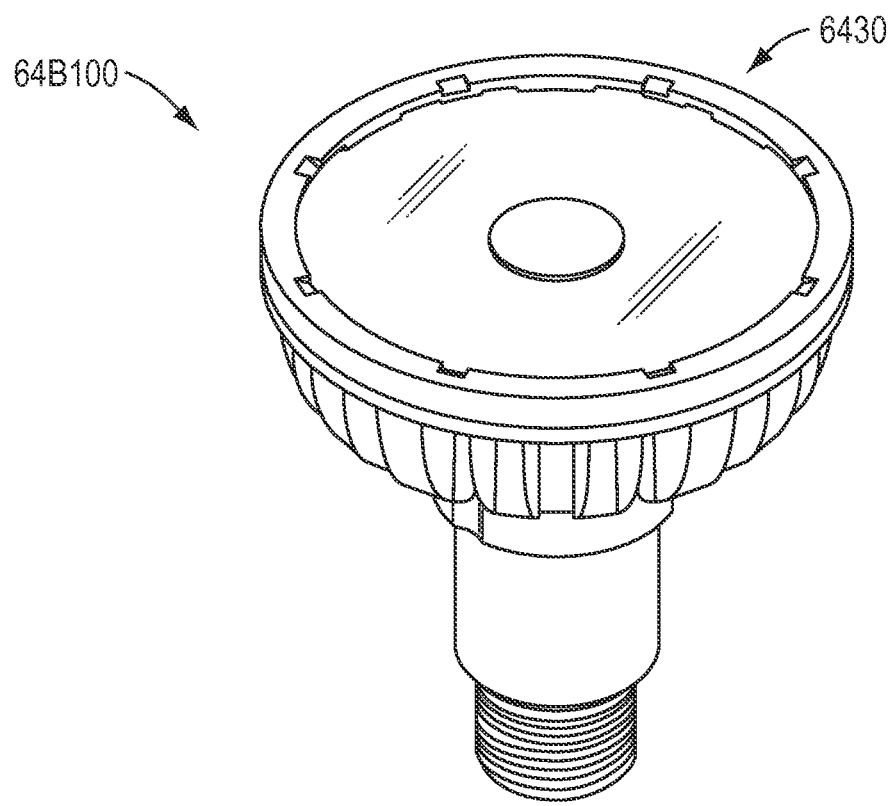
FIG. 64B1
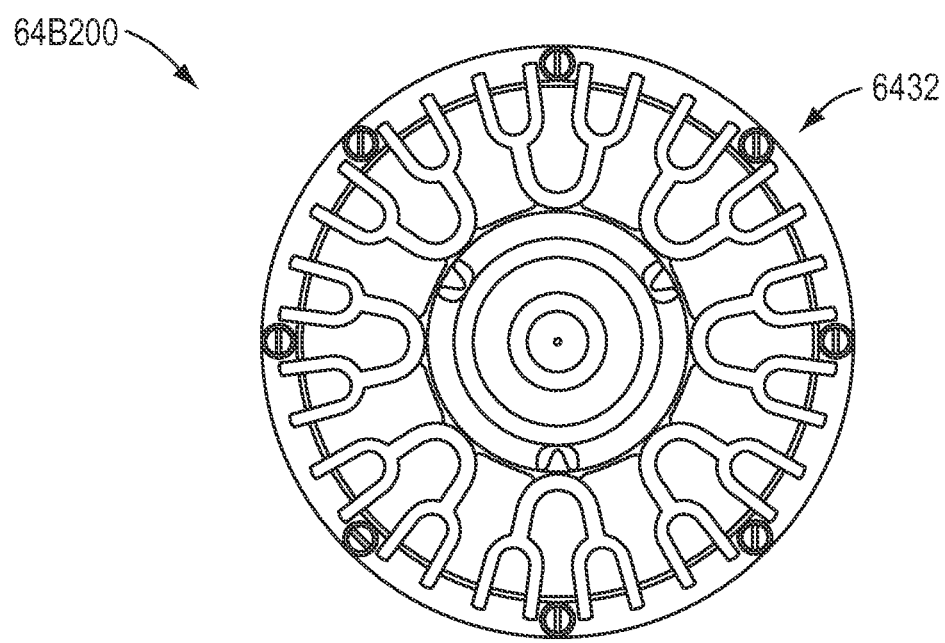
FIG. 64B2

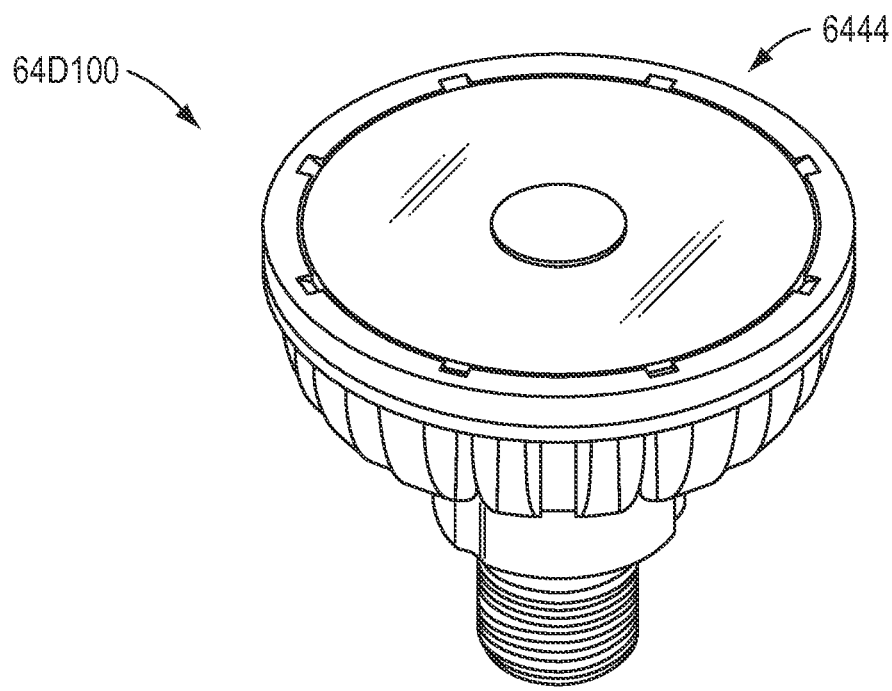
FIG. 64D1
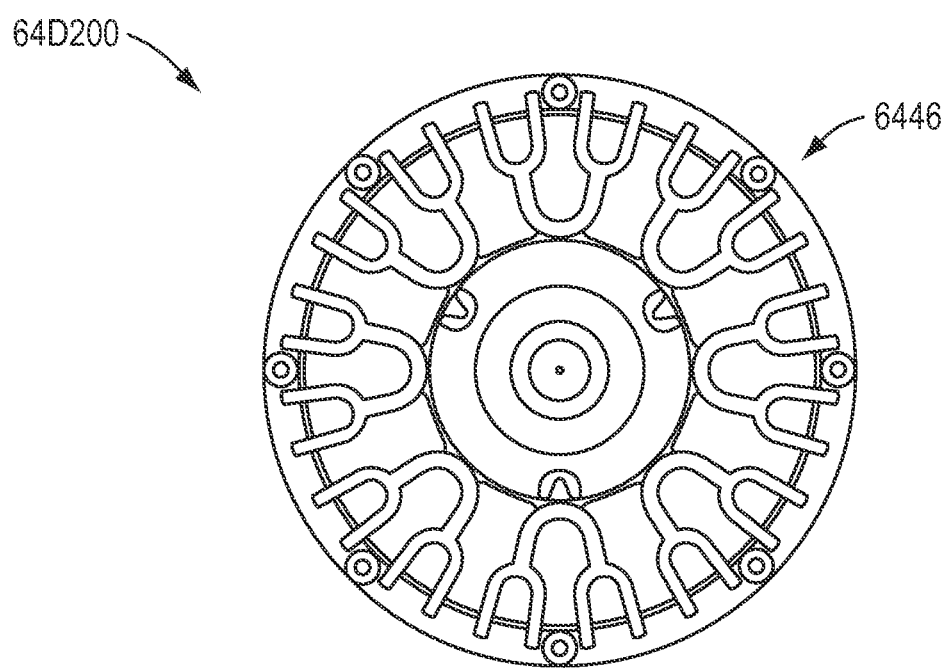
FIG. 64D2

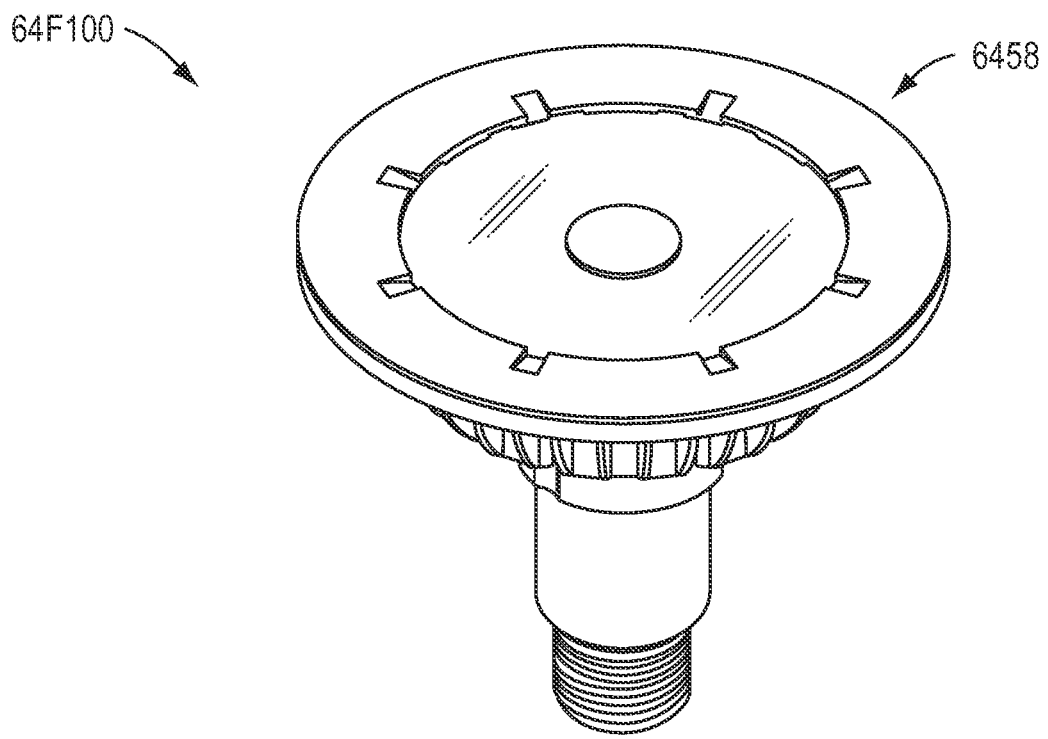
FIG. 64F1
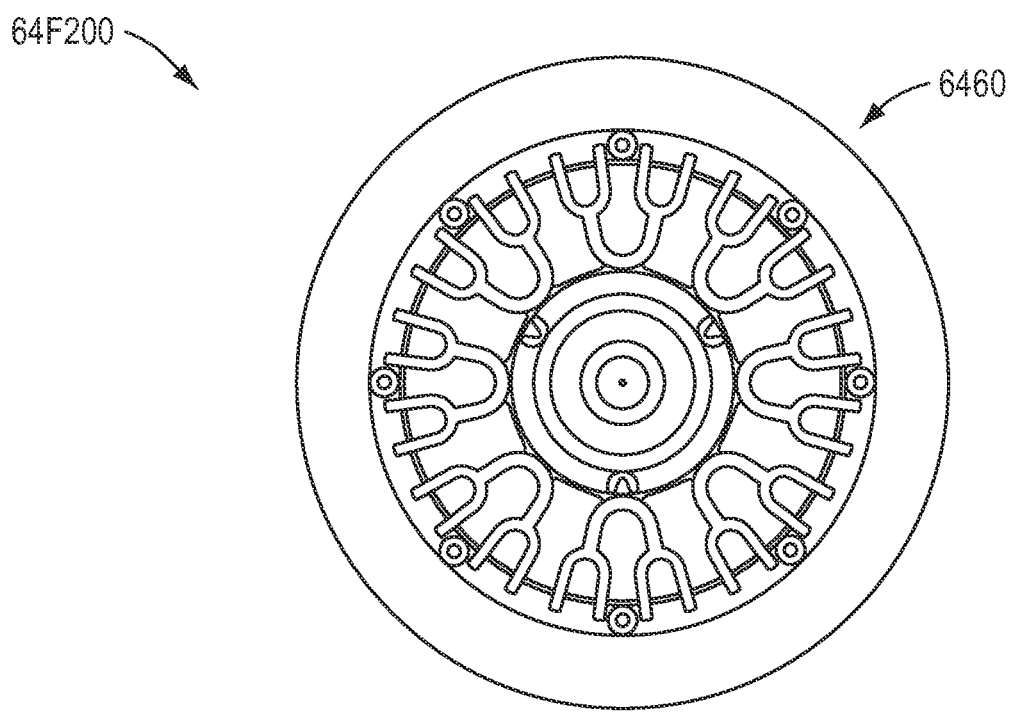
FIG. 64F2

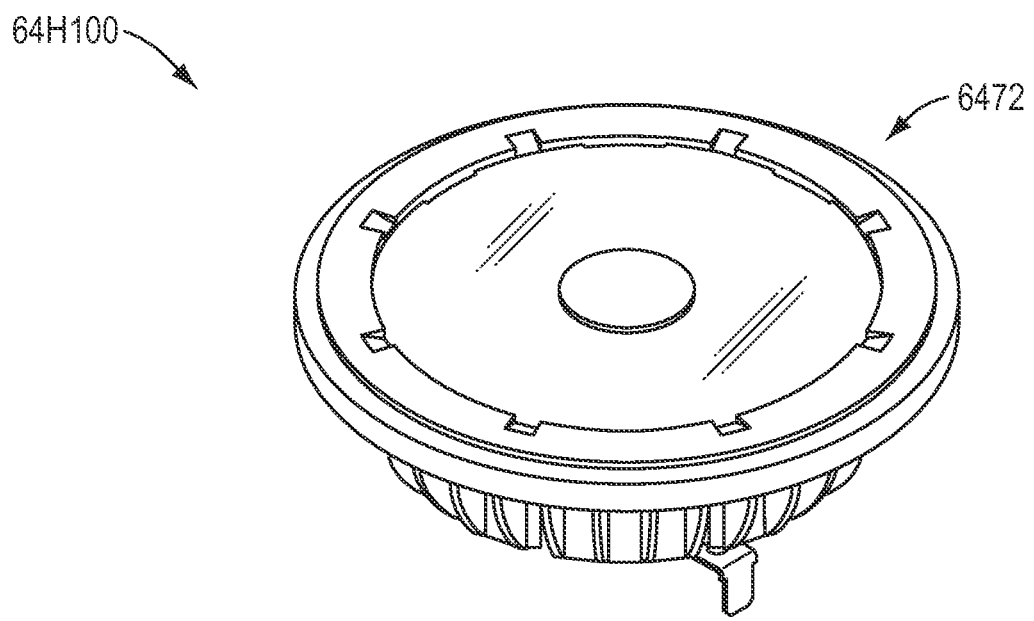
FIG. 64H1
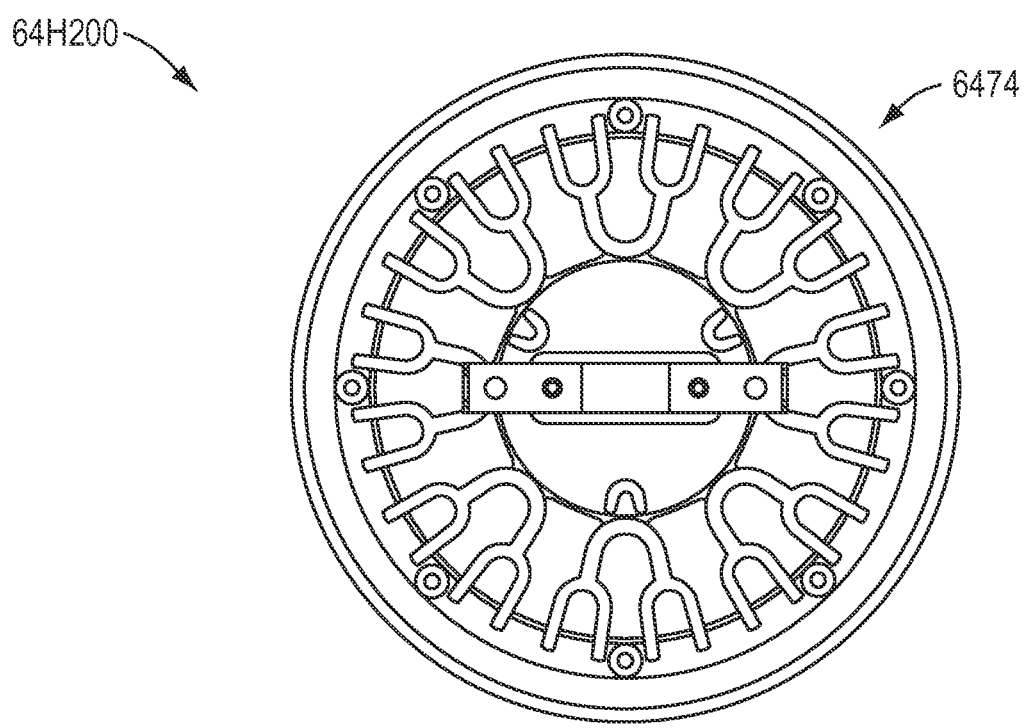
FIG. 64H2

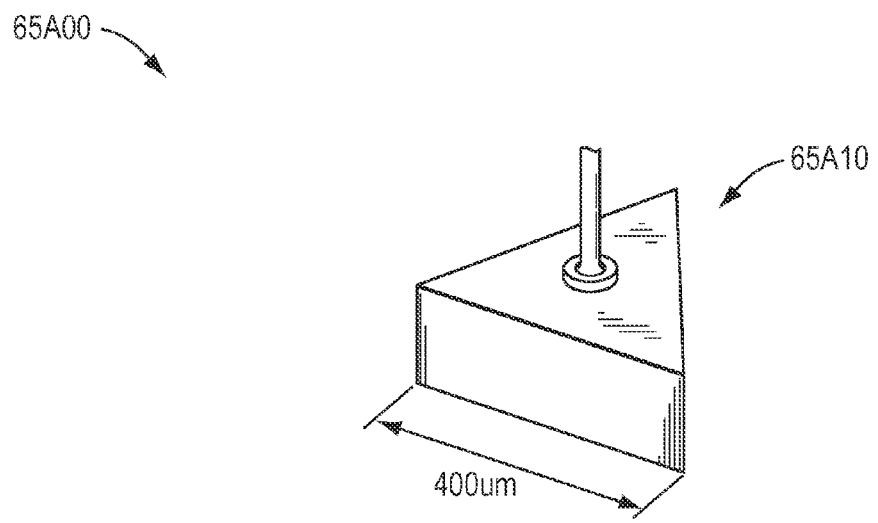
FIG. 65A1
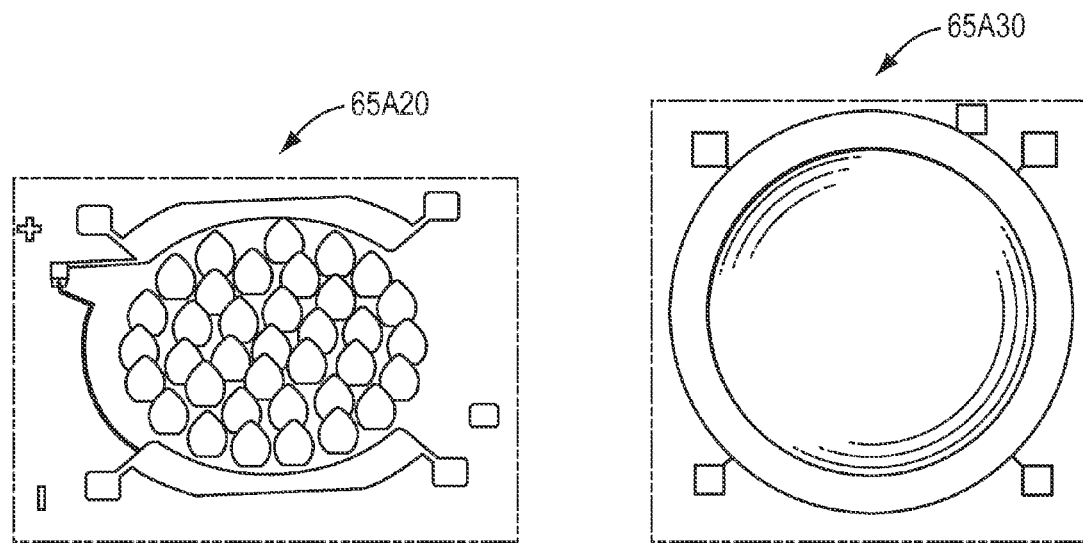
FIG. 65A2
FIG. 65A3

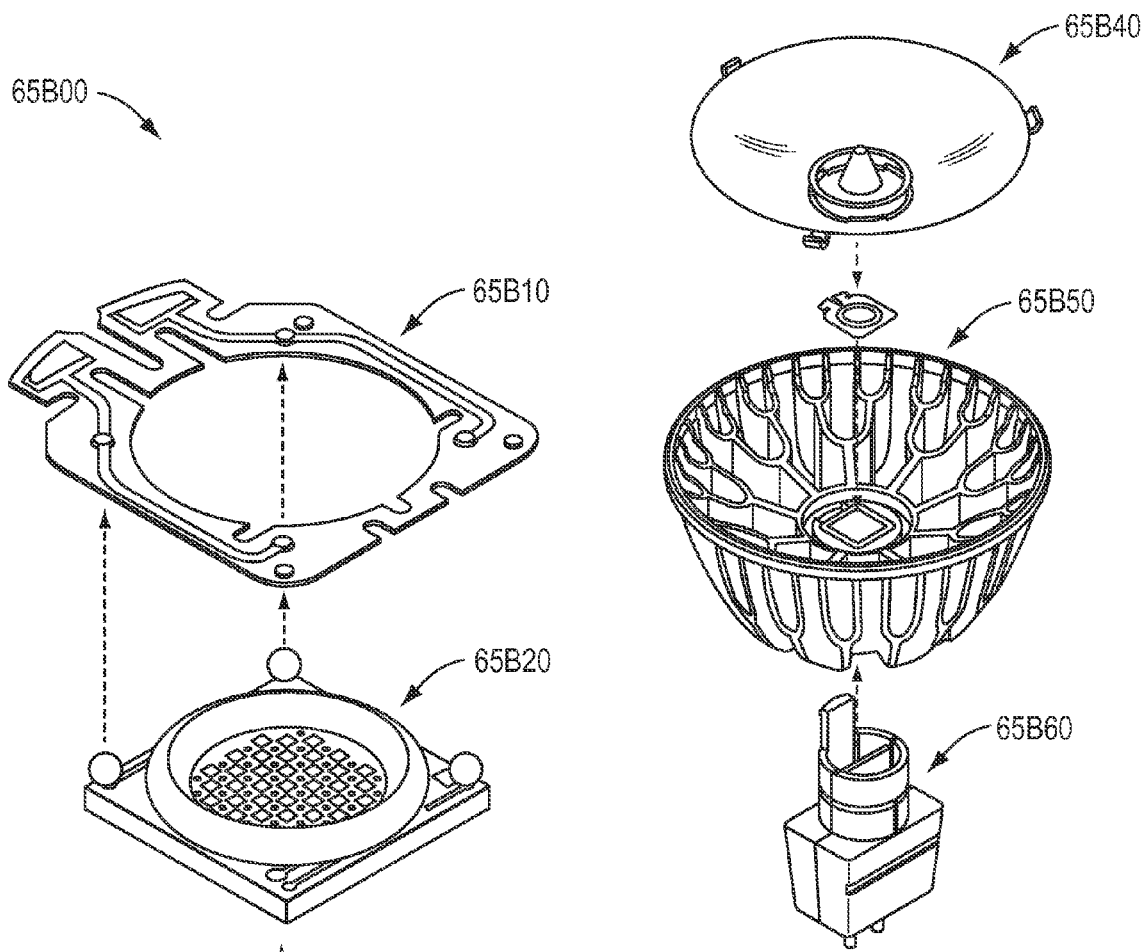
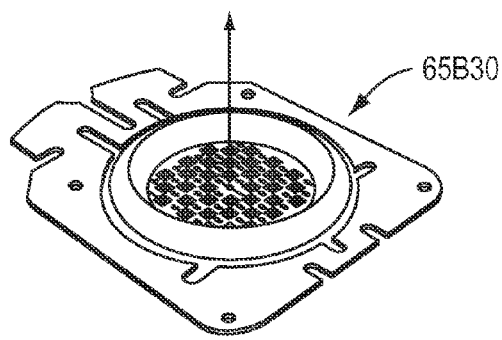
FIG. 65B1
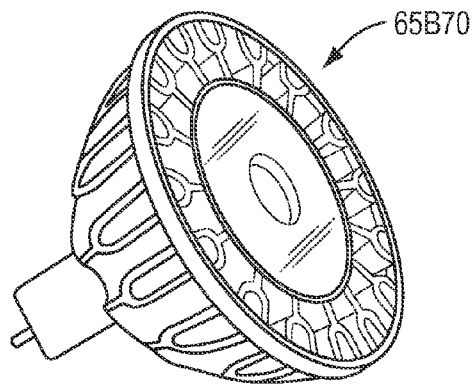
FIG. 65B3

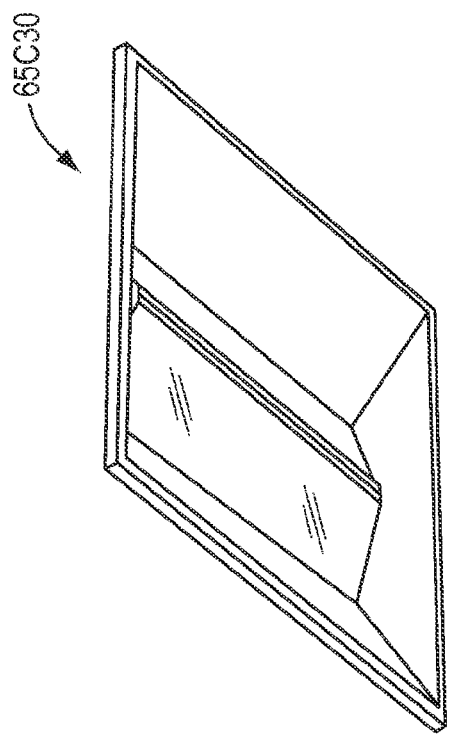
FIG. 65C3
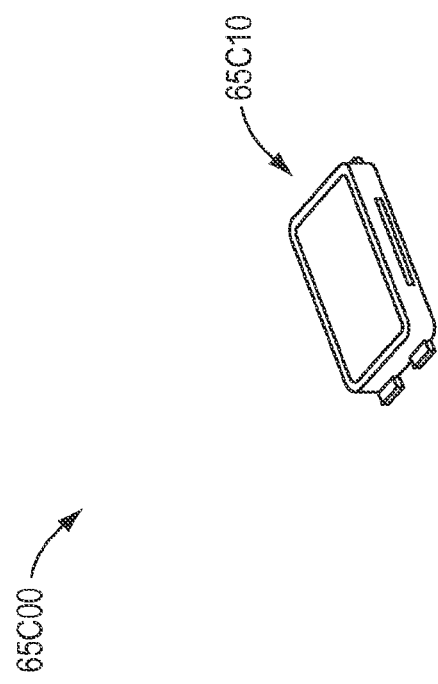
FIG. 65C1
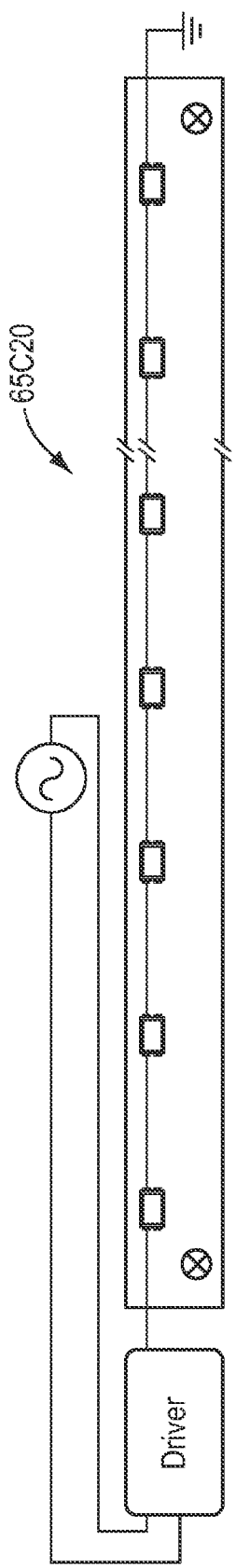
FIG. 65C2

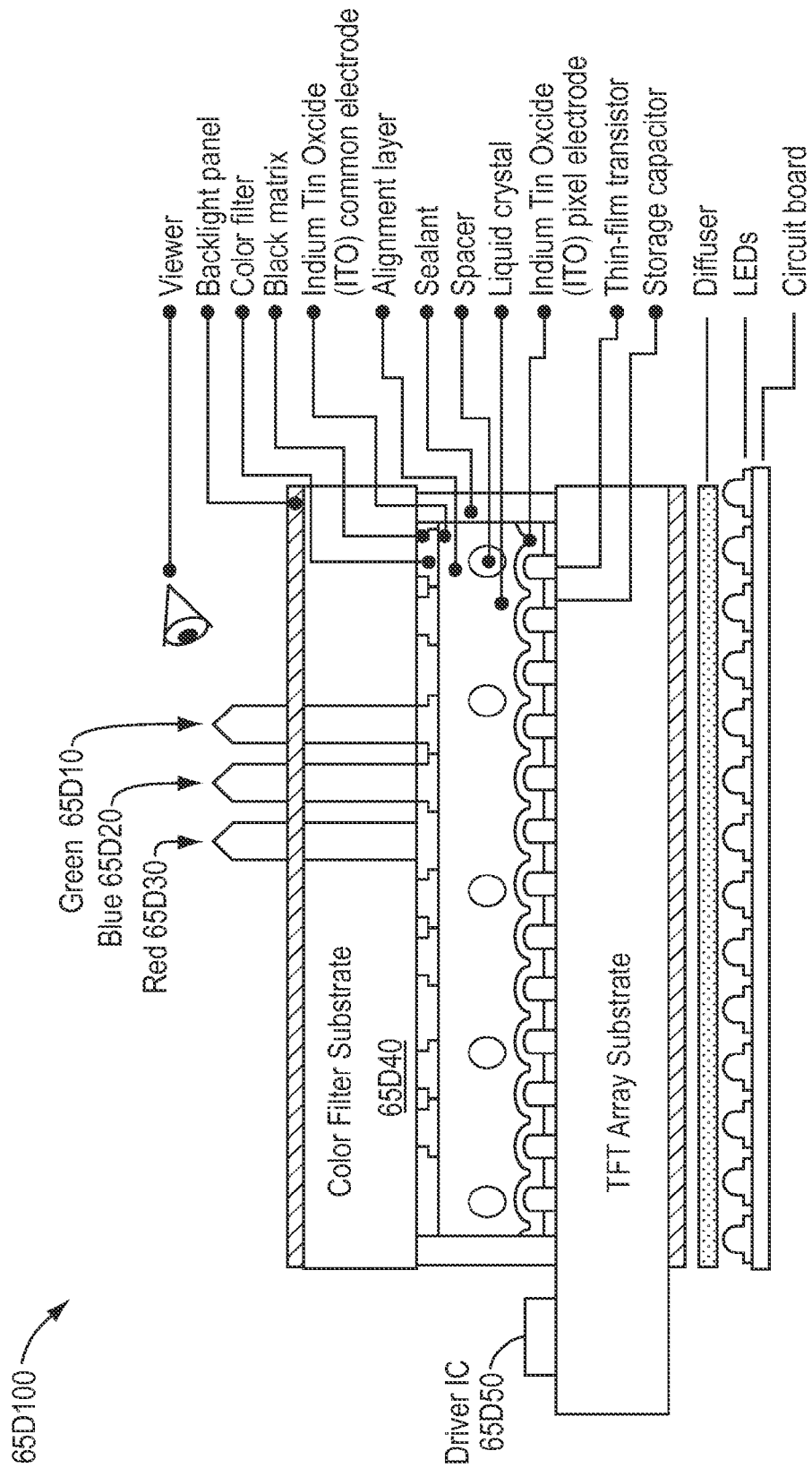
FIG. 65D1

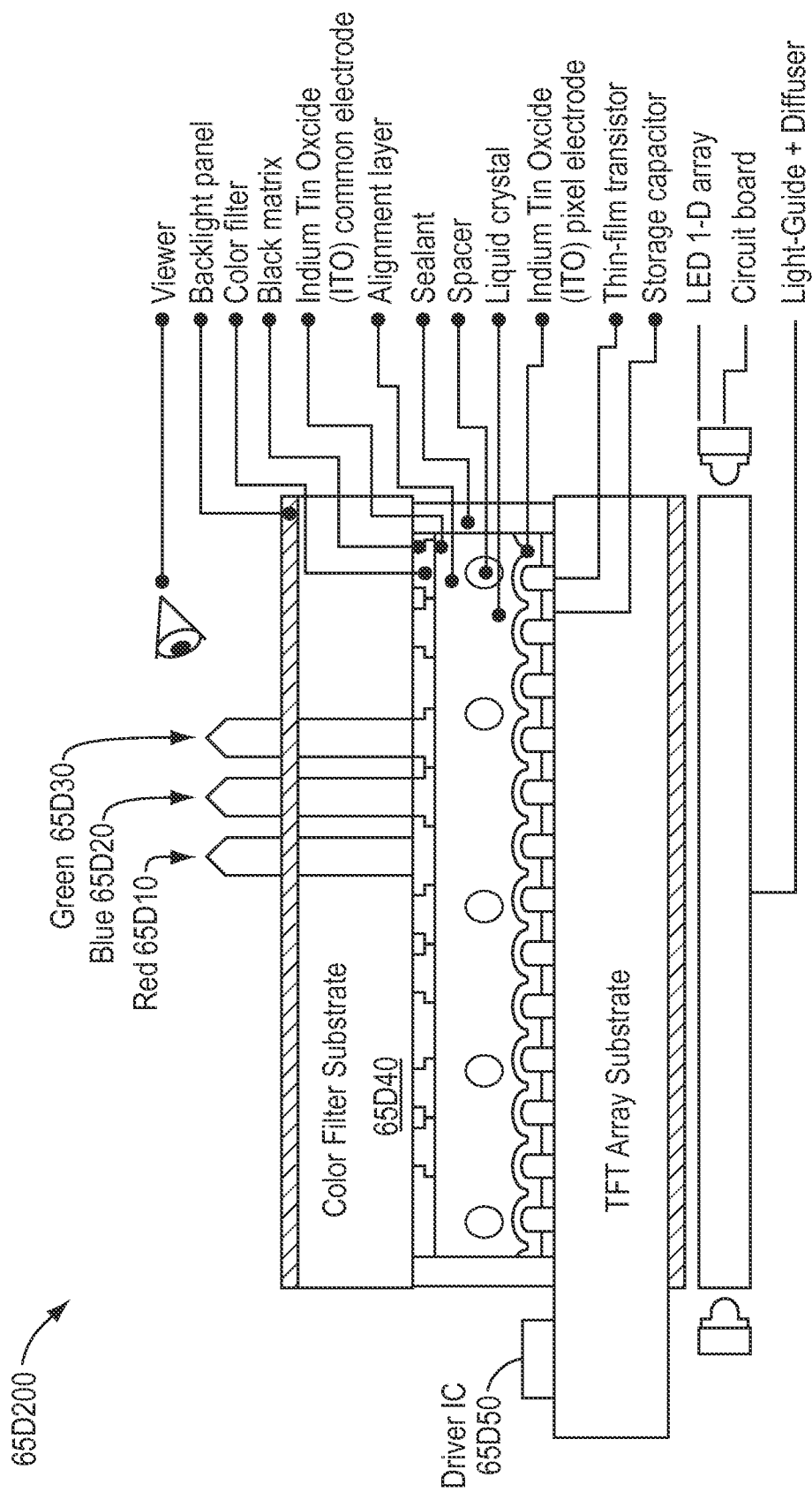
FIG. 65D2

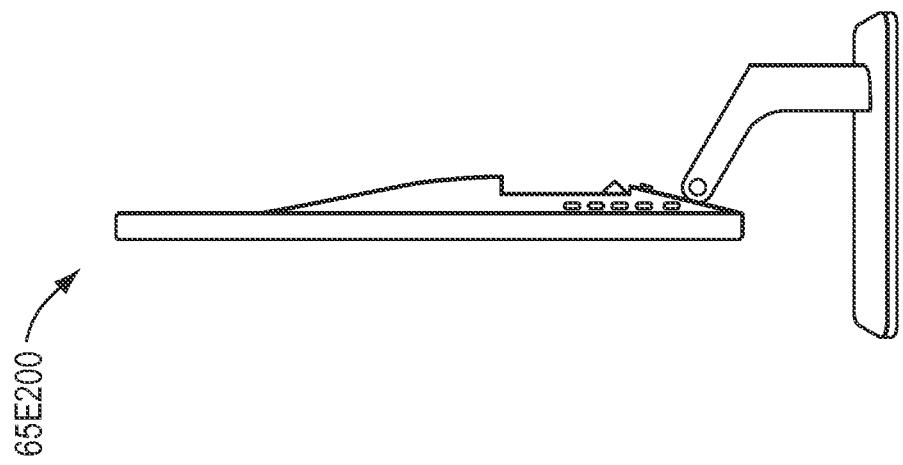
FIG. 65E2
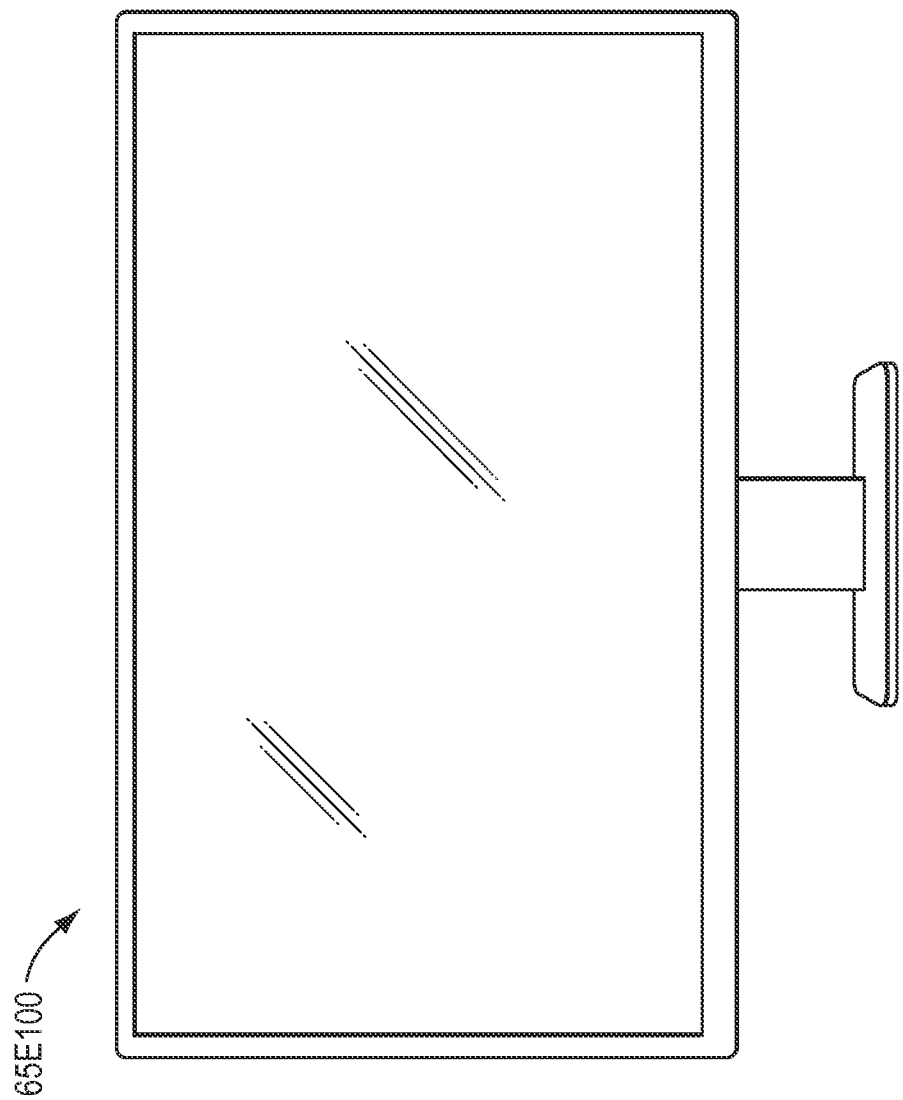
FIG. 65E1

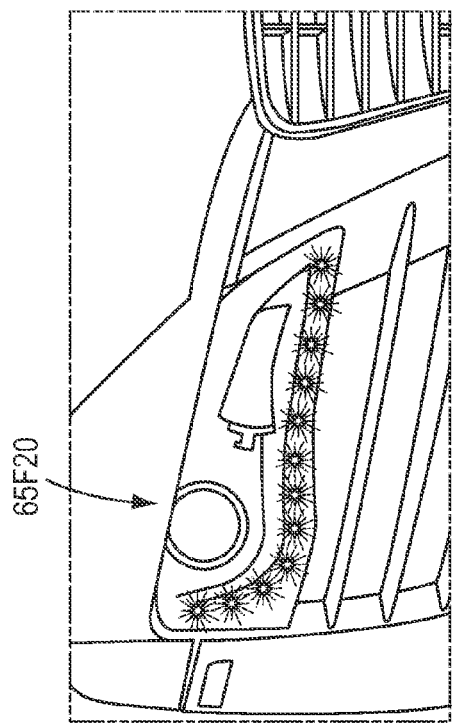
FIG. 65F1
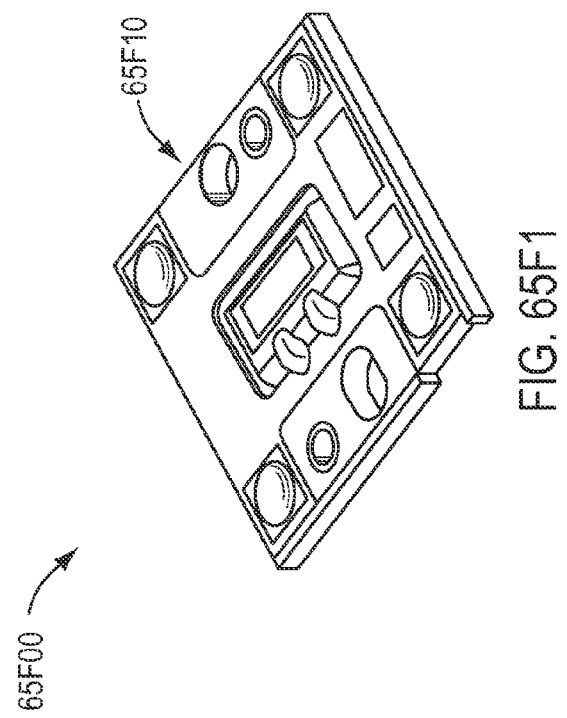
FIG. 65F2
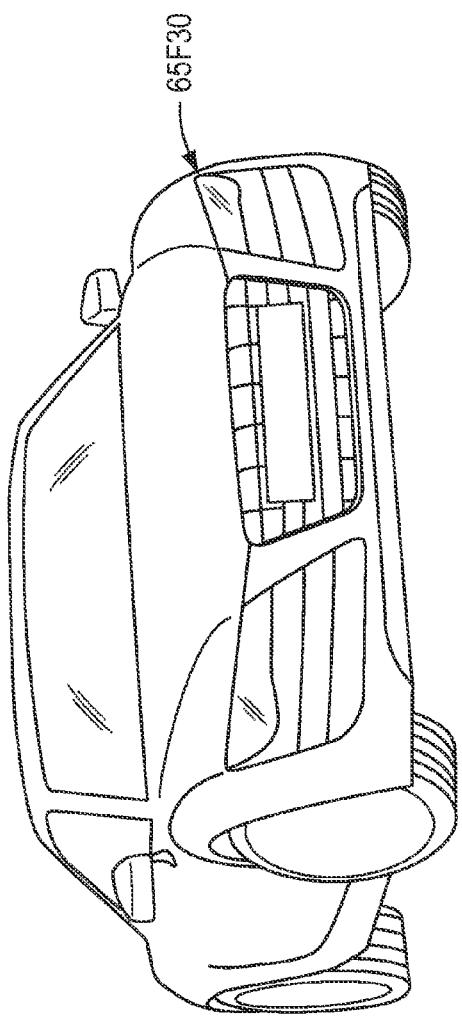
FIG. 65F3

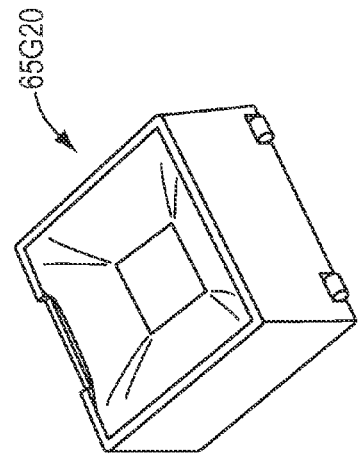
FIG. 65G2
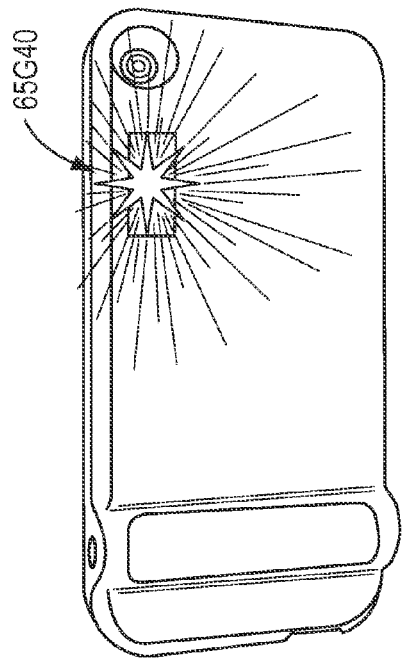
FIG. 65G4
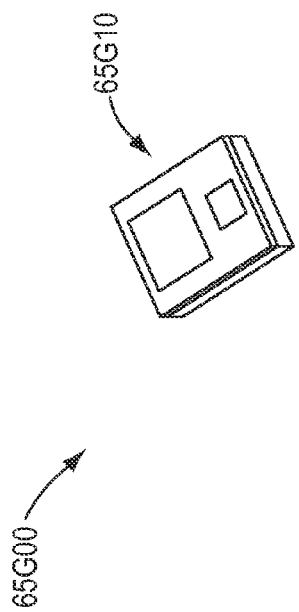
FIG. 65G1
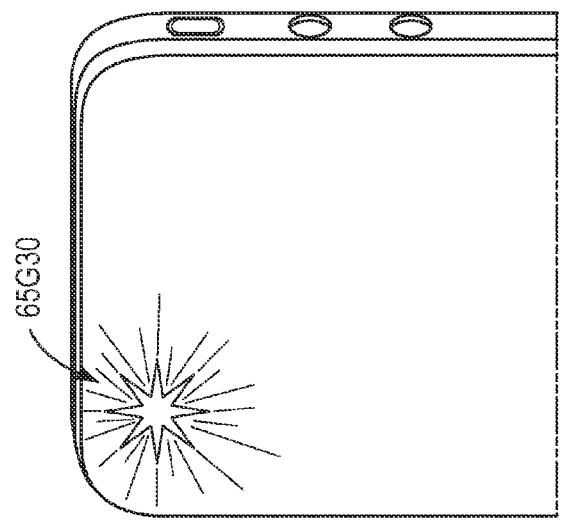
FIG. 65G3

LED LAMPS WITH IMPROVED QUALITY OF LIGHT

This application is a continuation of U.S. application Ser. No. 15/154,581, filed May 13, 2016, which is a continuation of U.S. application Ser. No. 14/698,574, filed on Apr. 28, 2015, now U.S. Pat. No. 9,368,695, issued Jun. 14, 2016, which is a continuation of U.S. application Ser. No. 14/528,876, filed on Oct. 30, 2014, now U.S. Pat. No. 9,046,227, issued on Jun. 2, 2015, which is a continuation of U.S. application Ser. No. 14/310,957, filed on Jun. 20, 2014, now U.S. Pat. No. 8,933,644, issued Jan. 13, 2015, which is a continuation-in-part of U.S. application Ser. No. 13/886,547, filed on May 3, 2013, which claims the benefit under 35 U.S.C. § 119(e) of U.S. Provisional Application No. 61/642,984, filed on May 4, 2012, and U.S. Provisional Application No. 61/783,888 filed on Mar. 14, 2013; and U.S. application Ser. No. 14/310,957 is a continuation-in-part of U.S. application Ser. No. 14/040,379, filed on Sep. 27, 2013, now U.S. Pat. No. 9,293,644, issued on Mar. 22, 2016, which is a continuation-in-part of U.S. application Ser. No. 13/931,359, filed on Jun. 28, 2013, now U.S. Pat. No. 8,686,458, issued on Apr. 1, 2014; and U.S. application Ser. No. 14/040,379 claims the benefit under 35 U.S.C. § 119(e) of U.S. Provisional Application No. 61/778,002, filed on Mar. 12, 2013; and U.S. application Ser. No. 13/931,359 is a continuation of U.S. application Ser. No. 12/936,238 filed on Jul. 29, 2011, now U.S. Pat. No. 8,502,465, issued on Aug. 6, 2013, which is a national stage entry of PCT International Application No. PCT/US2010/49531, filed on Sep. 20, 2010, which claims the benefit under 35 U.S.C. § 119(e) of U.S. Provisional Application No. 61/243,988, filed on Sep. 18, 2009; and U.S. application Ser. No. 14/310,957 is a continuation-in-part of U.S. application Ser. No. 13/211,145, filed on Aug. 16, 2011, now U.S. Pat. No. 9,293,667, issued on Mar. 22, 2016, which claims the benefit under 35 U.S.C. § 119(e) of U.S. Provisional Application No. 61/502,212, filed on Jun. 28, 2011, and U.S. Provisional Application No. 61/375,097, filed on Aug. 19, 2010, each of which is incorporated by reference in its entirety.

FIELD

The disclosure relates to the field of general lighting with light emitting diode (LED) lamps and more particularly to techniques for LED lamps with an improved quality of light.

BACKGROUND

Due to the limited efficacy of common light sources, there is a need for high-efficiency LED sources for general lighting. In the recent past, technical progress has enabled LED-based lamps to provide enough luminous flux to replace general illumination sources in the 40 W range and beyond, for example, lamps emitting 500 lm and beyond. There is a strong push to keep increasing the lumen output of LED-based lamps while also improving the quality of the light they generate. Therefore, there is a need for improved approaches.

SUMMARY

Accordingly, techniques for LED lamps with improved quality of light are disclosed whereby the following configurations, systems and methods can be embodied.

In a first aspect, LED lamps are provided comprising an LED device, wherein the LED lamp is characterized by a luminous flux of more than 500 lm, and a spectral power distribution (SPD) in which more than 2% of the radiometric optical power is emitted within a wavelength range from about 390 nm to about 430 nm.

In a second aspect, LED-based lamps are provided characterized by a luminous flux of more than 500 lm, wherein the lamp comprises one or more LED source die having a light emitting surface area of less than 29 mm$^2$.

In a third aspect, light sources are provided comprising a plurality of light emitting diodes (LEDs), for which at least 2% of an SPD is in a range 390 nm to 430 nm, and such that an International Commission on Illumination (CIE) whiteness of a high-whiteness reference sample illuminated by the light source is within −20 points to +40 points of a CIE whiteness of the same sample under illumination by a CIE reference illuminant of the same correlated color temperature (CCT) (respectively, a blackbody radiator if CCT<5000K or a D illuminant if CCT>5000K).

In a fourth aspect, light sources are provided comprising LEDs, for which at least 2% of an SPD is in a range about 390 nm to about 430 nm, and such that a CIE whiteness of a high-whiteness reference sample illuminated by the light source is within −20 points to +40 points of a CIE whiteness of the same sample under illumination by a ceramic metal halide illuminant of the same CCT.

In a fifth aspect, light sources are provided comprising a plurality of light emitting diodes (LEDs) wherein light emitted by the light source is characterized by a spectral power distribution in which at least 2% of the radiometric optical power is in a wavelength range from about 390 nm to about 430 nm, and a chromaticity of a high-whiteness reference sample illuminated by the source that is at least two Duv points and at most twelve Duv points away from a chromaticity of a white point of the light source, and the chromaticity shift is substantially toward the blue direction of the color space.

In a sixth aspect, light sources are provided comprising a plurality of light emitting diodes (LEDs) wherein light emitted by the light source is characterized by a spectral power distribution in which at least 2% of the radiometric optical power is in a wavelength range from about 390 nm to about 430 nm, and wherein the spectral power distribution has a color gamut Qg of at least 110 and a color fidelity Qf of at least 80.

In a seventh aspect, light sources are provided comprising a plurality of light emitting diodes (LEDs) wherein light emitted by the light source is characterized by a spectral power distribution in which at least 2% of the radiometric optical power is in a wavelength range from about 390 nm to about 430 nm, and wherein the spectral power distribution has a CCT between 3300K and 5300K and a cyanosis observation index below 3.3.

In an eighth aspect, optical devices are disclosed comprising substrate-emitting vertically-conducting high current density LED including a bulk GaN substrate, an n-Type (Al)(In)GaN epitaxial layer(s), a plurality of doped and/or undoped (Al)(In)GaN active region layers, a p-Type (Al)(In)GaN epitaxial layer(s), a reflective p-type contact, and an n-type contact.

In a ninth aspect, optical devices are disclosed comprising an LED whose peak emission is in the range of about 405 nm to 430 nm, provided on a substrate or submount, the LED emission pumping blue-, red-, and green-emitting phosphors adapted to emit white light, the phosphors being disposed in an encapsulant which is substantially transparent to both pump-LED source and phosphor-emitted light.

BRIEF DESCRIPTION OF THE DRAWINGS

Those skilled in the art will understand that the drawings, described herein, are for illustration purposes only. The drawings are not intended to limit the scope of the present disclosure.

FIG. 18A is a picture of multiple shadows cast by a hand under illumination by a conventional LED lamp with multiple light sources.

FIG. 18B is a picture showing a shadow cast by a hand under illumination by an embodiment of the present disclosure.

FIG. 19A1 and FIG. 19A2 depict an MR-16 form factor lamp with an integrated light source used in LED lamps with improved quality of light, according to some embodiments.

FIG. 19C1 and FIG. 19C2 depict an AR111 form factor lamp for use with LED lamps with improved quality of light, according to some embodiments.

FIG. 19D1 and FIG. 19D2 depict a PAR38 form factor lamp for use with LED lamps with improved quality of light, according to some embodiments.

FIG. 26A shows an example of a spectrum with an increased overall gamut, according to some embodiments.

FIG. 26B is a chart showing the CIELAB color space and the position of various colored objects illuminated by a reference source forming a reference gamut and the spectrum of FIG. 26A forming an increased gamut, for comparison.

FIG. 29A is a chart showing the calculated SPD of an LED lamp having an increased gamut, according to some embodiments.

FIG. 29B is a chart showing the corresponding gamut for comparison.

FIG. 31A is a chart showing the calculated SPD of an LED lamp having an increased gamut, according to some embodiments.

FIG. 31B is a chart showing the corresponding gamut for comparison.

FIG. 63A and FIG. 63B are diagrams illustrating the emission spectrum of a two-phosphor violet pumped white LED according to embodiments of the present disclosure.

FIG. 64A through FIG. 64I depict embodiments of the present disclosure in the form of lamp applications.

FIG. 65A1 through FIG. 65I depict embodiments of the present disclosure as can be applied toward lighting applications.

DETAILED DESCRIPTION

Figure 1A:
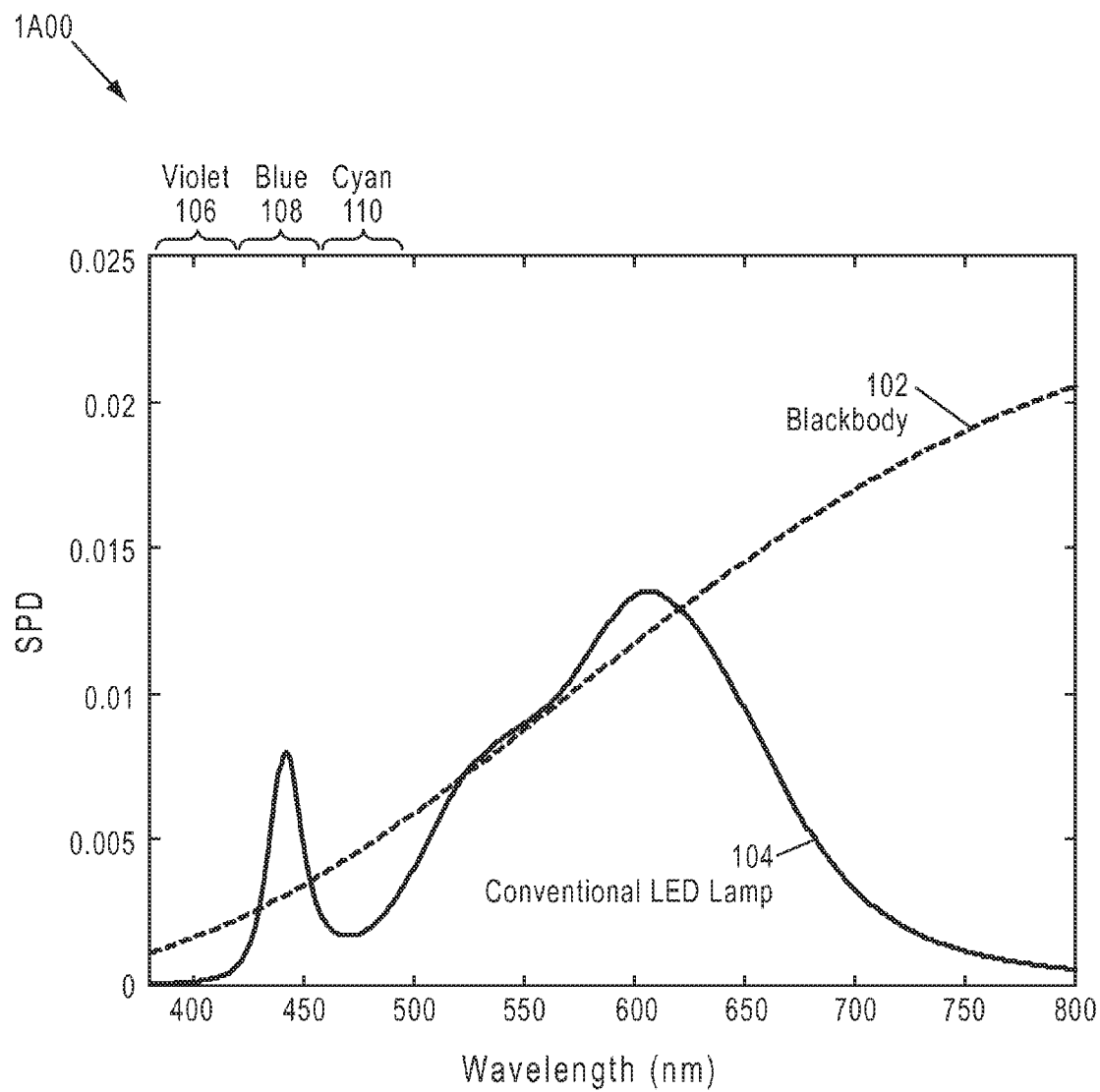
FIG. 1A is a graph showing a comparison of SPDs of a blackbody and a conventional LED lamp, using blue pump LEDs and two phosphors, with the same CCT of 3000K and having an equal luminous flux for comparing to LED lamps with improved quality of light, according to some embodiments.

The term "phosphors" as used herein means any compositions of wavelength-converting materials.

The acronym "CCT" refers to the correlated color temperature.

The acronym "SPD" as used herein means the spectral power distribution of a spectrum (e.g., its distribution of spectral power vs. wavelength).

The acronym "FWHM" as used herein means full-width at half maximum of an SPD.

The acronym "OBA" as used herein refers to an optical brightening agent (OBA), a substance which absorbs light in a wavelength range and emits light in another wavelength range to increase perceived whiteness. Typically conversion occurs from the ultraviolet-violet range to the blue range.

The acronym "SWSD" as used herein refers to a short-wavelength SPD discrepancy, a metric to quantify the discrepancy between two SPDs in the short-wavelength range. This metric is defined further in the application.

The term "total radiance factor" as used herein refers to the ratio of the radiation reflected and emitted from a body to that reflected from a perfect reflecting diffuser under the same conditions of illumination and detection.

The term "Duv" as used herein refers to the chromaticity difference between two color points of color coordinates (u'1,v'1) and (u'2,v'2), and is defined as:

$$Duv = 1000 \cdot \sqrt{(u'1-u'2)^2 + (v'1-v'2)^2}$$

The term "violet leak" as used herein refers to the fraction of an SPD in the range 390 nm to 430 nm.

The term "CCT-corrected whiteness" as used herein refers to a generalization of the CIE whiteness formula applicable to CCTs other than 6500K.

The term "high whiteness reference sample" as used herein refers to a commercially available whiteness standard whose nominal CIE whiteness is about 140, as further described herein.

The term "large-sample set CRI" as used herein refers to a generalization of the color rendering index where the color-error calculation is averaged over a large number of samples rather than eight samples, as further described herein.

The term "gamut" as used herein refers to the area encompassed by the chromaticity coordinates of a set of color samples when plotted in a color space such as CIELAB. The term Qf as used herein refers to a specific calculation of a color fidelity as implemented in the Color Quality Scale 9.0 framework.

The term "Qg" as used herein refers to a specific calculation of a gamut area, as implemented in the Color Quality Scale 9.0 framework.

Wavelength conversion materials can be ceramic or semiconductor particle phosphors, ceramic or semiconductor plate phosphors, organic or inorganic downconverters, upconverters (anti-stokes), nanoparticles, and other materials which provide wavelength conversion. Some examples are listed below:

$(Sr_n,Ca_{1-n})_{10}(PO_4)_6*B_2O_3:Eu^{2+}$ (wherein $0 \leq n \leq 1$)
$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$Sr_2Si_3O_8*2SrCl_2:Eu^{2+}$
$(Ca,Sr,Ba)_3MgSi_2O_8:Eu^{2+}, Mn^{2+}$
$BaAl_8O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2(Mg,Zn)Si_2O_7:Eu^{2+}$
$(Mg,Ca,Sr,Ba,Zn)_2Si_{1-x}O_{4-2x}:Eu^{2+}$ (wherein $0 \leq x \leq 0.2$)
$(Ca,Sr,Ba)MgSi_2O_6: Eu^{2+}$
$(Sr,Ca,Ba)(Al,Ga)_2S_4:Eu^{2+}$
$(Ca,Sr)_8(Mg,Zn)(SiO_4)_4Cl_2:Eu^{2+},Mn^{2+}$
$Na_2Gd_2B_2O_7:Ce^{3+},Tb^{3+}$
$(Sr,Ca,Ba,Mg,Zn)_2P_2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$(Y,Gd,Tb,La,Sm,Pr,Lu)_3(Sc,Al,Ga)_{5-n}O_{12-3/2n}:Ce^{3+}$ (wherein $0 \leq n \leq 0.5$)
$ZnS:Cu^+,Cl^-$
$(Y,Lu,Th)_3Al_5O_{12}:Ce^{3+}$
$ZnS:Cu^+,Al^{3+}$
$ZnS:Ag^+,A^{l3+}$
$ZnS:Ag^+,Cl^-$
The group:
$Ca_{1-x}Al_{x-xy}Si_{1-x+xy}N_{2-x-xy}C_{xy}:A$
$Ca_{1-x-z}Na_zM(III)_{x-xy-z}Si_{1-x+xy+z}N_{2-x-xy}C_{xy}:A$
$M(II)_{1-x-z}M(I)_zM(III)_{x-xy-z}Si_{1-x+xy+z}N_{2-x-xy}C_{xy}:A$
$M(II)_{1-x-z}M(I)_zM(III)_{x-xy-z}Si_{1-x+xy+z}N_{2-x-xy-2w/3}C_{xy}O_{w-v/2}H_v:A$
$M(II)_{1-x-z}M(I)_zM(III)_{x-xy-z}Si_{1-x+xy+z}N_{2-x-xy-2w/3-v/3}C_{xy}O_wH_v:A$
wherein $0<x<1$, $0<y<1$, $0 \leq z<1$, $0 \leq v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.
$LaAl(Si_{6-z}Al_z)(N_{10-z}O_z):Ce^{3+}$ (wherein $z=1$)
$(Ca,Sr)Ga_2S_4: Eu^{2+}$
$AlN:Eu^{2+}$
$SrY_2S_4:Eu^{2+}$ CaLa$_2$S$_4$:Ce$^{3+}$
(Ba,Sr,Ca)MgP$_2$O$_7$:Eu$^{2+}$,Mn$^{2+}$
(Y,Lu)$_2$WO$_6$:Eu$^{3+}$,Mo$^{6+}$
CaWO$_4$
(Y,Gd,La)$_2$O$_2$S:Eu$^{3+}$
(Y,Gd,La)$_2$O$_3$:Eu$^{3+}$
(Ba,Sr,Ca)$_n$Si$_n$N$_n$:Eu$^{2+}$ (where 2n+4=3n)
Ca$_3$(SiO$_4$)Cl$_2$:Eu$^{2+}$
(Y,Lu,Gd)$_{2-n}$Ca$_n$Si$_4$N$_{6+n}$C$_{1-n}$:Ce$^{3+}$, (wherein 0≤n≤0.5)
(Lu,Ca,Li,Mg,Y) alpha-SiAlON doped with Eu$^{2+}$ and/or Ce$^{3+}$
(Ca,Sr,Ba)SiO$_2$N$_2$:Eu$^{2+}$,Ce$^{3+}$
Ba$_3$MgSi$_2$O$_8$:Eu$^{2+}$,Mn$^{2+}$
(Sr,Ca)AlSiN$_3$:Eu$^{2+}$
CaAlSi(ON)$_3$:Eu$^{2+}$
Ba$_3$MgSi$_2$O$_8$:Eu$^{2+}$
LaSi$_3$N$_5$:Ce$^{3+}$
Sr$_{10}$(PO$_4$)$_6$Cl$_2$:Eu$^{2+}$
(BaSi)O$_{12}$N$_2$:Eu$^{2+}$
M(II)$_a$Si$_b$O$_c$N$_d$Ce:A wherein (6<a<8, 8<b<14, 13<c<17, 5<d<9, 0<e<2) and M(II) is a divalent cation of (Be,Mg,Ca,Sr,Ba,Cu,Co,Ni,Pd,Tm,Cd) and A of (Ce,Pr,Nd,Sm,Eu,Gd,Tb,Dy,Ho,Er,Tm,Yb,Lu,Mn,Bi,Sb)
SrSi$_2$(O,Cl)$_2$N$_2$:Eu$^{2+}$
SrSi$_9$Al$_{19}$ON$_{31}$:Eu$^{2+}$
(Ba,Sr)Si$_2$(O,Cl)$_2$N$_2$:Eu$^{2+}$
LiM$_2$O$_8$:Eu$^{3+}$ where M=(W or Mo)

For purposes of the application, it is understood that when a phosphor has two or more dopant ions (i.e., those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

Further, it is to be understood that nanoparticles, quantum dots, semiconductor particles, and other types of materials can be used as wavelength-converting materials. The list above is representative and should not be taken to include all the materials that may be utilized within the embodiments described herein.

Due to the limited efficacy of common light sources, there is a need for high-efficiency LED sources for general lighting. In the recent past, technical progress has enabled LED-based lamps to provide enough luminous flux to replace general illumination sources in the 40 W range and beyond, e.g., lamps emitting 500 lm and beyond.

Such conventional LED lamps use pump LEDs emitting in the range 440 nm to 460 nm and a mix of phosphor to generate white light. The choice of these "blue pump" LEDs (e.g., around 450 nm) for use in conventional LED lamps has in part been driven by the level of performance of such LEDs, which has made it possible to produce enough light (e.g., 500 lm) to suffice for some general lighting applications.

There is a strong push to keep increasing the lumen output of LED-based lamps, and also to improve the quality of the light they generate.

LED-based lamps are composed of several elements, including:

An LED source (or module) including LEDs and phosphors, which generate light;
A lamp body to which the LED source is attached;
An optical lens or other optical element that redirects or diffuses the light emitted by the LED source; and
An electrical power supply and circuitry (either external or integrated) for supplying power to the LED source.

Below are discussed some important limitations to the quality of light emitted by conventional LED lamps. Some of these issues are related to the use of blue pump LEDs, and some are related to the use of an extended LED light source and/or multiple LED light sources.

The color rendering index (CRI) is a recognized metric frequently employed to assess the quality of a light source. It provides a metric pertaining to the ability of a light source to reproduce the color rendering of a reference illuminant with the same correlated color temperature (CCT). However, under a variety of scenarios, the aforementioned CRI fails at correctly describing color rendering.

Indeed, the CRI only approximately evaluates the similarity between an ideal blackbody radiator and a light source in that the colors of illuminated test color samples (TCS) are compared. These TCSs display broad reflection spectra with slow variations, therefore, sharp variations in the spectral power distribution (SPD) of the source are not penalized. The TCS tests do not pose a very stringent test in terms of color matching in that they are forgiving of spectral discrepancies which occur in a narrow range of wavelengths.

However, there exist situations where the human eye is sensitive to minute changes in SPD, for instance when looking at objects with less regular reflection spectra, or objects whose reflection spectra are not close to one of the CRI TCSs. In such cases, a discrepancy between the SPD of the blackbody and the source over a narrow wavelength range may be perceived by an observer, and judged, as an inadequate color rendering. Thus, the only way to really avoid illuminant metamerism is to match the SPD of a reference illuminant at all wavelengths.

FIG. 1A is a graph 1A00 showing a comparison of the SPDs of a blackbody 102 and a conventional LED lamp 104, using blue pump LEDs and two phosphors, with the same CCT of 3000K and having an equal luminous flux for comparing to LED lamps with improved quality of light.

Figure 1B:
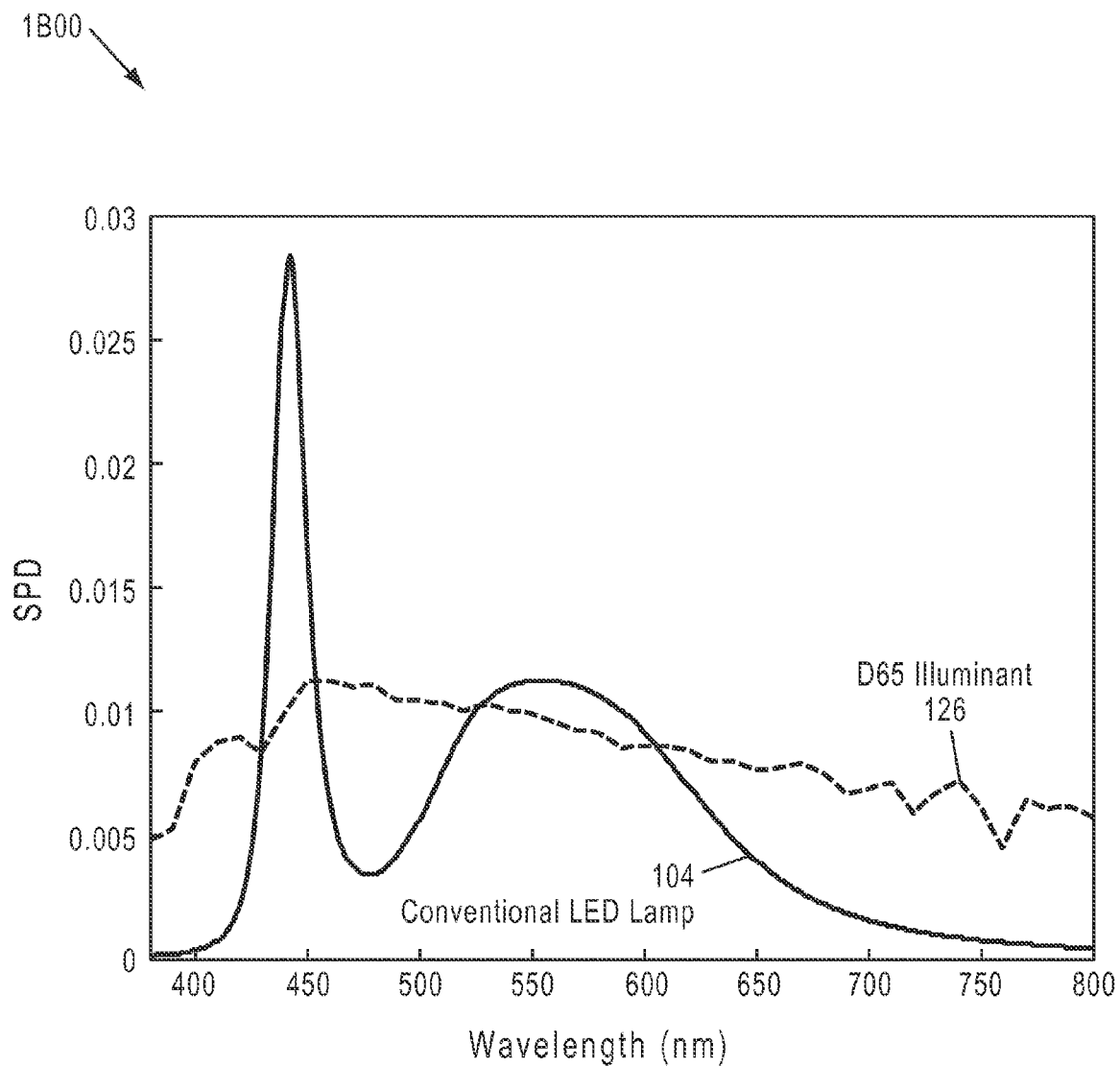
FIG. 1B is a graph showing a comparison of the SPD of a reference illuminant and a conventional LED lamp, using blue pump LEDs and one phosphor, with the same CCT of 6500K and an equal luminous flux for comparing to LED lamps with improved quality of light, according to some embodiments.

The compared SPDs of reference illuminants and conventional LEDs are shown in FIG. 1A and FIG. 1B, respectively for CCTs of 3000K and 6500K (for 3000K the reference is a blackbody 102, and for 6500K it is the D65 illuminant 126). The SPD discrepancy is especially notable in the short-wavelength range in that conventional LED sources employ blue pump LEDs with a narrow spectrum centered around 450 nm, and phosphor emission at longer wavelengths, separated by the Stokes shift between phosphor excitation and emission. Therefore, their SPD is too intense in the blue range 108 around 450 nm, too weak in the violet range 106, (390 nm to 430 nm), and weak in the cyan range 110 (470 nm to 500 nm) due to the Stokes shift.

FIG. 1B is a graph 1B00 showing a comparison of the SPD of a reference illuminant (D65 illuminant 126) and a conventional LED lamp 104, using blue pump LEDs and one phosphor, with the same CCT of 6500K and an equal luminous flux for comparing to LED lamps with improved quality of light.

As earlier described, at various CCTs, including the shown SPDs at 6500K, discrepancy is especially notable in the short-wavelength range in that conventional LED sources employ blue pump LEDs with a narrow spectrum centered around 450 nm, and phosphor emission at longer wavelengths, separated by the Stokes shift between phosphor excitation and emission.

Moreover, such discrepancies are not well described by the CRI. Indeed, recent academic research indicates that the color-matching functions underlying the CRI underestimate the sensitivity of the human eye in the short-wavelength range (e.g., for violet, blue and cyan wavelengths). Therefore, the importance of matching a reference spectrum at short wavelength is not properly described by the CRI, and little emphasis has been put on this issue in conventional LED sources. Improving SPD matching in this range can improve actual quality of light beyond what the CRI predicts.

Figure 2A:
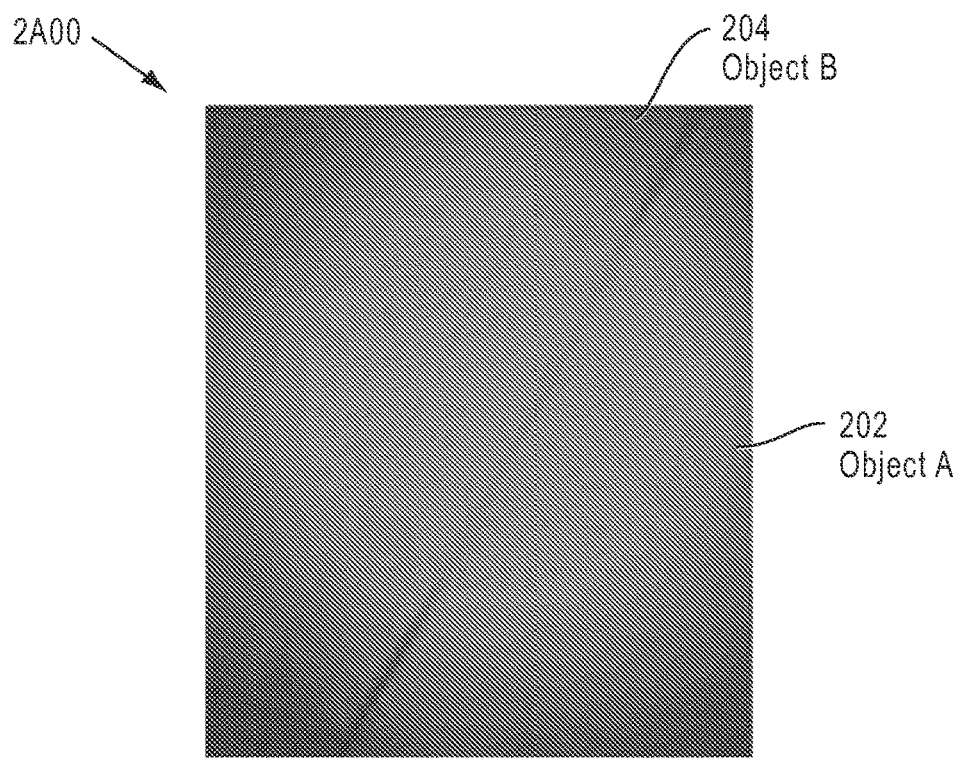
FIG. 2A is a picture showing two reddish objects evidencing metamerism under illumination by a conventional LED source with a 2700K CCT for comparison with LED lamps for improved quality of light.

FIG. 2A is a picture 2A00 showing two reddish objects evidencing metamerism under illumination by a conventional LED source with a 2700K CCT for comparison with LED lamps with improved quality of light.

FIG. 2A shows two reddish fabrics which have the same color point under daylight illumination. The picture is taken under illumination by a 2700K conventional LED source. The color of the objects appear markedly different, with object A (202) being more orange and object B (204) being more blue. This is a manifestation of metamerism (e.g., the effect that two objects similar under a particular illuminant can appear different under another illuminant). In some cases this is not desirable. Here, as shown, the two fabrics are designed to match in color, however under LED illumination they appear different (e.g., due to human visual perception).

Figure 2B:
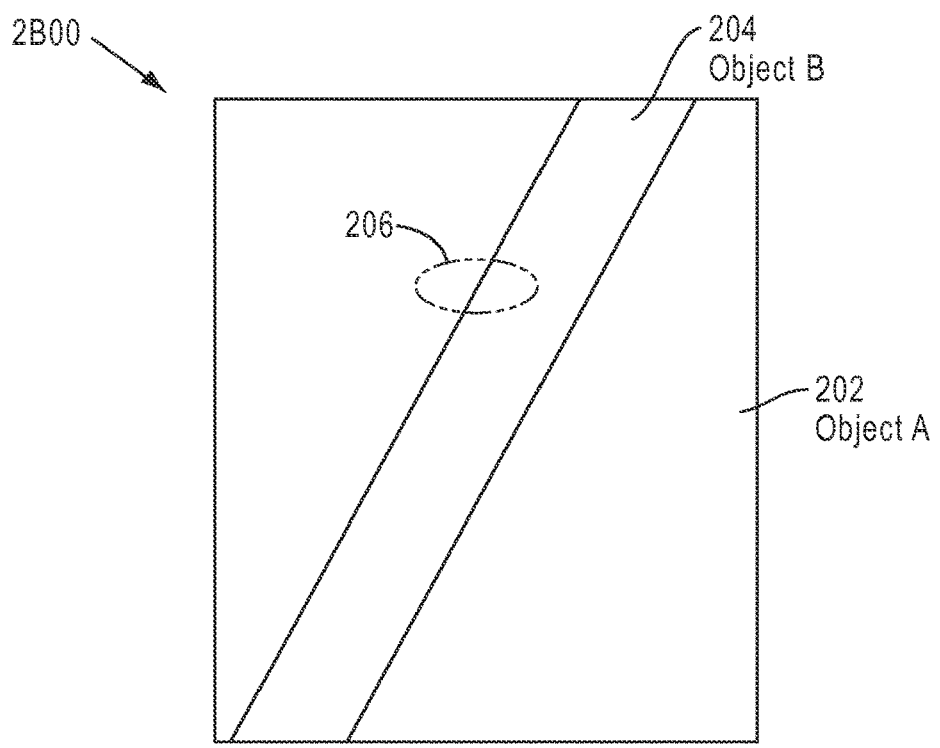
FIG. 2B is a sketch of FIG. 2A which shows two reddish objects evidencing metamerism under illumination by a conventional LED source with a 2700K CCT for comparison with LED lamps with improved quality of light.

FIG. 2B is a sketch 2B00 of FIG. 2A which shows two reddish objects evidencing metamerism under illumination by a conventional LED source with a 2700K CCT for comparison with LED lamps with improved quality of light.

FIG. 2B shows two fabrics which have the same color point under daylight illumination. As depicted by the sketch, the colors of the objects appear markedly different—this is a manifestation of metamerism. In some cases this is not desirable. Here the two fabrics (object A 202 and object B 204) are designed to match in color, but under certain LED illumination conditions, they appear different.

To quantify SPD matching more accurately than the CRI, one could use the CRI method (comparison of color coordinates for a set of standards), however an alternative is to use a wider variety of standards, including standards with sharper reflectivity spectra and a larger gamut than given in the TCS in order to better sample details of the SPD.

Embodiments described herein generalize the CRI correspondence to a larger variety of standards. A large number of physically-realistic, random reflectance spectra can be simulated numerically. Such a spectra collection covers the entire color space. By using such methods (e.g., one of the methods of Whitehead and Mossman), one can compute a large number of such spectra, for instance $10^6$ spectra, and use these spectra rather than the conventional TCS. The color error of each spectrum can be calculated. Further, since many spectra correspond to similar coordinates in color space (for instance in 1964 (uv) space), due to metamerism, the color space can be defined using discrete spectral cells, and the average color error in each cell of the color space can be computed. Also, the color error can be averaged over all cells to yield a large-sample set CRI value. As further discussed herein, this technique is well-behaved; for example, different sets of random spectra yield a similar large-sample set CRI value (e.g., within about one point) for realistic LED spectra, and the large-sample set CRI value does not depend significantly on the details of the discretization grid. By using this approach, a conventional LED lamp (having a CRI of about 84) has a large-sample set CRI of only about 66, which is a much lower value. This indicates that by widening the CRI approach to a large set of samples (e.g., covering the entire color space), the estimation of color rendering can be significantly improved. Quantitative analysis indicates that differences in estimation values are mainly due to the short- and long-wavelength ends of the LED source spectrum where departure from a blackbody SPD is pronounced.

Another straightforward way to estimate SPD discrepancy is to integrate the distance between the two SPDs over the visible wavelength range, weighted by proper response functions. For instance, one can choose the cone fundamentals S, L and M (the physiological response of the cone receptors in a human eye). The short-wavelength response S is especially sensitive in the range of about 400 nm to about 500 nm, and is a suitable weighting function to quantify SPD discrepancy in this range.

Exemplary quantifications define the short-wavelength SPD discrepancy (SWSD) as:

$$SWSD = \frac{\int |BB(\lambda) - LED(\lambda)| . S(\lambda) . d\lambda}{\int BB(\lambda) . S(\lambda) . d\lambda}$$

Here LED($\lambda$) is the SPD of the LED source. BB($\lambda$) is the SPD of a reference illuminant with the same CCT and equal luminous flux. As is customary, the reference illuminant is a blackbody below 5000K, and a phase of CIE standard illuminant D otherwise. S($\lambda$) is the short-wavelength cone fundamental. Note that similar functions can be defined for the other cone response functions L and M if one studies SPD discrepancies at longer wavelengths.

Figure 3:
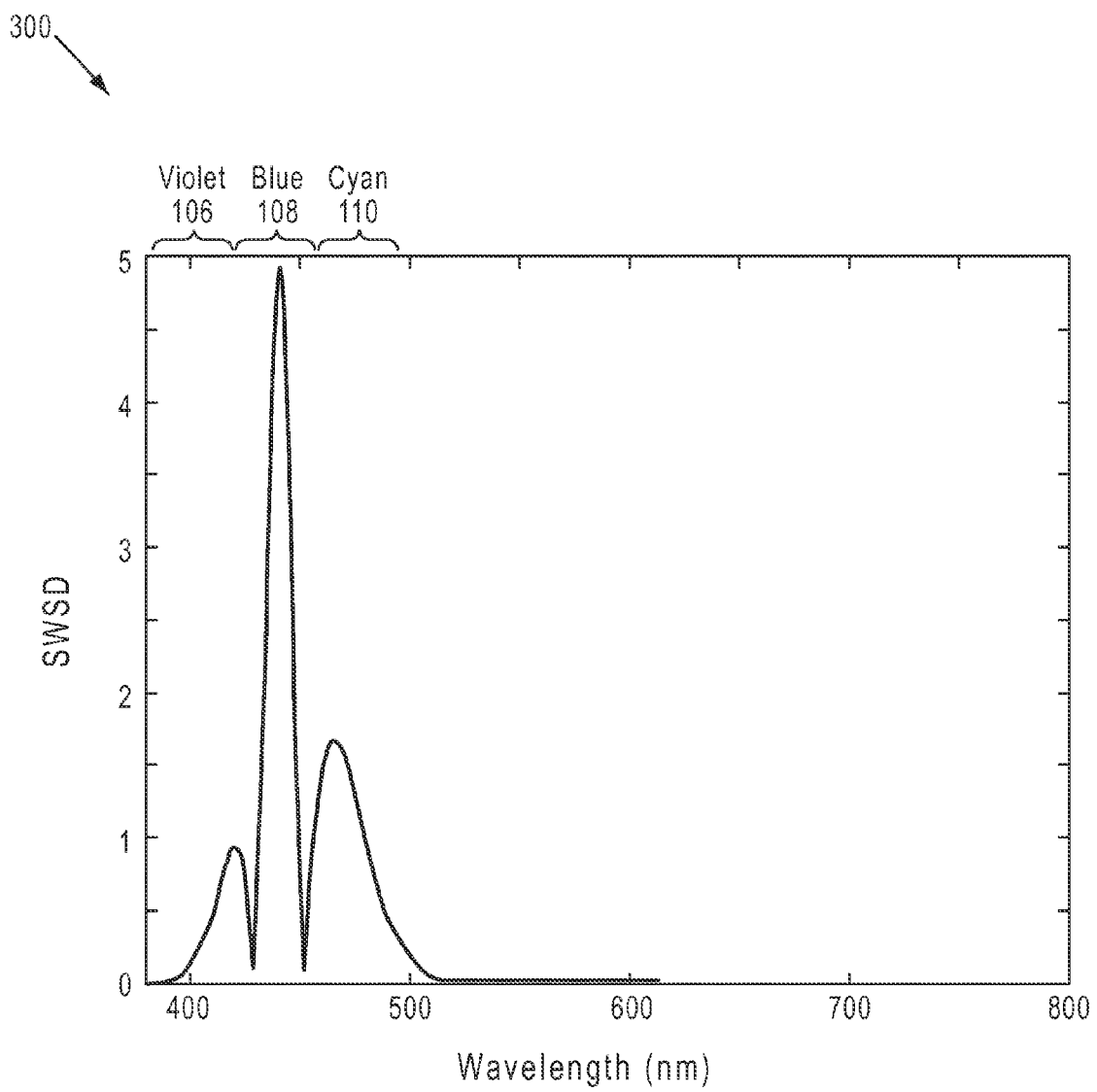
FIG. 3 is a graph showing the details of the short-wavelength SPD discrepancy (SWSD) between a conventional LED and a blackbody with the same CCT of 3000K and the same luminous flux for comparing LED lamps with improved quality of light, according to some embodiments.

FIG. 3 is a graph 300 showing the details of the SWSD between a conventional LED and a blackbody with the same CCT of 3000K and the same luminous flux for comparing LED lamps with improved quality of light. As expected, contributions to the discrepancy arise from the violet range 106, the blue range 108 and cyan range 110.

Observers will recognize that in some applications, very vivid colors are desired. In some such applications, color fidelity is less important than color saturation. Thus one does not seek a perfect match to a blackbody SPD but rather a SPD which will exacerbate color saturation/chromaticity. Again, this effect is not captured by CRI values.

While it is important for a lamp to properly render colors, the rendering of white is especially crucial. These two criteria are not equivalent. Indeed, most white objects in everyday life display a high whiteness thanks to the use of fluorescent species, commonly referred to as optical brightening agents (OBAs) or fluorescent whitening agents (FWAs). These OBAs absorb light in the ultraviolet/violet wavelength range and fluoresce in the blue range. Additional spectral contribution in the blue range is known to increase human perception of whiteness. Objects commonly containing OBAs include white paper, white fabrics, and washing detergents.

As was shown in FIG. 1A and FIG. 1B, the SPD of a conventional LED source lacks any contribution in the violet and ultraviolet ranges. Therefore, OBA fluorescence is not excited and the perceived whiteness is decreased.

Figure 4:
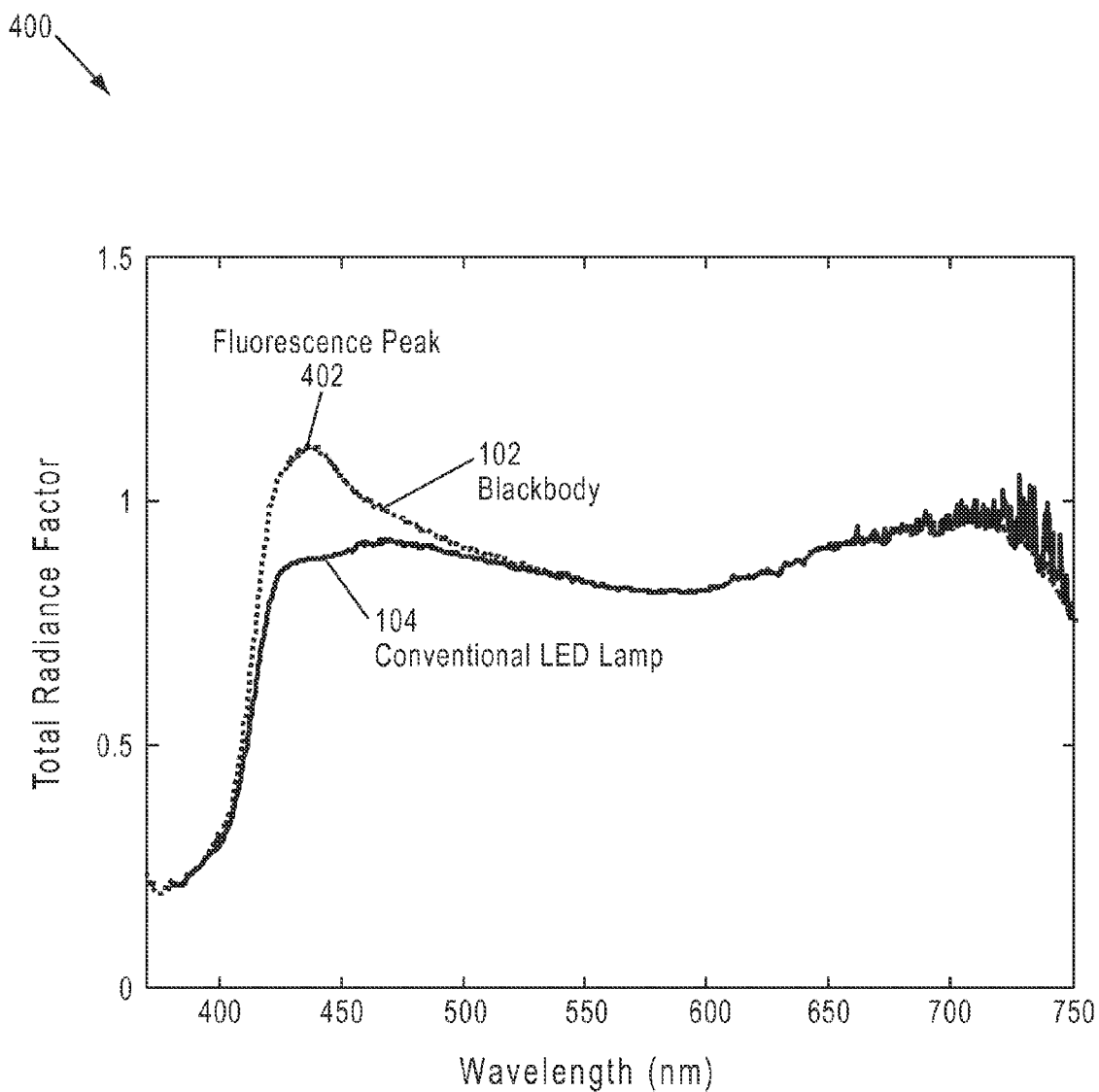
FIG. 4 is a graph showing the total radiance factor of a sample of white paper with optical brightening agents (OBAs) for an incandescent source and a conventional LED source, both with a 3000K CCT, for comparing to LED lamps with improved quality of light, according to some embodiments.

FIG. 4 is a graph 400 showing the total radiance factor of a sample of white paper with optical brightening agents (OBAs) for an incandescent source and a conventional LED source, both with a 3000K CCT, for comparing LED lamps with improved quality of light.

FIG. 4 illustrates this by comparing the total radiance factors of a sheet of white paper illuminated by a blackbody radiator (in practice, a halogen lamp) and a conventional LED, with the same CCT of 3000K. The total radiance factor represents the emitted light normalized by the source SPD, and is composed of a reflection and of fluorescence contributions. For the blackbody 102, a pronounced peak (e.g., fluorescence peak 402) is observed around 430 nm (the total radiance factor is higher than unity); this is due to fluorescence of OBAs excited by ultraviolet and violet light. For the conventional LED lamp 104, on the other hand, no fluorescence is excited and the total radiance factor is simply equal to the reflectivity spectrum of the paper sheet.

Various light sources are able to excite OBAs because their SPD contains violet and ultraviolet light. Such light sources include certain incandescent and halogen sources, and certain ceramic metal halide sources.

In order to quantify this effect one can use the CIE whiteness, a recognized metric for whiteness evaluation. CIE whiteness is defined in "Paper and board—Determination of CIE whiteness, D65/10° (outdoor daylight)", ISO International Standard 11475:2004E (2004).

Table 1 considers a commercially-available high-whiteness paper illuminated by various illuminants, and indicates the corresponding CIE whiteness. In characterizing the reference illuminants, the presented values assume no emissions below 360 nm (e.g., due to the presence of UV cutoff filters in the corresponding lamps). The whiteness under conventional blue-pumped LED illumination is significantly lower than under incandescent illumination. Note that, for a CCT of 3000K, whiteness values are always negative. This is due to the definition of CIE whiteness, which uses a reference illuminant at 6500K. Therefore, absolute values of CIE whiteness are not indicative for CCTs other than 6500K; however, relative changes in CIE whiteness are still indicative of a change in whiteness rendering because they quantify the desired color shift toward the blue, which enhances the perception of whiteness. Therefore, the 30-point difference in CIE whiteness between the reference illuminant and the LED is suggestive of a large difference in perceivable whiteness.

TABLE 1

CCT-corrected whiteness value for a 6500K illuminant.

|  | Reference | LED |
| --- | --- | --- |
| 6500K | 125 | 90 |
| 3000K | −137 | −165 |

Instead of directly employing the equation for CIE whiteness, which is defined for a CCT of 6500K, one can also adapt the CIE whiteness formula to a source of a different CCT. This can be done through known-in-the-art mathematics considering the foundations of the CIE whiteness formula. Exemplary mathematical treatments include a derivation of a formula similar to that of CIE whiteness but with modified numerical coefficients, which is referred to herein using the term "CCT-corrected whiteness". CCT-corrected whiteness quantifies the blue-shift of objects containing OBAs under illumination; however since the CCT of the illuminant is taken into account when using the CCT-corrected whiteness formula, the resulting whiteness values are positive, and absolute values are meaningful for any CCT.

Table 2 shows the CCT-corrected whiteness value for a 3000K illuminant over the same commercially-available paper as in the above discussion referring to Table 1. As discussed, the absolute values of CCT-corrected whiteness are meaningful as they reveal a large change in whiteness between the two illuminants.

TABLE 2

CCT-corrected whiteness value for a 3000K illuminant.

| CCT | Reference | LED |
| --- | --- | --- |
| 3000K | 113 | 86 |

In summary, the discussion above shows that conventional LEDs are unable to render whiteness in objects containing OBAs due to the lack of violet or UV radiation in their SPD.

Lamps generate shadows. The appearance of the shadows depends on the properties of the lamp. In general an extended light source will generate damped, blurred shadows whereas a point-like light source will generate very sharp shadows. This is especially true when the illuminated object is located close to the lamp. It is easy to decrease shadow sharpness (for instance by adding a reflector cup or a diffuser to the light source). On the other hand, there is no easy way to obtain sharp shadows from an extended source. Sharp shadows are desirable in some applications.

In order to be useful for general lighting, LED lamps need to deliver a minimum luminous flux. Due to limitations in power dissipation and source efficiency, this is often achieved by placing several LED sources in a lamp fixture. These LED sources are distributed across the lamp, and therefore increase the source size and generate blurred shadows. This is also true for some incandescent sources such as halogen MR-16 lamps, which use a large reflector cup.

Figure 5A:
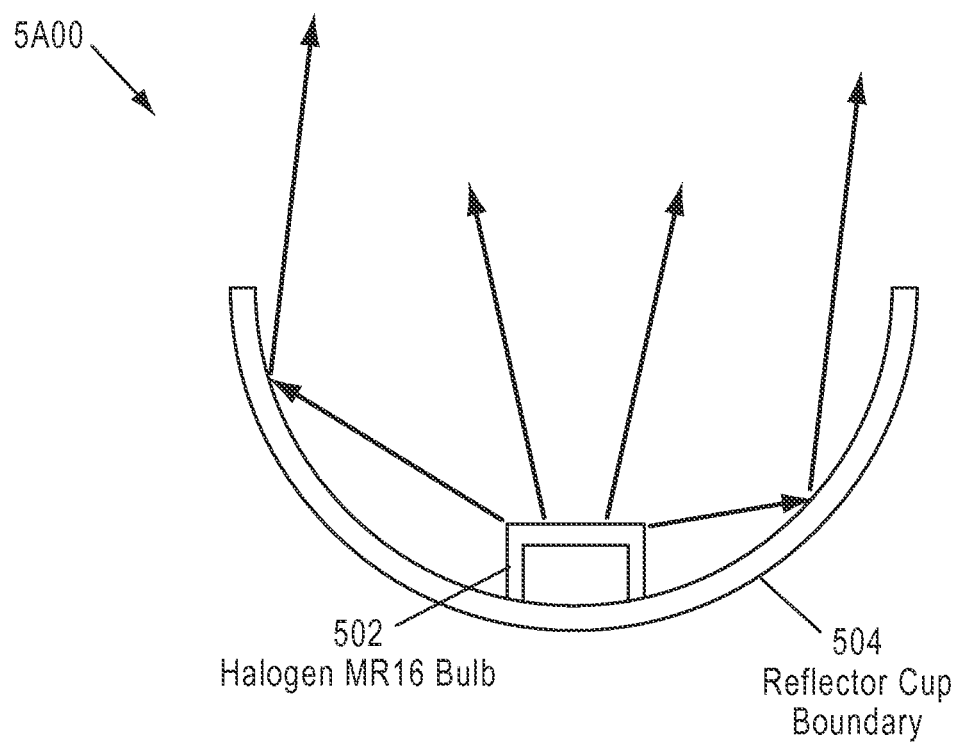
FIG. 5A depicts a halogen MR-16 bulb with an extended source area provided by a reflector cup boundary used in a system for LED lamps for comparing to LED lamps with improved quality of light, according to some embodiments.
Figure 5B:
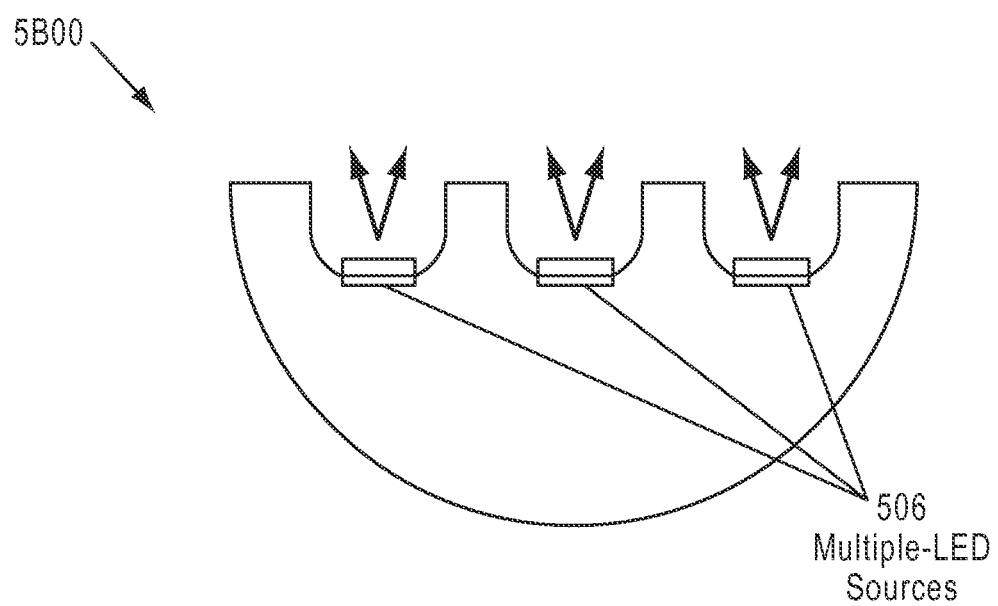
FIG. 5B depicts a multiple-source LED bulb with an extended source area provided by lamps with improved quality of light, according to some embodiments.

FIG. 5A and FIG. 5B depict, respectively, a halogen MR-16 bulb 502 and a multiple-source LED MR-16 506 with an extended source area provided by a reflector cup boundary 504. Of course, lamps consisting of multiple light sources 506 (e.g., LEDs) produce multiple shadows which are considered undesirable since they tend to "pollute" an illuminated scene and can distract observers. It is not possible to achieve a single-shadow situation from a multi-source lamp unless the lamp is distant from the illuminated objects. What is needed to improve the quality of shadows is a single-source with limited lateral extension (e.g., see FIG. 8).

Figure 6:
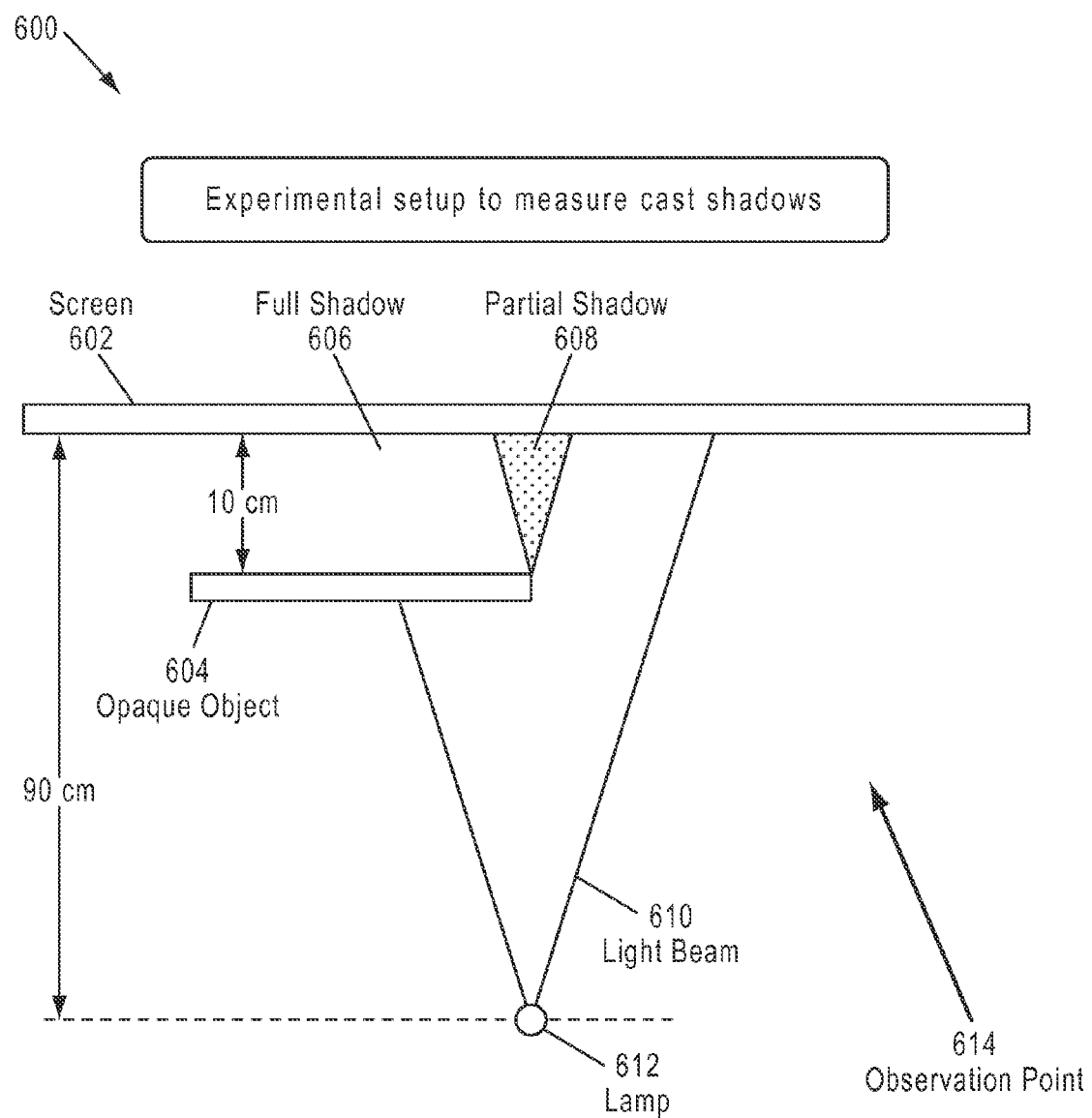
FIG. 6 depicts an experimental set-up to measure cast shadows for comparing LED lamps with improved quality of light, according to some embodiments.

FIG. 6 depicts an experimental set-up 600 to measure cast shadows for comparing LED lamps with improved quality of light.

FIG. 6 describes an experimental setup which can be used to evaluate the sharpness of a shadow. A lamp 612 is located 90 cm away from a screen 602, and the edge of an opaque object 604 is located at the center of the light beam 610, 10 cm away from the screen. The cast shadow is observed from observation point 614 at a distance of 1.2 m and an observation angle of 25 degrees. Also shown are a depiction of a full shadow 606 and a depiction of a partial shadow 608. The full shadow 606 corresponds to the area of the screen where no light impinges. The partial shadow 608 corresponds to the area of the screen where some light impinges, and across which light intensity transitions from full signal to no signal.

Figure 7:
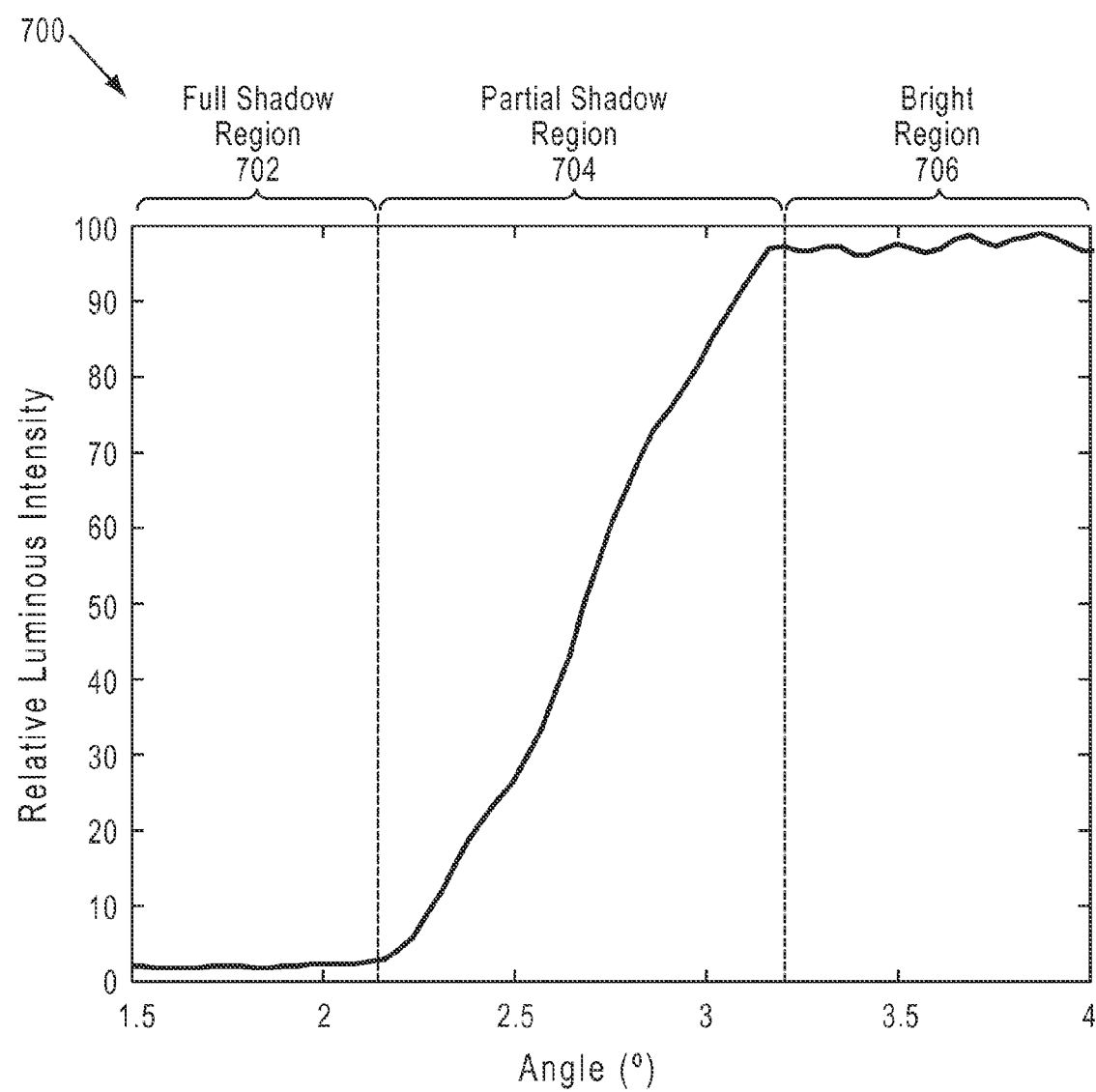
FIG. 7 depicts a graph showing relative luminous flux across a projected shadow vs. angle for a conventional LED-based MR-16 lamp for comparing to LED lamps with improved quality of light, according to some embodiments.

FIG. 7 depicts a graph showing relative luminous flux across a projected shadow vs. angle for a conventional LED-based MR-16 lamp for comparing to LED lamps with improved quality of light. The angular width of the partial shadow region is less than 0.8 degrees. FIG. 7 shows a cross-section of the cast shadow in such an experiment. The luminous intensity shows a bright region 706, a full shadow region 702, and a partial shadow region 704. The sharpness of the shadow can be quantified by the angular width of the partial shadow region, 1 degree in this case. Here the source is a conventional LED MR-16 lamp, but a wide variety of LED-based and halogen MR-16 lamps show very similar results.

Finally, lamps with multiple LED sources sometimes employ LEDs of different color points; for instance, one of the sources may have a slightly bluer SPD and another slightly more red SPD, the average reaching a desired SPD. In this case, the generated shadow is not only blurred, but also displays color variation which is not desirable. This can be evaluated by measuring the (u', v') color coordinates in different parts of the partial shadow.

In addition to the metrics discussed previously, various other metrics can be used to characterize quality of light. Many of these metrics can be classified in a broad category, such as fidelity or preference.

Fidelity metrics describe the ability of a light source to match the color rendering of a reference illuminant (such as a blackbody) and have already been discussed above.

Preference metrics, such as the GAI and Qg, measure the ability of a light source at increasing the saturation of colors; this is commonly measured by considering the gamut of various objects in a color space, and comparing this gamut under illumination by a reference illuminant and the light source. Preference can be important in applications such as retail, where consumers appreciate goods with saturated colors.

In general, a given desirable property of a light source can be obtained by suitably designing its emission spectrum. However, for practical energy-efficient applications, such an enhancement must be enabled by a technology which also allows sufficient efficiency such as high efficiency LEDs. Moreover, it is desirable to combine saturation enhancement with other features ensuring high quality of light. One such feature is a substantial presence of violet light in the spectrum. For example, earlier attempts suffered from a trade-off between efficiency, brightness and quality of light.

What is needed is an LED light source which can deliver sufficient flux for general illumination, and at the same time address some or all of the following issues: spectral matching to a reference SPD, good whiteness rendering, small LED source size, high color fidelity, increased gamut, and increased color contrast for specific objects or colors.

The herein-disclosed configurations are LED-based lamps providing a sufficient flux for general illumination and with improved light quality over a standard LED-based lamp.

An exemplary embodiment is as follows: an MR-16 lamp including an optical lens with a diameter of 30 mm, and an LED-based source formed of violet-emitting LEDs pumping three phosphors (e.g., a blue-, a green- and a red-emitting phosphor) such that 2% to 10% of the emitted power is in the range 390 nm to 430 nm. The lamp emits a luminous flux of at least 500 lm. This high luminous flux is achieved due to the high efficacy of the aforementioned LEDs at high power density, which are able to emit more than 200 W/cm$^2$ at a current density of 200 A/cm$^2$ and at a junction temperature of 100° C. and higher.

Figure 8:
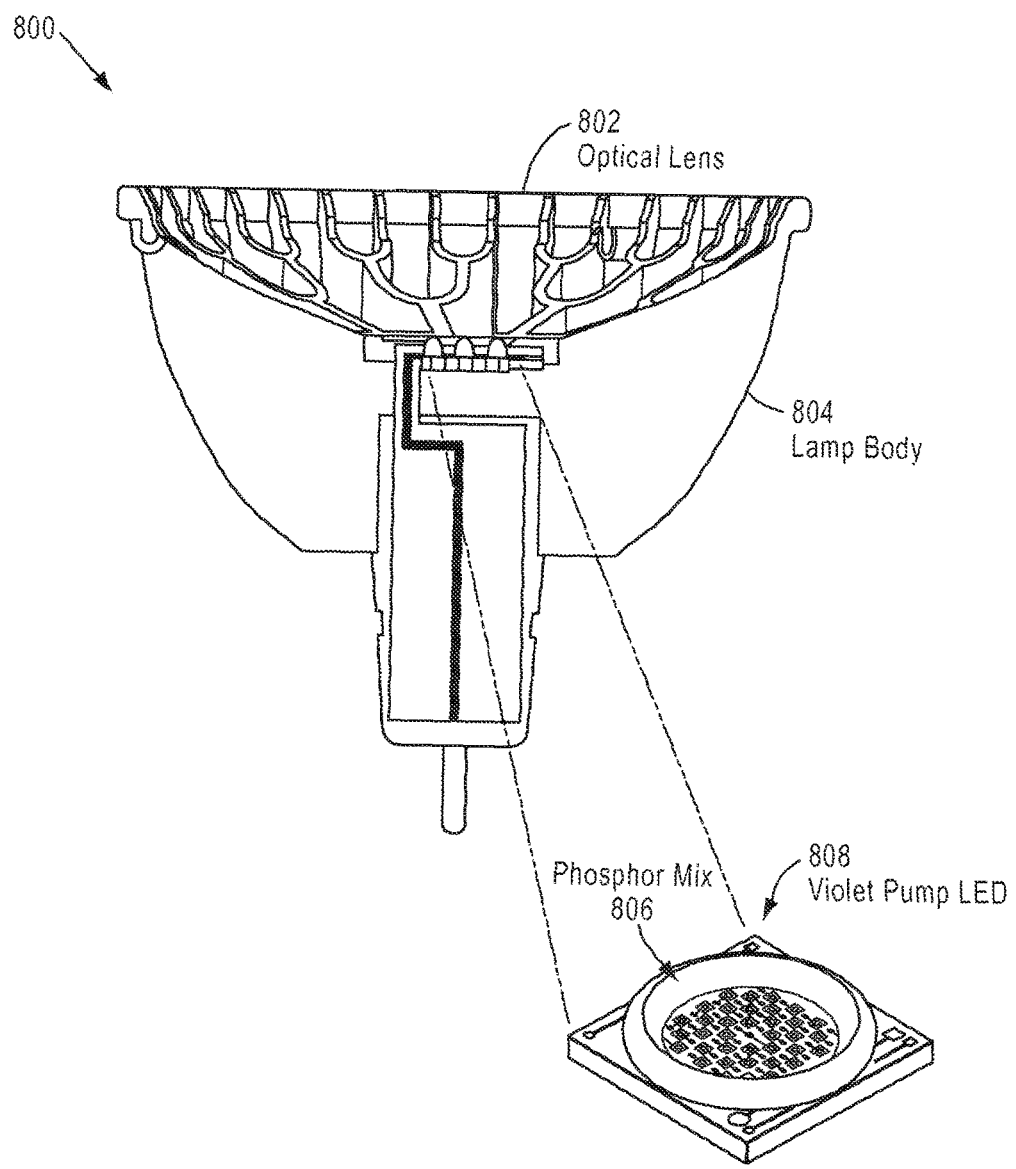
FIG. 8 is a sketch of an MR-16 lamp body embodiment as used in LED lamps with improved quality of light, according to some embodiments.

FIG. 8 is a sketch 800 of an MR-16 lamp body embodiment as used in LED lamps with improved quality of light. FIG. 8 shows an MR-16 lamp body 804, an optical lens 802, and an LED source that includes violet pump LEDs 808, and a phosphor mix 806 as used in LED lamps with improved quality of light.

Depending on the details of the configuration, various embodiments may address one or several of the issues described above.

In order to reduce the SPD discrepancy in the blue-violet range, one needs to modify the LED lamp's spectral power distribution. The disclosed configurations achieve this by including violet pump LEDs. In an exemplary embodiment, these violet pump LEDs pump one blue phosphor. In some embodiments, the full-width at half maximum (FWHM) of the blue phosphor is more than 30 nm. In contrast to typical blue-pump LEDs (whose spectral FWHM is ~20 nm), use of such a broad phosphor helps match the target SPD of a blackbody.

Figure 9A:
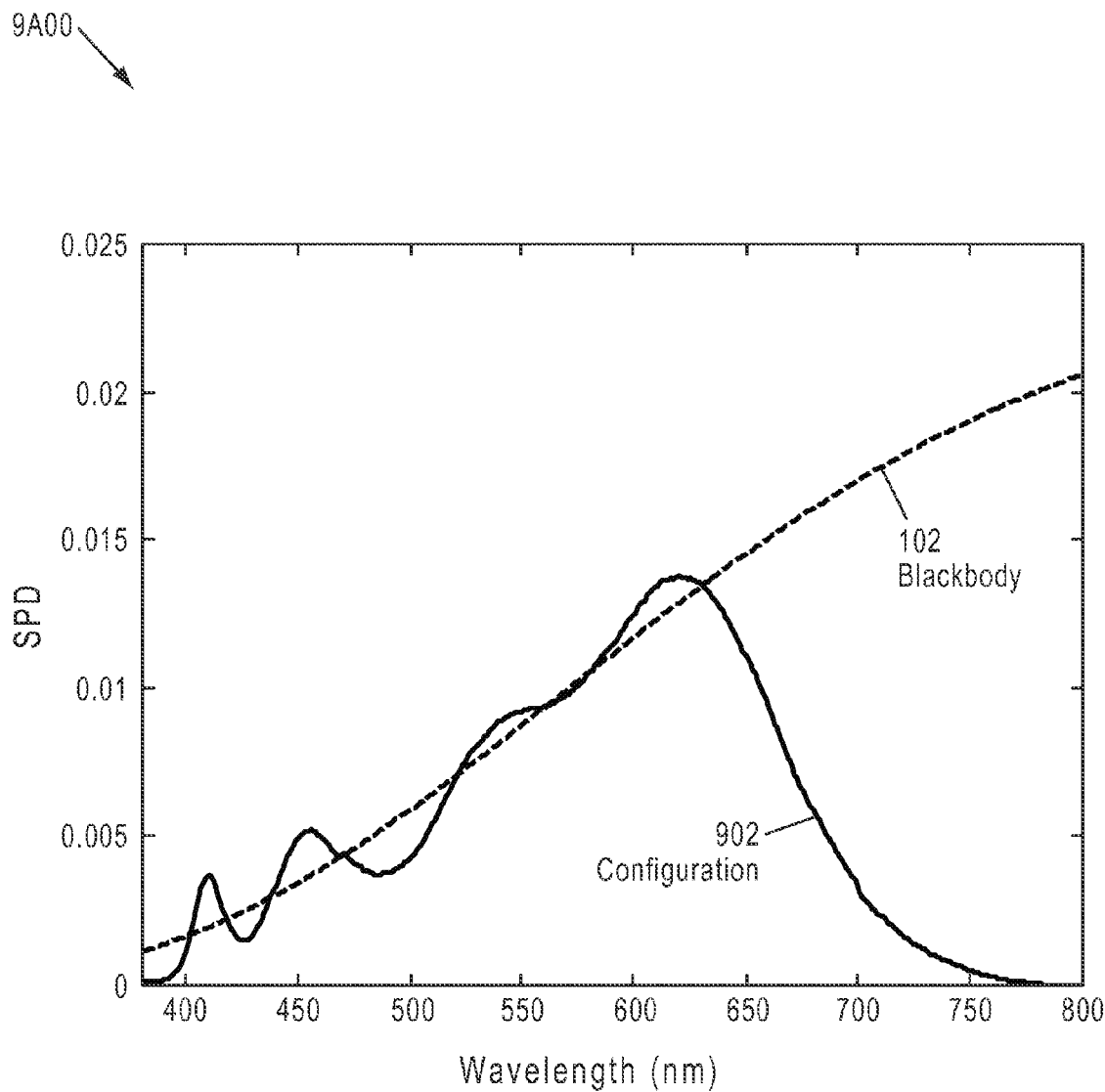
FIG. 9A is a chart showing a comparison of modeled SPDs of a blackbody and an LED lamp with improved quality of light, according to some embodiments.

FIG. 9A is a chart 9A00 showing a comparison of modeled SPDs of a blackbody and an LED lamp with improved quality of light (see configuration 902). FIG. 9A compares the SPD of an embodiment to that of a blackbody 102, both having a 3000K CCT and the same luminous flux. Compared to FIG. 1, the discrepancy is significantly reduced in the short-wavelength range.

Figure 9B:
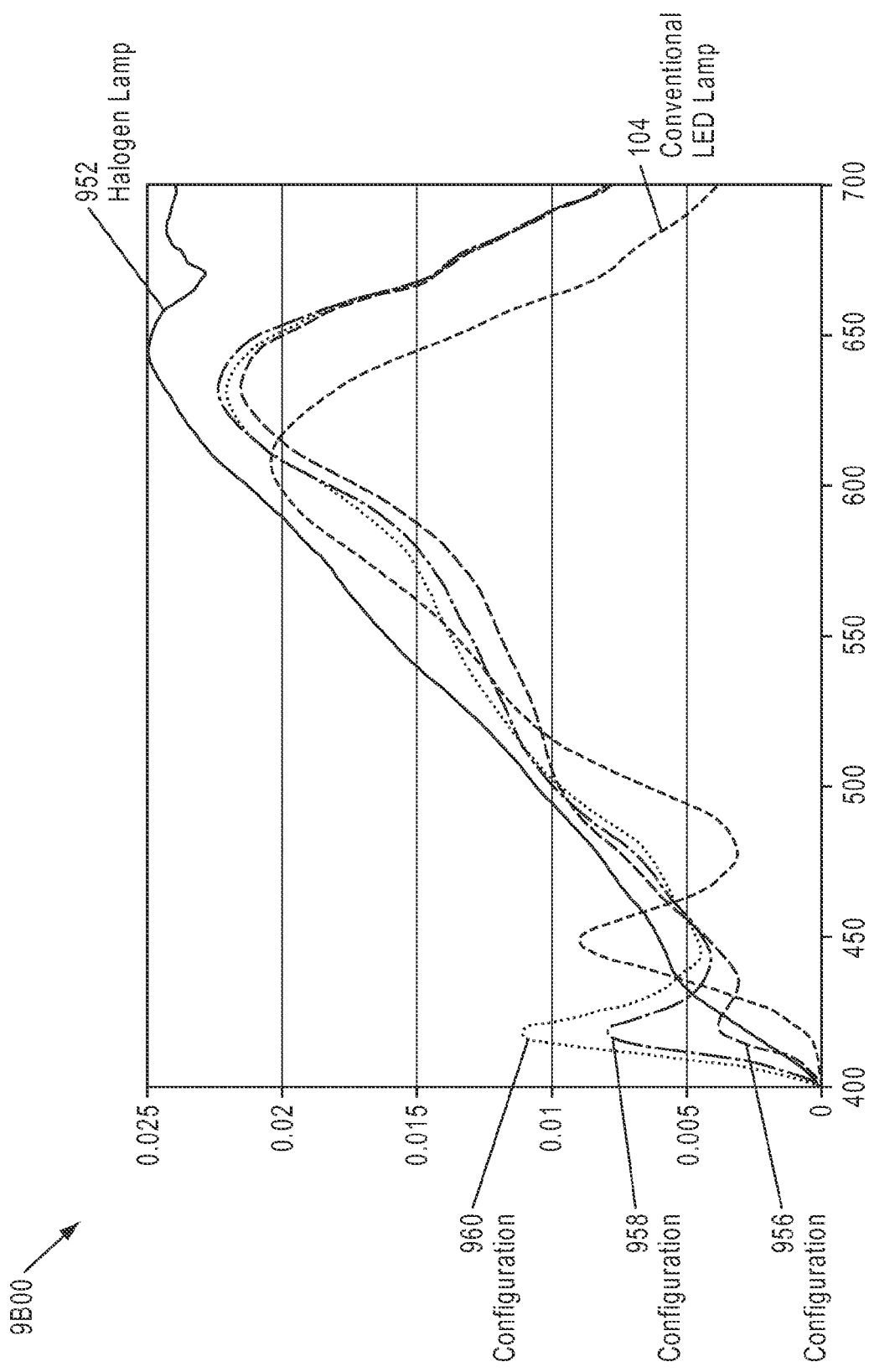
FIG. 9B is a chart showing a comparison of SPDs of various illuminants with a CCT of 3000K for comparing against lamps with improved quality of light, according to some embodiments.

FIG. 9B is a chart 9B00 showing a comparison of SPDs of various illuminants with a CCT of 3000K for comparing against lamps with improved quality of light. FIG. 9B compares experimental SPDs of illuminants with a CCT of 3000K. The illuminants are a halogen lamp 952, a conventional LED lamp 104, and three embodiments shown as configuration 956, configuration 958, and configuration 960, where the violet leak is varied (with respective values of about 2%, 5% and 7%).

Embodiments with various violet leaks can be considered and optimized for a high CRI. For instance, the experiments have verified that an embodiment with about a 7% violet leak may have a CRI of about 95, an R9 of about 95, and a large-sample set CRI of about 87. Other embodiments may lead to further improvements in these values.

Figure 10:
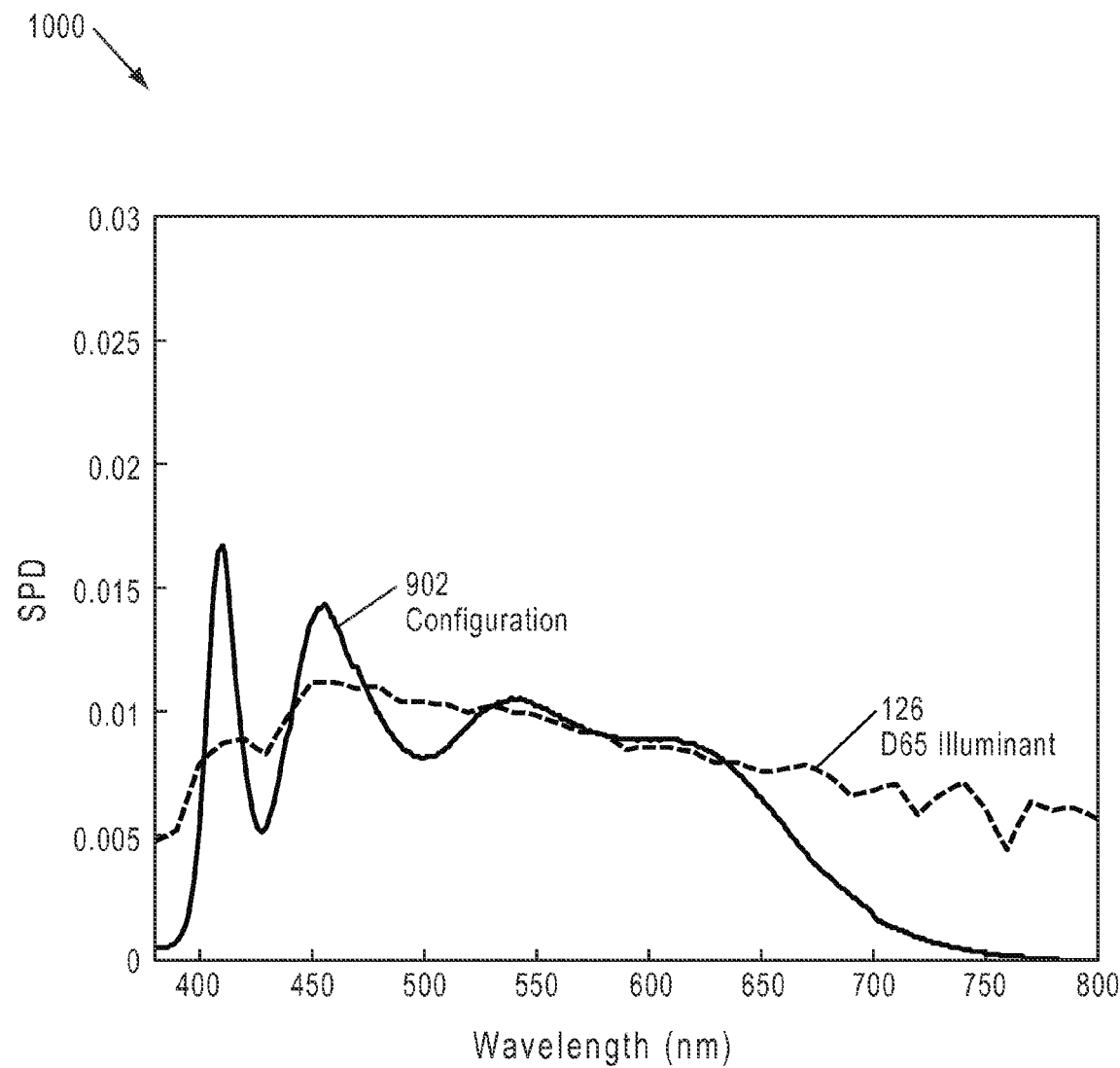
FIG. 10 is a chart showing a comparison of SPDs of a reference illuminant and an LED lamp with improved quality of light, according to some embodiments.

FIG. 10 is a chart 1000 showing a comparison of SPDs of a reference illuminant and an LED lamp with improved quality of light. FIG. 10 is similar to FIG. 9A, but here the reference illuminant D65 126 is for a 6500K CCT. The SPD dependence with respect to wavelength is also shown for configuration 902.

Figure 11:
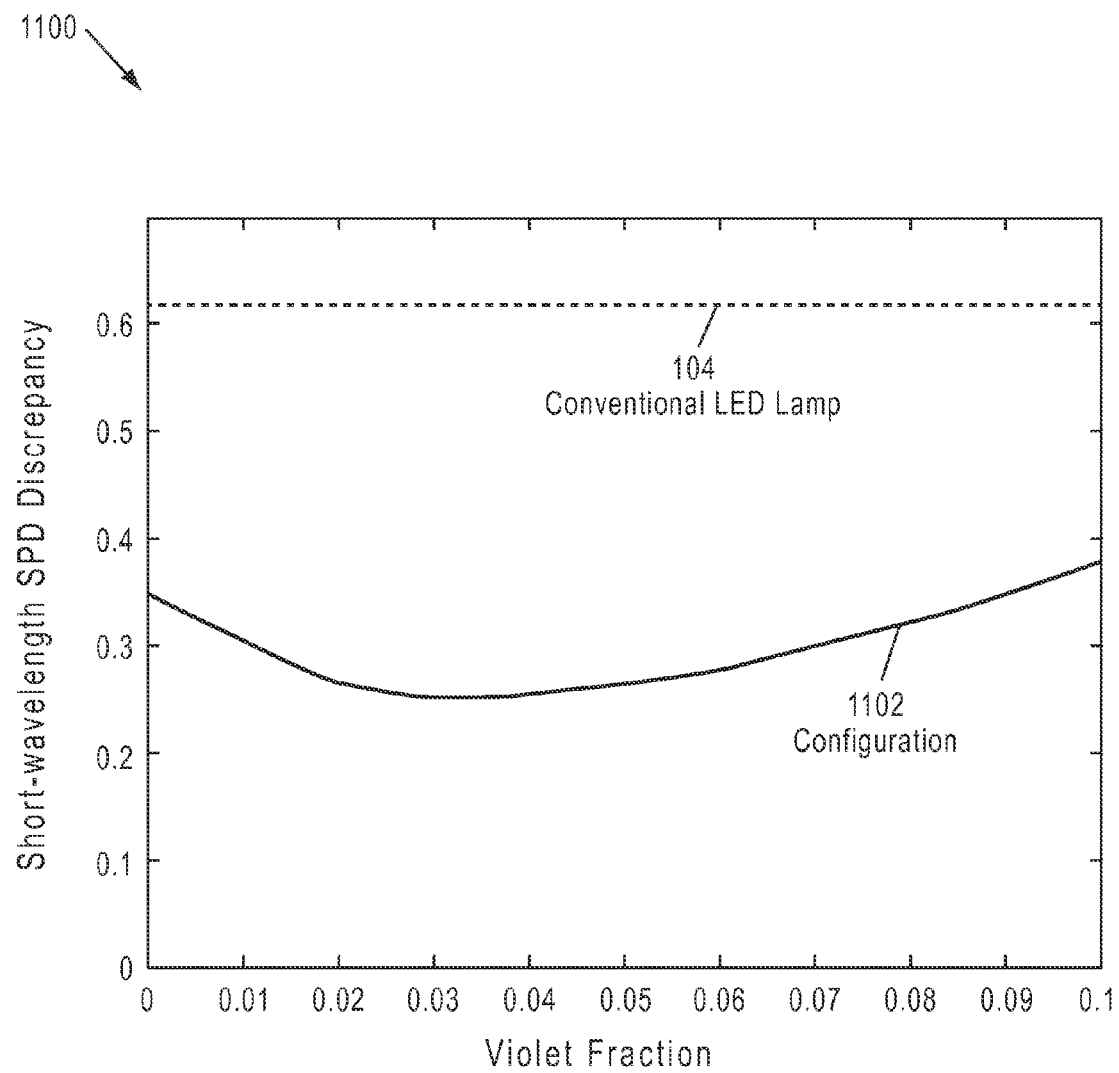
FIG. 11 is a chart showing the short-wavelength SPD discrepancy (SWSD) between a blackbody radiator and certain embodiments, both with a CCT of 3000K as a function of the SPD violet fraction for comparing LED lamps with improved quality of light, according to some embodiments.

FIG. 11 is a chart 1100 showing the short-wavelength SPD discrepancy (SWSD) between a blackbody radiator and configuration 1102 certain embodiments, both with a CCT of 3000K as a function of the SPD violet fraction for comparing LED lamps with improved quality of light. The dashed line represents the value for a conventional LED-based source 104.

FIG. 11 shows the SWSD of embodiments with a 3000K CCT as a function of the fraction of violet photons in the SPD. The SWSD is lower than for a conventional LED lamp 104 by a factor of two or more, depending on the violet fraction. Thus the violet fraction may be optimized to minimize SWSD, although other metrics may also be considered when choosing the violet fraction.

Figure 12:
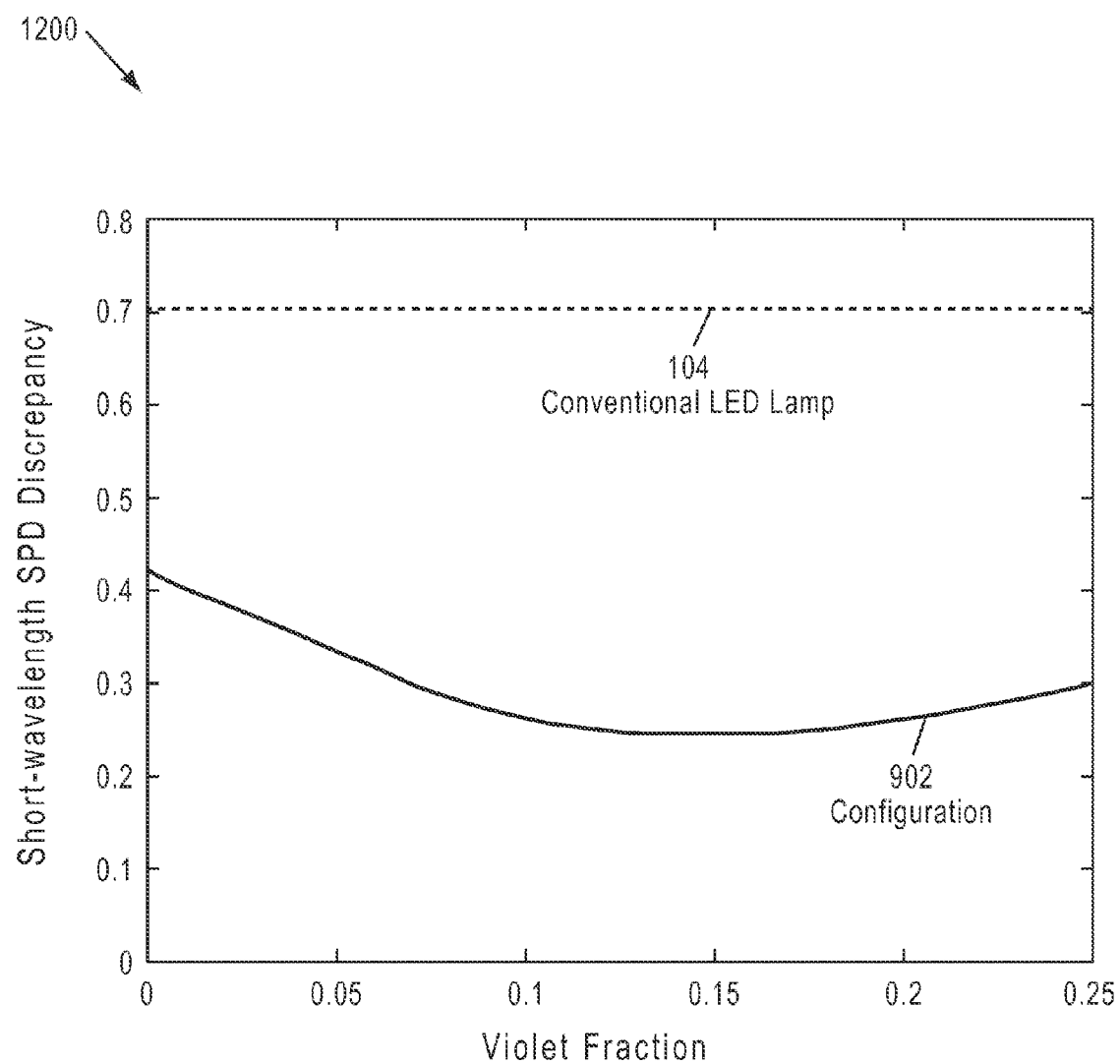
FIG. 12 is a chart showing the SWSD between a D65 illuminant and embodiments of the present disclosure, both with a CCT of 6500K, as a function of the SPD violet fraction for comparing LED lamps with improved quality of light, according to some embodiments.

FIG. 12 is a chart 1200 showing the short-wavelength SPD discrepancy (SWSD) between a D65 illuminant and embodiments of the present disclosure, configuration 902, both with a CCT of 6500K, as a function of the SPD violet fraction for comparing LED lamps with improved quality of light. The dashed line represents the value for a conventional LED-based source 104. The violet fraction may be optimized to minimize SWSD, although other metrics may also be considered when choosing the violet fraction.

Figure 13A:
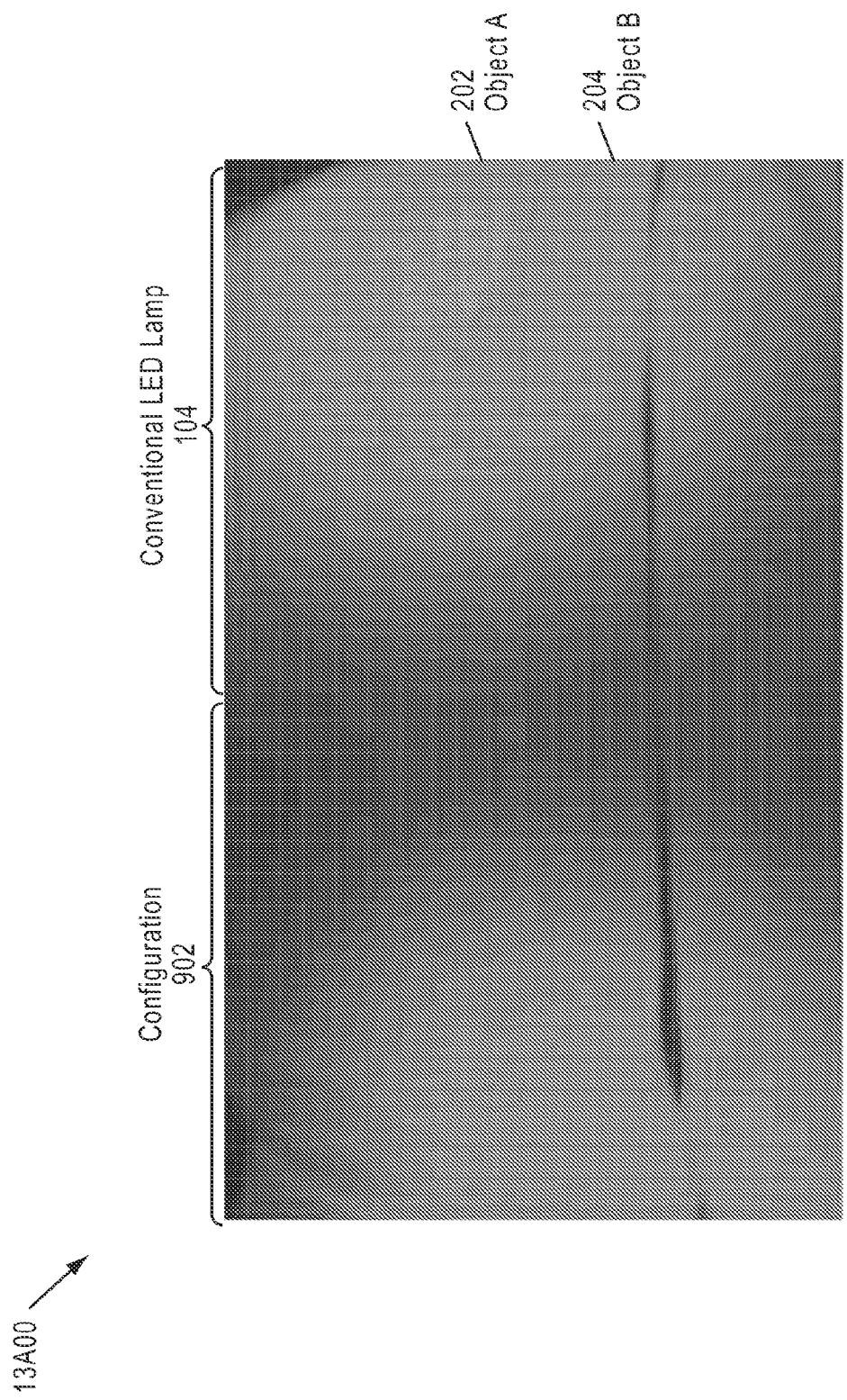
FIG. 13A is a picture showing two reddish objects under illumination by a conventional LED source and by a particular configuration, both with a 2700K CCT.

FIG. 13A is a picture 13A00 showing two reddish objects under illumination by a conventional LED source 104 and by a particular configuration 902, both with a 2700K CCT. The objects (object A 202 and object B 204) are the same as depicted in FIG. 2A. Again, metamerism is apparent with the conventional LED source and the objects having different colors. With particular configuration of the embodiments as disclosed herein, the color is nearly identical for both objects as it is under daylight illumination. FIG. 13A exemplifies how some embodiments of the disclosure can reduce metamerism and improve color rendering.

Figure 13B:
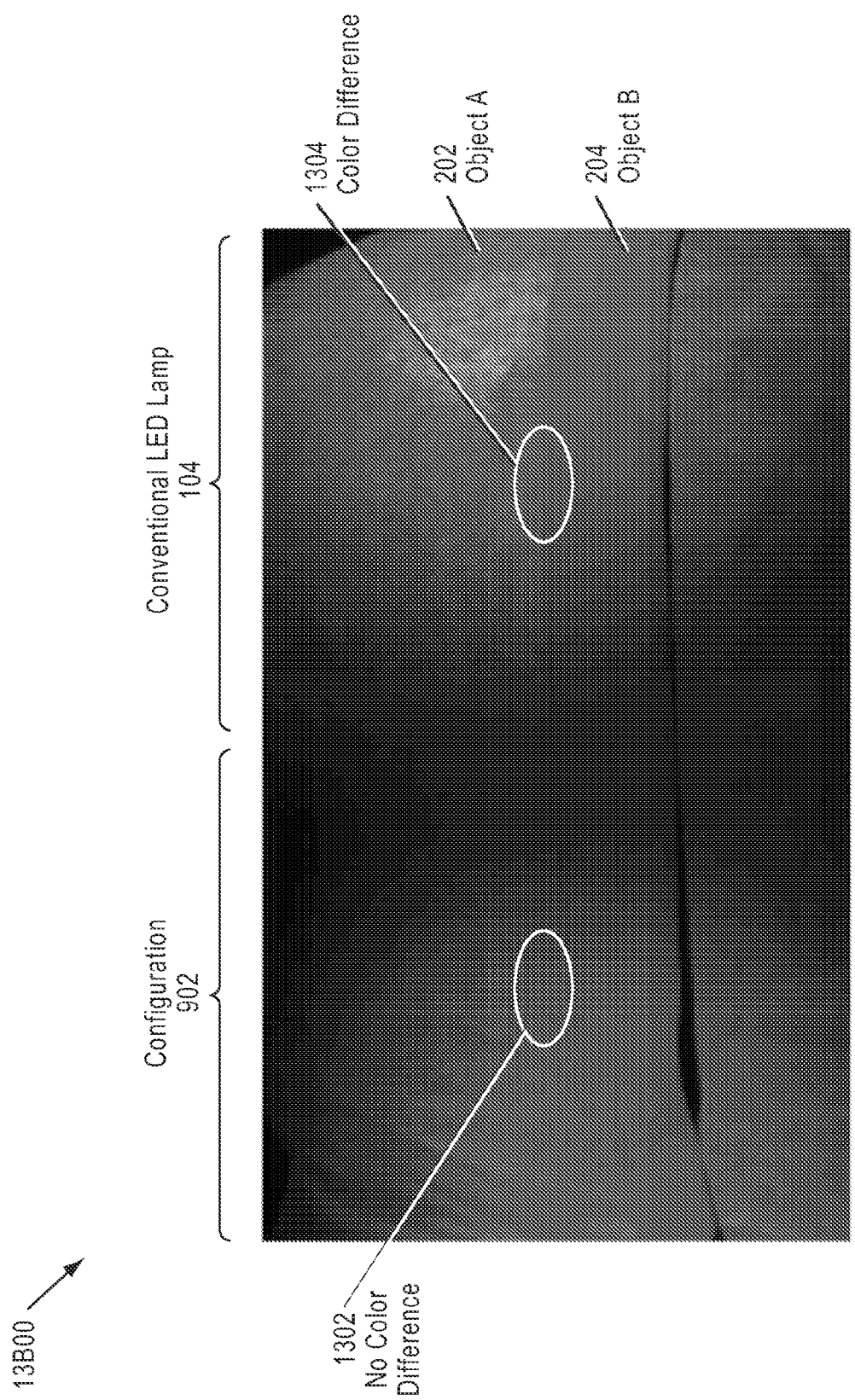
FIG. 13B is a sketch of FIG. 13A showing two reddish objects under illumination by a conventional LED source, and by a particular configuration, both with a 2700K CCT.

FIG. 13B is a sketch 13B00 of FIG. 13A showing the two reddish objects under illumination by a conventional LED source 104, and by a particular configuration 902, both with a 2700K CCT. Note the indication of color difference 1304 vs. no color difference 1302. Again, metamerism is apparent with the conventional LED source—the objects (object A 202 and object B 204) appear to have different colors. On the other hand, when illuminated with lamps following embodiments as disclosed herein, the color is nearly identical for both objects (which is similar to appearance under daylight illumination). FIG. 13B exemplifies how some embodiments of the disclosure can reduce metamerism and improve color rendering.

In some embodiments, more than one phosphor in the blue-cyan range is pumped by the violet LED. In some embodiments, part of the blue emission comes from LEDs.

In order to improve the whiteness of objects containing OBAs, the LED-based source should emit a sufficient amount of light in the excitation range of the OBAs. The noted configurations achieve this by including violet pump LEDs. In an exemplary embodiment, 2% to 15% of the power of the resulting SPD is emitted in the range of 390 nm to 430 nm. In an exemplary embodiment, the violet LEDs pump one or several phosphors emitting in the blue-cyan range.

Figure 14:
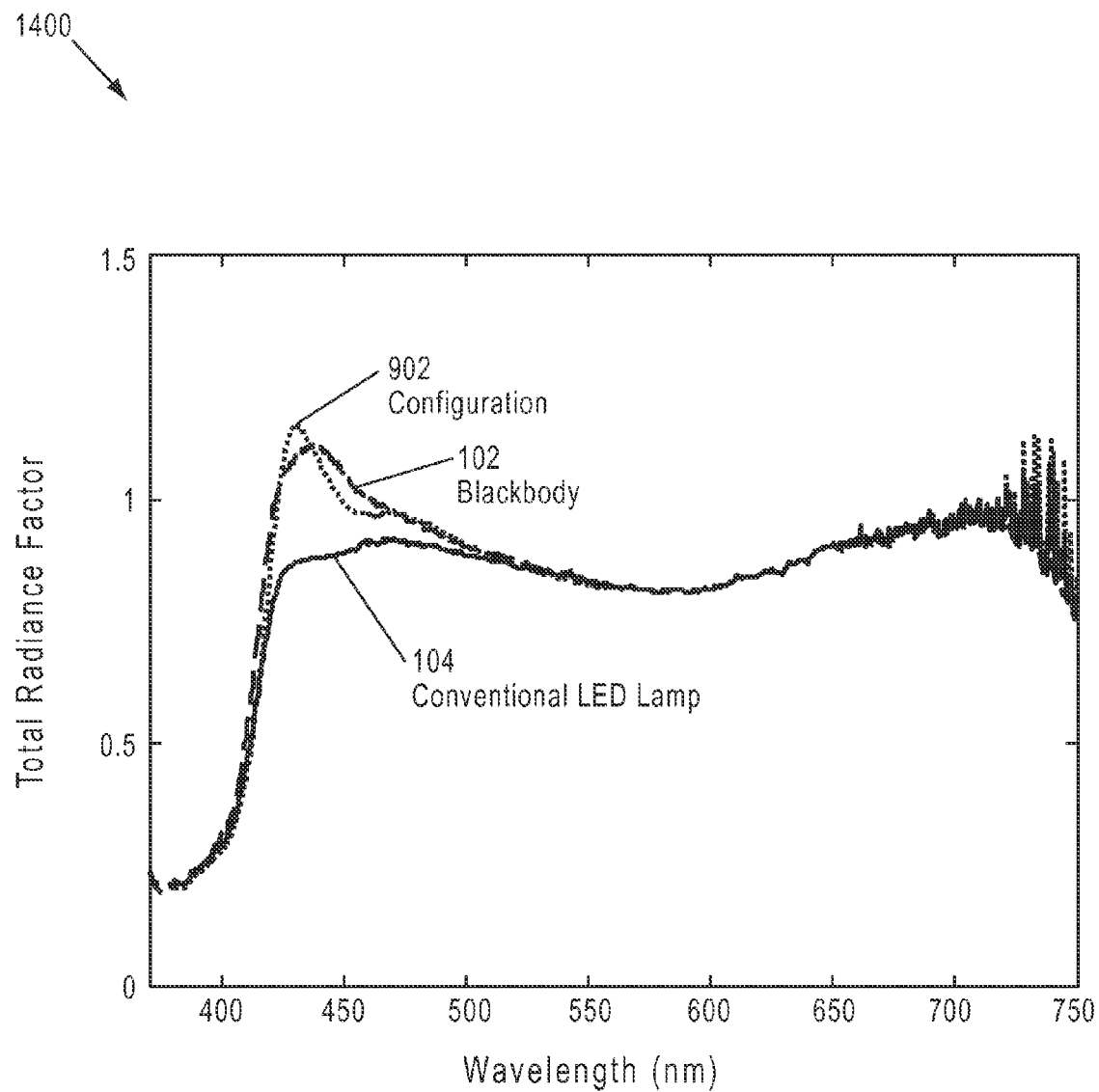
FIG. 14 is a chart showing the total radiance factor of a sample of white paper with optical brightening agents (OBAs) for an incandescent source and a selected embodiment, both with a 3000K CCT for comparing LED lamps with improved quality of light, according to some embodiments.

FIG. 14 is a chart 1400 showing the total radiance factor of a sample of white paper with optical brightening agents (OBAs) for an incandescent source and a selected embodiment, both with a 3000K CCT for comparing LED lamps with improved quality of light.

FIG. 14 compares the experimental total radiance factors of a sheet of commercial white paper illuminated by a blackbody 102 radiator (in practice, a halogen lamp), a conventional LED lamp 104, and an embodiment of the disclosure (configuration 902), all with the same CCT of 3000K. Unlike the conventional LED, the total radiance factor of the embodiment of the disclosure is similar to that of a blackbody source, due in part to the excitation of OBA fluorescence.

Figure 15:
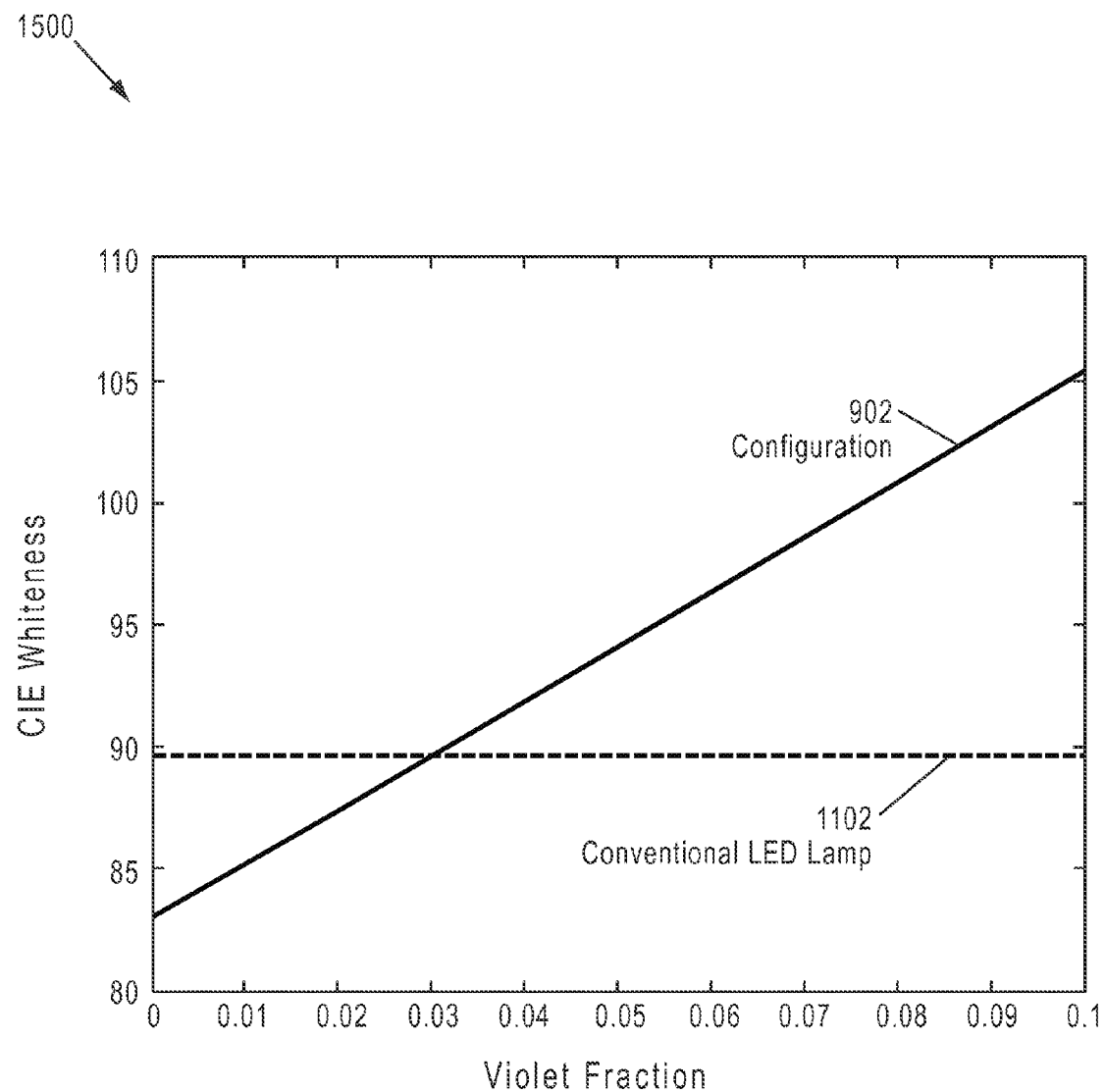
FIG. 15 is a chart showing the CIE whiteness of calculated sources with a 6500K CCT for comparisons of LED lamps with improved quality of light, according to some embodiments.

FIG. 15 is a chart 1500 showing the CIE whiteness of calculated sources with a 6500K CCT for comparisons of LED lamps with improved quality of light.

FIG. 15 displays the modeled CIE whiteness of a paper sheet as illuminated by various embodiments of the disclosure (configuration 902), where the amount of violet light in the SPD is varied. The improvement of whiteness can be significant. In this case, the CCT of the lamp is 6500K, in accordance with the definition of the CIE whiteness equation. The dashed line shows the CIE whiteness for a conventional LED source 1102.

In addition to tuning CIE whiteness by changing the amount of violet leak, it is also possible to affect CIE whiteness by changing the peak wavelength of the violet peak in some embodiments of the disclosure. For instance, in some embodiments the violet peak may have a maximum at 410 nm, 415 nm, or 420 nm. In general, OBAs have a soft absorption edge around 420 nm to 430 nm, so an embodiment with a violet peak beyond 420 nm may yield a lower optical excitation of OBAs.

Figure 16A:
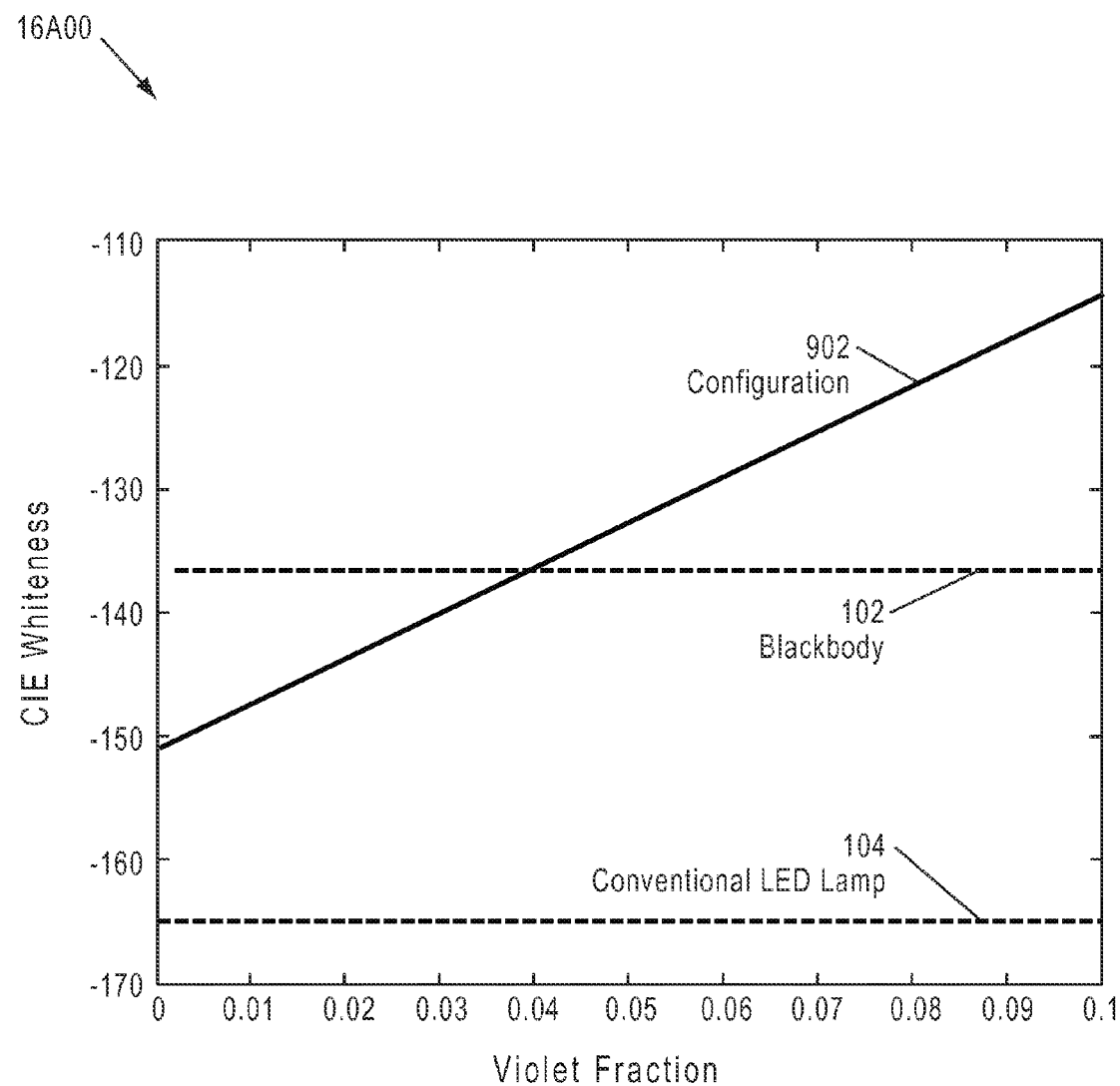
FIG. 16A is a chart showing the CIE whiteness of calculated sources with a 3000K CCT for comparisons of LED lamps with improved quality of light, according to some embodiments.

FIG. 16A is a chart 16A00 showing the CIE whiteness of calculated sources with a 3000K CCT for comparisons of LED lamps with improved quality of light.

FIG. 16A shows a chart 16A00 similar to the chart of FIG. 15, in the case where the CCT of the conventional LED lamp 104 is 3000K. In this case, CIE whiteness is in principle not well-defined because using the equation yields negative values. However, one can still use CIE whiteness as a relative metric to quantify improvements in whiteness. As before, the whiteness is significantly improved by addition of a violet peak in the SPD. The dashed lines show the CIE whiteness for a blackbody 102 and for a conventional LED lamp 104, respectively.

Figure 16B:
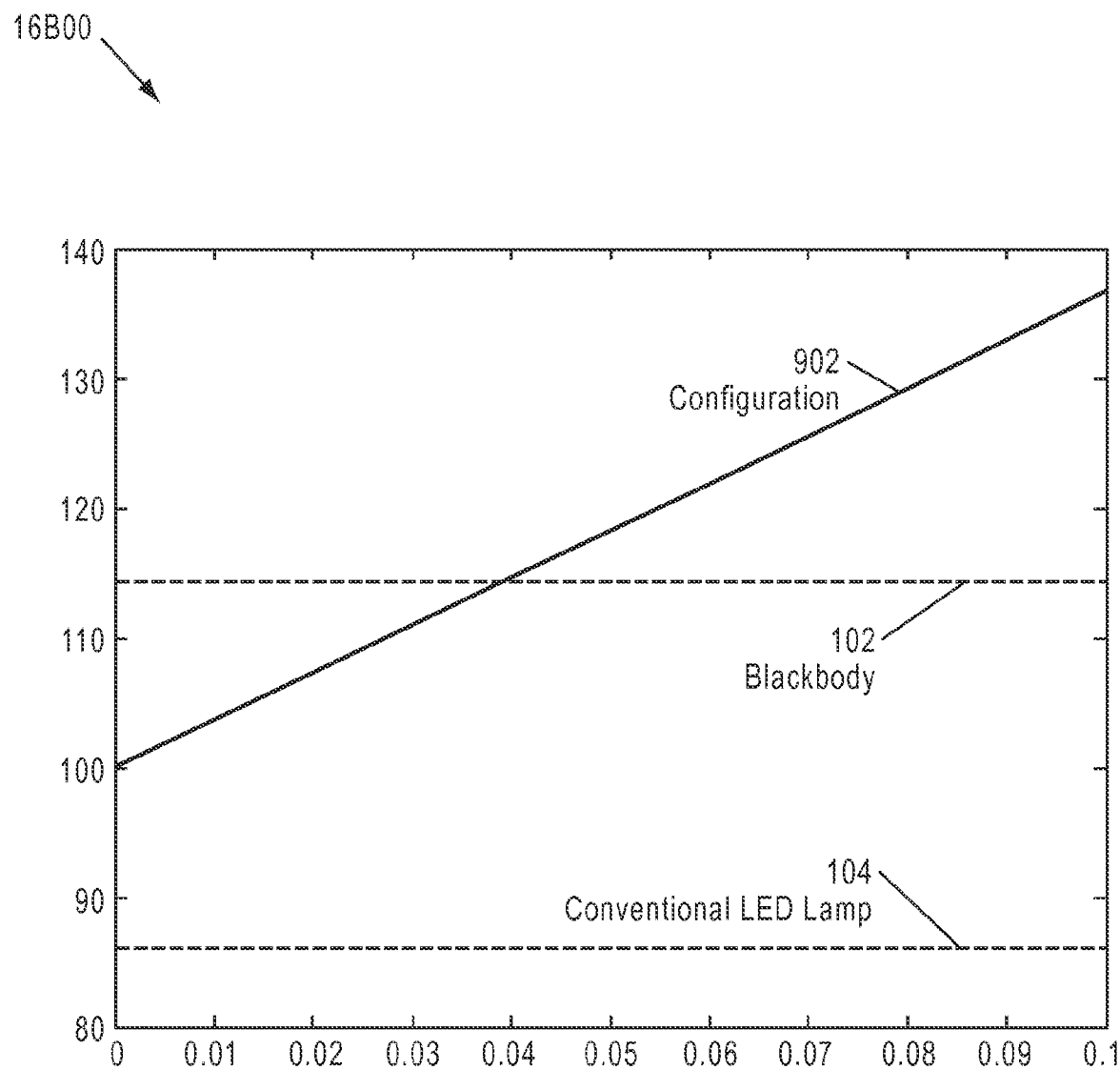
FIG. 16B is a chart showing the CCT-corrected whiteness of sources with a 3000K CCT for comparisons of LED lamps with improved quality of light, according to some embodiments.

FIG. 16B is a chart 16B00 showing the CCT-corrected whiteness of sources with a 3000K CCT for comparisons of LED lamps with improved quality of light. The CCT-corrected whiteness is shown for an embodiment of the present disclosure (configuration 902), a blackbody source 102, and for a conventional LED lamp 104.

FIG. 16B shows CCT-corrected whiteness rather than the CIE whiteness. Because the CCT of the illuminant is taken into account in the CCT-corrected whiteness formula, the values are positive. As in FIG. 16A, whiteness is significantly improved when the violet leak is increased.

Figure 21:
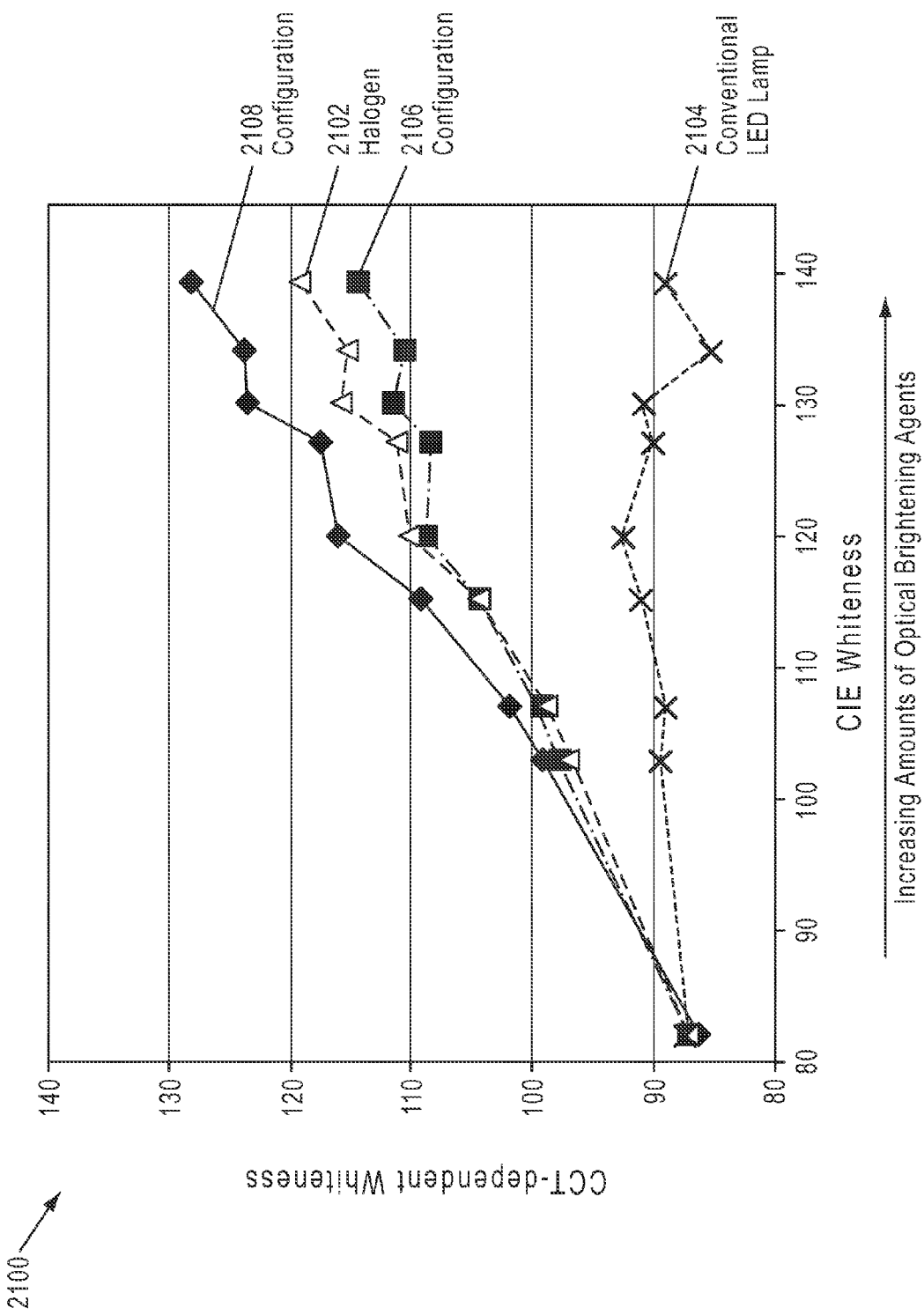
FIG. 21 is a chart showing the experimentally-measured CCT-corrected whiteness of various objects illuminated by various illuminants for comparison to of LED lamps with improved quality of light, according to some embodiments.
Figure 22:
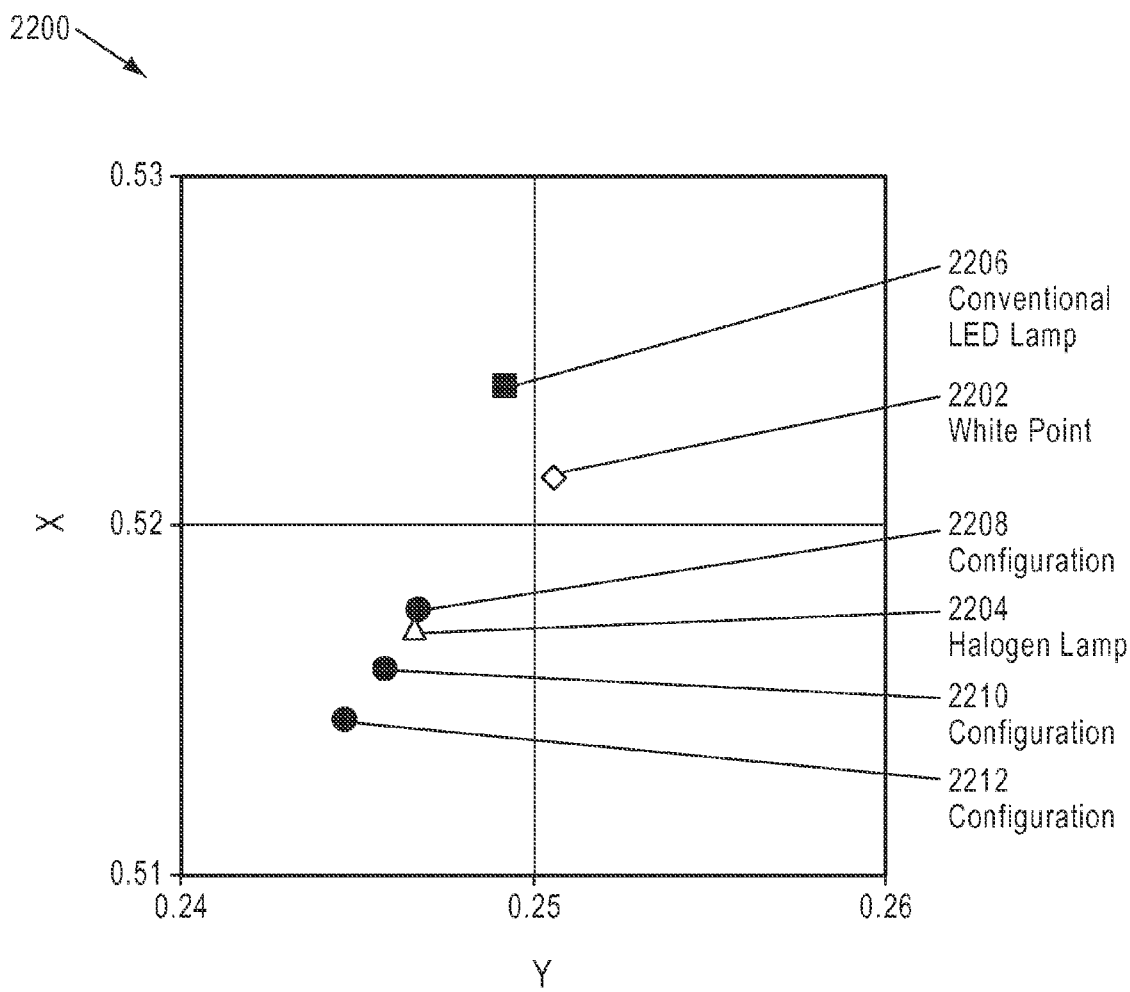
FIG. 22 is a chart showing the (x,y) color space coordinates of a high whiteness reference standard illuminated by various sources with a 3000K CCT for comparison to LED lamps with improved quality of light, according to some embodiments.

Empirical results for CCT-corrected whiteness of various objects illuminated by various illuminants and coordinates of a high whiteness reference standard illuminated by various sources are given in FIG. 21 and FIG. 22, respectively.

One skilled in the art will recognize that optical excitation of OBAs can be used to induce enhanced whiteness. In addition, it should be recognized that this effect should not be over used because a very large excitation of OBAs is perceived as giving a blue tint to an object, thus reducing perceived whiteness. For instance, numerous commercial objects have a CIE whiteness or a CCT-dependent whiteness of about 110 to 140 under excitation by a halogen or a ceramic metal halide CMH source. Exceeding this design value by a large amount, for instance more than 40 points, is likely to result in an unwanted blue tint.

Figure 17:
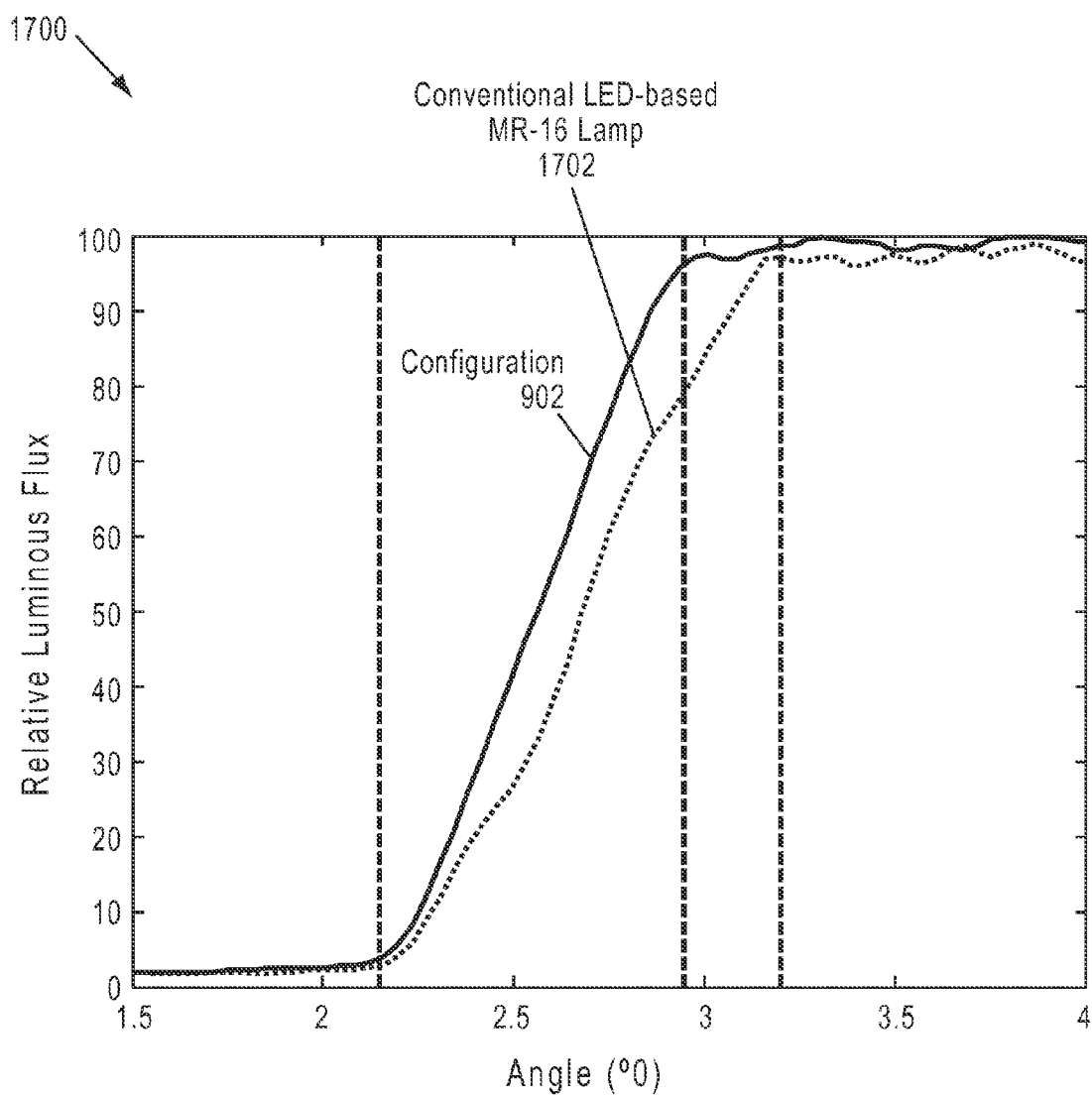
FIG. 17 is a chart showing the relative luminous flux across a projected shadow vs. angle for a conventional LED-based MR-16 lamp and an embodiment of the present disclosure for comparisons of LED lamps with improved quality of light, according to some embodiments.

FIG. 17 is a chart 1700 showing the relative luminous flux across a projected shadow vs. angle for a conventional LED-based MR-16 lamp 1702 and an embodiment of the present disclosure (configuration 902) for comparisons of LED lamps with improved quality of light. The vertical dashed lines mark the beginning and end of the partial shadow regions.

In order to produce sharp object shadows, the source needs to have a limited spatial extension. Furthermore, it should produce a sufficient luminous flux for general lighting. Such a configuration is achieved by employing an LED source which has a small footprint and a high luminous flux, together with a small-footprint optical lens.

In exemplary embodiments, the light-emitting-surface area of the LED source is less than 13 $mm^2$, or less than 29 $mm^2$. In exemplary embodiments, the light emitted by the LED source is redirected or collimated by a lens whose lateral extension is smaller than 51 mm.

FIG. 18A is a picture 18A00 of multiple shadows cast by a hand under illumination by a conventional LED lamp with multiple light sources, for comparison with an LED source with improved quality of light.

FIG. 18A shows how a multiple-source LED can be detrimental to shadow rendering. Each source casts a shadow, resulting in multiple and blurry shadows 1802. The separation between the fingers is barely visible in the shadow.

FIG. 18B is a picture 18B00 showing the shadow cast by a hand under illumination by an embodiment of the disclosure. In FIG. 18B, the shadow is well-defined (single shadow 1804). The fingers are clearly separated. This illustrates how a single source with a reduced lateral extent can improve shadow rendering.

FIG. 19A1 and FIG. 19A2 depict an MR-16 form factor lamp (see 19A100) with an integrated light source (see 19A100 and 19A200) as used in LED lamps with improved quality of light.

In addition to the aforementioned MR-16 lamp, there are many configurations of LED lamps and of connectors. For example, Table 3 gives standards (see "Designation") and corresponding characteristics.

TABLE 3

| Designation | Base Diameter (crest of thread) | Name | IEC 60061-1 Standard Sheet |
| --- | --- | --- | --- |
| E05 | 05 mm | Lilliput Edison Screw (LES) | 7004-25 |
| E10 | 10 mm | Miniature Edison Screw (MES) | 7004-22 |
| E11 | 11 mm | Mini-Candelabra Edison Screw (mini-can) | (7004-06-1) |
| E12 | 12 mm | Candelabra Edison Screw (CES) | 7004-28 |

TABLE 3-continued

| Designation | Base Diameter (crest of thread) | Name | IEC 60061-1 Standard Sheet |
| --- | --- | --- | --- |
| E14 | 14 mm | Small Edison Screw (SES) | 7004-23 |
| E17 | 17 mm | Intermediate Edison Screw (IES) | 7004-26 |
| E26 | 26 mm | [Medium] (one-inch) Edison Screw (ES or MES) | 7004-21A-2 |
| E27 | 27 mm | [Medium] Edison Screw (ES) | 7004-21 |
| E29 | 29 mm | [Medium] Edison Screw (ES) | |
| E39 | 39 mm | Single-contact (Mogul) Giant Edison Screw (GES) | 7004-24-A1 |
| E40 | 40 mm | (Mogul) Giant Edison Screw (GES) | 7004-24 |

Additionally, a base member (e.g., shell, casing, etc.) can be of any form factor configured to support electrical connections, which electrical connections can conform to any of a set of types or standards. For example Table 4 gives standards (see "Type") and corresponding characteristics, including mechanical spacings between a first pin (e.g., a power pin) and a second pin (e.g., a ground pin).

TABLE 4

| Type | Standard | Pin (center to center) | Pin Diameter | Usage |
| --- | --- | --- | --- | --- |
| G4 | IEC 60061-1 (7004-72) | 4.0 mm | 0.65-0.75 mm | MR11 and other small halogens of 5/10/20 watt and 6/12 volt |
| GU4 | IEC 60061-1 (7004-108) | 4.0 mm | 0.95-1.05 mm | |
| GY4 | IEC 60061-1 (7004-72A) | 4.0 mm | 0.65-0.75 mm | |
| GZ4 | IEC 60061-1 (7004-64) | 4.0 mm | 0.95-1.05 mm | |
| G5 | IEC 60061-1 (7004-52-5) | 5 mm | | T4 and T5 fluorescent tubes |
| G5.3 | IEC 60061-1 (7004-73) | 5.33 mm | 1.47-1.65 mm | |
| G5.3-4.8 | IEC 60061-1 (7004-126-1) | 5.33 mm | 1.45-1.6 mm | |
| GU5.3 | IEC 60061-1 (7004-109) | | | |
| GX5.3 | IEC 60061-1 (7004-73A) | 5.33 mm | 1.45-1.6 mm | MR-16 and other small halogens of 20/35/50 watt and 12/24 volt |
| GY5.3 | IEC 60061-1 (7004-73B) | | 5.33 mm | |
| G6.35 | IEC 60061-1 (7004-59) | 6.35 mm | 0.95-1.05 mm | |
| GX6.35 | IEC 60061-1 (7004-59) | 6.35 mm | 0.95-1.05 mm | |
| GY6.35 | IEC 60061-1 (7004-59) | 6.35 mm | 1.2-1.3 mm | Halogen 100 W 120 V |
| GZ6.35 | IEC 60061-1 (7004-59A) | 6.35 mm | 0.95-1.05 mm | |
| G8 | | 8.0 mm | | Halogen 100 W 120 V |
| GY8.6 | | 8.6 mm | | Halogen 100 W 120 V |
| G9 | IEC 60061-1 (7004-129) | 9.0 mm | | Halogen 120 V (US)/ 230 V (EU) |
| G9.5 | | 9.5 mm | 3.10-3.25 mm | Common for theatre use, several variants |
| GU10 | | 10 mm | | Twist-lock 120/230-volt MR-16 halogen lighting of 35/50 watt, since mid-2000s |
| G12 | | 12.0 mm | 2.35 mm | Used in theatre and single-end metal halide lamps |
| G13 | | 12.7 mm | | T8 and T12 fluorescent tubes |
| G23 | | 23 mm | 2 mm | |
| GU24 | | 24 mm | | Twist-lock for self-ballasted compact fluorescents, since 2000s |
| G38 | | 38 mm | | Mostly used for high-wattage theatre lamps |
| GX53 | | 53 mm | | Twist-lock for puck-shaped under-cabinet compact fluorescents, since 2000s |

Figure 19B:
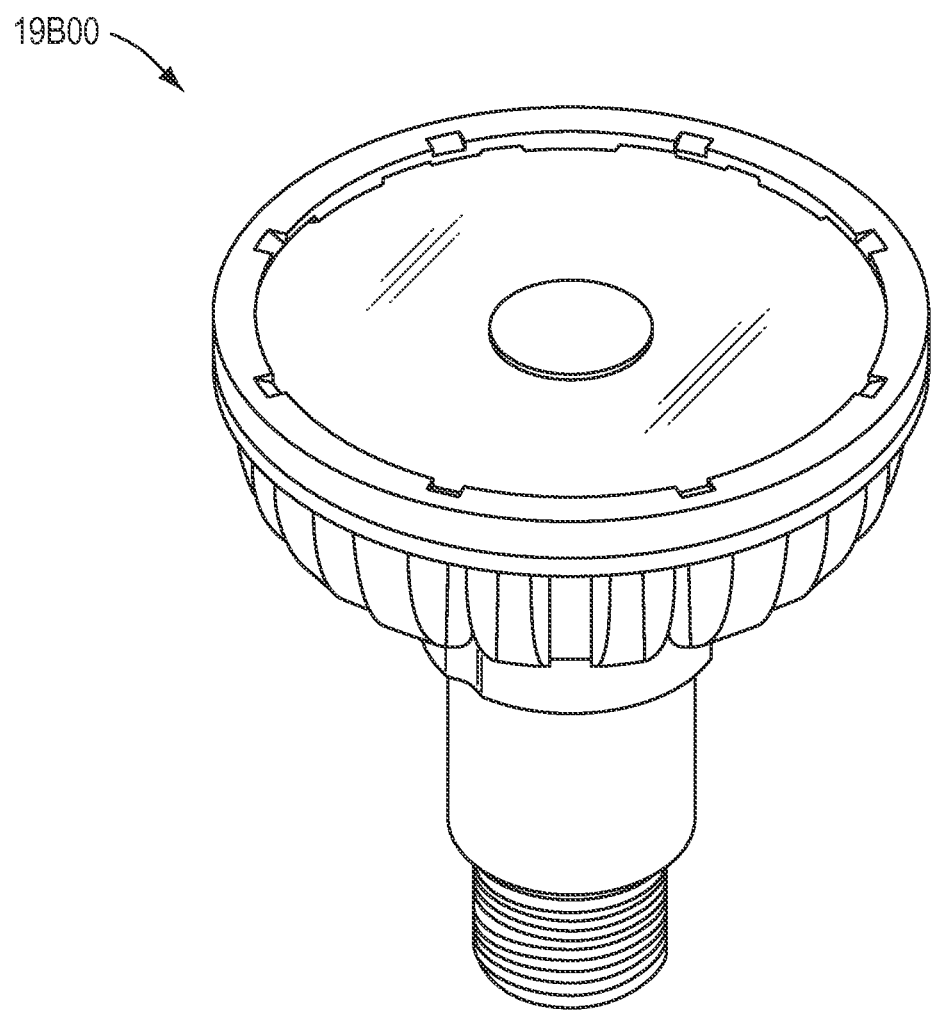
FIG. 19B depicts a PAR30 form factor lamp used in LED lamps with improved quality of light, according to some embodiments.

FIG. 19B depicts a PAR30 form factor lamp 19B00 used in LED lamps with improved quality of light.

FIG. 19C1 and FIG. 19C2 depict AR111 form factors 19C00 used in LED lamps with improved quality of light.

FIG. 19D1 and FIG. 19D2 depict a PAR38 form factor lamp 19D00 for use with LED lamps with improved quality of light.

Figure 20:
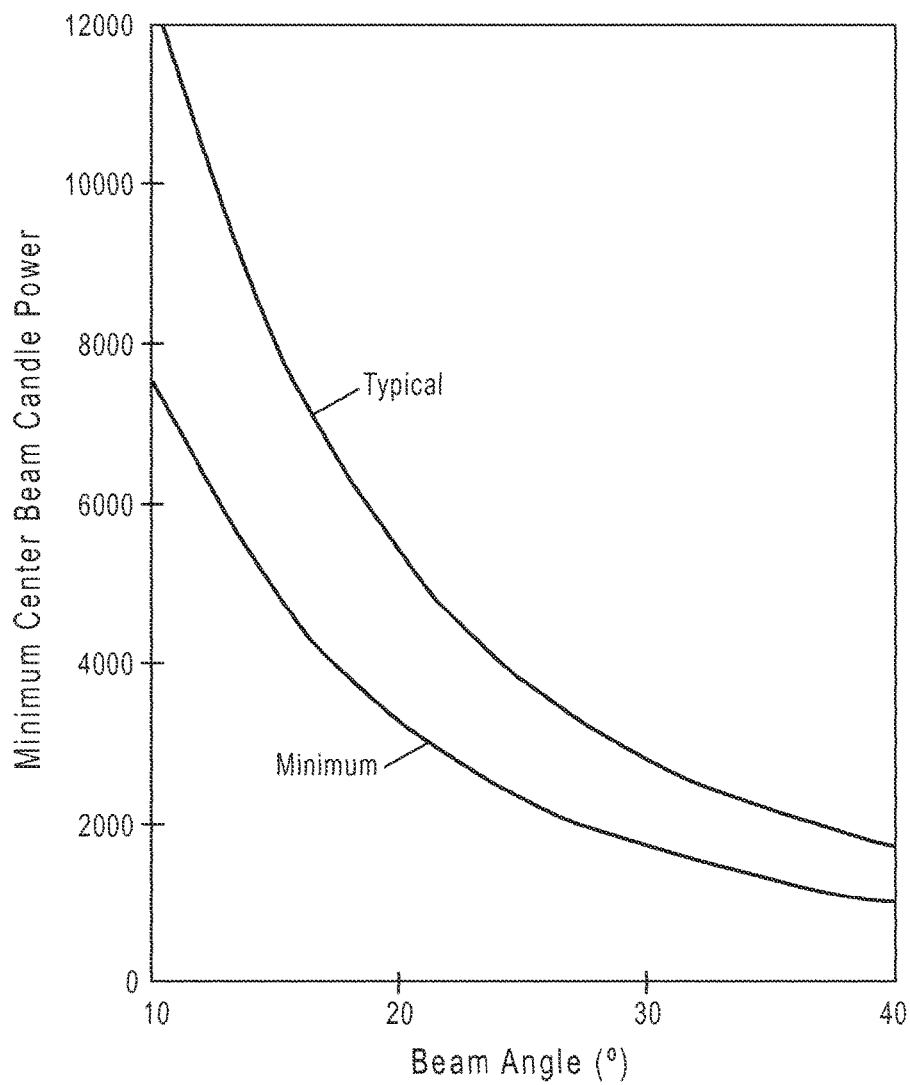
FIG. 20 is a chart that indicates the center beam candle power requirements for 50-watt equivalent MR-16 lamps as a function of the beam angle.

FIG. 20 is a chart 2000 that indicates the center beam candle power requirements for 50-watt equivalent MR-16 lamps as a function of the beam angle. For a typical application, such as a 25 degree beam angle, a center beam candle power of at least 2200 candelas is required.

FIG. 21 is a chart 2100 showing the experimentally-measured CCT-corrected whiteness of various objects illuminated by various illuminants for comparison to LED lamps with improved quality of light.

The various plotted objects in FIG. 21 correspond to a series of nine whiteness standards sold by Avian Technologies containing a varied amount of OBAs. The CIE whiteness of these standards increases with the amount of OBA. The sample with the highest amount of OBA, which reference number is AT-FTS-17a, has a CIE whiteness of about 140 and is referred to as a "high whiteness reference sample". The x-axis of the chart 2100 indicates the CIE whiteness of these standards (under D65 illumination). The plotted objects correspond to experimentally measured values. The y-axis of the chart indicates the corresponding CCT-corrected whiteness under various illuminants, as measured experimentally. The illuminants include a halogen lamp 2102; a conventional LED lamp 2104; a configuration 2106 with a 6% violet leak, and a configuration 2108 with a 10% violet leak. The conventional LED lamp 2104 fails to excite fluorescence from the OBAs, therefore the CCT-corrected whiteness is roughly the same (about 86) for all of the shown illuminants. The halogen lamp 2102, configuration 2106 and configuration 2108 show increased CCT-corrected whiteness for the standards having a higher CIE whiteness. The halogen lamp and configuration 2106 have very similar values of CCT-corrected whiteness. Configuration 2108 has higher values of CCT-corrected whiteness. This chart shows that, depending on the amount of violet leak, perceived whiteness can be tuned to match or exceed that of another illuminant (such as a halogen lamp).

FIG. 22 is a chart 2200 showing the (x,y) color space coordinates of a high whiteness reference standard illuminated by various sources with a 3000K CCT for comparison to LED lamps with improved quality of light.

FIG. 22 shows the (x,y) color space coordinates of various points. The white point 2202 for an illuminant with a CCT of 3000K is shown. The experimental color coordinates of a high whiteness reference standard, illuminated by several illuminants, are also shown. The illuminants are a halogen lamp 2204, a conventional LED lamp 2206, a configuration of the disclosure with a 6% violet leak 2208, a configuration of the disclosure with an 8% violet leak 2210, and a configuration of the disclosure with a 10%-violet leak 2212. The (x,y) color shift (with respect to the white point 2202) is in a similar direction, and of a similar magnitude, for the halogen lamp and the three configurations of the disclosure. This confirms that all these illuminants induce a similar whiteness enhancement. On the other hand, the (x,y) color shift is smaller and in a different direction for the conventional (blue pump) LED lamp 2206; this is because no OBA fluorescence is induced (e.g., the small shift is due to the slight tint of the reference sample).

These shifts in chromaticity can be summarized as a series of Duv values from the illuminant's white point (e.g., for each illuminant) the chromaticity of the high-whiteness reference sample is characterized and its distance Duv from the illuminant's white point is calculated. Table 5 is a table that shows the Duv values for various illuminants with a CCT of 3000K, and specifies the direction of the color shift (either toward the blue direction or away from the blue direction). As can be seen, sources which are able to excite significant whiteness are characterized by Duv values of about five and more toward the blue direction. In contrast, a conventional blue-based LED source has a Duv of about 3 away from the blue direction. In Table 5, two configurations of the disclosure are shown. Configuration 1 has a violet leak of 6%, and configuration 2 has a violet leak of 10%.

TABLE 5

| | Halogen source | Blue-pumped LED | Configuration 1 | Configuration 2 |
|---|---|---|---|---|
| Duv | 5.7 | 2.7 | 5.2 | 9.0 |
| Direction with respect to blue | toward | away form | toward | toward |

Figure 23:
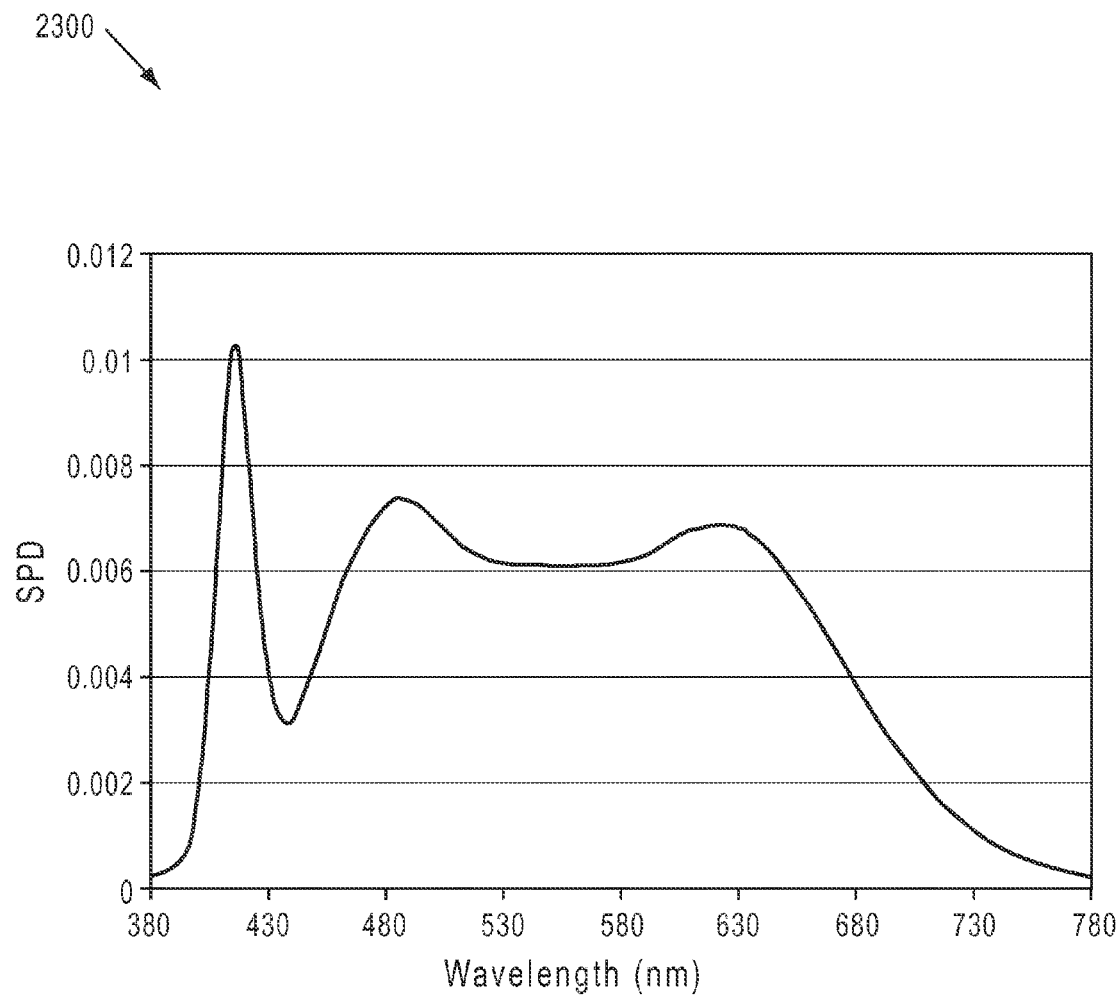
FIG. 23 is a chart showing the experimental SPD of an LED lamp with improved quality of light, according to some embodiments.

FIG. 23 is a chart 2300 showing the experimental SPD of an LED lamp with improved quality of light.

FIG. 23 is an experimental spectrum of an embodiment. It has a CCT of 5000K, a CRI value higher than 95, an R9 value higher than 95, and about 11% violet leak.

Additional embodiments providing enhanced quality of light, with the aim of improving metrics other than fidelity-related metrics, are now described.

These embodiments of the disclosure further improve the quality of light by engineering the emitted spectrum. Spectrum engineering may for instance be achieved by choice of the emission spectra of LEDs and phosphors in the lamps, and by use of additional optical filters. In the following, various quality-of-light metrics and corresponding embodiments will be discussed.

In the following discussion, the techniques make use of color metrics defined in the Color Quality Scale metric. The numerical values pertain to the most current version of this metric, i.e., version 9.0.

One possible quality of light metric is the gamut of the light source. To illustrate gamut enhancement, the exemplary techniques use the following methodology. Consider the 15 reflectance samples of the Color Quality Scale, then compute their chromaticity in CIELAB space under illumination by various sources and consider the gamut of the resulting points. This methodology is referred to as Qg in the Color Quality Scale.

Figure 24:
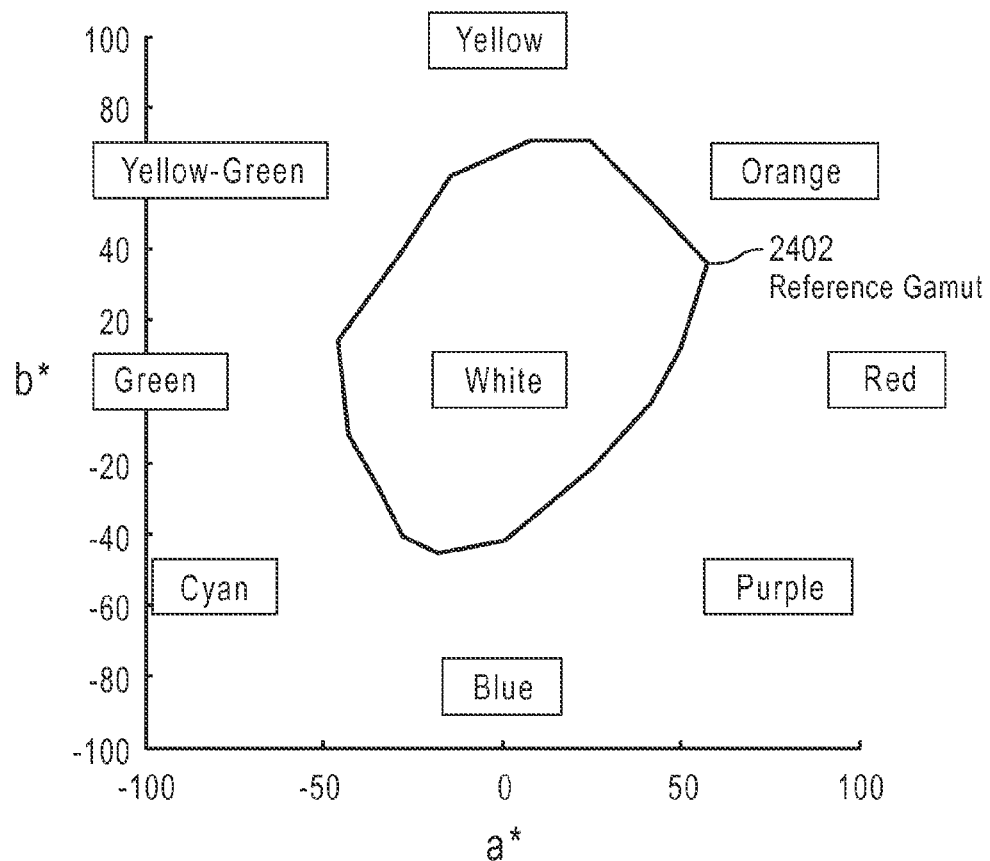
FIG. 24 is a chart showing the gamut for a black body radiator with a correlated color temperature (CCT) of 3000K for comparison with LED lamps with improved quality of light.

FIG. 24 is a chart showing the reference gamut 2402 for a blackbody radiator with a correlated color temperature (CCT) of 3000K. The objects are distributed around the white point, and cover various hues. These hues are indicated by labels on the figure. The distance between the origin and each object is a measure of its saturation—objects farther from the origin correspond to a higher saturation, which can be desirable.

Figure 25:
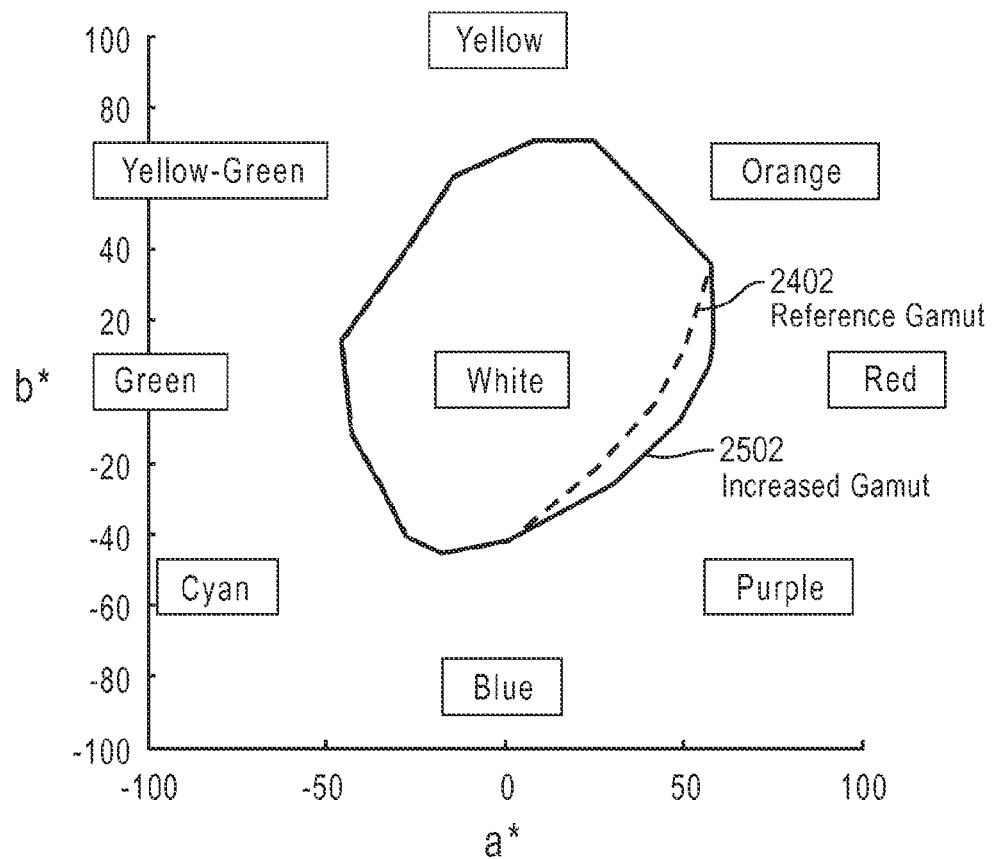
FIG. 25 shows the diagram as FIG. 24 where an exemplary increased gamut is also shown for comparison.

FIG. 25 shows the same diagram as FIG. 24 where an exemplary increased gamut is also shown for comparison. It can be seen that the increased gamut 2502 covers a larger area than the reference gamut 2402. Specifically, the gamut is increased in the purple and red region. A source with a CCT of 3000K which has this gamut will show more saturated reds and purples than a blackbody radiator.

In the following, the exemplary technique considers various sources and compare them to blackbody radiators of the same CCT. Gamut enhancement is illustrated in FIG. 25. In some cases, it is desirable to increase the overall gamut of the source, in order to obtain more saturated colors. This can be useful in applications such as retail, where consumers appreciate goods with saturated colors. This can be measured by a metric such as Qg.

FIG. 26A shows an example of a spectrum with an increased overall gamut. The spectrum resembles a blackbody radiator with a CCT of 3000K, with additional dips 2606 and peaks 2604. These dips and peaks may be obtained by choosing the light-emitting elements (phosphor, LEDs) and, if needed, by additional filtering. The dips shown on this figure are very sharp, but this is not a necessary property—in some cases smoother dips provide a similar gamut increase. The corresponding increased gamut is also shown on FIG. 26B, and compared to a reference gamut. The increased gamut 2602 has Qg=134 whereas the reference gamut has Qg=100.

FIG. 26B is a chart showing the CIELAB color space and the position of various colored objects illuminated by a reference source forming a reference gamut 2402 and the spectrum of FIG. 26A forming an increased gamut 2602 for comparison.

Figures 27A, 27B:
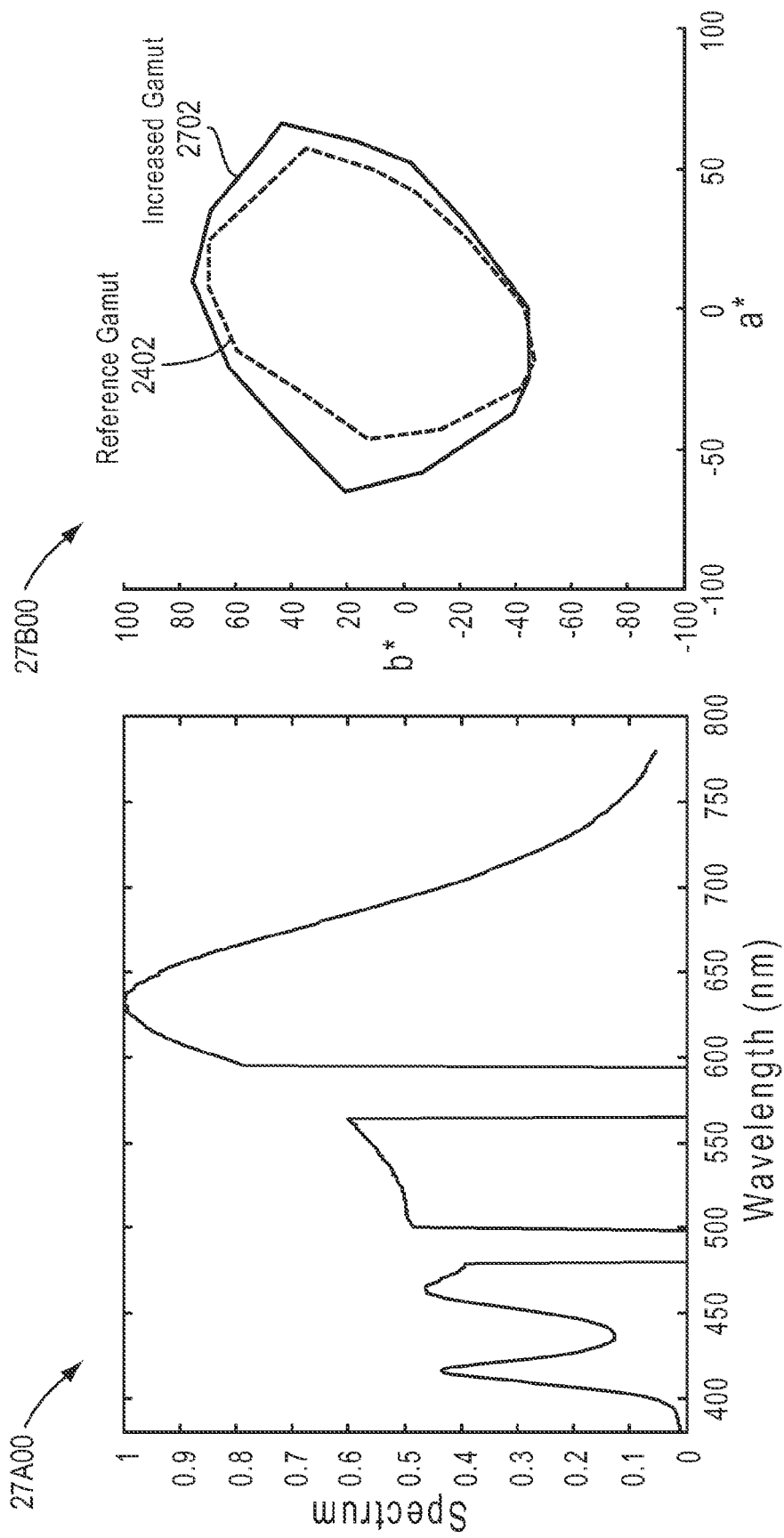
FIG. 27A is a chart showing the calculated SPD of an LED lamp having an increased gamut, according to some embodiments.
FIG. 27B is a chart showing the corresponding gamut for comparison.

FIG. 27A is a chart showing the calculated SPD of an LED lamp having an increased gamut. FIG. 27B is a chart showing the corresponding increased gamut 2702 and reference gamut 2402. FIG. 27A and FIG. 27B show another source with very similar gamut properties as that shown in FIG. 26. Here however, the spectrum resembles an LED spectrum with additional dips and peaks. The spectrum contains a pronounced violet peak at 415 nm. This spectrum can be achieved by a typical embodiment of the disclosure i.e., an LED source with violet LEDs, carefully chosen phosphors, and filters. The increased gamut 2702 has Qg=133.

Figures 28A, 28B:
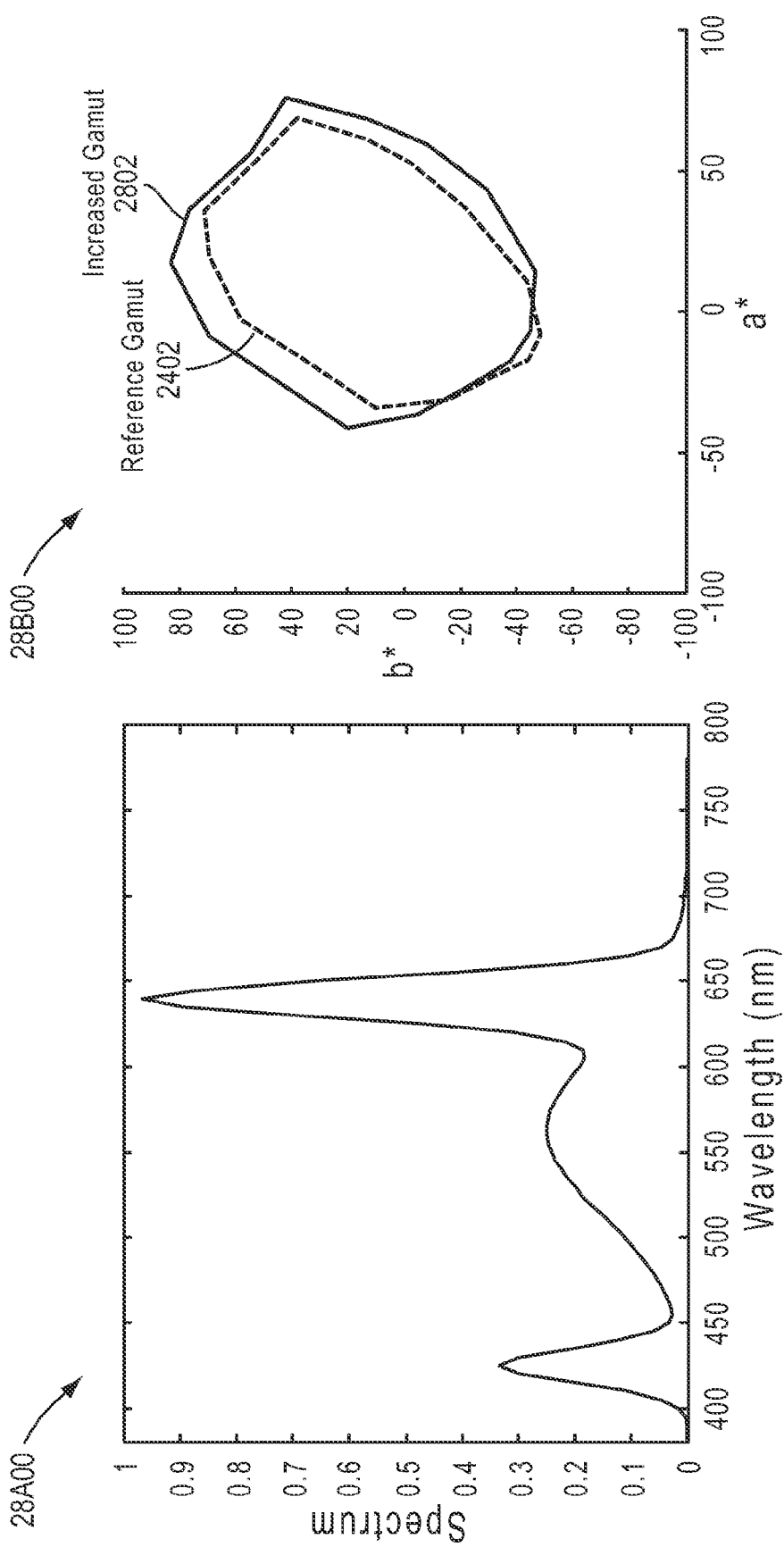
FIG. 28A is a chart showing the calculated SPD of an LED lamp having an increased gamut, according to some embodiments.
FIG. 28B is a chart showing the corresponding gamut for comparison.

FIG. 28A is a chart showing the calculated SPD of an LED lamp having an increased gamut. FIG. 28B is a chart showing the corresponding gamut 2802 and the reference gamut 2402. FIG. 28A and FIG. 28B show yet another source with increased gamut 2802 and with a spectrum which resembles an LED spectrum. Here only peaks are present in the spectrum, and their width and position is chosen to increase the gamut. These peaks may correspond to a mixture of LED emission spectra and of phosphor emission spectra. The increased gamut 2802 has Qg=131.

In other cases, one does not seek to increase saturation for all colors but rather for a limited set of colors, which are then rendered more preferably. For instance, in some embodiments the SPD is modified in order to increase saturation specifically for yellow or red objects. In other embodiments the SPD is modified in order to increase the saturation of human skin of a given ethnicity, or to increase the red content in the rendering of said skin tone. A possible metric for such cases is the chromaticity shift of a given reflectance sample.

In some embodiments of the disclosure, the increased saturation occurs for warm colors such as red, orange, pink—rather than in colors such as yellow and blue. This is useful because end users frequently value warm colors the most.

In some embodiments, the SPD is engineered such that the skin of a given ethnicity (such as Caucasian) has increased saturation, either directly radial (redder) or in a slightly non-radial (red-yellow) direction. In such an embodiment, the skin of a Caucasian ethnicity undergoes a chromatic shift which is substantially along the b* direction of the CIELAB space.

FIG. 29A is a chart showing the calculated SPD of an LED lamp having an increased gamut. FIG. 29B shows the corresponding gamut 2902 and reference gamut 2402. FIG. 29A and FIG. 29B show an example of a spectrum with increased gamut 2902 in the green and red/purple regions. The spectrum resembles a blackbody radiator with additional dips.

Figures 30A, 30B:
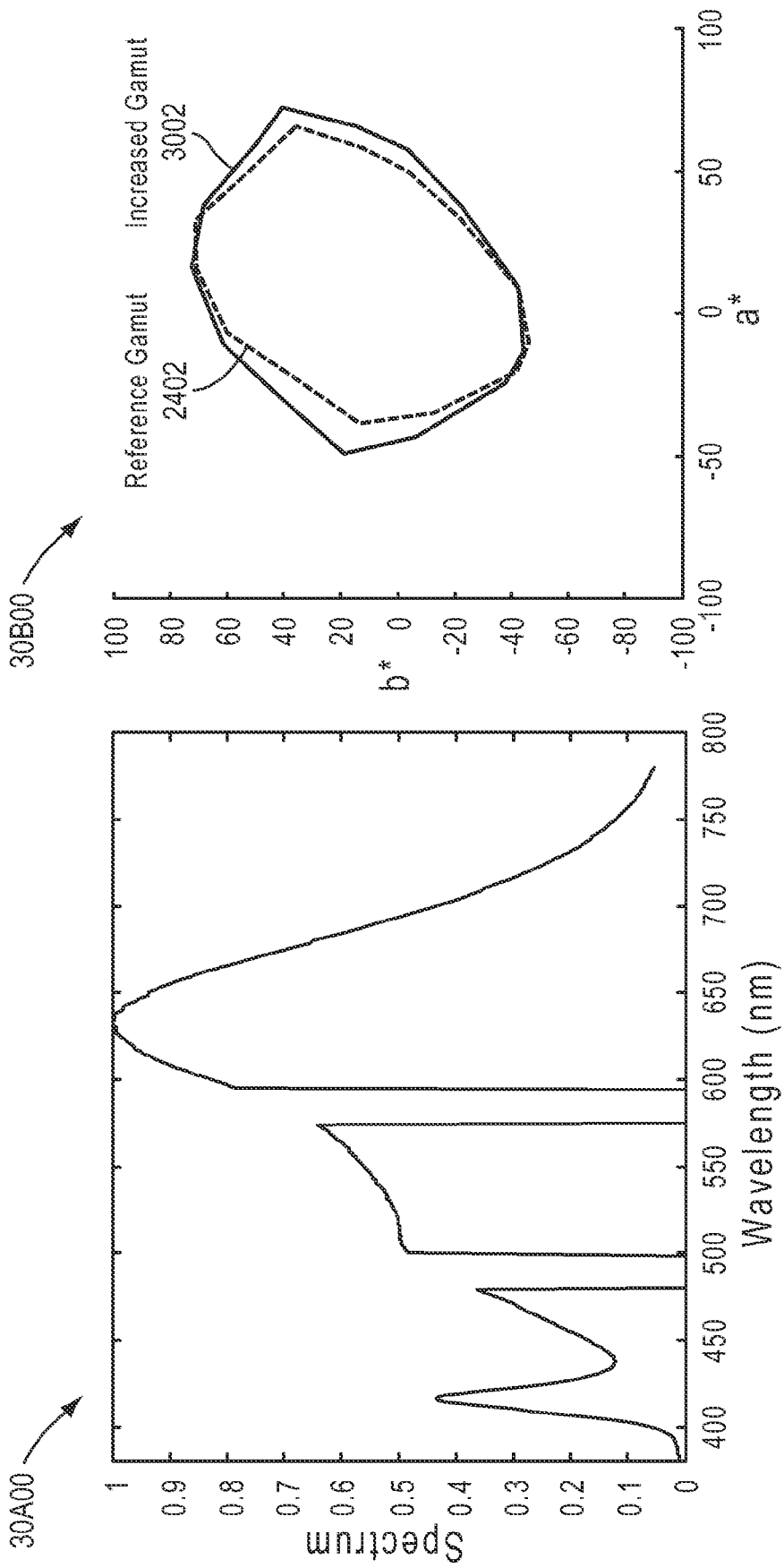
FIG. 30A is a chart showing the calculated SPD of an LED lamp having an increased gamut, according to some embodiments.
FIG. 30B is a chart showing the corresponding gamut for comparison.

FIG. 30A is a chart showing the calculated SPD of an LED lamp having an increased gamut. FIG. 30B shows the corresponding gamut 3002 and reference gamut 2402. FIG. 30A and FIG. 30B show another source with very similar gamut properties (e.g., increased gamut 3002). Here however, the spectrum resembles an LED spectrum with additional dips.

FIG. 31A is a chart showing the calculated SPD of an LED lamp having an increased gamut. FIG. 31B shows the corresponding gamut 3102 and reference gamut 2402. FIG. 31A and FIG. 31B show an example of a spectrum with increased gamut in the yellow region (e.g., increased gamut 3102). The spectrum resembles a blackbody radiator with additional dips and peaks.

Figures 32A, 32B:
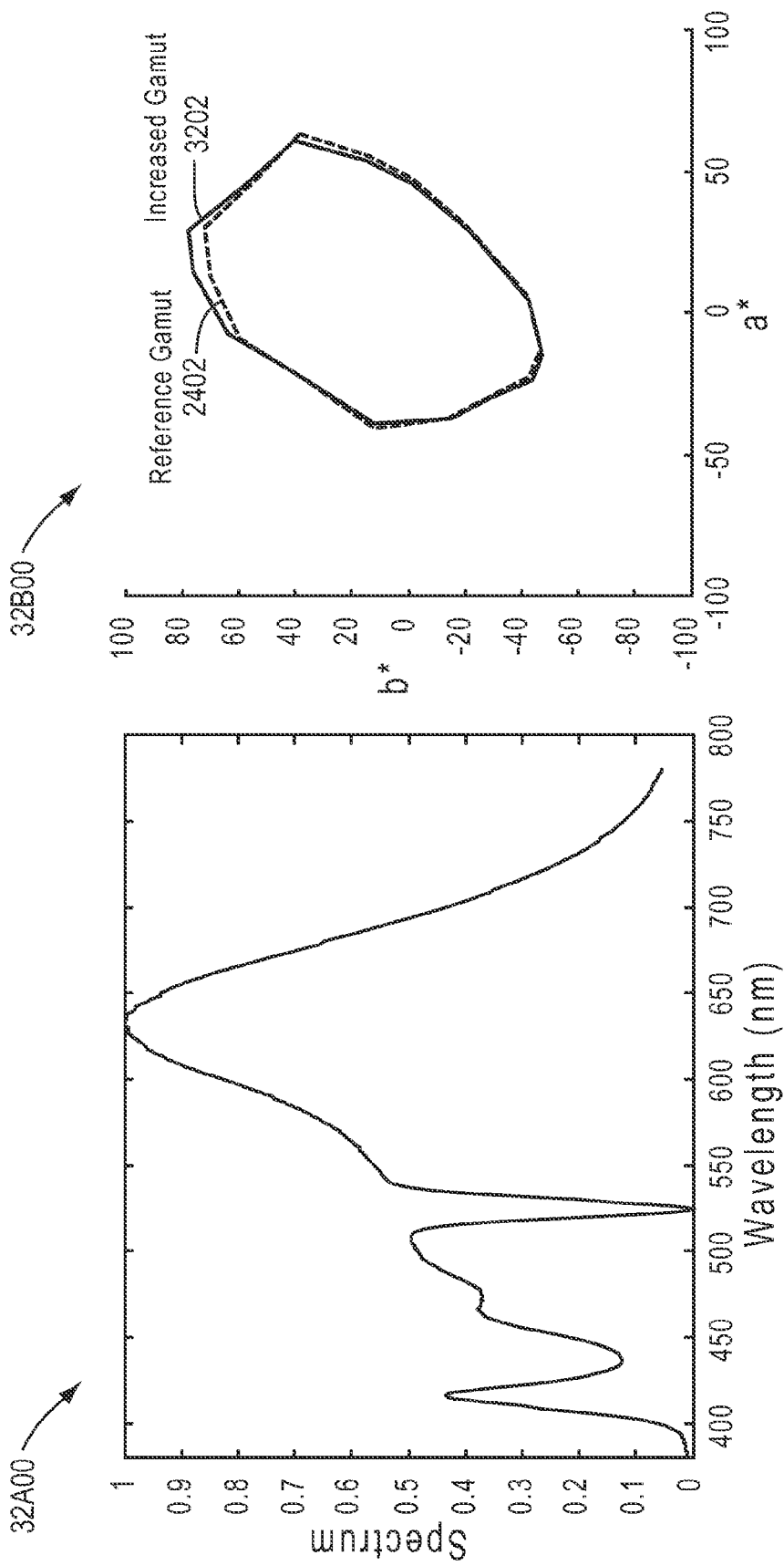
FIG. 32A is a chart showing the calculated SPD of an LED lamp having an increased gamut, according to some embodiments.
FIG. 32B is a chart showing the corresponding gamut for comparison.

FIG. 32A is a chart showing the calculated SPD of an LED lamp having an increased gamut. FIG. 32B shows the corresponding gamut 3202 and reference gamut 2402. FIG. 32A and FIG. 32B show another source with similar gamut properties (e.g., increased gamut 3202). Here however, the spectrum resembles an LED spectrum with additional dips and peaks.

While the previous examples were provided for warm-white spectra (CCT of about 2700-3000K), the same approach can be used for any CCT. For instance, if a CCT of 5000K is desired, the spectrum may be designed to increase the gamut.

Figures 33A, 33B:
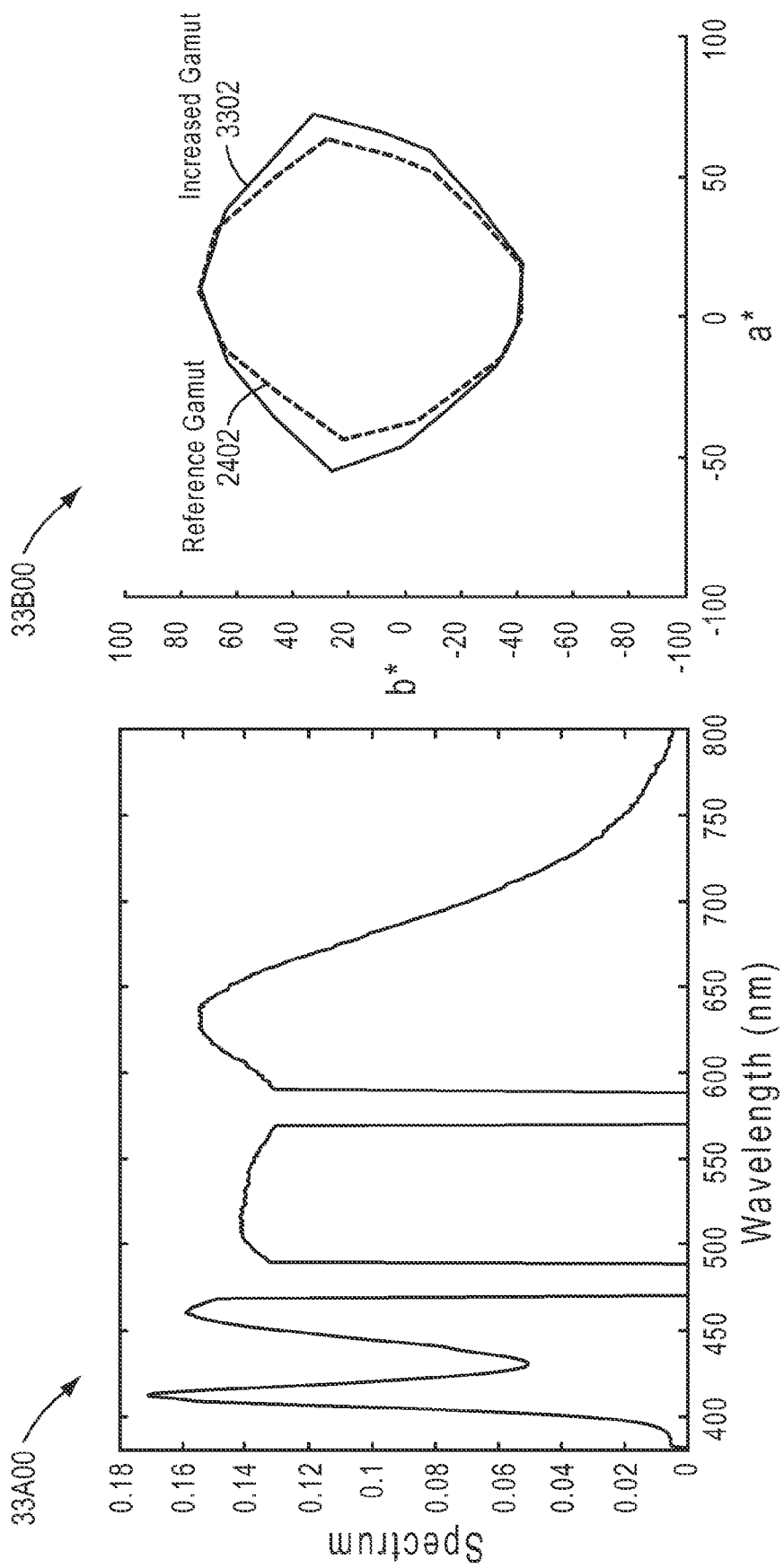
FIG. 33A is a chart showing the calculated SPD of an LED lamp having an increased gamut, according to some embodiments.
FIG. 33B is a chart showing the corresponding gamut for comparison.

FIG. 33A is a chart showing the calculated SPD of an LED lamp having an increased gamut. FIG. 33B shows the corresponding gamut 3302 and reference gamut 2402. FIG. 33A and FIG. 33B show a source with a CCT of about 5000K. The spectrum resembles an LED spectrum, with additional dips and peaks. The increased gamut 3302 has Qg=116.

In some cases, a large color contrast between two objects is desired. For instance in medical settings, some diagnoses are formulated by considering the color difference between two tissues (in the case of skin conditions) or the color difference between oxygenated and non-oxygenated blood (diagnosis of cyanosis). Again, modifications in the spectrum similar to those described above can be designed to meet such a requirement. Here, rather than increasing the gamut, one may seek to increase the color distance between the two objects.

In the particular case of diagnosis of cyanosis, relevant metrics are the cyanosis observation index (COI) defined in Standard AZ/NZS 1680.2.5:1997, and the CCT. According to Standard AZ/NZS 1680.2.5:1997, it is recommended that a source have 3300K<CCT<5300K and that the COI be no greater than 3.3, with lower COI values being also recommended.

Figure 34:
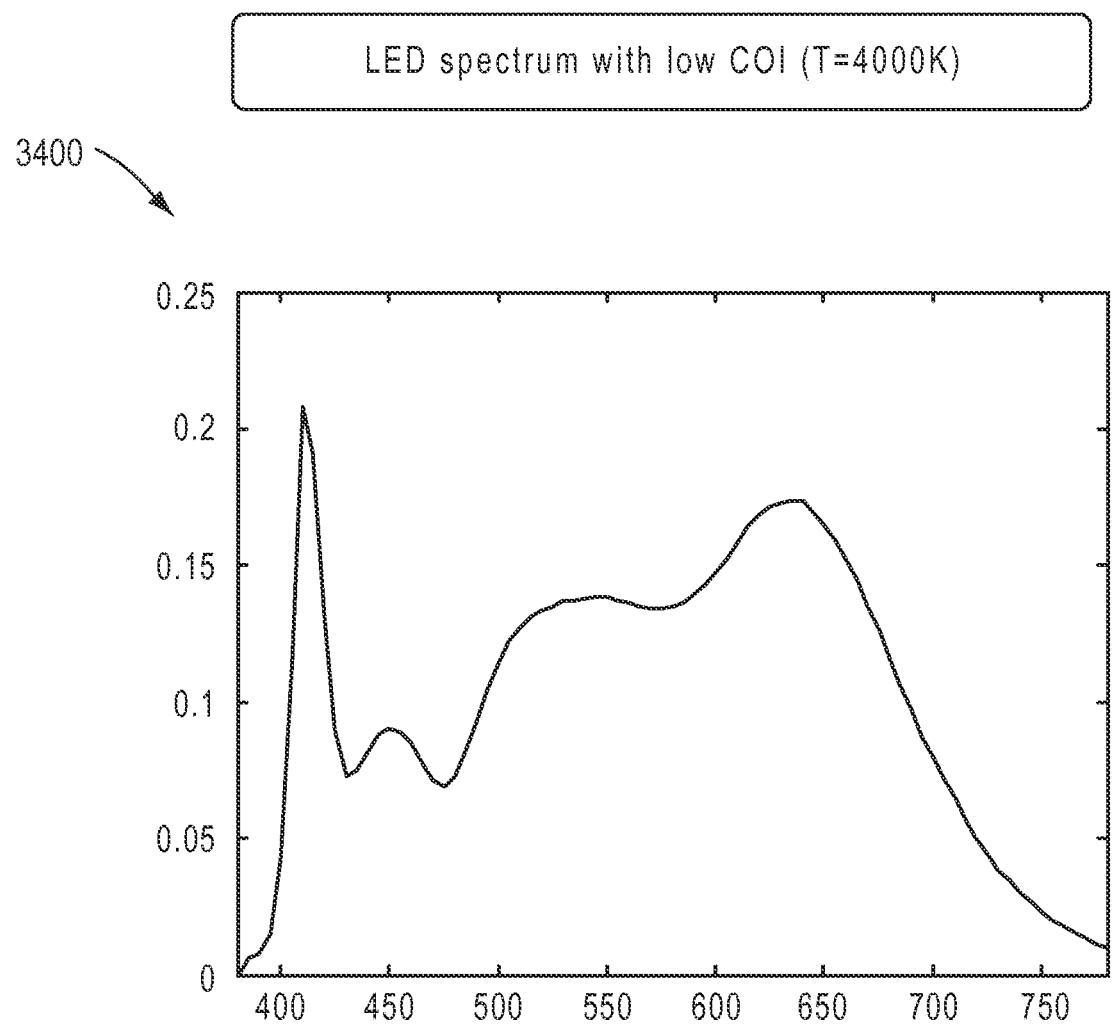
FIG. 34 is a chart showing a spectrum designed to obtain a CCT of 4000K and a low COI, according to some embodiments.

FIG. 34 is a chart showing a spectrum which has been designed (including the spectra of the phosphors and the amount of violet light) to obtain a low COI value of 0.59 and a CCT of 4000K.

The above discussion pertains to the rendering of various colors. In addition to color rendering, it is also possible to optimize the chromaticity (e.g., the white point) of the disclosure. Indeed, for a case where high fidelity is not required, there is more freedom in setting the chromaticity of the source. For instance, it has been shown that sources with a chromaticity below the blackbody locus were preferred in some cases. For example, a chromaticity located at Duv ~10 points below the blackbody locus can be preferred.

Figures 35A, 35B:
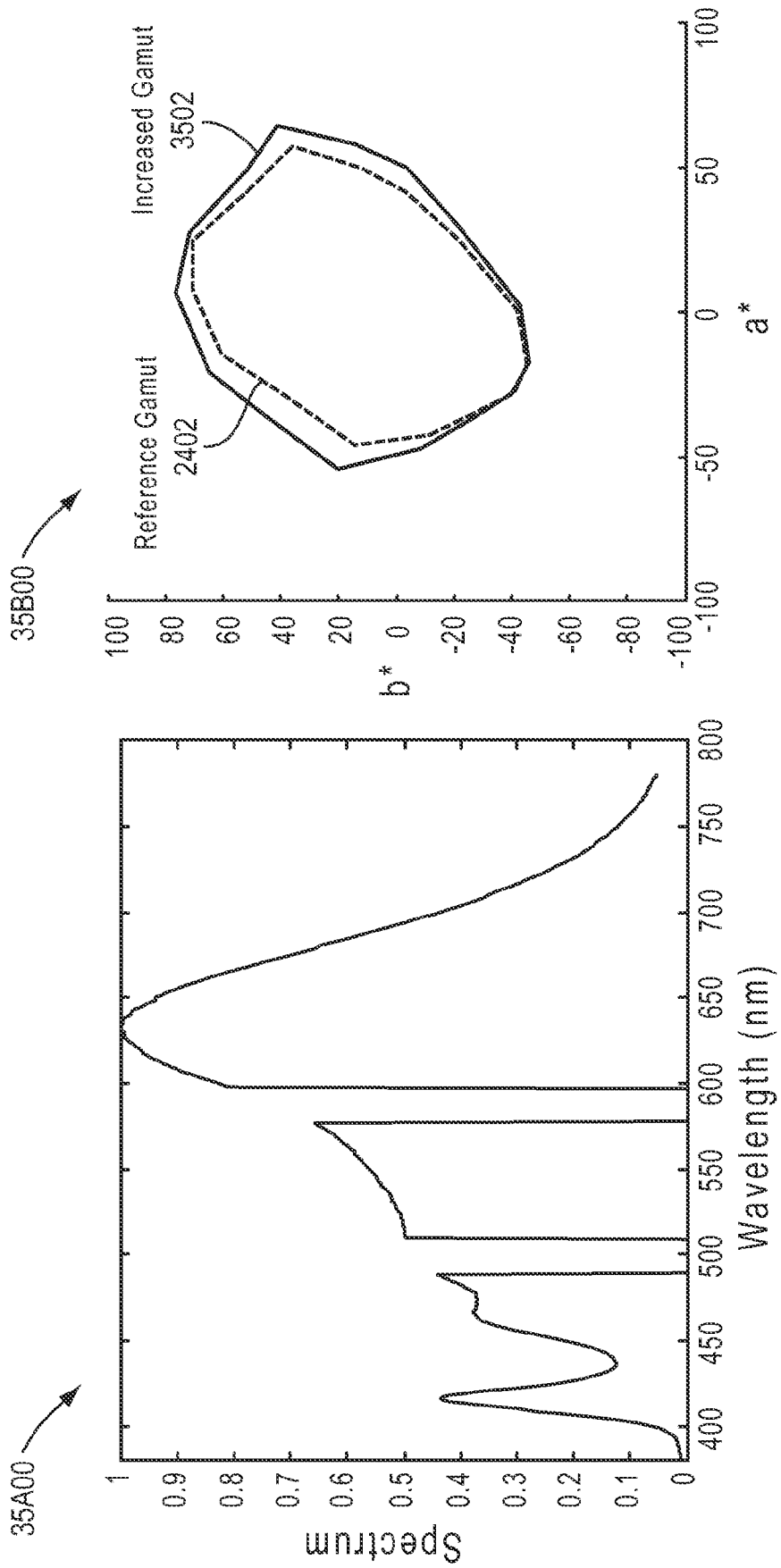
FIG. 35A is a chart showing the calculated SPD of an LED lamp having an increased gamut, according to some embodiments.
FIG. 35B is a chart showing the CIELAB color space and the position of various colored objects illuminated by a reference source forming a reference gamut and the spectrum of FIG. 26A forming an increased gamut for comparison.

FIG. 35A is a chart showing the calculated SPD of an LED lamp having an increased gamut.

FIG. 35B is a chart showing the CIELAB color space and the position of various colored objects illuminated by a reference source forming a reference gamut 2402 and the spectrum of FIG. 26A forming an increased gamut 3502 for comparison.

Figure 35C:
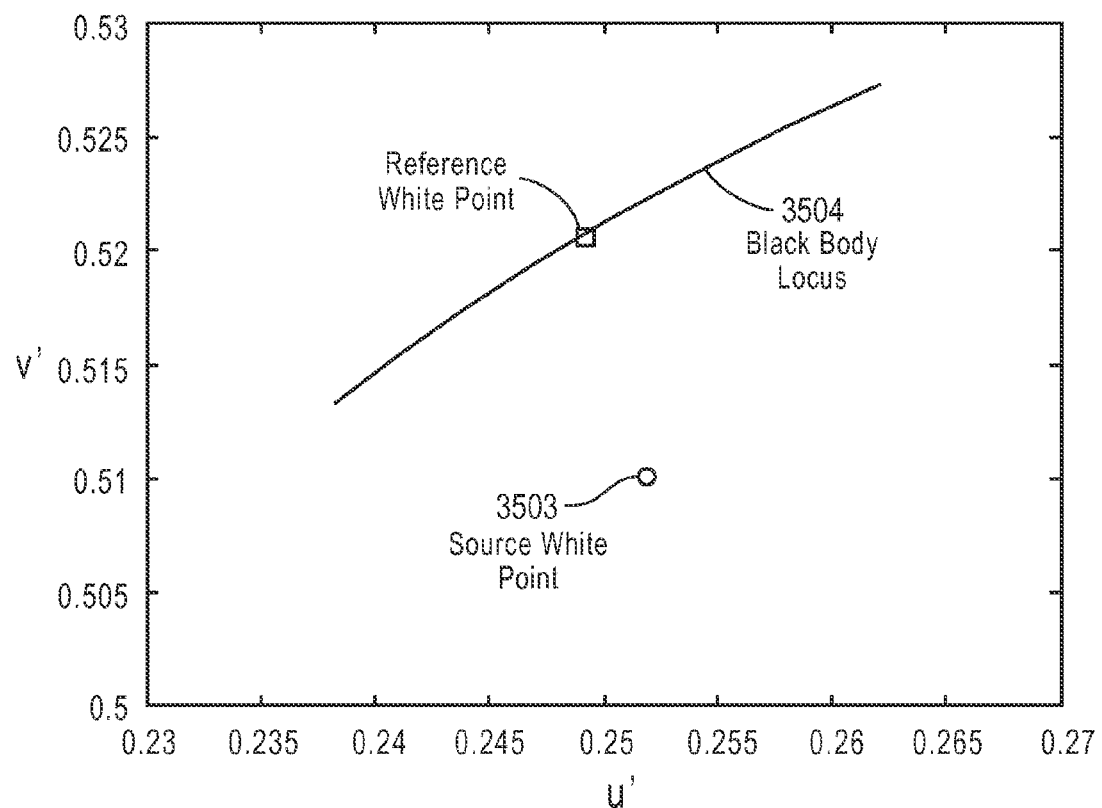
FIG. 35C is a chart showing the CIELUV (u'v') color space and the chromaticities of a reference illuminant and of the spectrum of FIG. 35A for comparison.

FIG. 35C is a chart showing the CIELUV (u'v') color space and the chromaticities of a reference illuminant and of the spectrum of FIG. 35A for comparison.

It is possible to design the spectrum so that it combines increased gamut properties and a desired shift of the white point. FIG. 35 exemplifies such a source. The spectrum resembles an LED spectrum with additional dips. The gamut is increased (e.g., increased gamut 3502). In addition, the white point 3503 of the source is shown in the 1964 CIE (u'v') color space. It is located below the blackbody locus 3504. Also indicated is the white point of a blackbody radiator with the same CCT (3000K).

In addition to these various optimizations, the presence of violet light in the spectrum can be used to improve the quality of light. This can be done to improve the rendering of objects containing OBAs, such as many manufactured white products. For instance, the amount of violet in the spectrum may be tuned to excite OBAs with enough intensity to reproduce the whiteness rendering of another source.

In addition, in some cases the spectrum may be tuned for optimal interaction with another device, such as a photo or video camera. Such image capture devices use light sensors with color filters (typically red, green and blue) in order to capture color information. The filters can have cross-talk, e.g., the transmission window of two filters may overlap. Using a light source which possesses spectral gaps in the overlap regions can help subsequent treatment of the data to reproduce the images in the scene. This may be used in conjunction with software which takes the source spectrum into account in order to accurately reproduce colors.

As previously mentioned, the practical implementation of such spectrum modifications can be achieved by a combination of LED/phosphor choice and filters. In the case of filters, the filter can be of various natures, for instance: a dielectric stack with a proper transmission, a color gel, or an absorbing material (such as an absorbing glass). Such filters can be deposited directly onto an existing element of the lamp, or can be added as a new element to the lamp. Such filters can be placed at various locations in an LED lamp to filter the light.

Figure 36:
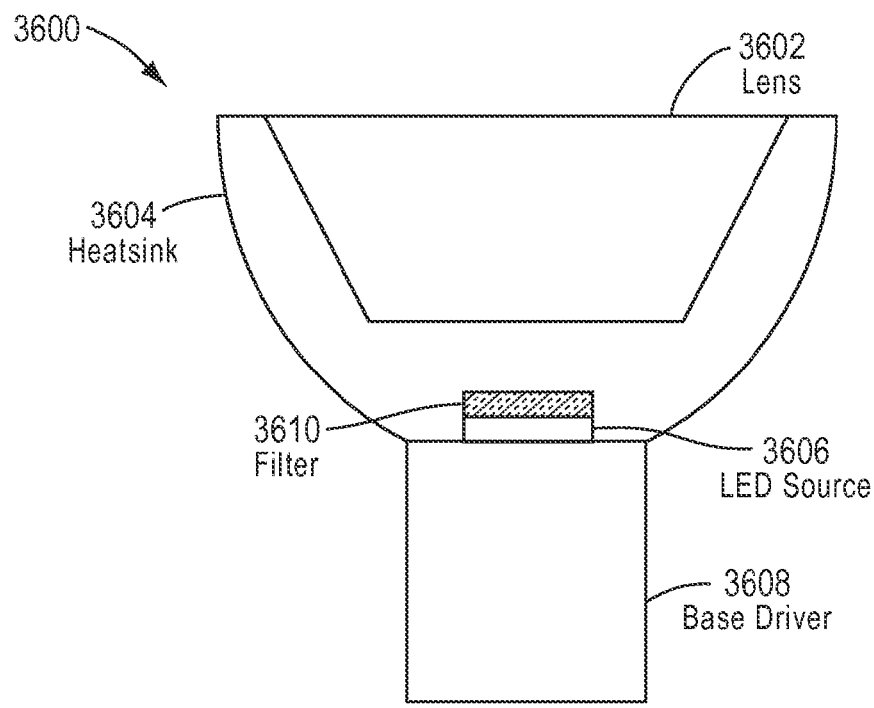
FIG. 36 shows a spot lamp such as an MR-16, composed of a base/driver, an LED source, an optical lens and a heatsink, according to some embodiments.

FIG. 36 shows a spot lamp such as an MR-16, composed of a base/driver 3608, an LED source 3606, an optical lens 3602 and a heatsink 3604. In FIG. 36 the filter 3610 is placed on top of the LED source.

Figure 37:
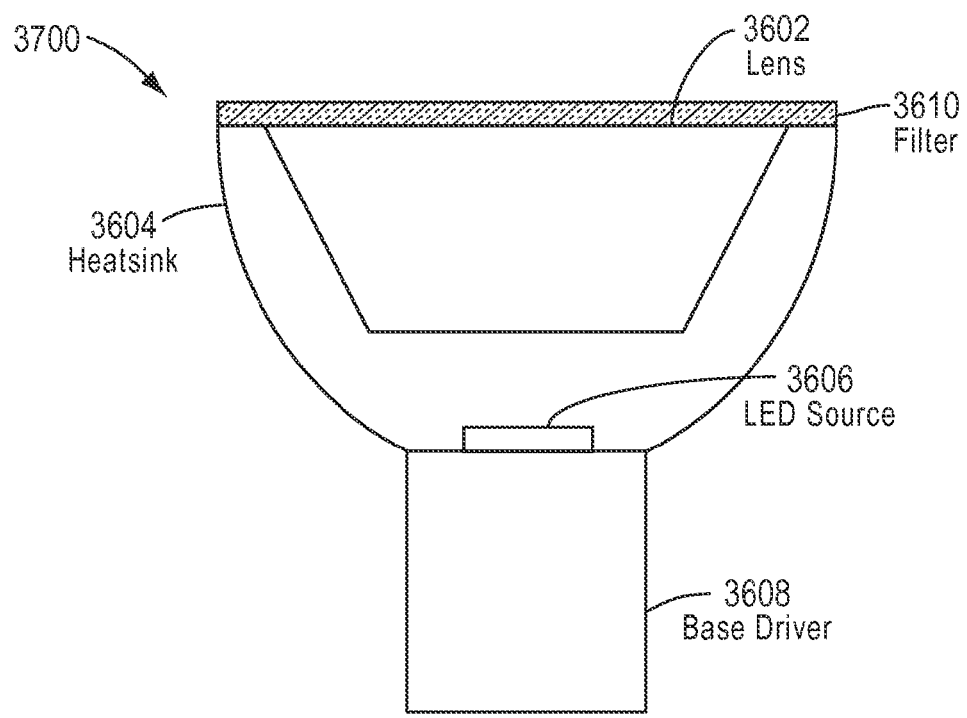
FIG. 37 is similar to FIG. 36 but here the filter is placed on top of the lens, either by coating the lens itself, or by attaching an accessory filter to the lens, according to some embodiments.

FIG. 37 is similar to FIG. 36 but here the filter 3610 is placed on top of the lens 3602, either by coating the lens itself, or by attaching an accessory filter to the lens. Likewise, the filter may be paced in other locations such as the input port of the optical lens.

Figure 38:
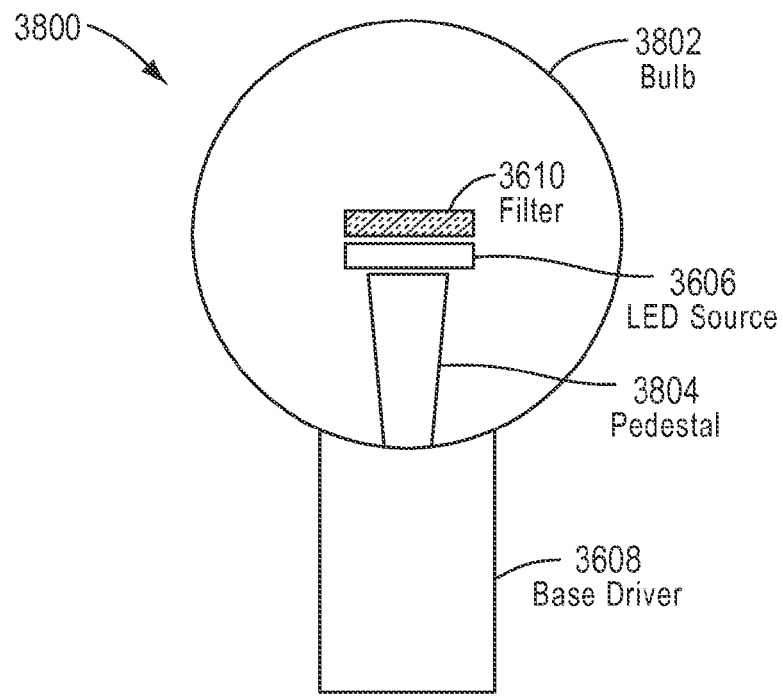
FIG. 38 shows a light bulb such as an A-lamp, composed of a base driver, a pedestal, an LED source and a bulb, according to some embodiments.

FIG. 38 shows a light bulb such as an A-lamp, composed of a base driver 3608, a pedestal 3804, an LED source 3606 and a bulb 3802. In FIG. 38 the filter 3610 is placed on top of the LED source. This is suitable in a case where the LED source emits light primarily from its top surface.

Figure 39:
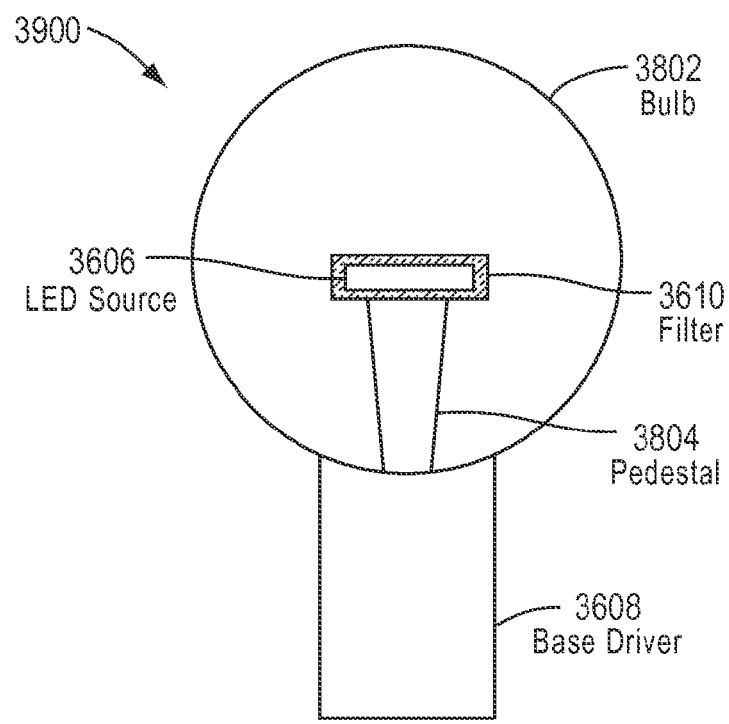
FIG. 39 shows a filter placed around the LED source, according to some embodiments.

FIG. 39 is similar to FIG. 38 but here the filter 3610 is placed around the LED source 3606. This is suitable in cases where the LED source emits light in a variety of angles. For instance, this is the case for LED sources which mimic the geometry of a traditional incandescent filament. Source 3900 includes pedestal 3804 and base driver 3608.

Figure 40:
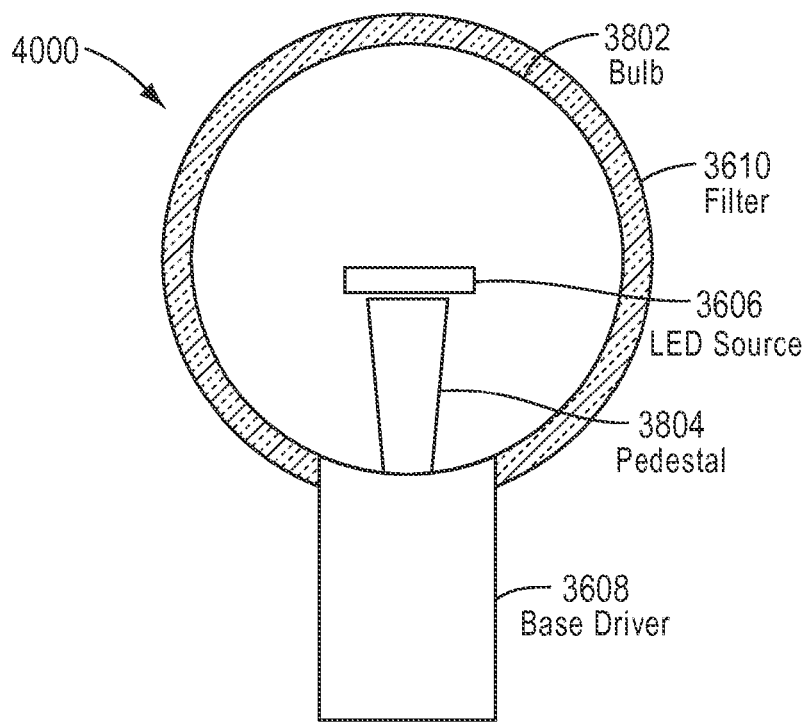
FIG. 40 shows a filter placed on the bulb, either on its inside surface or on its outside surface, according to some embodiments.

FIG. 40 is similar to FIG. 39 but here the filter 3610 is placed on the bulb 3802, either on its inside surface or on its outside surface. Source 4000 includes pedestal 3804, base driver 3608 and LED source 3606.

Figure 41A:
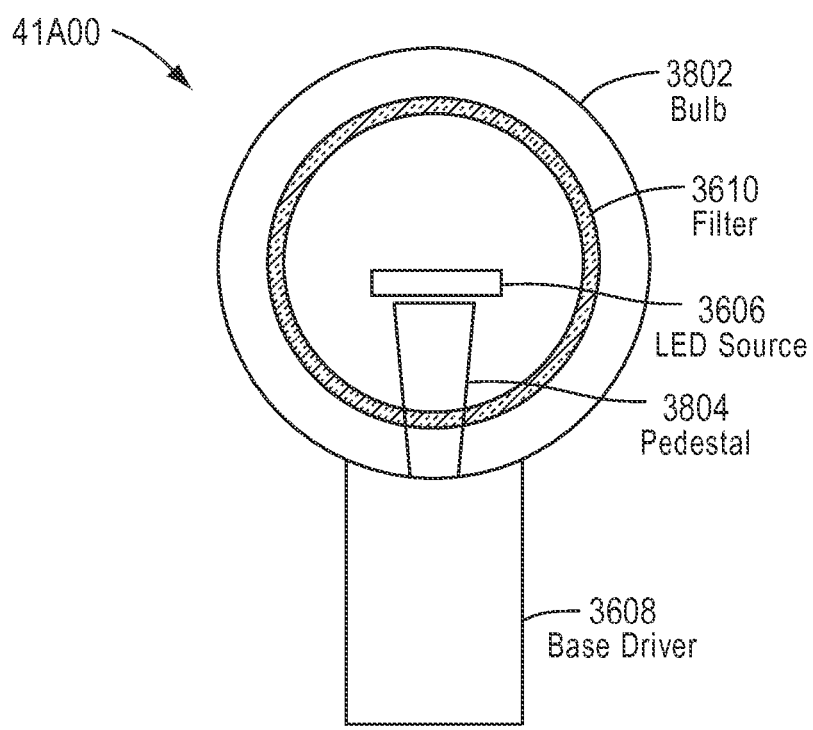
FIG. 41A shows a filter placed at an intermediate position inside the bulb, according to some embodiments.

FIG. 41A is similar to FIG. 40 but here the filter 3610 is placed at an intermediate position inside the bulb 3802. Source 41A00 includes LED source 3606, pedestal 3804, and base driver 3608.

As a consequence, it is desirable to configure an LED-based lamp which is useful for general illumination purposes and which improves on the quality-of-light limitations described above. In some applications, lamps with a varying spectrum are desirable. This includes variations in CCT, intensity, etc. This can be done, for instance, with a three-color RGB LED lamp where the three channels are driven separately and mixed to generate a desired spectrum. However, although they are able to produce many different spectra, such highly-configurable tunable spectrum sources are expensive and sometimes complex to control. In some cases, only a few specific spectra are desirable—for instance white spectra at a few or several CCTs.

One example is the 3-way incandescent bulb. Control of the 3-way bulb is simple and inexpensive, and often is based on an inexpensive mechanical selector.

Figure 41B:
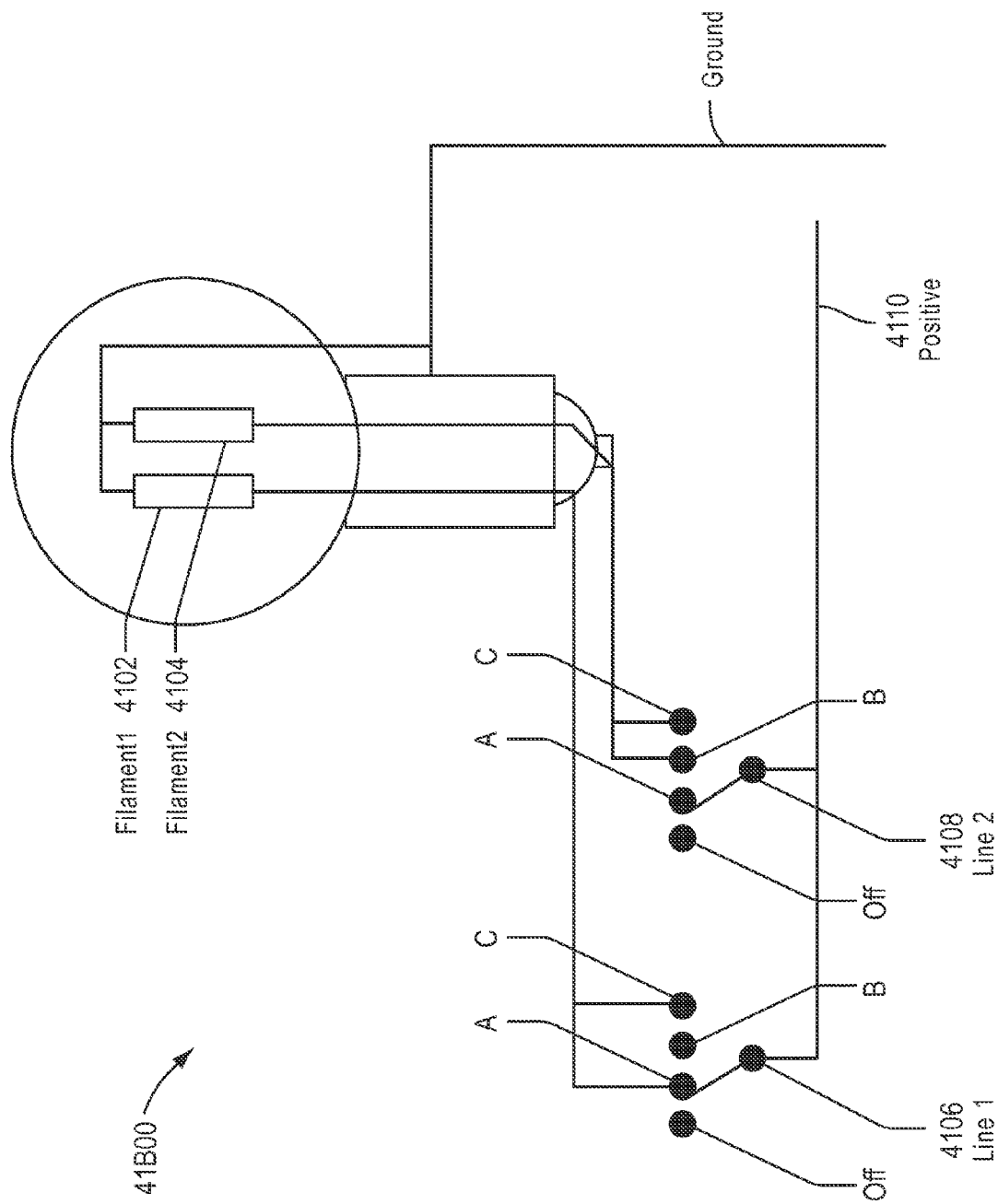
FIG. 41B shows a 3-way bulb with a screw-in socket, according to some embodiments.

FIG. 41B shows a 3-way bulb with a screw-in socket. The 3-way bulb takes advantage of the fact that, for conventional A-lamps with a screw-in socket, there are two points of contact (e.g., line 1 4106 and line 2 4108) for the positive signal (e.g., positive 4110). By wiring each point to a different incandescent filament (e.g., filament1 4102, filament2 4104), several operation modes can be enabled. In the off position, both lines are off. In position A, line 1 carries current and the corresponding filament lights up. In position B line, 2 carries current and the corresponding filament lights up. In position C, both lines carry current and both filaments light up. In a typical 3-way bulb, positions A, B and C are respectively identified as low, medium and high light output.

The 3-way bulb concept has also been adapted to other technologies, such as fluorescent and LED bulbs. However, the 3-way control is used to provide different levels of illumination, as in an incandescent 3-way LED.

Figure 41C:
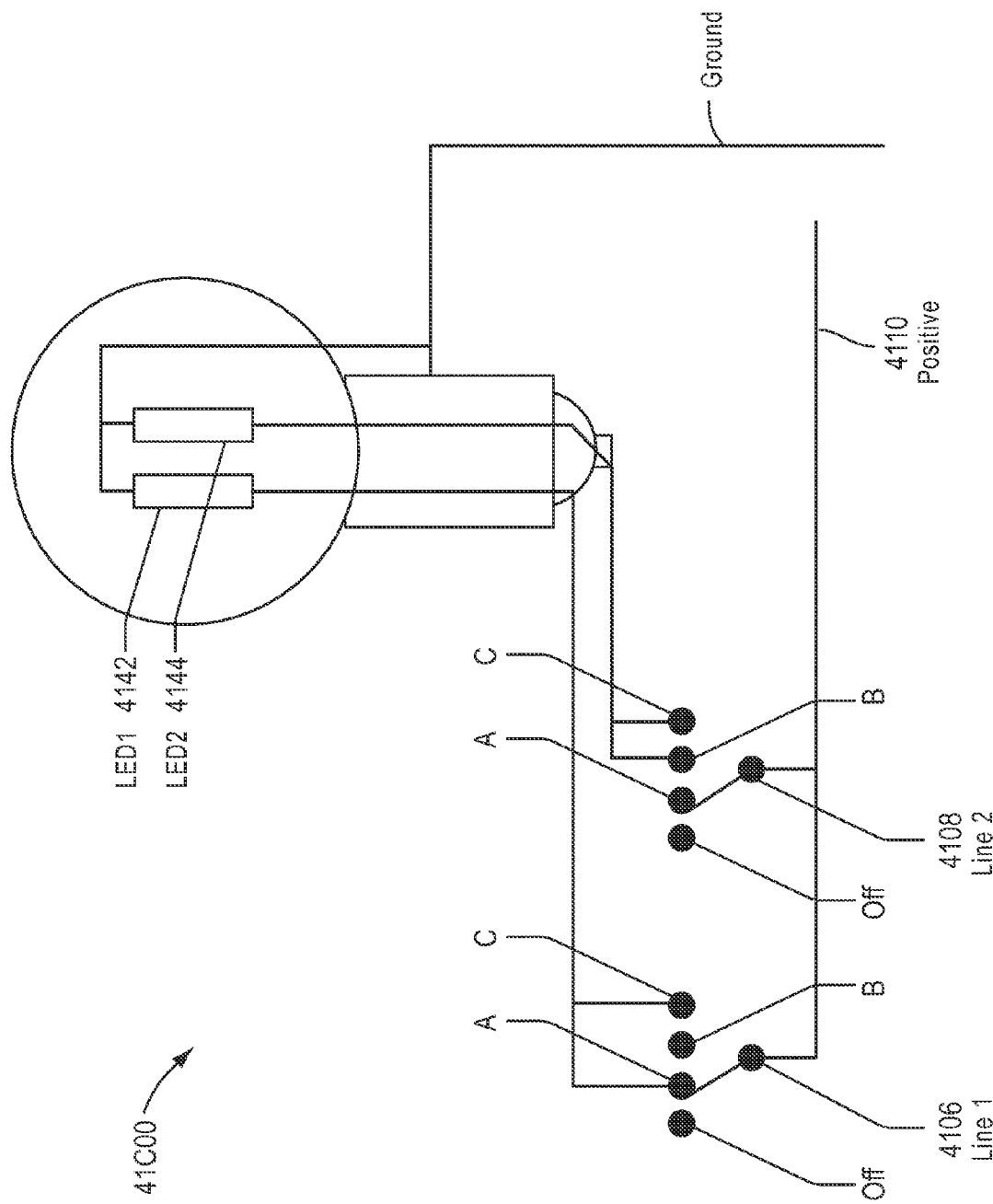
FIG. 41C shows a 3-way bulb with two filament-like LED sources, according to some embodiments.
Figure 41D:
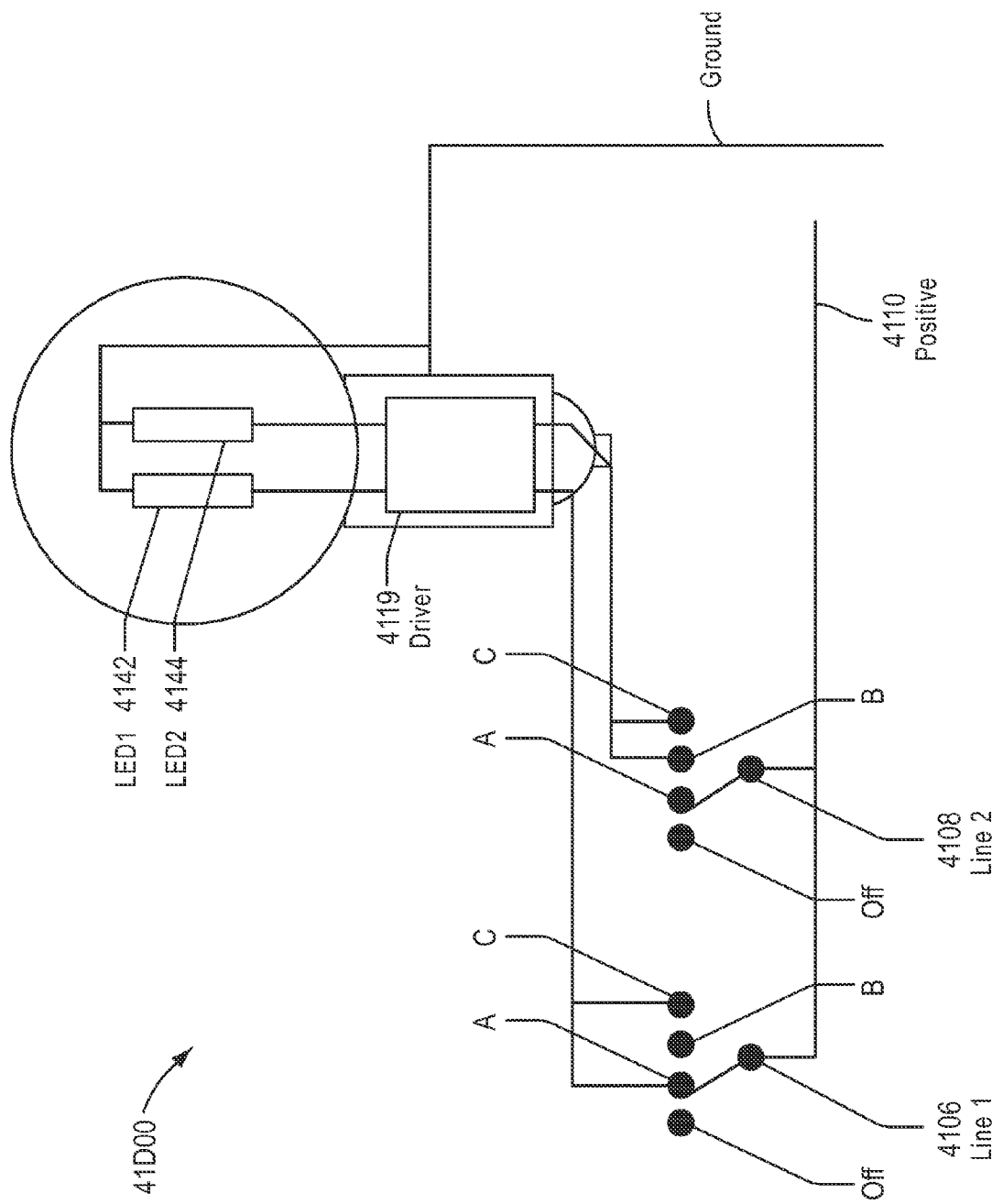
FIG. 41D shows a filter placed at an intermediate position inside the bulb, according to some embodiments.

The following figures disclose an LED lamp that can output a few specific spectra and be controlled by a simple mechanical switch as heretofore described. In one implementation, the lamp is embodied as a 3-way A-blub containing two LED sources (e.g., LED1 4142, LED2 4144 as shown in FIG. 41C and FIG. 41D), each with different CCTs. For example:
  cool white (~5000K)
  warm white (~3000K)

The bulb is compatible with a regular 3-way fixture. Depending on the switch position, the lamp emits light at 3000K, 5000K or about 4000K (e.g., when both LED sources are mixed).

FIG. 41C shows a 3-way bulb with two filament-like LED sources. In the case of FIG. 41C, the two LED strings are wired directly to lines 1 and 2. LEDs 1 and 2 have different emission spectra such that the visible spectra can emanate from LED1 or from LED2 or from both.

FIG. 41D shows a driver 4119 disposed inside the bulb. Lines 1 4106 and line 2 4108 both connect to an electrical driver 4119. In this embodiment, the driver serves several functions:

It converts the current from AC to a different electrical signal (for instance DC, or a rectified waveform more amenable to driving LEDs), and It also performs logic functions such as determining connectivity and/or routing current and/or varying the magnitude of the current.

For instance, in a given embodiment, about 10 watts of power are consumed by the lamp. LED1 4142 has a CCT of 3000K. LED2 4144 has a CCT of 5000K. In position A, only LED1 receives power. In position B, LEDs 1 and 2 receive power yielding a CCT between 3000K and 5000K. In position C, only LED2 receives power. In all positions, a similar amount of light is emitted because the same amount of power is driven through the LEDs. In position B, the balance of power feeding LEDs 1 and 2 can be tuned to achieve a desired spectrum.

In another embodiment, the total power consumed by the lamp varies with power. LED1 has a CCT of 2500K, and LED2 has a CCT of 3000K. In position A, only LED1 receives 4 W of power. In position B, LEDs 1 and 2 receive a total power of 7 W. In position C, only LED2 receives 10 W of power. Thus, the CCT of the lamp and its light output vary when the lamp is switched between positions. The LEDs and combinations may be configured to reproduce the warm-dimming effect of halogen lamps.

Various other CCT mixes are possible in other embodiments. In some cases the LEDs may be configured to manage light that has a chromaticities off of the Planckian locus. Some users prefer chromaticities below the Planckian locus.

Figure 41E:
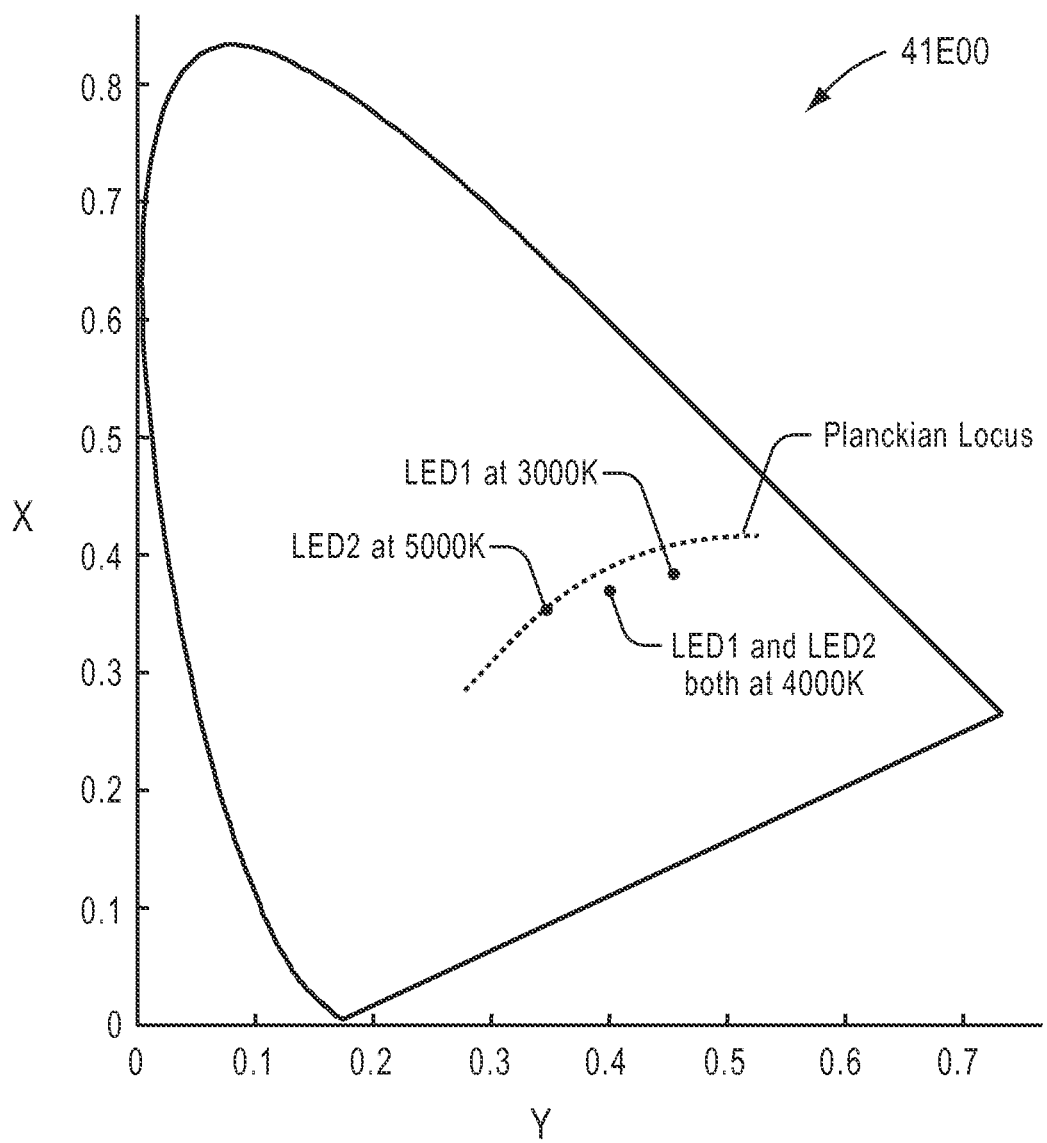
FIG. 41E shows a filter placed at an intermediate position inside the bulb, according to some embodiments.

FIG. 41E shows such an embodiment. FIG. 41E shows the (x-y) chromaticity diagram. The Planckian locus is shown, together with the chromaticity of LEDs 1 and 2. LED2, which are both substantially on-Planckian with a CCT of 5000K. LED1 is below the Planckian with a CCT of 3000K. Some embodiments are configured such that the mixture of LEDs 1 and 2 is off-Planckian with a CCT of about 4000K.

In another embodiment, three LEDs are present rather than two. Each LED has a different spectrum. Each position of the 3-way bulb corresponds to driving one or several of the three LEDs.

In some embodiments, the LED sources include violet dies. In some embodiments they include blue dies. In some embodiments the spectra emitted by the distinct LEDs have a different ratio of blue to violet; for instance, one LED has only violet dies and phosphors, and the second LED has only blue dies and phosphors.

Typically a 3-way bulb has to be used in a compatible fixture with a 3-way switch, which will contact either or both of the lines. In some embodiments however, a 3-way switch is integrated to the bulb, rather than being in the socket. Therefore the bulb can be placed in a conventional non-3-way fixture. The selection of the emitted spectrum can be obtained by using the 3-way switch on the bulb.

Aspects of embodiments can be combined, resulting in a light bulb having two or more LED sources, the two or more LED sources having different spectra, the bulb having at least three electrodes, such that upon driving current in the electrodes the several LED sources can be driven in at least two configurations to emit two different spectra.

In addition to the aforementioned lamps, the LED devices in accordance with the present disclosure include the embodiments shown in the following FIG. 42 through FIG. 54.

The discussions herein discuss limitations of conventional LEDs and approaches to address these limitations are disclosed.

One such limitation is the strong polarization fields in blue c-plane InGaN LEDs. The lack of strong polarization-induced electric fields that plague conventional devices on c-plane GaN leads to a greatly enhanced radiative recombination efficiency in the light emitting InGaN layers. For polar materials, the deleterious effects of polarization fields may be reduced by reducing the InN content of the active region, and/or reducing the barrier thicknesses in multi-quantum well (MQW) active region structures. Also, for any surface orientation, the bulk native substrate provides for device geometry that may be scaled down to provide lower costs (in dollars per lumen) compared to approaches based on foreign substrates like sapphire SiC, or Si. Furthermore, the reduced dislocation densities provided by bulk GaN offer assurance of high reliability at high current densities, which is not guaranteed by foreign substrate approaches.

As the input current in a light emitting diode is increased, the optical output power increases as the associated higher number of injected electrons are converted into photons. In an "ideal" LED the light output would continue increasing linearly with increased current such that small LEDs could be driven to very high current densities to achieve high output power. In practice, however, this light output vs. current input characteristic of light emitting diodes has been fundamentally limited by a phenomenon where the radiative efficiency of conventional light emitting diodes decreases as the current density increases. It has been observed that such phenomena causes rollover or a sublinear increase in output power vs. current. This results in only marginal increase in total flux as the input current is increased.

Figure 42:
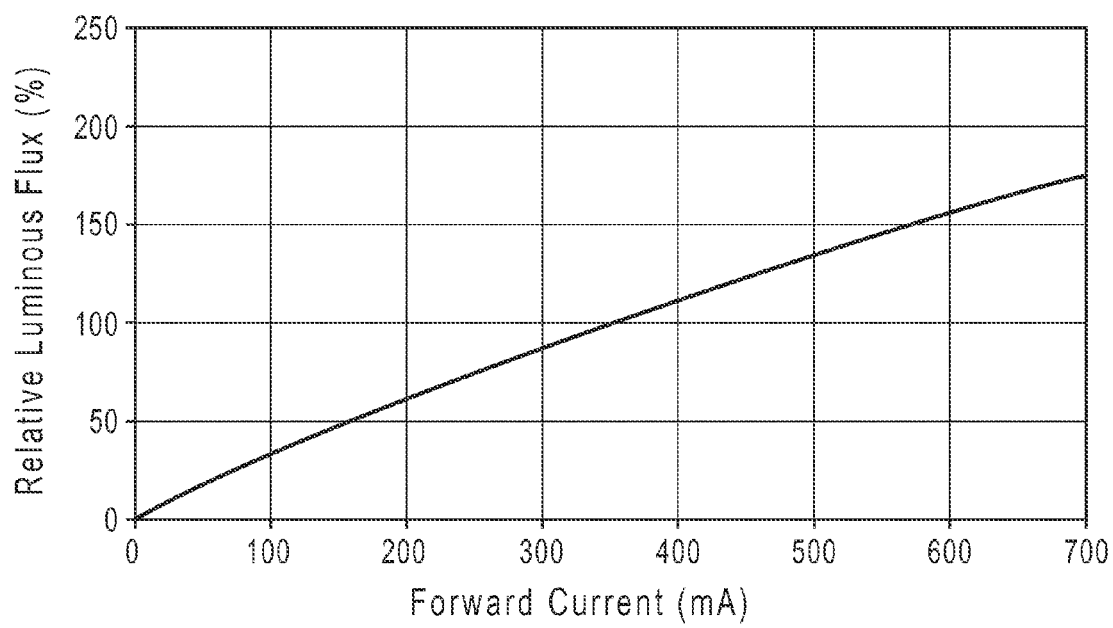
FIG. 42 shows a sample plot of relative luminous flux as a function of injection current for a conventional LED and a Cree XP-E white LED with junction temperature of 25° C.

FIG. 42 shows a sample plot 4200 of relative luminous flux as a function of injection (forward) current for a conventional LED, and a Cree XP-E white LED with junction temperature of 25° C. The plot shows that the relative luminous flux at 350 mA (approximately 30-50 A/cm$^2$) is 100% while at 700 mA the relative luminous flux is only approximately 170%. This shows that for a conventional LED a roll-off in efficiency for the LED of approximately 15% occurs over the operating range from approximately 30-50 A/cm$^2$ to 60-100 A/cm$^2$. In addition, the peak efficiency for this diode occurs at an even lower operating current density, indicating that the roll-off in efficiency from the peak value is even greater than 15% were the diode to be operated at 700 mA.

Due to the phenomenon, conventional light emitting diodes are typically operated at lower current densities than provided by the present method and devices, typically less than from 50 A/cm$^2$. This operating current density restriction has placed practical limits on the total flux that is possible from a single conventional light emitting diode. Common approaches to increase the flux from an LED package include increasing the active area of the LED (thereby allowing the LED to have a higher operating current while maintaining a suitably low current density), and packaging several LED die into an array of LEDs, whereby the total current is divided amongst the LEDs in the package. While these approaches have the effect of generating more total flux per LED package while maintaining a suitably low current density, they are inherently more costly due to the requirement of increased total LED die area. One or more embodiments describe a method and device for lighting based on one or more small-chip high brightness LEDs offering high efficiency operating at current densities in excess of conventional LEDs while maintaining a long operating lifetime.

There is a large body of work that establishes conventional knowledge of the limitations of operating LEDs at high current density with efficient operation. This body of work includes the similarity in operating current density for high brightness LEDs that have been commercialized by the largest LED manufacturers, and a large body of work referencing the "LED Droop" phenomena. Examples of commercial LEDs include Cree's XP-E, XR-E, and MC-E packages and Lumileds K2 and Rebel packages. Similar high brightness LEDs are available from companies such as Osram, Nichia, Avago, Bridgelux, etc. that all operate in a current density range much lower than proposed in this disclosure either through limiting the total current, increasing the die size beyond 1 mm², or packaging multiple LED chips to effectively increase the LED junction area. Examples of literature referencing and showing the LED "droop" phenomena are described by Shen et al. in Applied Physics Letters, 91, 141101 (2007), and Michiue et al. in the Proceedings of the SPIE Vol. 7216, 72161Z-1 (2009) by way of example. In addition, Gardner et al. in Applied Physics Letters, 91, 243506 (2007) explicitly state in reference to this phenomena and attempts to overcome it that typical current densities of interest for LEDs are 20-400 A/cm² with their double heterostructure LED grown on a sapphire substrate showing a peak efficiency at approximately 200 A/cm² and then rolling off above that operating point. In addition to the limits in maintaining device efficiency while operating at high current density, it has been shown that as the current density is increased in light emitting devices, the lifetime of the devices degrades below acceptable levels with this degradation being correlated with dislocations in the material. Tomiya et. al. demonstrated in IEEE J. of Quantum Elec., Vol. 10, No. 6 (2004) that light emitting devices fabricated on reduced dislocation density material allowed for higher current operation without the decrease in lifetime that was observed for devices fabricated on high dislocation material. In their studies, dislocation reduction was achieved by means of lateral epitaxial overgrowth on material grown heteroepitaxially. To date, conventional methods related to light emitting diodes related to alleviating or minimizing the droop phenomena have not addressed growth and device design of light emitting diodes grown and fabricated on bulk substrates. A further explanation of conventional LED devices and their quantum efficiencies are described in more detail below.

Figure 43:
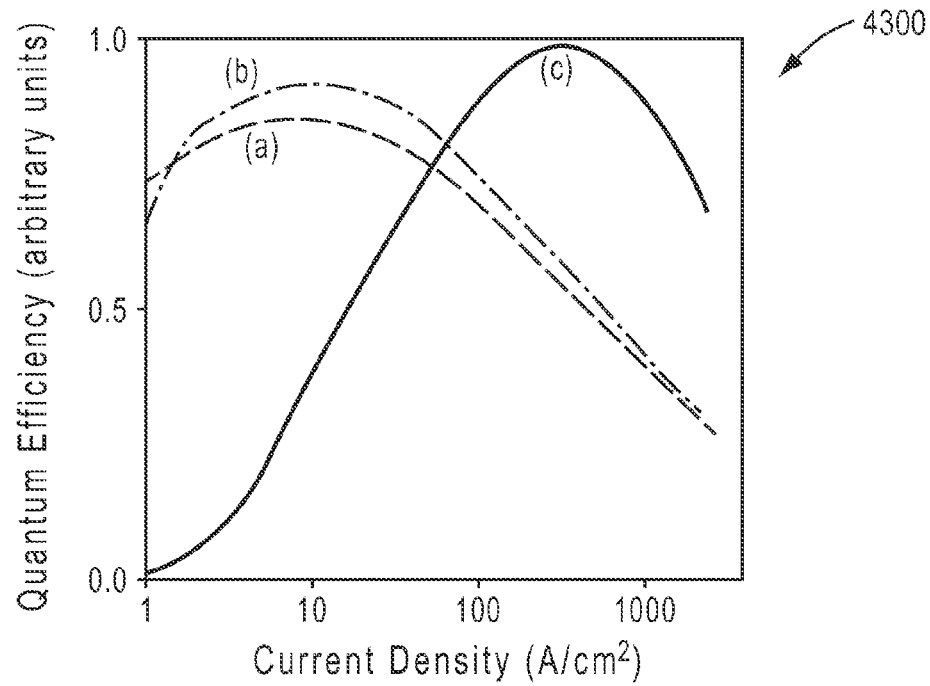
FIG. 43 shows two types of variations in the external quantum efficiency as a function of current density

FIG. 43 shows two types of variations in the external quantum efficiency as a function of current density. FIG. 43 is taken from Gardner et al., "Blue-emitting InGaN-GaN double-heterostructure light-emitting diodes reaching maximum quantum efficiency above 200 A/cm²", Applied Physics Letters 91, 243506 (2007). The behavior shown in reference letters (a) and (b) of FIG. 43 are representative of that of conventional LEDs. With one or more relatively thin quantum wells, for example, less than about 4 nm thick, the external quantum efficiency peaks at a current density of about 10 A per square centimeter or less and drops relatively sharply at higher current densities. The external quantum efficiency at higher current densities can be increased by increasing the thickness of the active layer, for example, to approximately 13 nanometers. However, referring to curve (c), in this case the external quantum efficiency is very low at current densities below about 30 amperes per square centimeter (A/cm²) and also at current densities above about 300 A/cm², with a relatively sharp maximum in between. Ideal would be an LED with an external quantum efficiency that was approximately constant from current densities of about 20 A/cm² to current densities above about 200 A/cm², above about 300 A/cm², above about 400 A/cm², above about 500 A/cm², or above about 1000 A/cm².

Schmidt et al. in Jap. J. of Appl. Phys. Vol. 46, No. 7, 2007 previously demonstrated an LED with a peak emission wavelength of 408 nm that was grown on a bulk non-polar m-Plane substrate with a threading dislocation density of less than $1\times10^6$ cm$^{-2}$. Despite the use of a high-quality bulk substrate with a non-polar orientation, the devices demonstrated in this work showed a peak external quantum efficiency of only 38.9%. These and other limitations of conventional techniques have been overcome in part by the present method and devices, which are described throughout the present specification and more particularly below.

Figure 44:
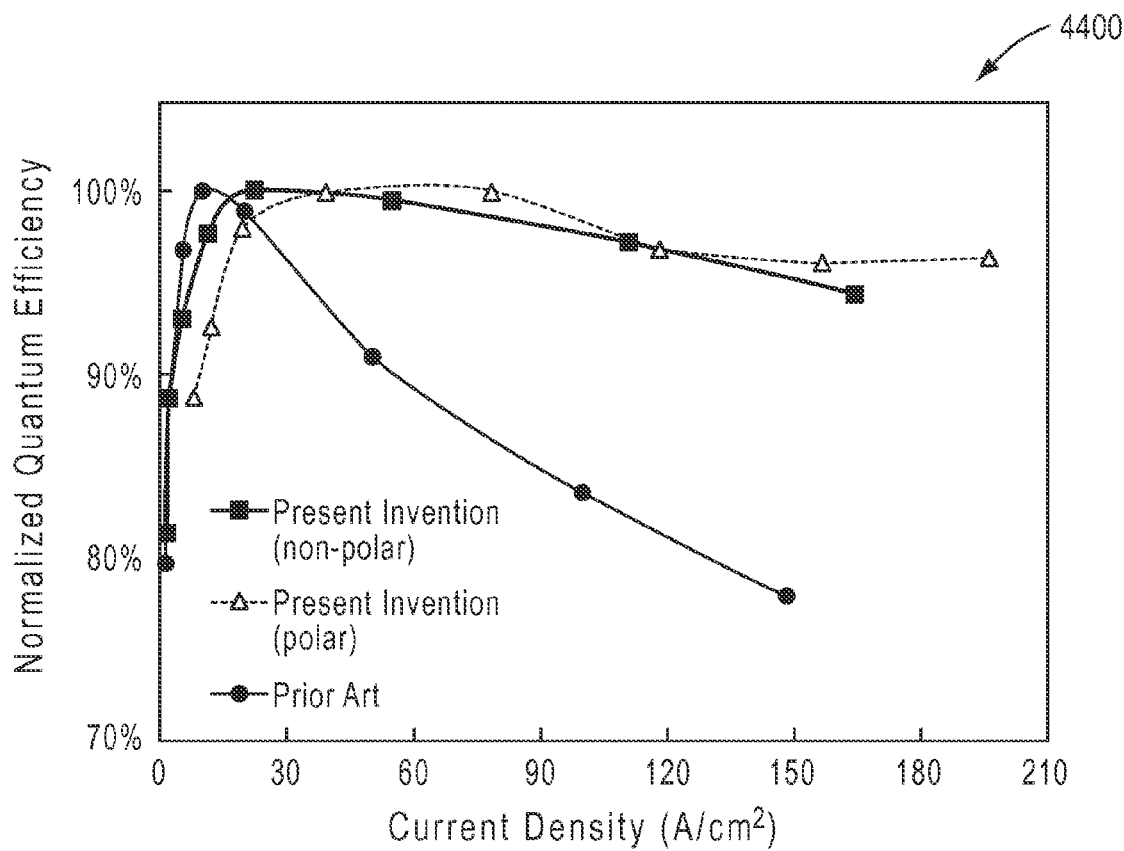
FIG. 44 illustrates quantum efficiency plotted against current density for LED devices according to an embodiment of the present disclosure.

FIG. 44 illustrates quantum efficiency plotted against current density for LED devices according to an embodiment of the present disclosure and for a prior art device. As shown, the present devices are substantially free from current droop (less than about 10 percent), which is significant. Further details of the present device can be found throughout the present specification and more particularly below.

Figure 45:
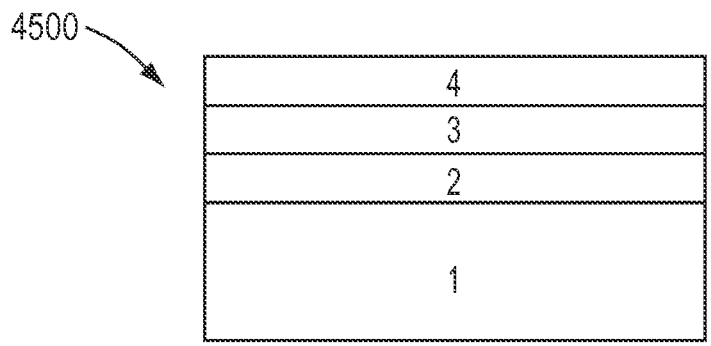
FIG. 45 is a diagram of a high current density epitaxially grown LED structure according to an embodiment of the present disclosure.

FIG. 45 is a diagram 4500 of a high current density epitaxially grown LED structure according to an embodiment of the present disclosure. This diagram is merely an example, which should not unduly limit the scope of the claims herein. One of ordinary skill in the art would recognize other variations, modifications, and alternatives. In one or more embodiments, the LED structure includes at least:

1. A bulk GaN substrate, including a polar, semipolar or non-polar surface orientation. Further details are provided below:
   Any orientation, e.g., polar, non-polar, semi-polar, c-plane.
   (Al,Ga,In)N based material.
   Threading dislocation (TD) density <$10^8$ cm$^{-2}$.
   Stacking fault (SF) density <$10^4$ cm$^{-1}$.
   Doping >$10^{17}$ cm$^{-3}$.
2. An n-Type (Al)(In)GaN epitaxial layer(s) having a thickness ranging from about 1 nm to about 10 μm and a dopant concentration ranging from about $1\times10^{16}$ cm$^{-3}$ to about $5\times10^{20}$ cm$^{-3}$. Further details are provided below:
   Thickness <2 μm, <1 μm, <0.5 μm, <0.2 μm.
   (Al,Ga,In)N based material.
   Growth T<1200° C., <1000° C.
   Unintentionally doped (UID) or doped.
3. A plurality of doped and/or undoped (Al)(In)GaN active region layers. Further details are provided below:
   At least one (Al,Ga,In)N based layer.
   Quantum Well (QW) structure with one ore more wells.
   QWs are >20 Å, >50 Å, >80 Å in thickness.
   QW and n- and p-layer growth temperature identical, or similar.
   Emission wavelength <575 nm, <500 nm, <450 nm, <410 nm.
4. A p-Type (Al)(In)GaN epitaxial layer(s) having a thickness ranging from about 10 nm to about 500 nm and a dopant concentration ranging from about $1\times10^{16}$ cm$^{-3}$ to about $1\times10^{21}$ cm$^{-3}$. Further details are provided below:
   At least one Mg doped layer.
   Thickness <0.3 μm, <0.1 μm.
   (Al,Ga,In)N based.
   Growth T<1100° C., <1000° C., <900° C.
   At least one layer acts as an electron blocking layer.
   At least one layer acts as a contact layer.

In a specific embodiment, epitaxial layers are deposited on the substrate by metalorganic chemical vapor deposition (MOCVD) at atmospheric pressure. The ratio of the flow rate of the group V precursor (ammonia) to that of the group III precursor (trimethyl gallium, trimethyl indium, trimethyl aluminum) during growth is between about 3000 and about 12000. In a specific embodiment, a contact layer of n-type (silicon-doped) GaN is deposited on the substrate, with a thickness of less than 5 microns and a doping level of about $2 \times 10^{18}$ cm$^{-3}$.

In a specific embodiment, an undoped InGaN/GaN multiple quantum well (MQW) is deposited as the active layer. The MQW active region has two to twenty periods, comprising alternating layers of 2-12 nm of InGaN and 1-20 nm of GaN as the barrier layers. Next, a 5-30 nm undoped AlGaN electron blocking layer is deposited on top of the active region. In other embodiments, the multiple quantum wells can be configured slightly differently. Of course, there can be other variations, modifications and alternatives. The substrate and resulting epitaxial surface orientation may be polar, nonpolar or semipolar. In one or more other embodiments, the bulk wafer can be in an off-axis configuration, which causes formation of one or more smooth films. In or more embodiments, the overlying epitaxial film and structures are characterized by a morphology being smooth and relatively free from pyramidal hillocks. Further details of the off-axis configuration and surface morphology can be found throughout the present specification and more particularly below. As an example, however, details of the off cut embodiment is described in U.S. Pat. No. 8,247,887 and in U.S. Application Publication No. 2013/0075770.

A method according to embodiments for forming a smooth epitaxial film using an offcut or miscut or off-axis substrate is outlined below:

1. Provide GaN substrate or boule.
2. Perform off-axis miscut of GaN substrate to expose desired surface region or process substrate or boule (e.g., mechanical process) to expose off-axis oriented surface region, and perform polishing operations to provide an epi-ready surface.
3. Transfer GaN substrate into MOCVD process chamber.
4. Provide a carrier gas selected from nitrogen gas, hydrogen gas, or a mixture of them.
5. Provide a nitrogen bearing species such as ammonia or the like.
6. Raise MOCVD process chamber to growth temperature, e.g., 700 to 1200° C.
7. Maintain the growth temperature within a predetermined range.
8. Combine the carrier gas and nitrogen bearing species such as ammonia with group III precursors such as the indium precursor species tri-methyl-indium and/or tri-ethyl-indium, the gallium precursor species tri-methyl-gallium and/or tri-ethyl-gallium, and/or the aluminum precursor tri-methyl-aluminum into the chamber.
9. Form an epitaxial film containing one or more of the following layers GaN, InGaN, AlGaN, InAlGaN.
10. Cause formation of a surface region of the epitaxial gallium nitride film substantially free from hillocks and other surface roughness structures and/or features.
11. Repeat steps (7) and (8) for other epitaxial films to form one or more device structures.
12. Perform other desired processing steps.

The above sequence of steps provides a method according to an embodiment of the present disclosure. In a specific embodiment, the present disclosure provides a method and resulting crystalline epitaxial material with a surface region that is substantially smooth and free from hillocks and the like for improved device performance. Although the above has been described in terms of an off-axis surface configuration, there can be other embodiments having an on-axis configuration using one or more selected process recipes, which have been described in more detail throughout the present specification and more particularly below. Other alternatives can also be provided where steps are added, one or more steps are removed, or one or more steps are provided in a different sequence without departing from the scope of the claims herein.

As merely an example, the present method can use the following sequence of steps in forming one or more of the epitaxial growth regions using an MOCVD tool operable at atmospheric pressure, or low pressure, in some embodiments:

1. Start.
2. Provide a crystalline substrate member comprising a backside region and a surface region, which has been offcut or miscut or off-axis.
3. Load substrate member into an MOCVD chamber.
4. Place substrate member on susceptor, which is provided in the chamber, to expose the offcut or miscut or off-axis surface region of the substrate member.
5. Subject the surface region to a first flow (e.g., derived from one or more precursor gases including at least an ammonia containing species, a Group III species, and a first carrier gas) in a first direction substantially parallel to the surface region.
6. Form a first boundary layer within a vicinity of the surface region.
7. Provide a second flow (e.g., derived from at least a second carrier gas) in a second direction configured to cause change in the first boundary layer to a second boundary layer.
8. Increase a growth rate of crystalline material formed overlying the surface region of the crystalline substrate member.
9. Continue crystalline material growth to be substantially free from hillocks and/or other imperfections.
10. Cease flow of precursor gases to stop crystalline growth.
11. Perform other steps and repetition of the above, as desired.

The above sequence of steps provides methods according to an embodiment of the present disclosure. As shown, the method uses a combination of steps including a way of forming a film of crystalline material using MOCVD. In some embodiments, the present disclosure includes atmospheric pressure (e.g., 700-800 Torr) growth for formation of high quality gallium nitride containing crystalline films that are smooth and substantially free from hillocks, pyramidal hillocks, and other imperfections that lead to degradation of the electrical or optical performance of the device, including droop. In some embodiments, a multiflow technique is provided.

Figure 46:
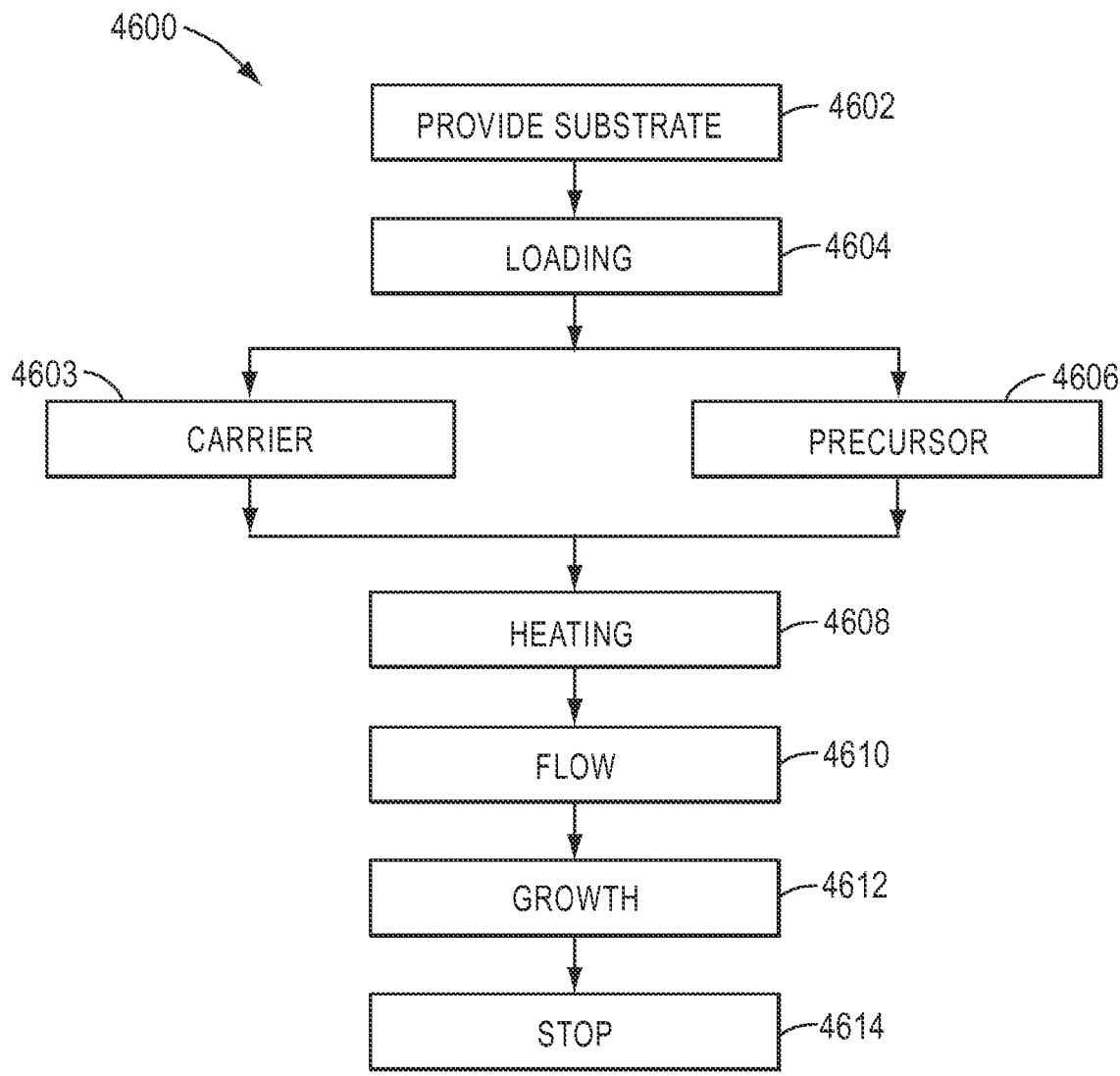
FIG. 46 is a flow diagram of a method for fabricating an improved GaN film according to an embodiment of the present disclosure.

FIG. 46 is a flow diagram 4600 of a method for fabricating an improved GaN film according to an embodiment of the present disclosure. The method provides a crystalline substrate member having a backside region and a surface region. The crystalline substrate member can include a gallium nitride wafer, or the like.

As shown, the method includes providing a substrate step 4602, placing or loading (step 4604) the substrate member into an MOCVD chamber. In a specific embodiment, the method supplies one or more carrier gases, and one or more nitrogen bearing precursor gases, step 4603 and 4606, which are described in more detail below. In one or more embodiments, the crystalline substrate member is provided on a susceptor from the backside to expose the surface region of the substrate member. The susceptor is preferably heated using resistive elements or other suitable techniques. In a specific embodiment, the susceptor is heated (step 4608) to a growth temperature ranging from about 700° C. to about 1200° C.

In a specific embodiment, the present method includes subjecting the surface region of the crystalline substrate to a first flow 4610 in a first direction substantially parallel to the surface region. In a specific embodiment, the method forms a first boundary layer within a vicinity of the surface region. In a specific embodiment, the first boundary layer is believed to have a thickness ranging from about 1 mm to about 1 cm, but can be other thicknesses. Further details of the present method can be found below.

Depending upon the embodiment, a flow 4610 is preferably derived from one or more precursor gases including at least an ammonia containing species, a Group III species, and a first carrier gas, and possibly other entities. Ammonia is a Group V precursor according to a specific embodiment. Other Group V precursors include $N_2$. In a specific embodiment, the first carrier gas can include hydrogen gas, nitrogen gas, argon gas, or other inert species, including combinations. In a specific embodiment, the Group III precursors include TMGa, TEGa, TMIn, TMAl, dopants (e.g., Cp2Mg, disilane, silane, diethelyl zinc, iron, manganese, or cobalt containing precursors), and other species.

Depending upon the embodiment, the method also continues with epitaxial crystalline material growth 4612, which is substantially smooth and free of hillocks or other imperfections. In a specific embodiment, the method also can cease flow of precursor gases to stop growth and/or perform other steps. In a specific embodiment, the method stops at step 4614. In some embodiments, the present method causes formation of a gallium nitride containing crystalline material that has a surface region that is substantially free of hillocks and other defects, which lead to poorer crystal quality and can be detrimental to device performance. In a specific embodiment, at least 90% of the surface area of the crystalline material is free from pyramidal hillock structures.

The above sequence of steps provides methods according to an embodiment of the present disclosure. As shown, the method uses a combination of steps including a way of forming a film of crystalline material using MOCVD. In some embodiments, the present disclosure includes a flow technique provided at atmospheric pressure for formation of high quality gallium nitride containing crystalline films, which have surface regions substantially smooth and free from hillocks and other defects or imperfections. The above sequence of steps provides a method according to an embodiment of the present disclosure. In a specific embodiment, the resulting crystalline material is substantially free from hillocks for improved device performance.

In one or more embodiments, a p-type GaN contact layer is deposited, with a thickness of about 200 nm and a hole concentration greater than about $5 \times 10^{17}$ cm$^{-3}$. An Ohmic contact layer is deposited onto the p-type contact layer as the p-type contact and may be annealed to provide desired characteristics. Ohmic contact layers include Ag-based single- or multi-layer contacts, indium-tin-oxide (ITO) based contacts, Pd based contacts, Au based contacts, and others. LED mesas, with a size of about 250×250 µm², are formed by photolithography and dry etching using a chlorine-based inductively-coupled plasma (ICP) technique. The wafer is diced into discrete LED dies using techniques such as laser scribe and break, diamond scribe and break, sawing, water-jet cutting, laser ablation, or others. Electrical connections are formed by conventional die-attach and wire bonding steps.

Figure 47:
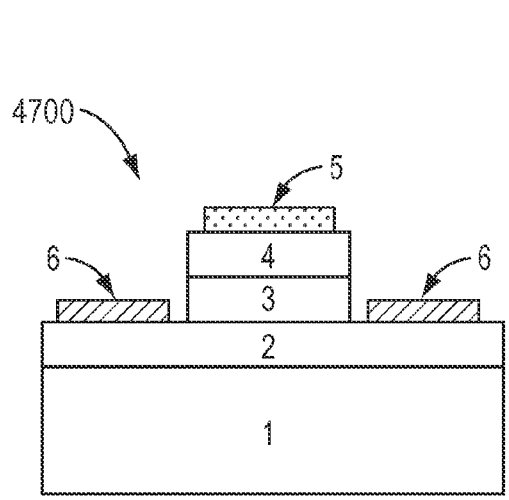
FIG. 47 is a diagram illustrating a high current density LED structure with electrical connections according to an embodiment of the present disclosure.

FIG. 47 is a diagram 4700 illustrating a high current density LED structure with electrical connections according to an embodiment of the present disclosure. This diagram is merely an illustration, which should not unduly limit the scope of the claims herein. One of ordinary skill in the art would recognize other variations, modifications, and alternatives. As shown, the LED structure is characterized as a top-emitting lateral conducting high current density LED according to a specific embodiment. Preferably, the LED structure includes at least:

1. A bulk GaN substrate, including polar, semipolar or non-polar surface orientation.
2. An n-Type (Al)(In)GaN epitaxial layer(s) having a thickness ranging from about 1 nm to about 10 µm and a dopant concentration ranging from about $1 \times 10^{16}$ cm$^{-3}$ to about $5 \times 10^{20}$ cm$^{-3}$.
3. A plurality of doped and/or undoped (Al)(In)GaN active region layers.
4. A p-Type (Al)(In)GaN epitaxial layer(s) having a thickness ranging from about 10 nm to about 500 nm and a dopant concentration ranging from about $1 \times 10^{16}$ cm$^{-3}$ to about $1 \times 10^{21}$ cm$^{-3}$.
5. A semi-transparent p-type contact made of a suitable material such as indium tin oxide, zinc oxide and having a thickness ranging from about 5 nm to about 500 nm.
6: An n-type contact made of a suitable material such as Ti/Al/Ni/Au or combinations of these metals, Ti/Al/Ti/Au or combinations of these metals having a thickness ranging from about 100 nm to about 7 µm.

Figure 48:
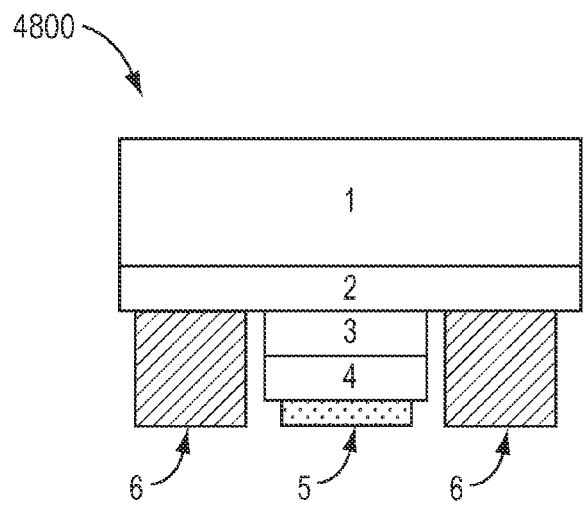
FIG. 48 is a diagram of a substrate-emitting lateral conducting high current density LED device according to an embodiment of the present disclosure.

FIG. 48 is a diagram 4800 of a substrate-emitting lateral conducting (i.e., "flip-chip") high current density LED device according to an embodiment of the present disclosure. In this embodiment, the LED device includes at least:

1. A bulk GaN substrate.
2. An n-Type (Al)(In)GaN epitaxial layer(s).
3. A plurality of doped and/or undoped (Al)(In)GaN active region layers.
4. A p-Type (Al)(In)GaN epitaxial layer(s).
5. A reflective p-type contact.
6. An n-type contact.

Figure 49:
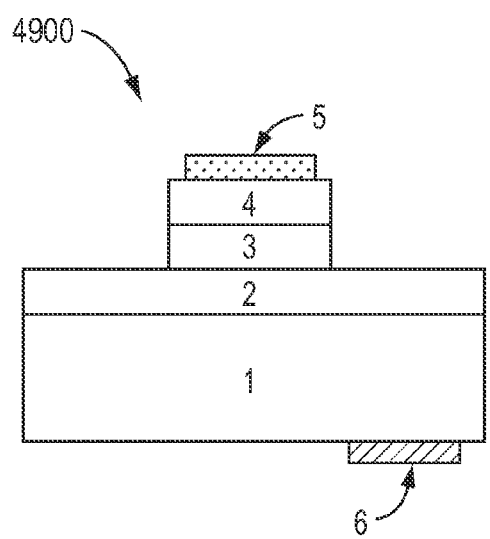
FIG. 49 is a diagram of a substrate-emitting vertically conducting high current density LED according to a specific embodiment of the present disclosure.

FIG. 49 is a diagram 4900 of a substrate-emitting vertically conducting high current density LED according to a specific embodiment of the present disclosure. The LED device includes at least:

1. A bulk GaN substrate.
2. An n-Type (Al)(In)GaN epitaxial layer(s).
3. A plurality of doped and/or undoped (Al)(In)GaN active region layers.
4. A p-Type (Al)(In)GaN epitaxial layer(s).
5. A reflective p-type contact.
6. An n-type contact.

Figure 50A:
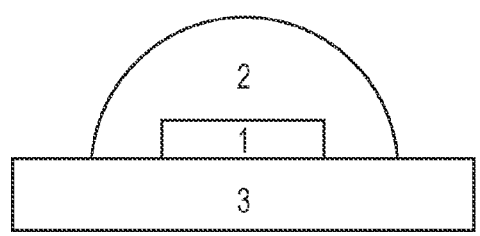
FIG. 50A is an example of a packaged white LED containing a high current density LED device according to an embodiment of the present disclosure.

FIG. 50A is an example of a packaged white LED containing a high current density LED device according to an embodiment of the present disclosure. In a specific embodiment, the packaged LED device includes at least:

1. A high current density LED device.
2. An encapsulant or lens material which may or may not contain a combination of red-, green-, blue-, orange-, and yellow-emitting or other color down-conversion materials in a configuration such that white light is produced when the down-conversion materials are contained in the encapsulant or lens.

3. An LED package that provides an electrical connection to the LED and a path for thermal dissipation from the subject apparatus to the surrounding environment.

Other examples of packaged devices can be found in U.S. Application Publication No. 2011/0186887. In other embodiments, the packaged device includes an array configuration such as described in U.S. Application Publication No. 2011/0186874, which is incorporated by reference in its entirety. The present LED device can be configured in an array formed on a substrate member. Such techniques are disclosed in U.S. Application No. 2013/0026483 and in U.S. Provisional Application No. 61/936,000, filed on Feb. 5, 2014, each of which is incorporated by reference in its entirety.

Figure 50B:
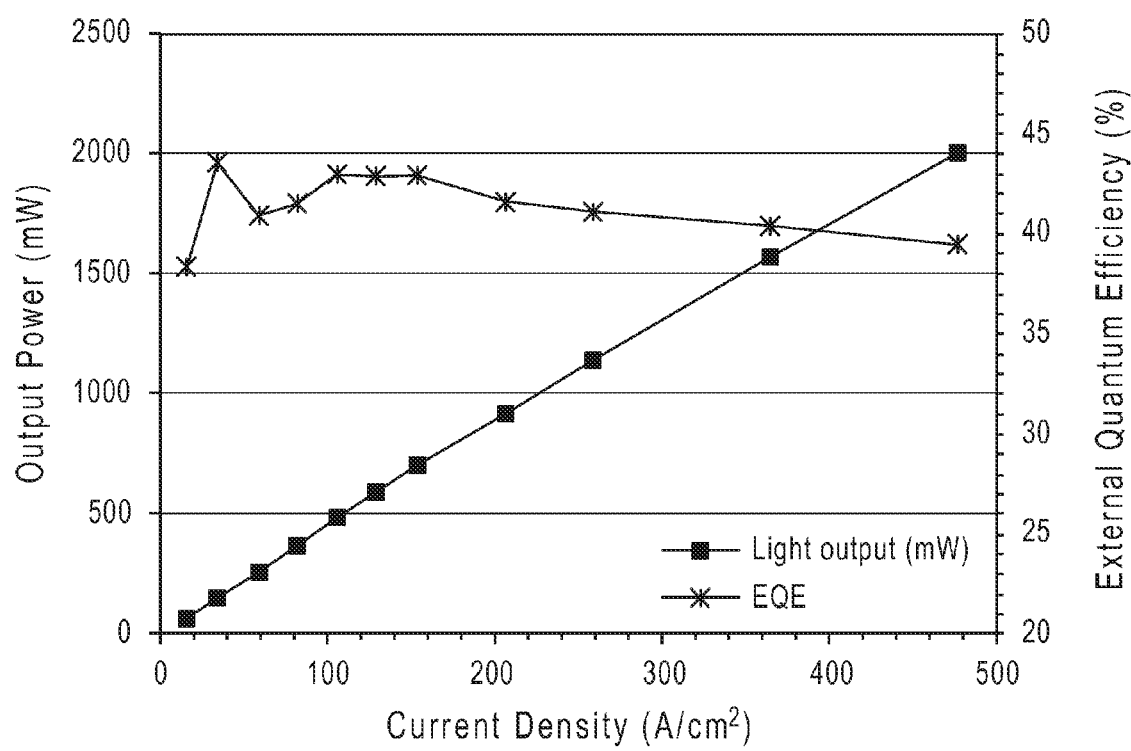
FIG. 50B is diagram showing pulsed output power vs. current density and external quantum efficiency vs. current density for an LED according to one or more embodiments.

FIG. 50B is a plot of die EQE vs. current density. It shows that embodiments of the disclosure exhibit an EQE of more than 40%, and more than about 45%, at current densities below 200 A/cm$^2$. The plot shows pulsed output power vs. current density and external quantum efficiency vs. current density for an LED fabricated on GaN with an emission wavelength of about 405 nm according to one or more embodiments. This plot is merely an illustration, which should not unduly limit the scope of the claims herein. One of ordinary skill in the art would recognize other variations, modifications and alternatives. Of particular mention is the small decrease in external quantum efficiency up to approximately four times higher operating current density than for conventional LEDs that have been fabricated in accordance with the prior techniques. In some embodiments, the device uses an indium tin oxide (ITO) as a contact material configured for operation at high current density. In a some embodiments, the high current density is 200 A/cm$^2$, for example as high as 500 A/cm$^2$, or even 1000 A/cm$^2$ and greater. The ITO material is substantially free from degradation and free from imperfections. The junction temperature of the LED under operating conditions is greater than about 100° C., and often greater than about 150° C., or even above about 200° C. In some embodiments, the LED is able to operate in continuous wave (CW) mode without active cooling, and in some cases without passive cooling.

Other embodiments provide a resulting device and method using bulk gallium and nitrogen containing material for improved reliability. That is, growth on the bulk GaN substrates increases reliability at the high current densities. In contrast, conventional LEDs grown on foreign substrates are imperfect and include multiple defects. It is believed that such defects caused by the heteroepitaxial growth limit the device lifetime and therefore prohibit operation at high current densities. The LEDs according to one or more embodiments should not suffer from the same defects. In a some embodiments, the lifetime windows are >500 hrs CW, >1000 hrs CW, >2000 hrs CW, >5000 hrs CW, or others.

In a specific embodiment, the present disclosure also includes LED based lighting fixtures and replacement lamps. As an example, goals of these lighting fixtures are to produce an acceptable level of light (total lumens), of a desirable appearance (color temperature and CRI), with a high efficacy (lm/W), at a low cost. While these characteristics are all desirable, there are typically design tradeoffs that must be considered which result in some, but not all of the requirements being met. Some embodiments of the present disclosure propose LED based fixtures and lamps that are based on light emitting diodes grown on bulk III-Nitride substrates such as a bulk gallium nitride substrate. These LEDs exhibit surprisingly different performance characteristics compared with conventional LEDs that are grown heteroepitaxially on foreign substrates such as sapphire, silicon carbide, silicon, zinc oxide, and the like. The characteristics that these bulk III-Nitride based LEDs exhibit enable very different lamp/fixture designs that are currently not believed to be possible with conventional LEDs.

Conventional light sources, incandescent, halogen, fluorescent, HID, and the like have well defined standard characteristics. This standardization allows for a high degree of knowledge on the operating characteristics that are required from LED based lamps when designing light sources that are made to be replacements for the incumbent technology. While there is a vast array of lighting products on the market, there are a large number of standard lamps or fixtures that have been the subject of intense research for LED based replacement solutions. Some examples of these lamp/fixtures, while not exhaustive, include A-lamps, fluorescent tubes, compact CFLs, metallic reflectors of various sizes (MR), parabolic reflectors of various sizes (PAR), reflector bulbs (R), single- and double-ended quartz halogens, candelabras, globe bulbs, high bays, troffers, and cobra-heads. A given lamp will have characteristic luminous outputs that are dictated by the input power to the lamp. For example, a 20 W MR-16 fixture will typically emit approximately 300 lm, a 30 W MR-16 will emit 450 lm, and a 50 W MR-16 will emit 700 lm. To appropriately replace these fixtures with an LED solution, the lamp must conform to the geometrical sizing for MR16 lamps and reach minimum levels of luminous flux.

Despite these specified guidelines, there are relatively few true replacement lamps that are designed with LEDs that reach the luminous flux desired and have either a comparable or higher luminous efficacy, motivating the end user to switch from the incumbent technology. Those products that do meet these requirements are prohibitively expensive, which has led to extremely slow adoption. A large portion of this cost is dictated by the number of LEDs required for LED based lamps to reach the luminous flux and luminous efficacy of current technology. This has occurred despite the high luminous efficacy that is typically reported for LEDs, which is much lower in an SSL lamp than specified as a discrete device.

Figure 51:
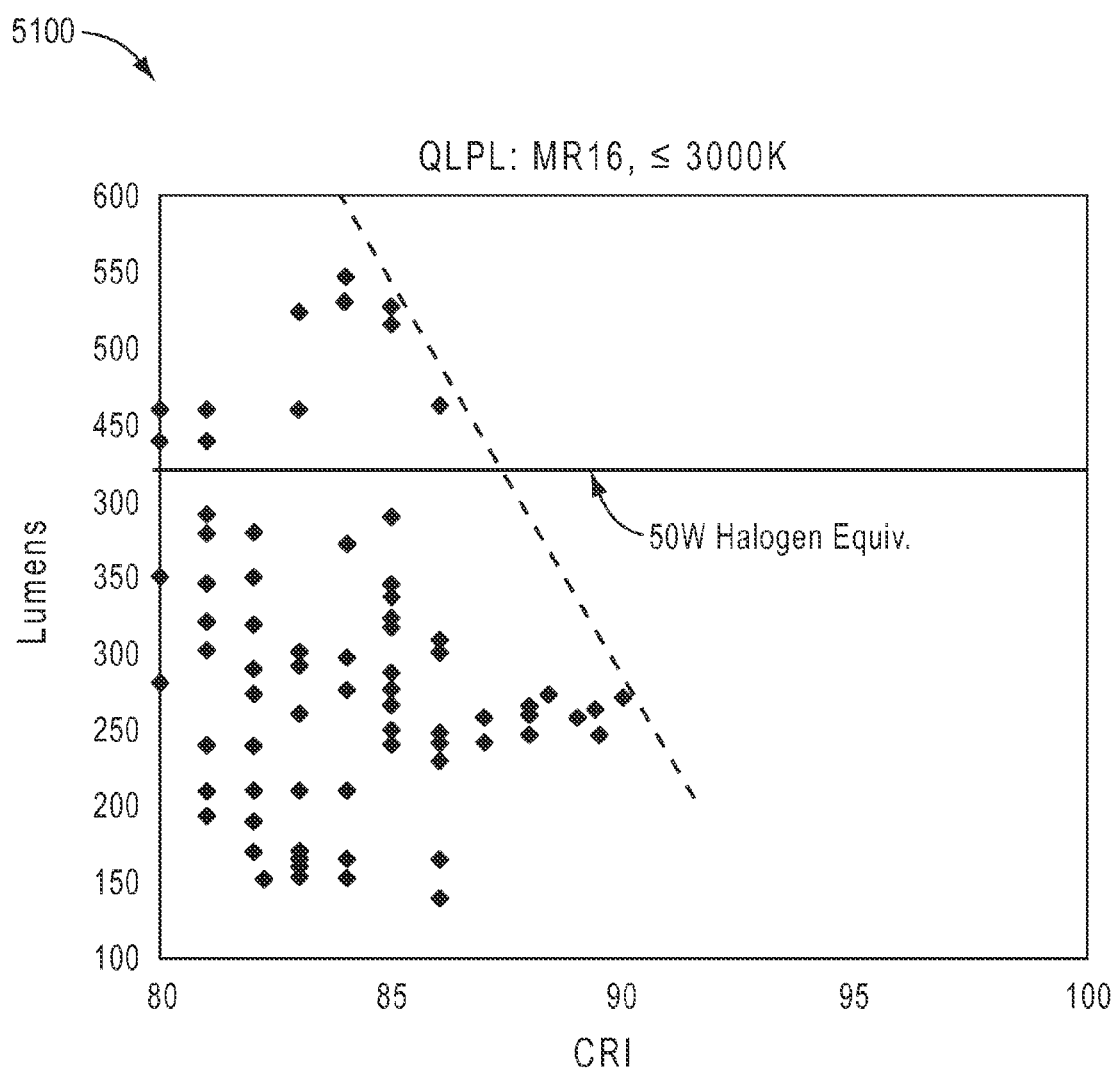
FIG. 51 is a diagram showing pulsed output power vs. current density and external quantum efficiency vs. current density for an LED, according to one or more embodiments.

FIG. 51 is a diagram 5100 showing pulsed output power vs. current density and external quantum efficiency vs. current density for an LED fabricated on GaN with an emission wavelength of about 405 nm according to one or more embodiments. This diagram is merely an illustration, which should not unduly limit the scope of the claims herein. One of ordinary skill in the art would recognize other variations, modifications, and alternatives. Of particular mention is the small decrease in external quantum efficiency up to approximately four times higher operating current density than for conventional LEDs that have been fabricated in the prior art. Other examples are provided in FIG. 44.

The junction temperature of the LED under operating conditions is greater than about 100° C., and often greater than about 150° C. In some embodiments, the LED is able to operate in continuous wave (CW) mode without active cooling, and in some cases without passive cooling.

Figure 52:
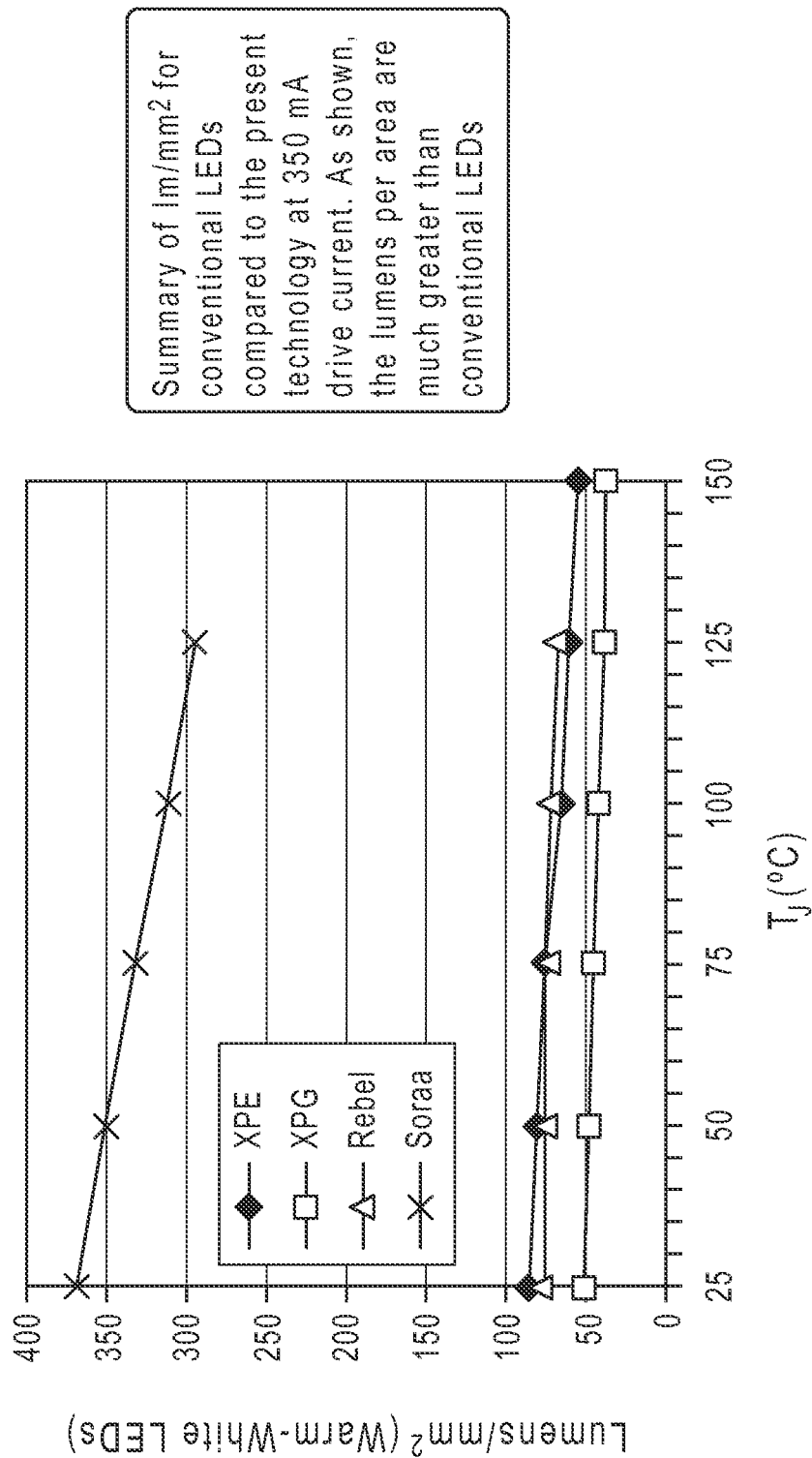
FIG. 52 through FIG. 54 are experimental results for LED devices, according to one or more embodiments.
Figure 53:
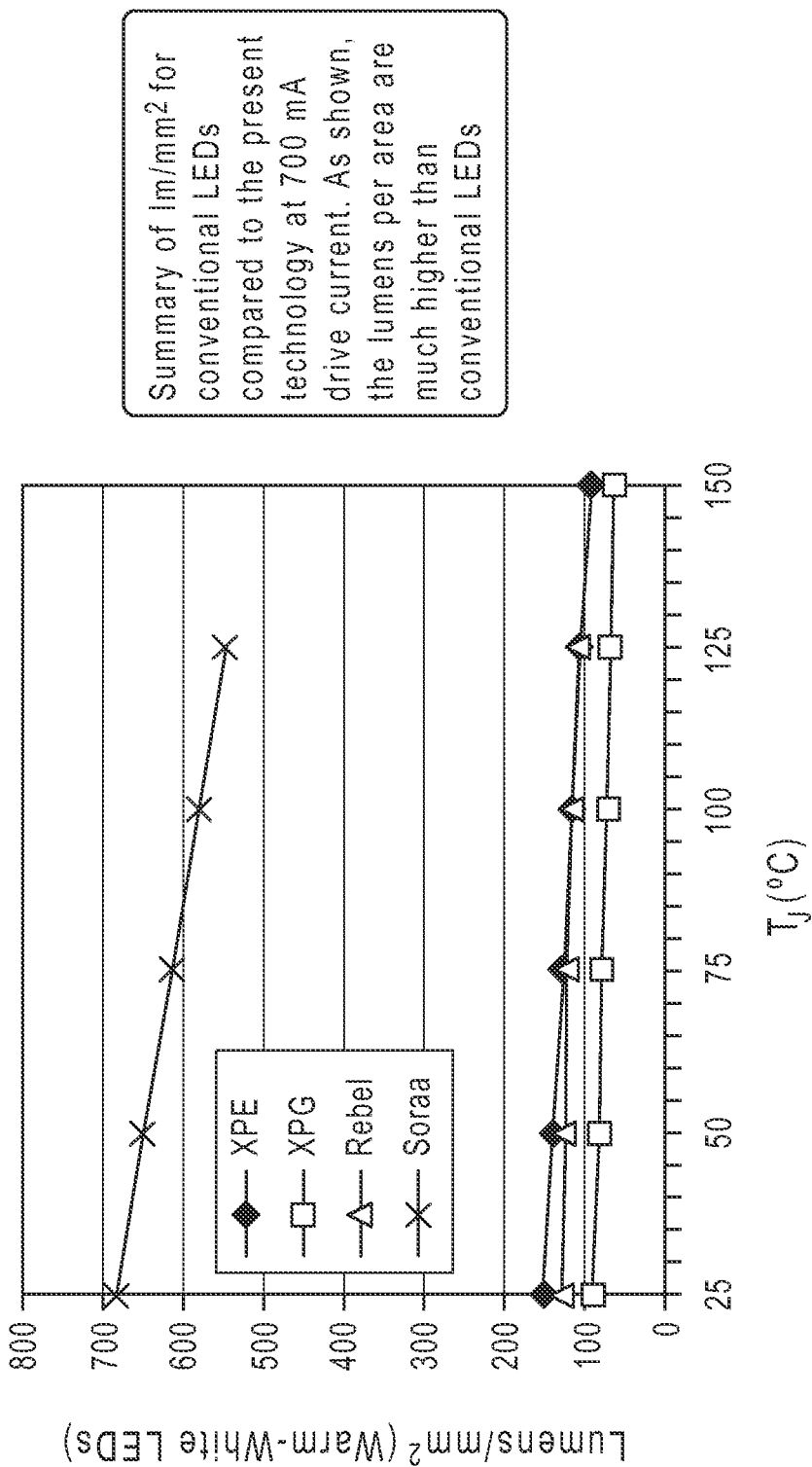
Figure 54:
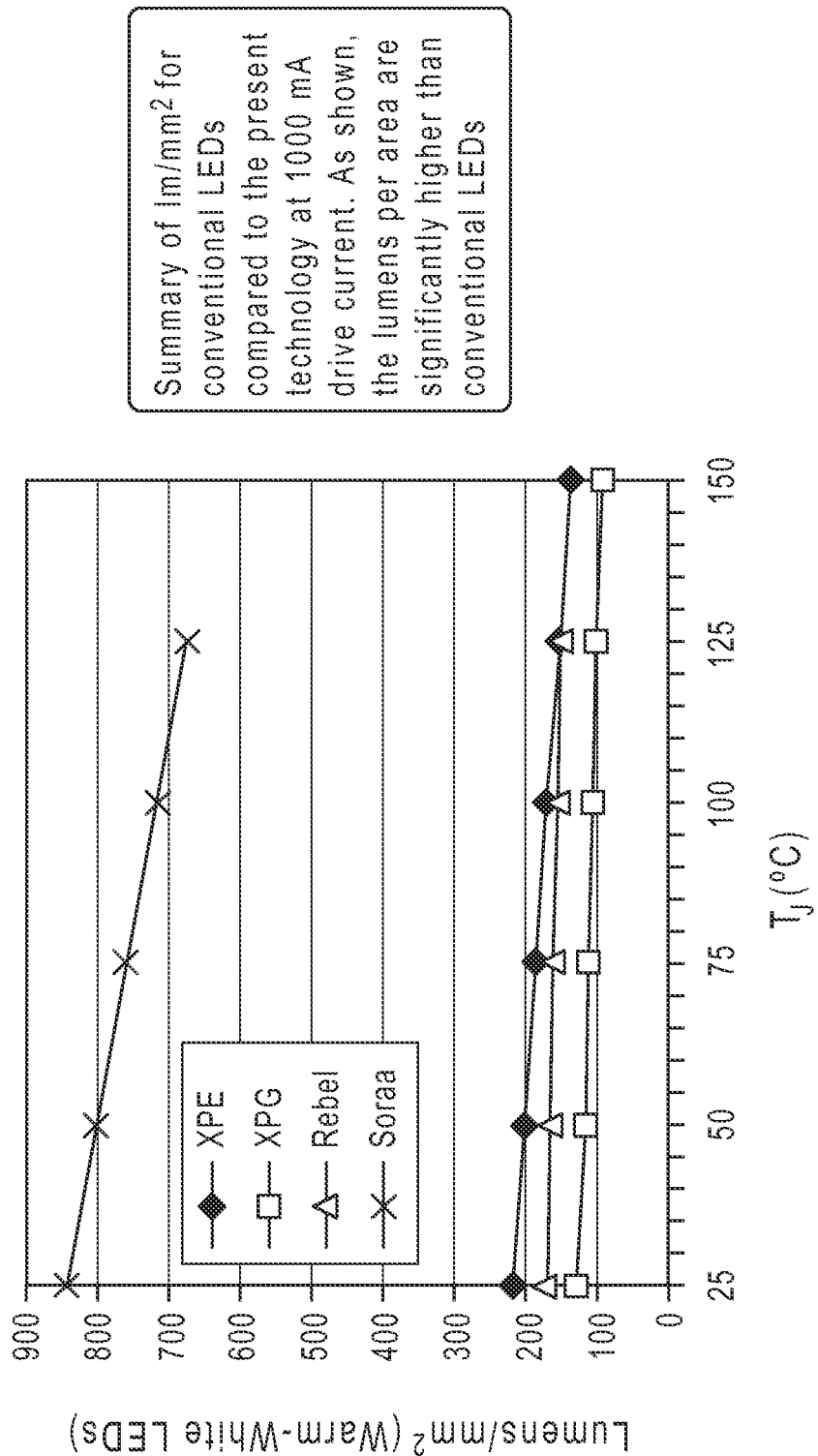

Summary performance in terms of lumens per base LED area (total LED chip plan-view area) is shown in FIG. 52, FIG. 53 and FIG. 54, which are experimental results for LED devices in comparison to 350 mA, 700 mA, and 1000 mA drive per mm$^2$ for conventional LEDs. Using the elements described herein, increased LED output lumen density can be achieved and is several times higher than for conventional LEDs, leading to lower cost lighting products through reduced LED chip area and smaller optics, which in turn facilitates techniques for improved heat sinking.

In other embodiments, the present disclosure provides a resulting device and method using bulk gallium and nitrogen containing material for improved reliability. That is, growth on the bulk GaN substrates increases reliability at the high current densities. In contrast, conventional LEDs grown on foreign substrates are imperfect and include multiple defects. It is believed that such defects caused by the heteroepitaxial growth limit the device lifetime and therefore prohibit operation at high current densities. The LEDs according to one or more embodiments should not suffer from the same defects. In a some embodiments, the lifetime windows are >1000 hrs CW, >10000 hrs CW, >25000 hrs CW, >50000 hrs CW, or others.

Returning to the FIG. 51, the diagram 5100 illustrates the performance limitations of legacy LED based lamps. It can be shown that in order to replicate the output power of a 20 W halogen bulb, the LED equivalent must generate at least 270 lumens of flux with a luminous efficacy in excess of 13 lm/W. While even with de-rating, the results show that most products exceed the luminous efficacy of the halogen incumbent, only one product generated enough total flux to claim equivalence to a 20 W MR16. In addition, this product achieved this flux by mounting a large number (>4) of high power LEDs into the MR16 fixture, resulting in a fixture with greater than 4 mm$^2$ of LED junction active area. The cost of the lamp increases approximately linearly as the total junction active area for the LEDs increases. Thus, it is highly desirable to decrease the total active junction area of LED that is contained within a given lamp, while still maintaining the desired total flux and efficacy.

Typical LEDs that are grown heteroepitaxially are unable to maintain high flux while decreasing the active area size because of current and thermal "droop". As the current density is increased in an LED, the relative efficiency has been shown to decrease. This effect can result in a decrease in relative radiative efficiency from 100% at about 10 A/cm$^2$ to 50% at about 100 A/cm$^2$.

In certain embodiments, LED devices provided by the present disclosure use the structures and techniques as shown in FIG. 55 through FIG. 63, as follows.

Figure 55:
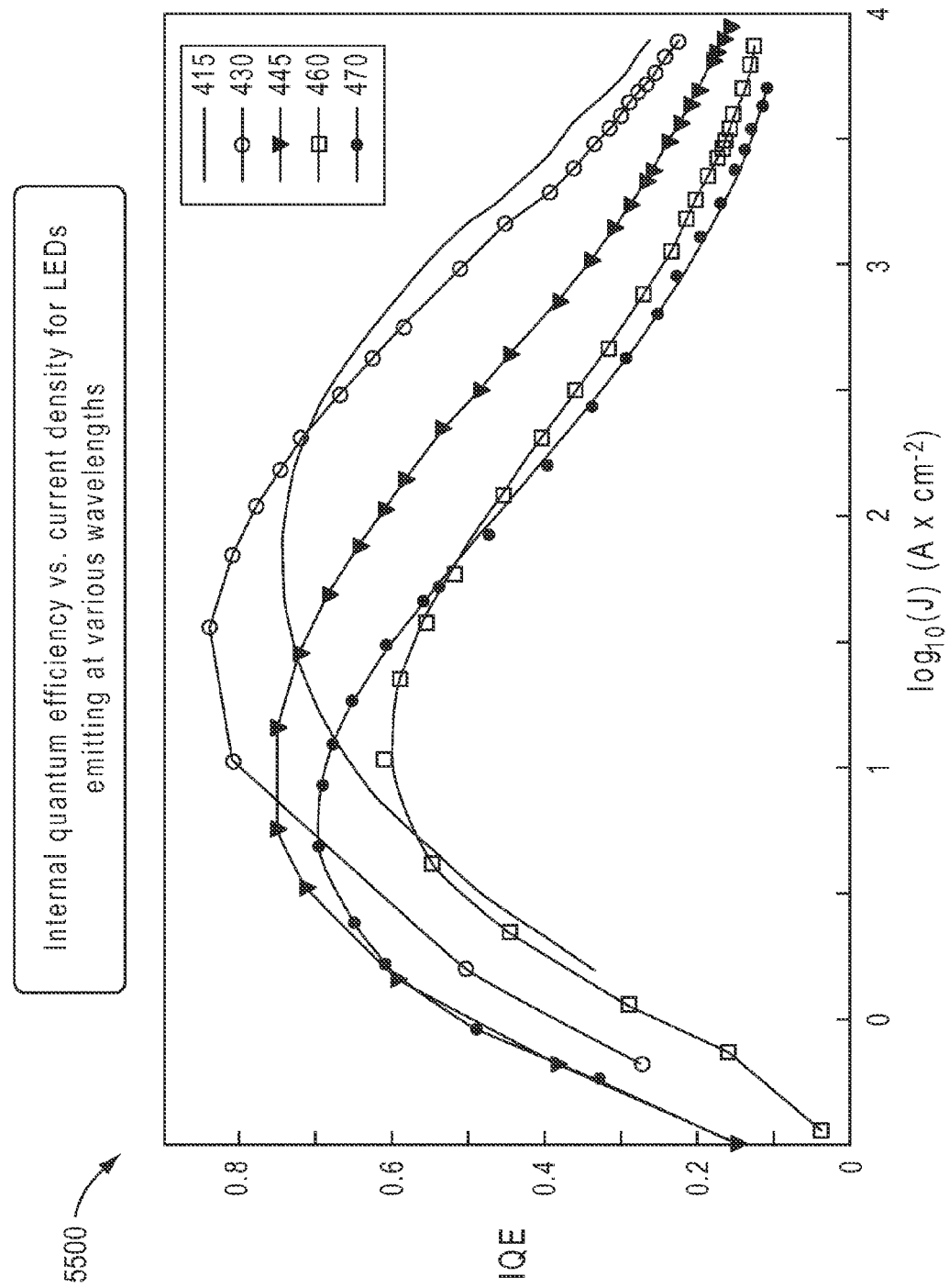
FIG. 55 illustrates the efficiency characteristics of LEDs emitting at various wavelengths, according to one or more embodiments.

FIG. 55 illustrates the efficiency characteristics of LEDs emitting at various wavelengths. Short-wavelength LEDs (415-430 nm) maintain efficiency at much higher carrier densities than long-wavelength LEDs (445 nm and above). FIG. 55 is taken from "Influence of polarization fields on carrier lifetime and recombination rates in InGaN-based light-emitting diodes", David et al, Appl. Phys. Lett. 97, 033501 (2010), which describes the increase of the polarization fields in longer-wavelength LEDs. The article "Carrier distribution in (0001)InGaN/GaN multiple quantum well light-emitting diodes", David et al, Appl. Phys. Lett. 92, 053502 (2008), discusses the difficulty in spreading carriers between the quantum wells in 450 nm-pump LEDs.

The blue light from the pump LED contributes to the white spectrum. Therefore, the amount of blue light that is transmitted by the phosphors needs to be well-controlled to achieve a given CCT. Variations in the wavelength of the pump LED need to be accounted for in the phosphor composition/loading. Accounting for the differences in wavelength can be a challenging task when manufacturing white LEDs.

State-of-the-art results for 440-nm pump LEDs can be found in the article "White light emitting diodes with super-high luminous efficacy", Narukawa et al, J. Phys. D 43, 354002 (2010). At room temperature and a current density of about 100 A/cm$^2$, an external quantum efficiency of 65% is reported. Assuming an extraction efficiency of about 90% and a performance drop of about 10% between room temperature and a 100° C. junction temperature, this corresponds to an IQE of about 65% at 100 A/cm$^2$ and 100° C.

Another conventional approach consists in using a pump LED whose emission peak is in the 395 nm to 405 nm range to pump a system of three or four phosphors. This is advantageous because 400 nm pump LEDs typically retain higher performance at a higher current density than 445 nm pump LEDs, presumably due to the lower piezoelectric fields and to the thick active regions.

Employing an LED emitter whose final spectra is minimally affected (in color or brightness) by the presence or absence of the emitter wavelength in the final spectra allows for stable performance over drive currents and temperatures. Proper selection of color-stable phosphor materials for the devices range of operation (e.g., a 405 nm emitter's spectral weight) is only 1.5% that of a 450 nm emitter). A 420 nm emitter's spectral weight is still only 10% of that of a 450 nm emitter. Stability in color and flux of a finished phosphor-converted LED is increased dramatically over a traditional blue pump device where as much as 20% of the final spectrum is comprised of the underlying emitter at 450 nm.

The elimination of the need to target a certain amount of emitter light leakage in the final spectra also offers improved color yield in a manufacturing environment. The manufacturing phosphor deposition process for an about 405 nm to 430 nm pump device can accept more process variance without sacrificing large-volume color repeatability. In turn, this allows a manufacturing process to run with higher throughput without loss in repeatability.

Use of three or more component colors (chip emission and at least two phosphors) offers a larger tunable color gamut for a phosphor-converted LED device than does a two-component color system. A large range of tunable colors and color rendering indices become available. A two-color component white LED will only have one possible cross section with the Planckian curve (one point to achieve a balanced white spectrum) whereas a three or more color system allows for infinite tunability along the Planckian curve. This approach, however, suffers from various limitations:

1. The Stokes loss between the pump wavelengths and the phosphors wavelengths is larger, so more energy is lost in the phosphor down-conversion process. The comparatively larger band gap of a 400 nm pump LED causes a larger operation voltage. The reduced carrier confinement in the active region of a 400 nm pump LED makes it easier for carriers to escape, and therefore decreases the high-temperature performance. Most materials have a significantly larger absorption at 400 nm than at 445 nm (this is the case for high-reflectivity metals such as Al and Ag which are commonly used in LEDs, of silicones, of some substrates such as GaN or SiC, and of Au wire bonds) which decreases the light-extraction efficiency.
2. There has not been focused development on phosphors for use with 380-430 nm excitation light. This places the performance levels of the available phosphor materials behind the state-of-the-art phosphor performance enjoyed by LED manufacturers employing 450 nm pump LEDs for use with materials such as $Y_3Al_5O_{12}$:$Ce^{3+}$ (YAG-yellow) and $CaAlSiN$:$Eu^{2+}$ (red) which have had both time and pressure applied to their improvements.

Figure 56:
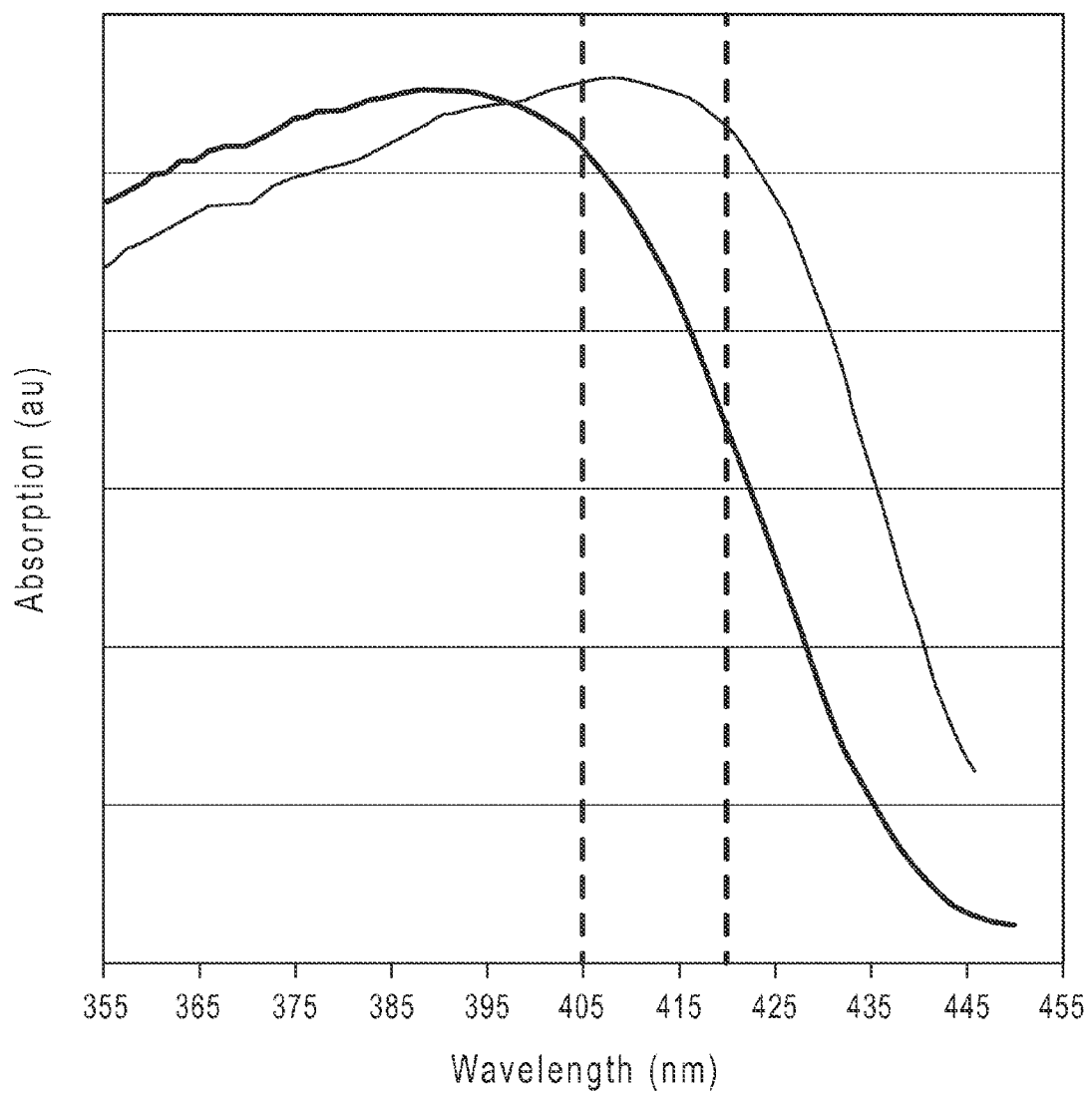
FIG. 56 and FIG. 57 illustrate absorption properties of blue phosphors and the corresponding white LED performance depending on the emission wavelength of the LED, according to one or more embodiments.
Figure 57:
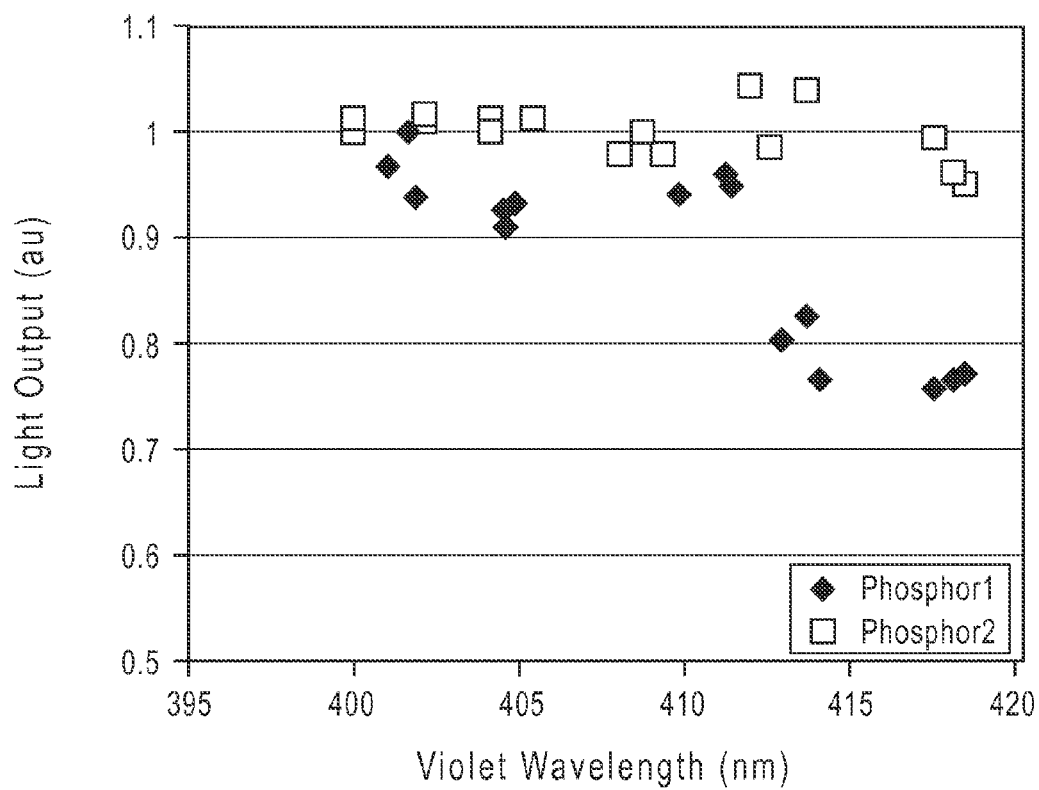

3. Due to this offset in state-of-the-art phosphor material performance, not all of the available phosphors can be used in high performance LED devices. Prime examples are blue phosphors which are not suitable for use with all chip-emission wavelengths. The absorption characteristics of two blue-emitting phosphors are shown in FIG. 56. In graph 5600 vertical lines indicate the position of a 405 nm and 420 nm emitter relative to these two phosphor absorption curves. Though the two materials absorption strengths are similar at 405 nm, they are clearly not the same at 420 nm. This reduction in absorption strength of the first phosphor materially affects the device performance with longer-wavelength emitters. This change in performance is shown in FIG. 57 depicting graph 5700 comparing the light output for phosphor 1 and phosphor 2 with wavelength.

Present embodiments provide white LED light sources with high performance.

Among other things, the disclosure provides a new approach to high-CRI white LEDs. For example, the white LED light source comprises pump LED(s) whose peak emission is in the range of about 405 nm to 430 nm and a system of three or more phosphors (such as blue, green, and red). A substantially white spectrum is produced by the phosphor emission.

One advantage of the embodiments of the disclosure is that a pump LED in the range of about 405 nm to 430 nm can display a very high IQE at high carrier density (similar to a 400 nm pump LED) due to the moderate strain and piezoelectric fields. The carrier confinement in the active region, on the other hand, is significantly improved so that the high-temperature performance is not compromised. The lower band gap compared to a 400 nm LED also enables a lower forward voltage. Therefore, the range of about 405 nm to 430 nm is optimal from the standpoint of pump LED performance. High IQE performance for such LEDs (at a current density of 100 A/cm$^2$ and a junction temperature 100° C.) can be better than 70% and even exceed 90%. This is to be compared to about 65% for state-of-the art LEDs emitting at 440 nm as described in the prior art.

In addition, optical absorption in most materials is significantly reduced between 400 nm and about 405 nm to 430 nm, yielding overall larger light-extraction efficiency. Also, as explained above, the use of three or more phosphors to generate white light is advantageous in terms of color control and process stability. Blue phosphors are available with strong absorption in the range of about 405 nm to 430 nm, and with high quantum efficiency. Some examples of blue-emitting phosphors with strong absorption in this wavelength range are $BaMgAl_{10}O17:Eu^{2+}$, $Sr_{10}(PO_4)_6Cl_2$:E, $LaAl(Si_{6-z}Al_z)N_{10-z}O_z:Ce^{3+}$, a-Sialon:$Ce^{3+}$, (Y,La)—Si—O—N:$Ce^{3+}$, $Gd_{1-x}Sr_{2+x}AlO_{5-x}F_x:Ce^{3+}$. The Stokes loss is also mitigated in comparison to a 400 nm pump LED.

Figure 58:
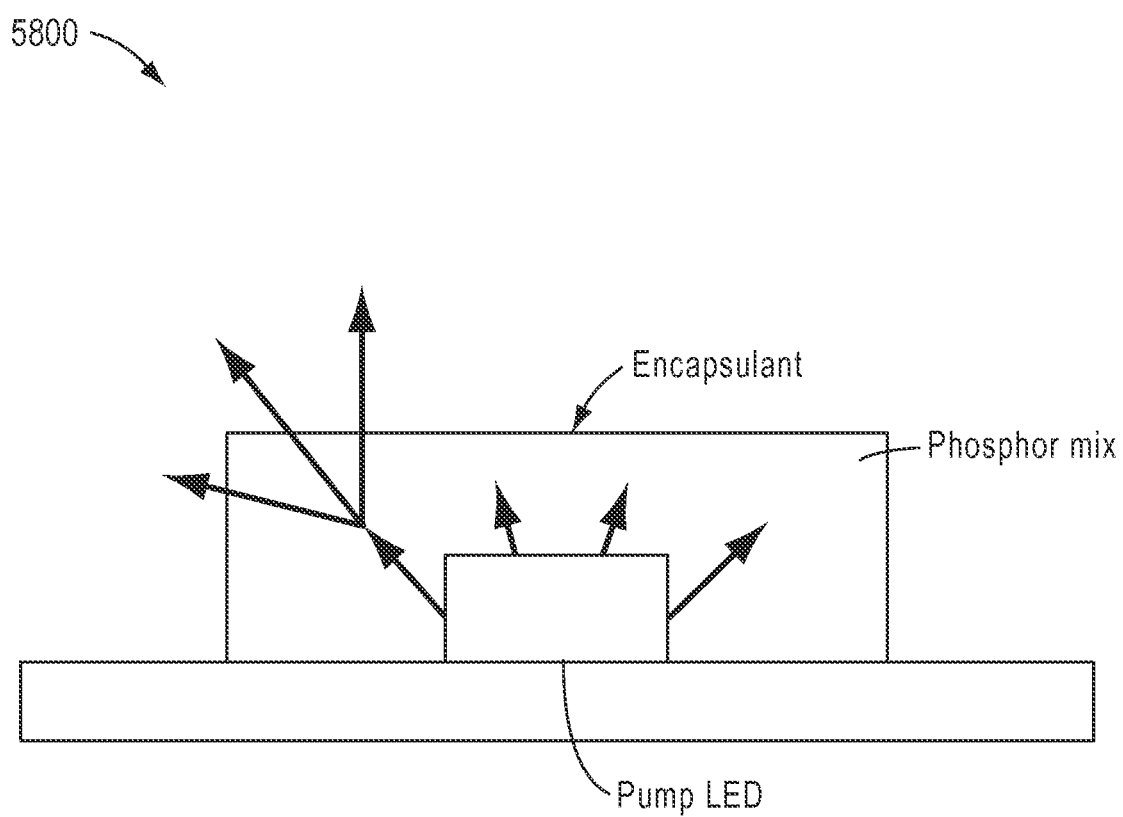
FIG. 58 illustrates an embodiment of the disclosure where an LED with peak emission is in the range of about 405-430 nm pumps blue-, red-, and green-emitting phosphors.

FIG. 58 illustrates an embodiment of the disclosure 5800, where an LED with peak emission is in the range of about 405 nm to 430 nm pumps blue-, red-, and green-emitting phosphors. As shown in FIG. 58, a pump LED source is provided on a substrate or a submount. For example, the pump LED source emits radiation at a wavelength of about 405 nm to 430 nm. The pump LED source is disposed in a mix of phosphor materials, which absorbs the radiation emitted by the LED source. The phosphor materials are excited by the pump LED and emit blue, green, and red light. In a some embodiments, the mix of phosphors is specifically adapted to emit white light by the combination of emissions from the phosphors. The mix of phosphor materials is disposed in an encapsulant which is substantially transparent to both pump-LED-source and phosphor-emitted light.

Depending on the application, the encapsulant may include various types of materials. In a some embodiments, the encapsulant is specifically configured to improve light-extraction efficiency. For example, the encapsulant material can comprise polymeric species. In some embodiments, the pump LED source emits radiation in the wavelength range from about 405 nm to 430 nm and pumps three phosphors (e.g., a blue, a green, and a red phosphor) that are mixed together, and the phosphor mix converts a substantial fraction of the pump LED source light to longer wavelength light. Of course, the phosphor mix may contain additional phosphors, e.g., an amber phosphor can be added to increase CRI.

In various embodiments, the wavelength emitted by the LED changes due to changes in temperature. For example, a pump LED emits radiation at a wavelength of about 398 nm at room temperature. When temperature increases to about 120° C., the pump LED emits radiation at about 405 nm. Typically, high current and/or high temperature are the main causes of wavelength shift. For example, for each increase of 23° C. in operating temperature, the wavelength of the radiation emitted by the pump LED increases by 1 nm. The encapsulant and the phosphor material used in various embodiments of the disclosure can compensate for the wavelength shift.

Figure 59A:
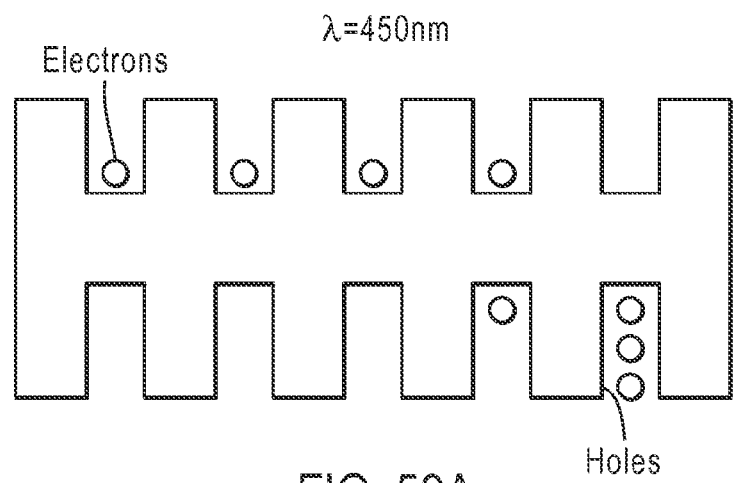
FIG. 59A and FIG. 59B illustrate carrier spreading in multi-quantum well LEDs emitting at 450 nm and 420 nm, respectively, according to one or more embodiments.
Figure 59B:
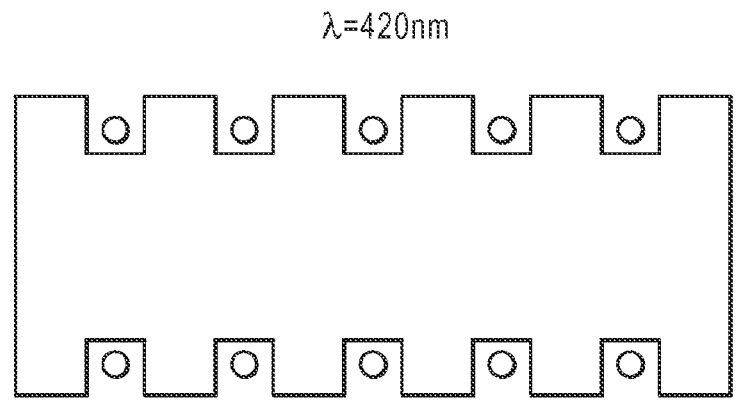

FIG. 59A and FIG. 59B illustrate carrier spreading in multi-quantum well (MQW) LEDs emitting at 450 nm (left, FIG. 59A) and 420 nm (right, FIG. 59B). In a 450 nm-emitting scheme 59A00, the energy barriers are larger, which can impede spreading of the holes between the quantum wells. As shown, electrons are more or less spread evenly, while holes are not. In contrast, in a 420 nm-emitting scheme 59B00, the energy barriers are lower and hole spreading is thus improved, thereby increasing the effective volume of the active region. Better optimized carrier spreading is achieved by embodiments of the present disclosure. More specifically, carrier confinement can be reduced compared to that a 450 nm pump LED, which enables better carrier spreading in a MQW system. Therefore, one can employ a thick active region (for instance, more than 10 nm thick or more than 50 nm thick) and inject carriers efficiently across this active region, as illustrated in FIG. 59.

Figure 60:
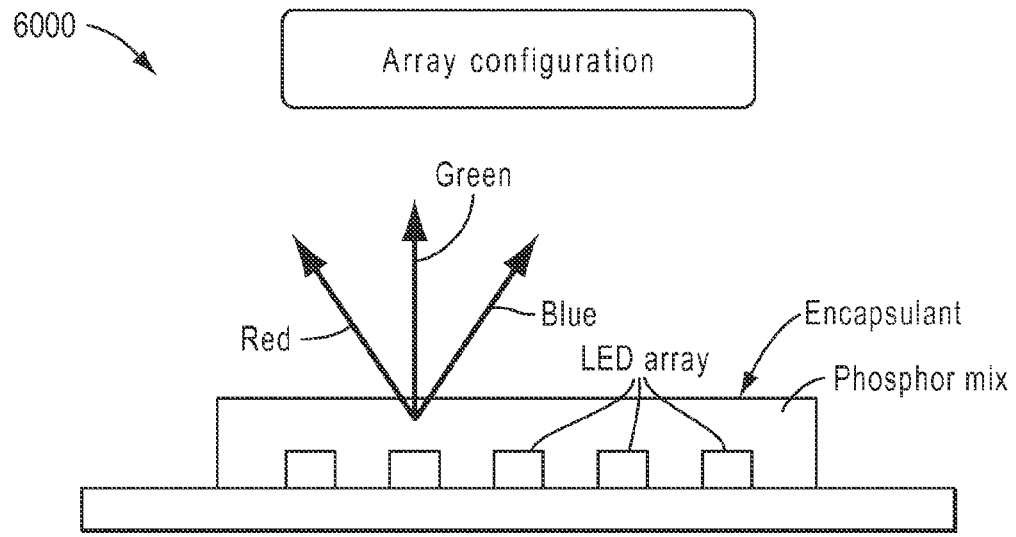
FIG. 60 illustrates an embodiment of the disclosure where five pump LEDs are arranged in an array, according to one or more embodiments.

FIG. 60 illustrates an embodiment 6000 of the disclosure where five pump LEDs are arranged in an array. In this implementation the LEDs emit at about 405 nm to 430 nm. The LEDs are disposed as a phosphor mix that is specifically made for color conversion. As described above, the phosphor mix comprises phosphor materials which have a high absorption of the light emitted by the pump LEDs. For example, the phosphor mix comprises one or more of the following materials: $BaMgAl_{10}O_{17}:Eu^{2+}$, $Sr_{10}(PO_4)_6Cl_2$:E, $LaAl(Si_{6-z}Al_z)N_{10-z}O_z:Ce^{3+}$, a-Sialon:$Ce^{3+}$, (Y,La)—Si—O—N:$Ce^{3+}$, $Gd_{1-x}Sr_{2+x}AlO_{5-x}F_x:Ce^{3+}$. The phosphor mix is prepared for converting the light from the pump LEDs to light in other colors such as red, green, and/or blue. When the light in different colors is combined, preferably substantially white light is produced. The mix of phosphor materials is disposed in an encapsulant, which is substantially transparent to both pump-LED and phosphor-emitted light. In some embodiments, the encapsulant is specifically configured to improve light extraction efficiency and is formed from polymeric species.

Figure 61:
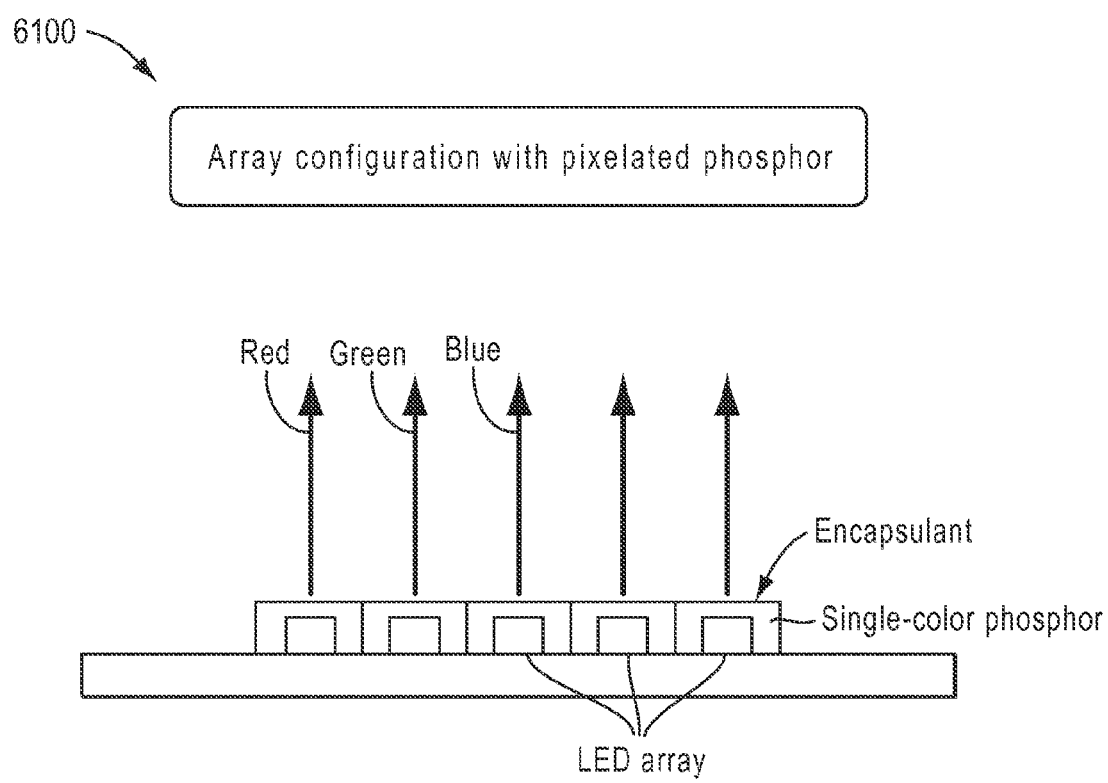
FIG. 61 illustrates an embodiment of the disclosure where the pump LEDs are arranged in an array, and the phosphor composition is varied spatially in a pixelated configuration, according to one or more embodiments.

FIG. 61 illustrates an embodiment of the disclosure 6100 where the pump LEDs are arranged in an array, and the phosphor composition is varied spatially in a pixilated configuration. Here, separate spatial regions perform conversion to red, green, and blue light. As shown in FIG. 61, five LEDs are arranged in an array configured to pump phosphor materials. Single-color phosphor materials in different colors absorb radiation emitted by the LEDs and re-emit light in a color associated with the phosphor material. The phosphor materials are arranged in a pixelated fashion over the LEDs. The pixelated pattern is specifically created to create a mix of emissions whose combination produces light that is substantially white in color.

In some embodiments, the LEDs emit radiation in substantially the same color (e.g., about 405 nm to 430 nm in wavelength), and the radiation from the LEDs pumps the single-color phosphor materials that are in different spatial locations. In return, the colored phosphor materials emit colored light. For example, the phosphor materials, as shown in FIG. 61, emit respectively red, green, and blue light. In the configuration shown in FIG. 61, the type of pump LEDs and/or the phosphors can be varied across the array based on the color needed and the type of LEDs used.

Figure 62:
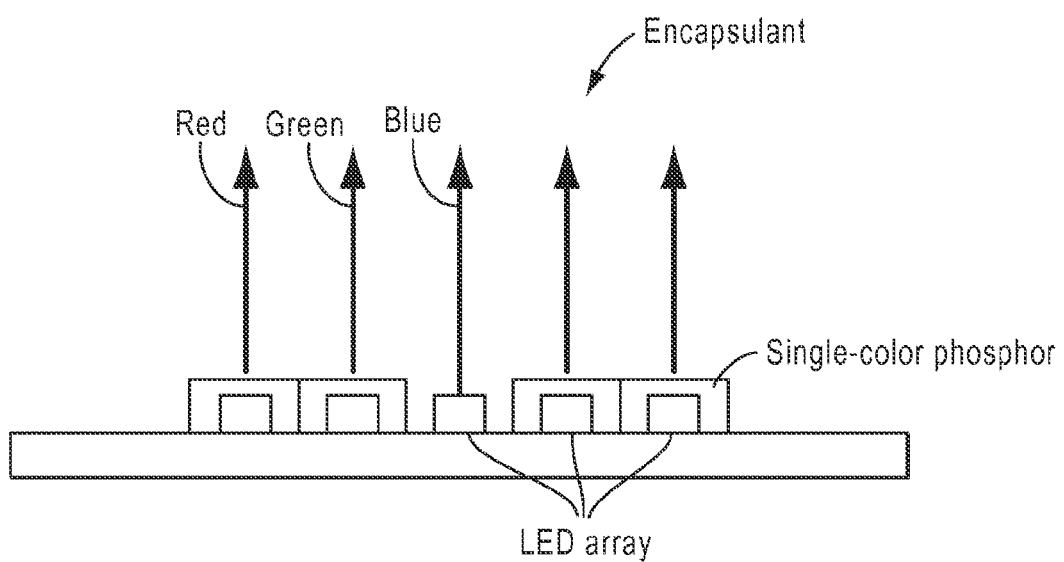
FIG. 62 illustrates an embodiment of the disclosure where the pump LEDs are arranged in an array, and two LED emission wavelengths are employed, according to one or more embodiments.

FIG. 62 illustrates an embodiment of the disclosure 6200 where the pump LEDs are arranged in an array, and two LED emission wavelengths are employed. Short-wavelength LEDs (about 405 nm to 430 nm) pump red and green phosphors, while longer-wavelength LEDs (440 nm to 460 nm) emit blue light. As shown in FIG. 62, five LED devices form an LED array positioned on a substrate or submount. More specifically, the LED device in the middle emits blue light (e.g., wavelength of about 440 nm to 460 nm), while the other LED devices emit radiation in substantially the violet wavelength range (e.g., about 405 nm to 430 nm). The violet LED devices are disposed in colored phosphor materials, where the LED devices pump the phosphor material which emits a colored light, e.g., red light. Similarly, the green phosphor material, upon absorbing substantially violet radiation, emits green light. The blue LED device is not disposed within a phosphor material, and as a result the blue light generated by the blue LED devices is emitted directly.

Depending on the application, the LEDs can be arranged in array geometry using several pump LEDs in combination with blue or red LEDs that are not configured to pump phosphor material. It is to be appreciated that the arrangement of LEDs as shown in FIG. 62 can help reduce light absorption. For example, inter-die absorption is reduced at about 405 nm to 430 nm relative to 400 nm because of the lower substrate absorption, which is an additional advantage of using a longer wavelength pump LED.

Figure 63A:
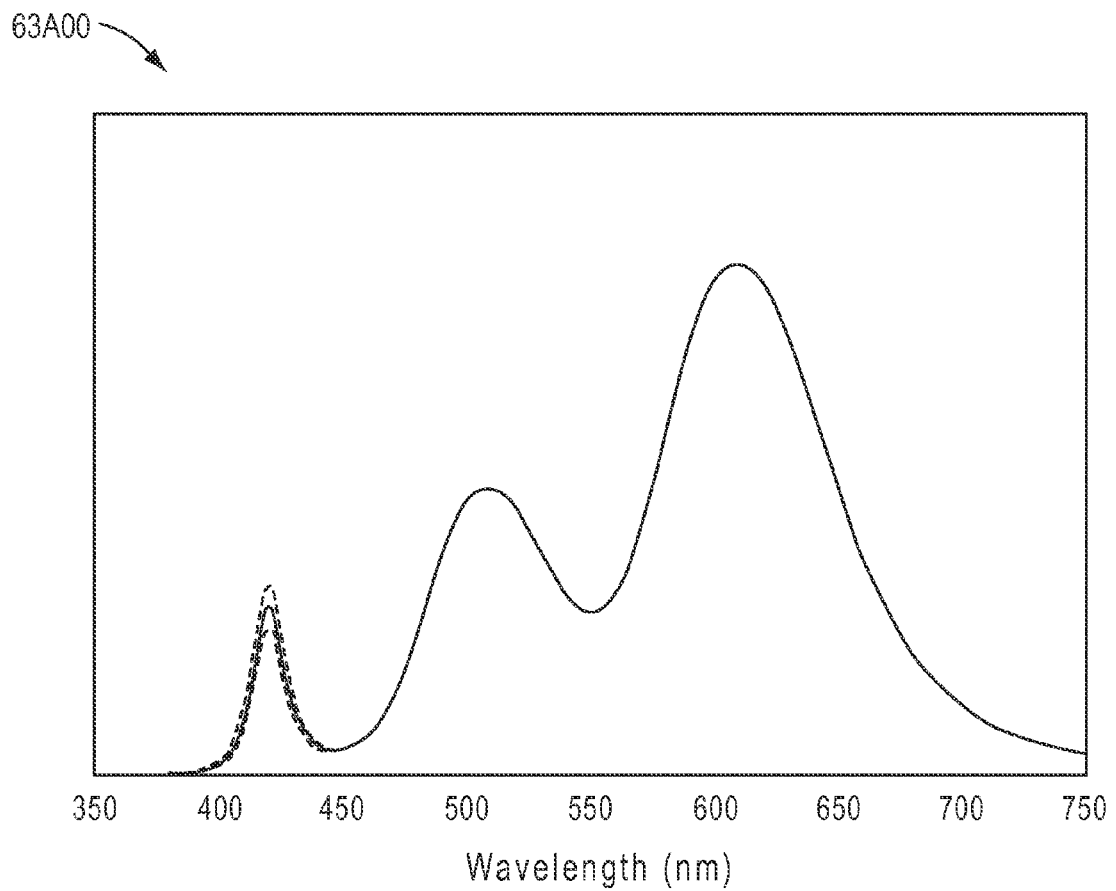

FIG. 63A is a diagram 6300 illustrating the emission spectrum of a two-phosphor violet pumped white LED. In this example, a cyan phosphor G1758™ and an orange phosphor O6040™ from Intematix Corp. are combined and pumped by about 420 nm emitting LED. It is to be appreciated that other types of cyan and orange phosphor can be used as well. Other phosphor combinations and other choices of a pump emission wavelength in such a configuration are possible. In the table shown in FIG. 63B, the violet pump LED leakage is varied ±20% relative to an absolute level of 5% leakage. For all three cases, the color rendering index (CRI) is at about 83 at a CCT of approximately 2700K. The variation in chromaticity between the three spectra is very small, with the total deviation from the Planckian at less than 0.004 in terms of u'v'. The lumen equivalent is at about 301-305 lm/Wopt. One of the benefits is that the configuration uses long wavelength pump chips (e.g., in this case 420 nm), which increases light extraction efficiency and package efficiency, and reduces forward voltage and Stokes loss as compared to shorter wavelength pump LEDs. In addition, by avoiding blue phosphor, this configuration removes one component in loss in efficiency, reduces overall phosphor loading, and reduces cost and complexity.

In certain embodiments, LED devices provided by the present disclosure use the structures and techniques as disclosed in U.S. Pat. No. 8,293,551 B2 and in U.S. Application Publication No. 2011/0186874 A1, each of which are incorporated by reference in its entirety. The following examples describe in detail methods and example apparatus of constituent elements of the herein-disclosed embodiments. It will be apparent to those skilled in the art that many modifications, both to materials and methods, may be practiced without departing from the scope of the disclosure.

An exemplary fabrication flow can proceed as follows:

Obtain a GaN-containing substrate.

Place the substrate in a MOCVD reactor and grow an LED comprising an n-type layer, an active region and a p-type layer, the LED being configured to emit light in the wavelength range 390-430 nm.

Form an LED die by using conventional semiconductor fabrication techniques, including lithography and n- and p-contact deposition.

Singulate the LED into a die of triangular shape, the above fabrication process resulting in an LED die with an EQE of at least 45% at an ambient temperature of 25° C. and a current density of 200 A/cm$^2$.

Obtain a submount substrate such as silicon.

Deposit a high reflectivity mirror on the submount, the mirror containing for instance Ag, Al or dielectric layers and having a reflectivity higher than 90%.

Deposit conducting metallic traces on the submount, the traces configured such that dies can be attached to the submount and driven with electrical current.

Attach several LED dies in an array on the submount.

Place a dam material around the LED die array.

Prepare a mix of wavelength-converting materials and silicone.

Fill the dam material with said mix, such that the resulting element emits a white light spectrum with desired characteristics (such as CCT, chromaticity, CRI, R9, amount of violet content in the spectrum, and other aspects of quality of light).

Attach the resulting white-light emitting array to a lamp heatsink.

Attach an optical element such as a lens to the heatsink.

Connect the white-light emitting array to an electrical driver.

This results in a white-light emitting LED lamp with desired quality of light properties.

Embodiment 1

An LED lamp comprising an LED device emitting more than 500 lm, and for which more than 2% of the power in the SPD is emitted within the range of about 390 nm to about 430 nm. A lamp in this (and other) embodiments can be obtained by these approaches: (i) use violet pump LEDs only, (ii) add violet LEDs to a blue-pump based system, or (iii) or a combination of blue and violet pump LEDs.

Embodiment 2

The lamp of embodiment 1, wherein more than 5% of power in the SPD is emitted within the range about 390 nm to about 430 nm.

Embodiment 3

The lamp of embodiment 1, wherein less than 1% of power in the SPD is emitted below 400 nm.

Embodiment 4

The lamp of embodiment 1, wherein the beam angle is narrower than 15° and the center-beam candle power is greater than 15000 cd.

Embodiment 5

The lamp of embodiment 1, emitting at least 1500 lm.

Embodiment 6

The lamp of embodiment 1, further comprising an MR16 form factor.

Embodiment 7

The lamp of embodiment 1, wherein an output facet of the lamp has a diameter of about 121 mm.

Embodiment 8

The lamp of embodiment 1, further comprising a PAR30 lamp form factor.

Embodiment 9

The lamp of embodiment 1, wherein at least part of power in the SPD is provided by at least one violet-emitting LED.

Embodiment 10

The lamp of embodiment 9, wherein the at least one violet-emitting LED emits more than 200 W/cm$^2$ at a current density of 200 A/cm$^2$ at a junction temperature of 100° C. or greater. In certain embodiments, the junction temperature is from 85° C. to 120° C.

Embodiment 11

The lamp of embodiment 9, wherein the at least one violet-emitting LED pumps at least a blue or cyan phosphor. In certain embodiments, the wavelength conversion material is configured to provide a CRI of at least 90. In certain embodiments, the wavelength conversion material comprises a combination of phosphors such as three phosphors, four phosphors, five phosphors or more than five phosphors.

Embodiment 12

The lamp of embodiment 9, wherein the at least one violet-emitting LED pumps more than one blue/cyan phosphors.

Embodiment 13

The lamp of embodiment 9: further comprising at least one LED emitting at wavelengths other than the violet-emitting LED. The lamp of embodiment 1, wherein the SWSD for a source with a CCT in the range 2500K-7000K is less than 35%.

Embodiment 14

The lamp of embodiment 1, wherein the SWSD for a source with a CCT in the range 5000K-7000K is less than 35%.

Embodiment 15

The lamp of embodiment 1, wherein the violet leak is lower than 10%.

Embodiment 16

The lamp of embodiment 1, wherein the CIE whiteness of a typical white paper is improved by at least 5 points, over a similar lamp which would have no significant SPD component in the range about 390 nm to about 430 nm.

Embodiment 17

The lamp of embodiment 1, wherein the violet leak is configured to achieve a particular CIE whiteness value.

Embodiment 18

The lamp of embodiment 1, wherein the violet leak is such that a CIE whiteness of a high-whiteness reference sample illuminated by the lamp is within minus 20 points and plus 40 points of a CIE whiteness of the same sample under illumination by a CIE reference illuminant of same CCT (respectively a blackbody radiator if CCT<5000K or a D illuminant if CCT>5000K).

Embodiment 19

The lamp of embodiment 1, wherein the violet leak is such that a CCT-corrected whiteness of a high-whiteness reference object illuminated by the lamp is within minus 20 points and plus 40 points of a CCT-corrected whiteness of the same object under illumination by a CIE reference illuminant of same CCT (respectively a blackbody radiator if CCT<5000K or a D illuminant if CCT>5000K).

Embodiment 20

The lamp of embodiment 1, wherein the violet leak is such that a (u'v') chromaticity shift with respect to the source's white point of a high-whiteness reference sample illuminated by the lamp, when compared to a chromaticity shift of the same sample under illumination by a CIE reference illuminant of same CCT (respectively a blackbody radiator if CCT<5000K or a D illuminant if CCT>5000K) is (i) substantially in the same direction; and (ii) at least of a similar magnitude.

Embodiment 21

The lamp of embodiment 1, wherein part of the blue light is provided by LEDs.

Embodiment 22

The lamp of embodiment 1, wherein a beam angle is narrower than 25o and a center-beam candle power is higher than 2200cd.

Embodiment 23

The lamp of embodiment 1, wherein the lamp is an MR-16 form factor.

Embodiment 24

The lamp of embodiment 1, wherein a CRI for a source with a CCT in the range about 2500K to about 7000K is more than 90.

Embodiment 25

The lamp of embodiment 1, wherein a CRI for a source with a CCT in the range about 5000K to about 7000K is more than 90.

Embodiment 26

The lamp of embodiment 1, wherein a R9 is more than 80.

Embodiment 27

The lamp of embodiment 1, wherein a large-sample set CRI is more than 80.

Embodiment 28

An LED-based lamp emitting more than 500 lm, comprising one or more LED source die having a base area of less than 40 $mm^2$.

Embodiment 29

The lamp of embodiment 29, wherein more than 2% of the power in the SPD is emitted within the range about 390 nm to about 430 nm. In certain embodiments, from 1% to 4% of the power in the SPD is emitted within the range from about 390 nm to about 430 nm.

Embodiment 30

The lamp of embodiment 29, wherein the lamp is an MR-16 form factor.

Embodiment 31

The lamp of embodiment 29, wherein the diameter of the optical lens is less than 51 mm.

Embodiment 32

The lamp of embodiment 29, wherein the partial shadow angular width is less than 1°.

Embodiment 33

The lamp of embodiment 29, wherein the chromaticity variation Duv is less than 8, for two points in the partial shadow region.

Embodiment 34

The lamp of embodiment 29, wherein the chromaticity variation Duv of the beam is less than 8 between the center of the emitted beam, and a point with 10% intensity.

Embodiment 35

A light source comprising LEDs, for which at least 2% of the SPD is in the range about 390 nm to about 430 nm, and such that a CIE whiteness of a high-whiteness reference sample illuminated by the light source is within minus 20 points and plus 40 points of a CIE whiteness of the same sample under illumination by a CIE reference illuminant of same CCT (respectively a blackbody radiator if CCT<5000K or a D illuminant if CCT>5000K).

Embodiment 36

The light source of embodiment 36, wherein a CIE whiteness of a high-whiteness reference sample illuminated by the light source is at most 200% of a CIE whiteness of the same sample under illumination by a CIE reference illuminant of same CCT (respectively a blackbody radiator if CCT<5000K or a D illuminant if CCT>5000K).

Embodiment 37

A light source comprising LEDs, for which at least 2% of the SPD is in the range 390-430 nm, and such that a CIE whiteness of a high-whiteness reference sample illuminated by the light source is within minus 20 points to plus 40 points of a CIE whiteness of the same sample under illumination by a CIE reference illuminant of same CCT (respectively a blackbody radiator if CCT<5000K or a D illuminant if CCT>5000K).

Embodiment 38

A light source comprising LEDs, for which at least 2% of the SPD is in the range 390 nm to 430 nm, and such that a CIE whiteness of a high-whiteness reference sample illuminated by the light source is within minus 20 points to plus 40 points of a CIE whiteness of the same sample under illumination by a ceramic metal halide illuminant of same CCT.

Embodiment 39

The light source of embodiment 38, wherein a CCT-corrected whiteness of a high-whiteness reference sample illuminated by the light source is at most 200% of a CCT-corrected whiteness of the same sample under illumination by a CIE reference illuminant of same CCT (respectively a blackbody radiator if CCT<5000K or a D illuminant if CCT>5000K).

Embodiment 40

A light source comprising LEDs, for which at least 2% of the SPD is in the range 390-430 nm, and such that a chromaticity of a high-whiteness reference sample illuminated by the source is at least two Duv points and at most twelve Duv points away from a chromaticity of the source's white point, and substantially toward the blue direction.

Embodiment 41

A light source comprising LEDs, for which at least 2% of the SPD is in the range 390 nm to 430 nm, and such that a chromaticity of a commercial white paper with a CIE whiteness of at least 130, illuminated by the source, is at least two Duv points away from a chromaticity of the source's white point, and toward the blue direction.

Embodiment 42

A method comprising: selecting an object containing OBAs; measuring an optical excitation of the OBAs under a light source which contains no LEDs; and producing a light source comprising LEDs, for which at least 2% of the SPD is in the range 390-430 nm, and such that an optical excitation of the OBAs under the LED light source is at least 50% of the optical excitation of OBAs under the light source which contains no LEDs.

Embodiment 43

The method of embodiment 42, wherein the light source which contains no LEDs is either a halogen or ceramic metal halide source.

Embodiment 44

A method comprising: selecting an object containing OBAs; measuring a chromaticity of the object under a light source which contains no LEDs, called reference chromaticity; and producing a light source comprising LEDs, for which at least 2% of the SPD is in the range 390 nm to 430 nm, and such that a chromaticity of the object under the LED light source is within 5 Duv points of the reference chromaticity.

Embodiment 45

The method of embodiment 44, wherein the light source which contains no LEDs is either a halogen or ceramic metal halide (CMH) source.

Embodiment 46

A light source comprising LEDs, for which at least 2% of the SPD is in the range 390-430 nm, and such that a using CCT-corrected whiteness of a high-whiteness reference sample illuminated by the light source is within minus 20 points to plus 40 points of a CCT-corrected whiteness of the same sample under illumination by a CIE reference illuminant of same CCT-corrected whiteness value.

Embodiment 47

The lamp of embodiment 1, having a gamut area Qg of more than 110.

Embodiment 48

The lamp of embodiment 1, having a gamut area Qg of more than 110, and having more than 5% of the power in the SPD emitted within the range of about 390 nm to 430 nm.

Embodiment 49

The lamp of embodiment 1, having a gamut area Qg of more than 110 and including at least one violet-emitting LED.

Embodiment 50

The lamp of embodiment 1, having a gamut area Qg of more than 110 and including at least one violet-emitting LED and another LED emitting at another wavelength.

Embodiment 51

The lamp of embodiment 1, having a gamut area Qg of more than 110 and a color fidelity Qf of more than 80.

Embodiment 52

The lamp of embodiment 1, having a gamut area Qg of more than 110 and a deep-red rendering R9 of more than 50.

Embodiment 53

The lamp of embodiment 1, having a gamut area Qg of more than 110, the source's chromaticity being within Duv=3 points of the Planckian locus.

Embodiment 54

The lamp of embodiment 1, having a gamut area Qg of more than 110, the source's chromaticity being below the Planckian locus and within Duv=30 points of the Planckian locus.

Embodiment 55

The lamp of embodiment 1, having a gamut area Qg of more than 110 and a CCT between 1900K and 3300K.

Embodiment 56

The lamp of embodiment 1, having a gamut area Qg of more than 110 and a CCT between 3900K and 5100K.

Embodiment 57

The lamp of embodiment 1, having a gamut area Qg of more than 110, and substantially enhancing the saturation of red colors (i.e., increasing the saturation of the CQS red color sample VS1 by at least 3 points vs. the reference illuminant at the same CCT).

Embodiment 58

The lamp of embodiment 1, having a gamut area Qg of more than 110, and substantially enhancing the saturation of Caucasian skin colors (i.e., increasing the saturation of a variety of Caucasian skins by at least 5% vs. the reference illuminant at the same CCT).

Embodiment 59

The lamp of embodiment 1, having a tunable spectrum where the gamut area Qg can be tuned by at least 10 points and can reach a value of more than 110.

Embodiment 60

The lamp of embodiment 1, having a CCT between 3300K and 5300K and a COI below 3.3.

Embodiment 61

The lamp of embodiment 1, having a CCT between 3300K and 5300K and a COI below 1.

Embodiment 62

A method including: specifying a metric pertaining to the chromaticity of a light source; and generating an LED-based lamp emitting more than 500 lm, for which more than 2% of the power in the SPD is emitted within the range of about 390 nm to about 430 nm, and whose SPD satisfies said metric.

Embodiment 63

An LED lamp comprising an LED device emitting more than 500 lm; the light being generated by a pump LED pumping at least two phosphors; the resulting light having a gamut area Qg of more than 110 and substantially enhancing the saturation of red colors (i.e., increasing the saturation of the CQS red color sample VS1 by at least 3 points vs. the reference illuminant at the same CCT).

Embodiment 64

The lamp of embodiment 61, further comprising a filter which suppresses radiation at some wavelengths.

Embodiment 65

The lamp of embodiment 62, where the filter is a neodymium-doped glass filter.

Embodiment 66

The lamp of embodiment 62, where the filter is a dichroic filter.

Embodiment 67

A light bulb having at least two LED sources, the LED sources having different spectra, the bulb having at least three electrodes, such that upon driving current in the electrodes the several LED sources can be driven in at least two configurations to emit two different spectra.

Embodiment 68

The light bulb of embodiment 67, where the bulb is a 3-way bulb.

Embodiment 69

The light bulb of embodiment 67, where the two sources have CCTs which differ by at least 500K.

The lamp of embodiment 1, where the SPD is configured to have a Color Quality Scale gamut metric Qg of 1.05 or higher.

The lamp of embodiment 1, where the SPD is configured to have a Color Quality Scale gamut metric Qg in the range 1.10 to 1.40 and a Color Quality Scale fidelity metric Qf of 60 or higher.

The lamp of embodiment 1, where the SPD is configured to substantially increase a visual saturation of warm colors such as red, orange and pink objects vs. a conventional lamp with same correlated color temperature.

The lamp of embodiment 1, where the SPD is configured to modify a saturation of at least one of the following Color Quality Scale samples: VS1 (red), VS2 (red-orange), VS3 (orange), VS14 (red-pink), VS15 (pink); the saturation being increased by at least 5% vs. a conventional lamp with a same correlated color temperature.

The lamp of embodiment 1, where the SPD is configured such that the modified light pattern renders various Caucasian skins with a color distortion which is substantially along the CIELAB b* direction, with an increase in b* of at least 1 point.

The lamp of embodiment 1, where the SPD is configured such that the modified light pattern has a chromaticity lying below the Planckian locus by a distance of at least 3 Du'v' points.

FIG. 64A through FIG. 64I depict embodiments of the present disclosure in the form of lamp applications. In these lamp applications, one or more light emitting diodes are used in lamps and fixtures. Such lamps and fixtures include replacement and/or retro-fit directional lighting fixtures.

Figure 64A:
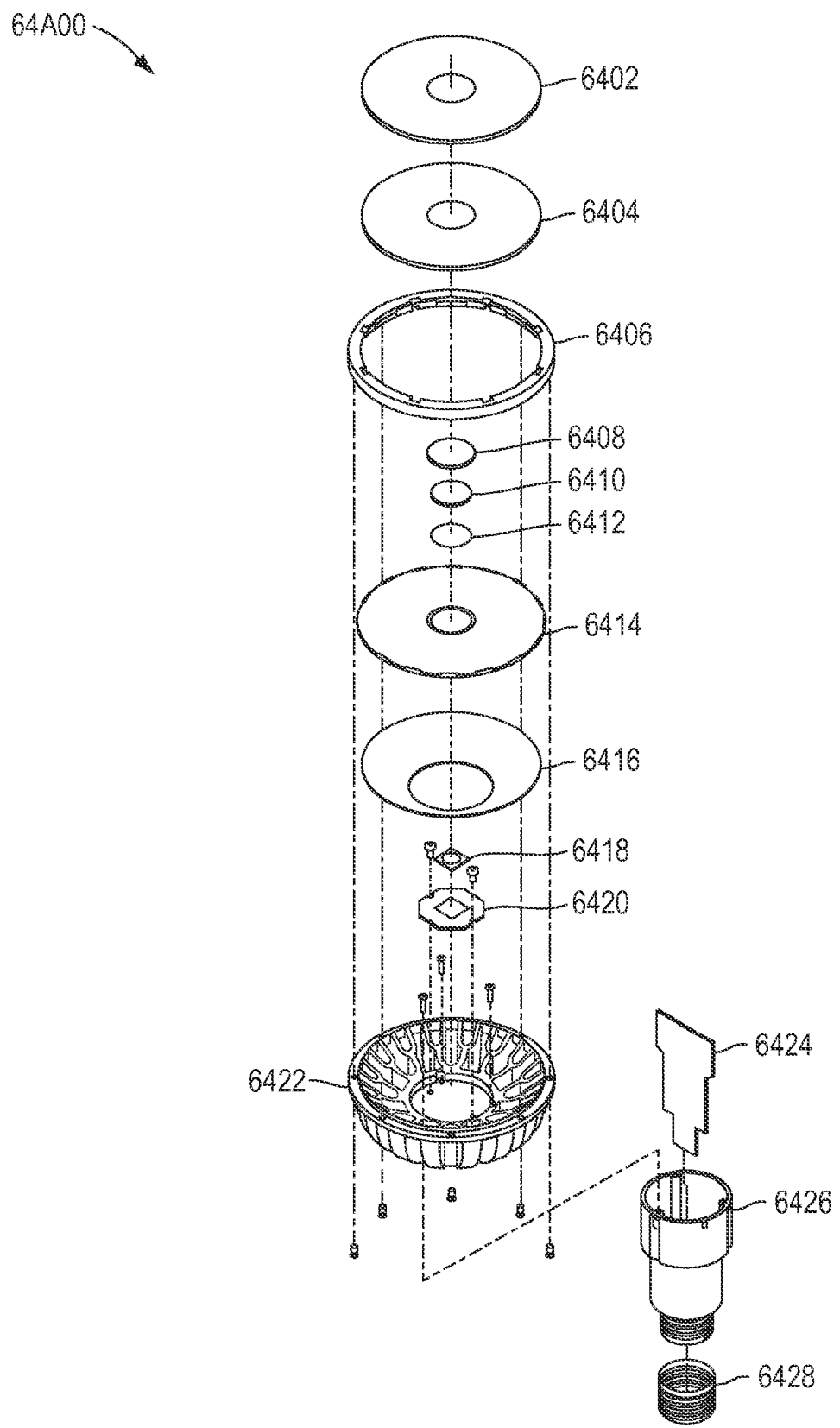
Figure 64C:
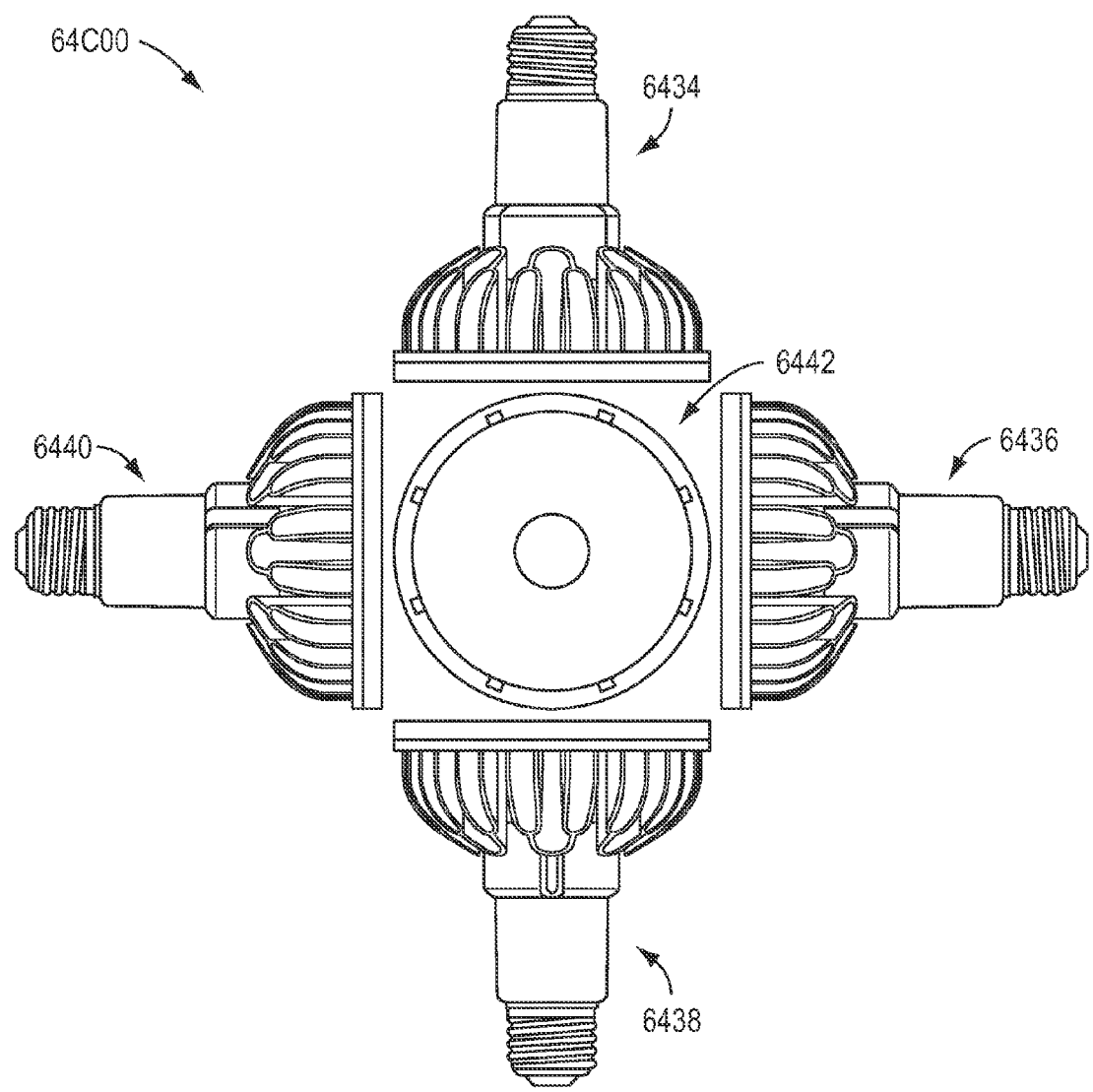
Figure 64E:
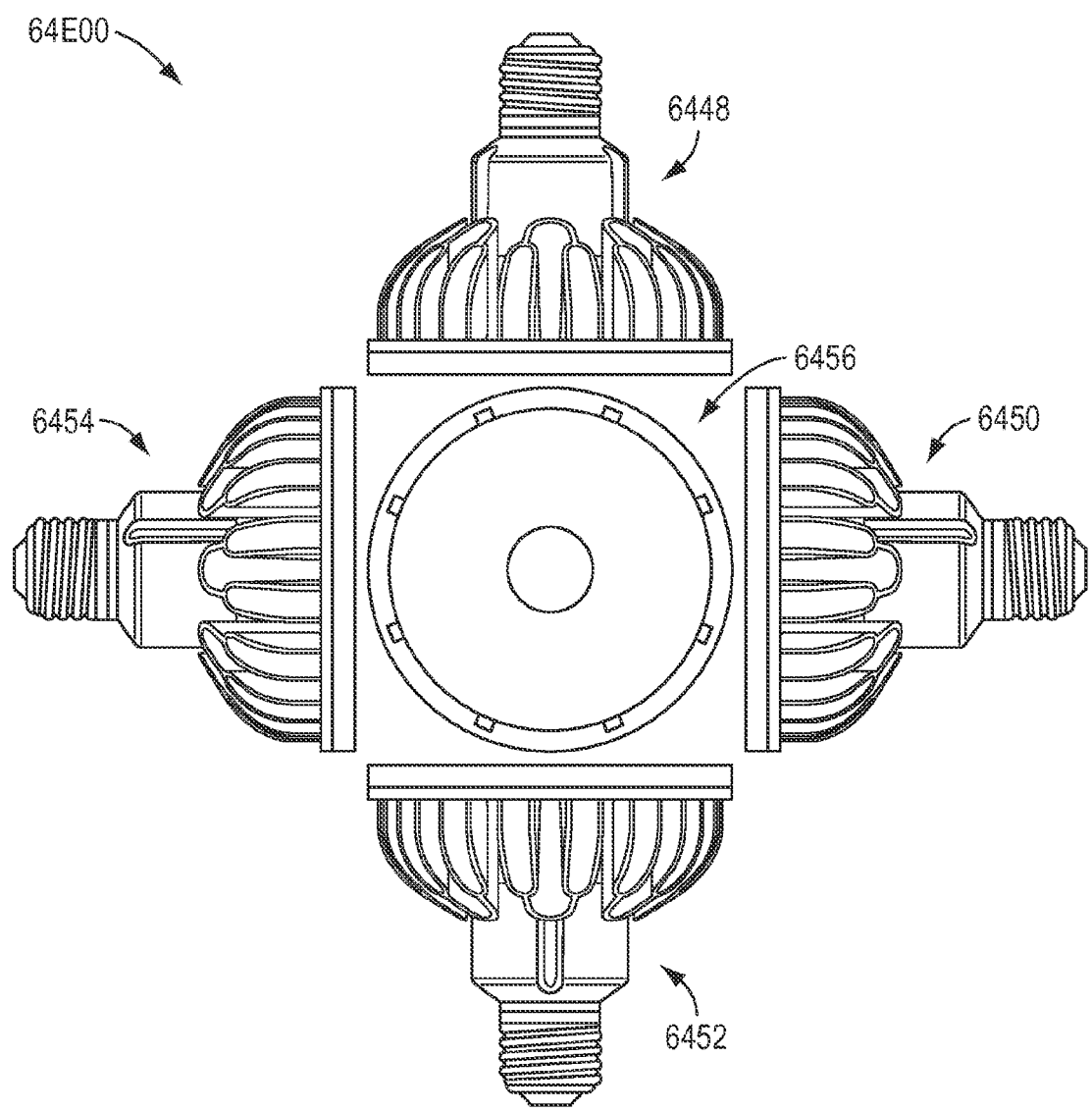
Figure 64G:
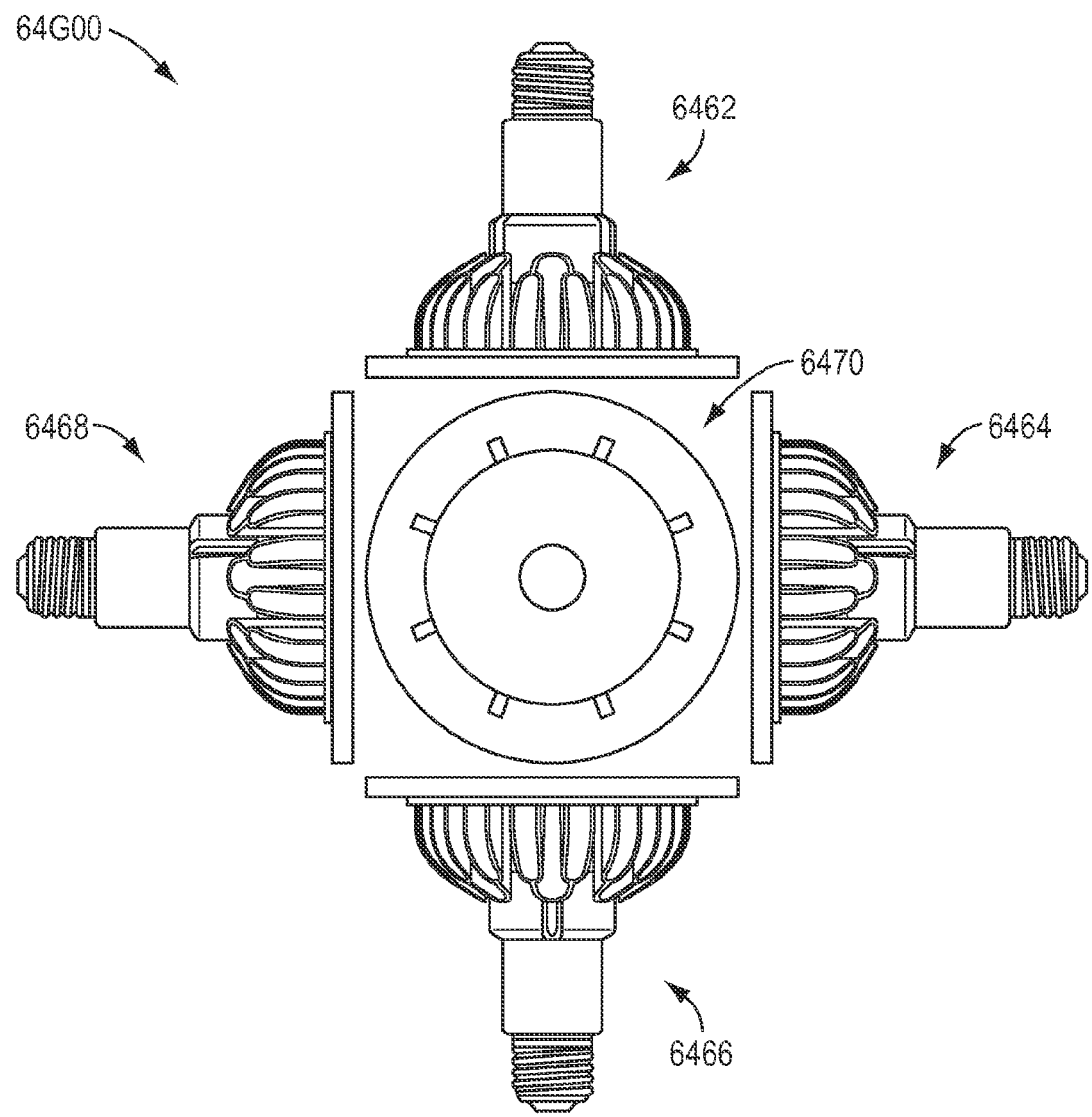
Figure 64I:
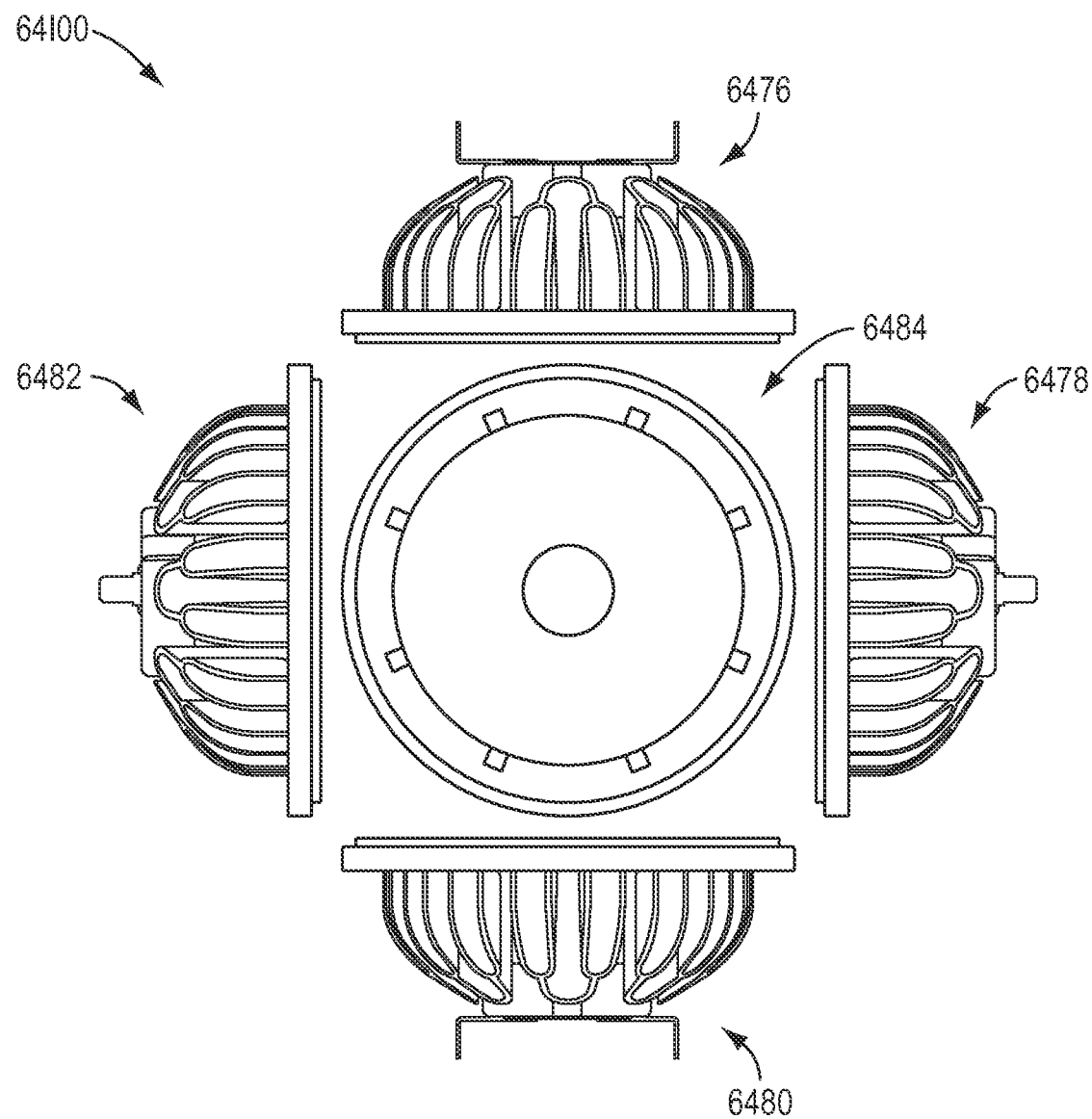

In some embodiments, aspects of the present disclosure can be used in an assembly. As shown in FIG. 64A, the assembly comprises a screw cap 6428, a driver housing 6426, a driver board 6424, a heatsink 6422, a metal-core printed circuit board 6420, an LED light source 6418, a dust shield 6416, a lens 6414, a reflector disc 6412, a magnet 6410, a magnet cap 6408, a trim ring 6406, a first accessory 6404, and a second accessory 6402.

The components of assembly 64A00 may be described in substantial detail. Some components are 'active components' and some are 'passive' components, and can be variously-described based on the particular component's impact to the overall design, and/or impact(s) to the objective optimization function. A component can be described using a CAD/CAM drawing or model, and the CAD/CAM model can be analyzed so as to extract figures of merit as may pertain to e particular component's impact to the overall design, and/or impact(s) to the objective optimization function. Strictly as one example, a CAD/CAM model of a trim ring is provided in a model corresponding to the drawing of FIG. 64A.

The components of the assembly 64A00 can be fitted together to form a lamp.

FIG. 64B1 depicts a perspective view 6430 and FIG. 64B2 depicts a top view 6432 of such a lamp. As shown in FIGS. 64B1 and 64B2, the lamp 64B00 comports to a form factor known as PAR30L. The PAR30L form factor is further depicted by the principal views (e.g., left 6440, right 6436, back 6434, front 6438 and top 6442) given in array 64C00 of FIG. 64C.

The components of the assembly 64A00 can be fitted together to form a lamp. FIG. 64D1 depicts a perspective view 6444 and FIG. 64D2 depicts a top view 6446 of such a lamp. As shown in FIGS. 64D1 and 64D2, the lamp 64D00 comports to a form factor known as PAR30S. The PAR30S form factor is further depicted by the principal views (e.g., left 6454, right 6450, back 6448, front 6452 and top 6456) given in array 64E00 of FIG. 64E.

The components of the assembly 64A00 can be fitted together to form a lamp. FIG. 64F1 depicts a perspective view 6458 and FIG. 64F2 depicts a top view 6460 of such a lamp. As shown in FIGS. 64F1 and 64F2, the lamp 64F00 comports to a form factor known as PAR38. The PAR38 form factor is further depicted by the principal views (e.g., left 6468, right 6464, back 6462, front 6466 and top 6470) given in array 64G00 of FIG. 64G.

The components of the assembly 64A00 can be fitted together to form a lamp. FIG. 64H1 depicts a perspective view 6472 and FIG. 64H2 depicts a top view 6474 of such a lamp. As shown in FIGS. 64H1 and 64H2, the lamp 64H00 comports to a form factor known as PAR111. The PAR111 form factor is further depicted by the principal views (e.g., left 6482, right 6478, back 6476, front 6480 and top 6484) given in array 64I00 of FIG. 64I.

Another example is an MR-16 lamp. It contains an LED source comprising violet pump LEDs pumping three phosphors: a red-, a green- and a blue-emitting phosphor. The lamp emits more than 500 lm and has a CCT in the range 2700K to 3000K. The diameter of the LED source is 6 mm and the diameter of the optical lens is 30 mm. The lamp has a beam angle of 25 degrees and a center-beam candle power of at least 2200 candelas.

Figure 65H:
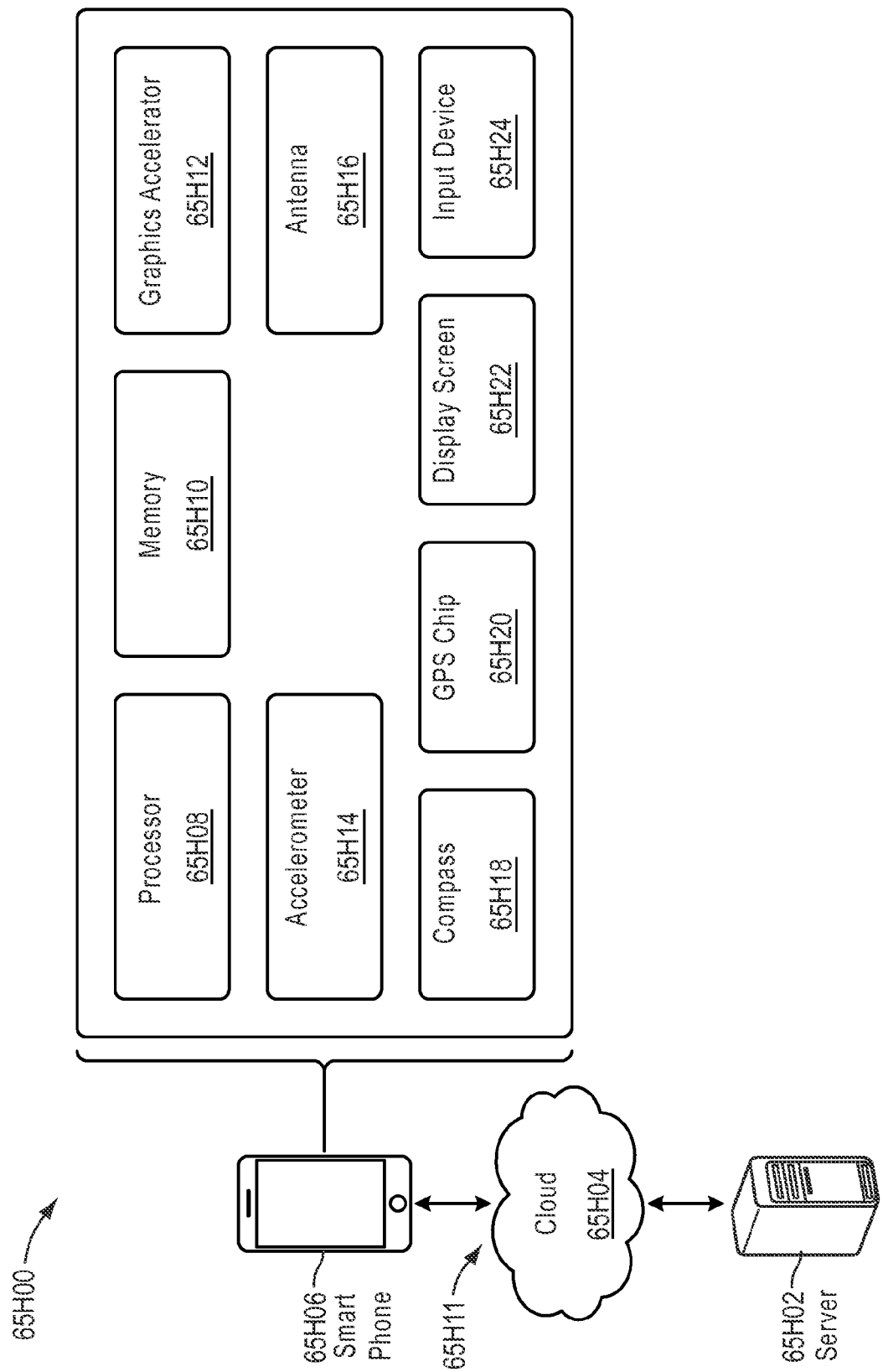
Figure 65I:
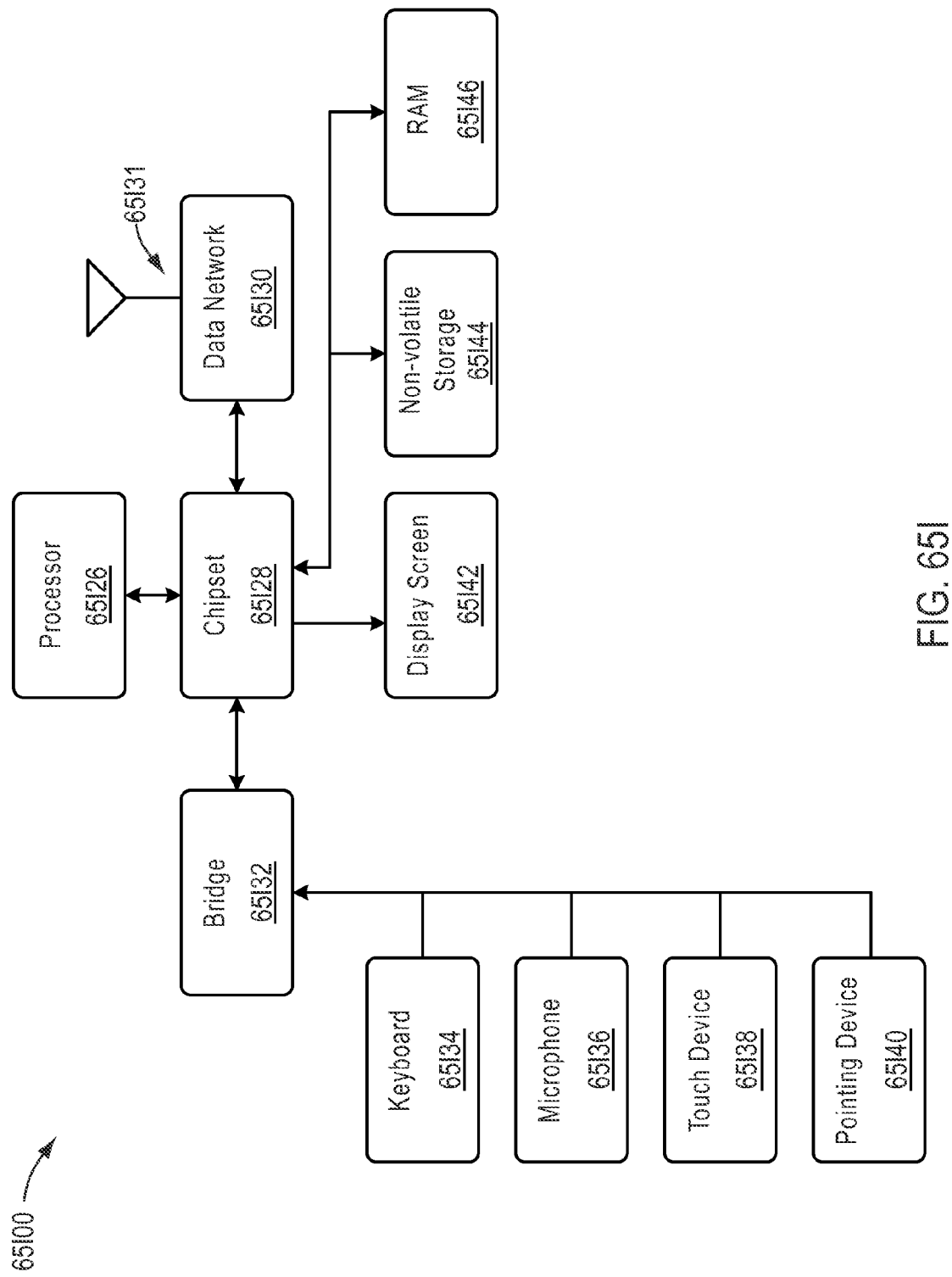

FIG. 65A1 through FIG. 65I depict embodiments of the present disclosure as can be applied toward lighting applications. In these embodiments, one or more light-emitting diodes 65A10 (FIG. 65A1), as taught by this disclosure, can be mounted on a submount or package to provide an electrical interconnection. The submount or package can be a ceramic, oxide, nitride, semiconductor, metal, or combination thereof that includes an electrical interconnection capability 65A20 (FIG. 65A2) for the various LEDs. The submount or package can be mounted to a heatsink member 65B50 (FIG. 65B2) via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing.

The total light emitting surface (LES) of the LEDs and any down-conversion materials can form a light source 65A30 (FIG. 65A3). One or more light sources can be interconnected into an array 65B20 (FIG. 65B1), which in turn is in electrical contact with connectors 65B10 (FIG. 65B1) and brought into an assembly 65B30 (FIG. 65B1). One or more lens elements 65B40 (FIG. 65B2) can be optically coupled to the light source. The lens design and properties can be selected so that the desired directional beam pattern for a lighting product is achieved for a given LES. The directional lighting product may be an LED module, a retrofit lamp 65B70 (FIG. 65B3), or a lighting fixture 65C30 (FIG. 65C3). In the case of a retrofit lamp, an electronic driver can be provided with a surrounding member 65B60 (FIG. 65B2), the driver to condition electrical power from an external source to render it suitable for the LED light source. The driver can be integrated into the retrofit lamp. In the case of a fixture, an electronic driver is provided which conditions electrical power from an external source to make it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of suitable external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based MR16, PAR16, PAR20, PAR30, PAR38, BR30, A19, and various other lamp types. Examples of fixtures include replacements for halogen-based and ceramic metal halide-based directional lighting fixtures.

In some embodiments, the present disclosure can be applied to non-directional lighting applications. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing that includes electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination thereof. The LEDs can be distributed to provide a desired shape of the light source. For example, one common shape is a linear light source for replacement of conventional fluorescent linear tube lamps. One or more optical elements can be coupled to the LEDs to provide a desired non-directional light distribution. The non-directional lighting product may be an LED module, a retrofit lamp, or a lighting fixture. In the case of a retrofit lamp, an electronic driver can be provided to condition electrical power from an external source to render it suitable for the LED light source, with the driver integrated into the retrofit lamp. In the case of a fixture, an electronic driver is provided to condition electrical power from an external source to render it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based replacements for various linear, circular, or curved fluorescent lamps. An example of a non-directional lighting product is shown in FIGS. 65C1-65C3. Such a lighting fixture can include replacements for fluorescent-based troffer luminaires. In this embodiment, LEDs are mechanically secured into a package 65C10 (FIG. 65C1), and multiple packages are arranged into a suitable shape such as linear array 65C20 (FIG. 65C2).

Some embodiments of the present disclosure can be applied to backlighting for flat panel display applications. In these embodiments, one or more light-emitting diodes (LEDs), as taught by this disclosure, can be mounted on a submount or package to provide an electrical interconnection. The submount or package can be a ceramic, oxide, nitride, semiconductor, metal, or combination of any of the foregoing that include electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing. The LEDs can be distributed to provide a desired shape of the light source. One common shape is a linear light source. The light source can be optically coupled to a lightguide for the backlight. This can be achieved by coupling at the edge of the lightguide (edge-lit), or by coupling light from behind the lightguide (direct-lit). The lightguide distributes light uniformly toward a controllable display such as a liquid crystal display (LCD) panel. The display converts the LED light into desired images based on electrical control of light transmission and its color. One way to control the color is by use of filters (e.g., color filter substrate 65D40 (FIG. 65D1)). Alternatively, multiple LEDs may be used and driven in pulsed mode to sequence the desired primary emission colors (e.g., using a red LED 65D30, a green LED 65D100 (FIG. 65D1), and a blue LED 65D200 (FIG. 65D2)). Optional brightness-enhancing films may be included in the backlight "stack". The brightness-enhancing films narrow the flat panel display emission to increase brightness at the expense of the observer viewing angle. An electronic driver can be provided to condition electrical power from an external source to render it suitable for the LED light source for backlighting, including any color sequencing or brightness variation per LED location (e.g., one-dimensional or two-dimensional dimming). Examples of external power sources include mains AC (e.g., 120 Vrms AC or 240 Vrms AC), low-voltage AC (e.g., 12 VAC), and low-voltage DC (e.g., 12 VDC). Examples of backlighting products are shown in FIG. 65D1, FIG. 65D2, FIG. 65E, and FIG. 65E2.

Some embodiments of the present disclosure can be applied to automotive forward lighting applications, as shown in FIGS. 65F1-65F3 (e.g., see the example of an automotive forward lighting product 65F30 (FIG. 65F3)). In these embodiments, one or more light-emitting diodes (LEDs) can be mounted on a submount or on a rigid or semi-rigid package 65F10 (FIG. 65F1) to provide an electrical interconnection. The submount or package can be a ceramic, oxide, nitride, semiconductor, metal, or combination thereof, that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials form a light source. One or more lens elements 65F20 (FIG. 65F2) can be optically coupled to the light source. The lens design and properties can be selected to produce a desired directional beam pattern for an automotive forward lighting application for a given LED. An electronic driver can be provided to condition electrical power from an external source to render it suitable for the LED light source. Power sources for automotive applications include low-voltage DC (e.g., 12 VDC). An LED light source may perform a high-beam function, a low-beam function, a side-beam function, or any combination thereof.

In some embodiments the present disclosure can be applied to digital imaging applications such as illumination for mobile phone and digital still cameras (e.g., see FIGS. 65G1-65G4). In these embodiments, one or more light-emitting diodes (LEDs), as taught by the disclosure, can be mounted on a submount or package 65G10 (FIG. 65G1) to provide an electrical interconnection. The submount or package can be, for example, a ceramic, oxide, nitride, semiconductor, metal, or combination of any of the foregoing, that include electrical interconnection capability for the various LEDs. The submount or package can be mounted to a circuit board member and fitted with or into a mounting package 65G20 (FIG. 65G2). The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination thereof. The total light emitting surface (LES) of the LEDs and any down-conversion materials form a light source. One or more lens elements can be optically coupled to the light source. The lens design and properties can be selected so that the desired directional beam pattern for an imaging application is achieved for a given LES. An electronic driver can be provided to condition electrical power from an external source to render it suitable for the LED light source. Examples of suitable external power sources for imaging applications include low-voltage DC (e.g., 5 VDC). An LED light source may perform a low-intensity function 65G30 (FIG. 65G3), a high-intensity function 65G40 (FIG. 65G4), or any combination thereof.

Some embodiments of the present disclosure can be applied to mobile terminal applications. FIG. 65H is a diagram illustrating a mobile terminal (see smart phone architecture 65H00). As shown, the smart phone 65H06 includes a housing, display screen, and interface device, which may include a button, microphone, and/or touch screen. In certain embodiments, a phone has a high resolution camera device, which can be used in various modes. An example of a smart phone can be an iPhone from Apple Inc. of Cupertino, Calif. Alternatively, a smart phone can be a Galaxy from Samsung, or others.

In an example, the smart phone may include one or more of the following features (which are found in an iPhone 4 from Apple Inc., although there can be variations), see www.apple.com:

GSM model: UMTS/HSDPA/HSUPA (850, 900, 1900, 2100 MHz); GSM/EDGE (850, 900, 1800, 1900 MHz)
CDMA model: CDMA EV-DO Rev. A (800, 1900 MHz)
802.11b/g/n Wi-Fi (802.11n 2.4 GHz only)
Bluetooth 2.1+EDR wireless technology
Assisted GPS
Digital compass
Wi-Fi
Cellular
Retina display
3.5-inch (diagonal) widescreen multi-touch display
800:1 contrast ratio (typical)
500 cd/m2 max brightness (typical)
Fingerprint-resistant oleophobic coating on front and back
Support for display of multiple languages and characters simultaneously
5-megapixel iSight camera
Video recording, HD (720p) up to 30 frames per second with audio
VGA-quality photos and video at up to 30 frames per second with the front camera
Tap to focus video or still images
LED flash
Photo and video geotagging
Built-in rechargeable lithium-ion battery
Charging via USB to computer system or power adapter
Talk time: Up to 20 hours on 3G, up to 14 hours on 2G (GSM)
Standby time: Up to 300 hours
Internet use: Up to 6 hours on 3G, up to 10 hours on Wi-Fi
Video playback: Up to 10 hours
Audio playback: Up to 40 hours
Frequency response: 20 Hz to 22,000 Hz
Audio formats supported: AAC (8 to 320 Kbps), protected AAC (from iTunes Store), HE-AAC, MP3 (8 to 320 Kbps), MP3 VBR, audible (formats 2, 3, 4, audible enhanced audio, AAX, and AAX+), Apple lossless, AIFF, and WAV
User-configurable maximum volume limit
Video out support with Apple digital AV adapter or Apple VGA adapter; 576p and 480p with Apple component AV cable; 576i and 480i with Apple composite AV cable (cables sold separately)
Video formats supported: H.264 video up to 1080p, 30 frames per second, main profile Level 3.1 with AAC-LC audio up to 160 Kbps, 48 kHz, stereo audio in .m4v, .mp4, and .mov file formats; MPEG-4 video up to 2.5

Mbps, 640 by 480 pixels, 30 frames per second, simple profile with AAC-LC audio up to 160 Kbps per channel, 48 kHz, stereo audio in .m4v, .mp4, and .mov file formats; motion JPEG (M-JPEG) up to 35 Mbps, 1280 by 1020 pixels, 30 frames per second, audio in ulaw, PCM stereo audio in .avi file format Three-axis gyro Accelerometer Proximity sensor Ambient light sensor etcetera.

Embodiments of the present disclosure may be used with other electronic devices. Examples of suitable electronic devices include a portable electronic device such as a media player, a cellular phone, a personal data organizer, or the like. In such embodiments, a portable electronic device may include a combination of the functionalities of such devices. In addition, an electronic device may allow a user to connect to and communicate through the Internet or through other networks such as local or wide area networks. For example, a portable electronic device may allow a user to access the internet and to communicate using e-mail, text messaging, instant messaging, or using other forms of electronic communication. By way of example, the electronic device may be similar to an iPod having a display screen or an iPhone available from Apple Inc.

In certain embodiments, a device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, the device may be sized such that it fits relatively easily into a pocket or the hand of the user. While certain embodiments of the present disclosure are described with respect to portable electronic devices, it should be noted that the presently disclosed techniques may be applicable to a wide array of other, less portable, electronic devices and systems that are configured to render graphical data such as a desktop computer.

As shown, FIG. 65H includes a system diagram with a smart phone that includes an LED according to an embodiment of the present disclosure. The smart phone 65H06 is configured to communicate with a server 65H02 in electronic communication with any forms of handheld electronic devices. Illustrative examples of such handheld electronic devices can include functional components such as a processor 65H08, memory 65H10, graphics accelerator 65H12, accelerometer 65H14, communications interface 65H11 (possibly including an antenna 65H16), compass 65H18, GPS chip 65H20, display screen 65H22, and an input device 65H24. Each device is not limited to the illustrated components. The components may be hardware, software or a combination of both.

In some examples, instructions can be input to the handheld electronic device through an input device 65H24 that instructs the processor 65H08 to execute functions in an electronic imaging application. One potential instruction can be to generate an abstract of a captured image of a portion of a human user. In that case the processor 65H08 instructs the communications interface 65H11 to communicate with the server 65H02 (e.g., possibly through or using a cloud 65H04) and transfer data (e.g., image data). The data is transferred by the communications interface 65H11 and either processed by the processor 65H08 immediately after image capture or stored in memory 65H10 for later use, or both. The processor 65H08 also receives information regarding the display screen's attributes, and can calculate the orientation of the device, e.g., using information from an accelerometer 65H14 and/or other external data such as compass headings from a compass 65H18, or GPS location from a GPS chip 65H20, and the processor then uses the information to determine an orientation in which to display the image depending upon the example.

The captured image can be rendered by the processor 65H08, by a graphics accelerator 65H12, or by a combination of the two. In some embodiments, the processor can be the graphics accelerator 65H12. The image can first be stored in memory 65H10 or, if available, the memory can be directly associated with the graphics accelerator 65H12. The methods described herein can be implemented by the processor 65H08, the graphics accelerator 65H12, or a combination of the two to create the image and related abstract. An image or abstract can be displayed on the display screen 65H22.

FIG. 65I depicts an interconnection of components in an electronic device 65I00. Examples of electronic devices include an enclosure or housing, a display, user input structures, and input/output connectors in addition to the aforementioned interconnection of components. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light emitting diode (LED) based display, an organic light emitting diode (OLED) based display, or some other suitable display. In accordance with certain embodiments of the present disclosure, the display may display a user interface and various other images such as logos, avatars, photos, album art, and the like. Additionally, in certain embodiments, a display may include a touch screen through which a user may interact with the user interface. The display may also include various functions and/or system indicators to provide feedback to a user such as power status, call status, memory status, or the like. These indicators may be incorporated into the user interface displayed on the display.

In certain embodiments, one or more of the user input structures can be configured to control the device such as by controlling a mode of operation, an output level, an output type, etc. For instance, the user input structures may include a button to turn the device on or off. Further, the user input structures may allow a user to interact with the user interface on the display. Embodiments of the portable electronic device may include any number of user input structures including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

Certain device may also include various input and output ports to allow connection of additional devices. For example, a port may be a headphone jack that provides for the connection of headphones. Additionally, a port may have both input and output capabilities to provide for the connection of a headset (e.g., a headphone and microphone combination). Embodiments of the present disclosure may include any number of input and/or output ports such as headphone and headset jacks, universal serial bus (USB) ports, IEEE-1394 ports, and AC and/or DC power connectors. Further, a device may use the input and output ports to connect to and send or receive data with any other device such as other portable electronic devices, personal computers, printers, or the like. For example, in one embodiment, the device may connect to a personal computer via an IEEE-1394 connection to send and receive data files such as media files.

The depiction of an electronic device 65100 encompasses a smart phone system diagram according to an embodiment of the present disclosure. The depiction of an electronic device 65100 illustrates computer hardware, software, and firmware that can be used to implement the disclosures above. The shown system includes a processor 65126, which is representative of any number of physically and/or logically distinct resources capable of executing software, firmware, and hardware configured to perform identified computations. A processor 65126 communicates with a chipset 65128 that can control input to and output from processor 65126. In this example, chipset 65128 outputs information to display screen 65142 and can read and write information to non-volatile storage 65144, which can include magnetic media and solid state media, and/or other non-transitory media, for example. Chipset 65128 can also read data from and write data to RAM 65146. A bridge 65132 for interfacing with a variety of user interface components can be provided for interfacing with chipset 65128. Such user interface components can include a keyboard 65134, a microphone 65136, touch-detection-and-processing circuitry 65138, a pointing device 65140 such as a mouse, and so on. In general, inputs to the system can come from any of a variety of machine-generated and/or human-generated sources.

Chipset 65128 also can interface with one or more data network interfaces 65130 that can have different physical interfaces. Such data network interfaces 65130 can include interfaces for wired and wireless local area networks, for broadband wireless networks, as well as personal area networks. Some applications of the methods for generating, displaying and using the GUI disclosed herein can include receiving data over a physical interface 65131 or be generated by the machine itself by a processor 65126 analyzing data stored in non-volatile storage 65144 and/or in memory or RAM 65146. Further, the machine can receive inputs from a user via devices such as a keyboard 65134, microphone 65136, touch-detection-and-processing circuitry 65138, and pointing device 65140 and execute appropriate functions such as browsing functions by interpreting these inputs using processor 65126.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

What is claimed is:

1. A three-way lighting system comprising:
a first light emitting diode (LED) configured to emit first light having a first spectral power distribution (SPD);
a second LED configured to emit second light having a second SPD substantially different from said first SPD;
a driver coupled to said first LED and said second LED and configured to selectively power said first LED to emit said first light and said second LED to emit said second light, wherein said driver is configured to interface with a user-operated switch to operate in at least first, second, and third modes, in said first mode, said driver is configured to power one of said first LED and said second LED, in said second mode, said driver is configured to power both of said first LED and said second LED, and in said third mode, said driver is configured to power neither of said first LED and said second LED.

2. The lighting system of claim 1, wherein in said first mode, said driver is configured to power said first LED.

3. The lighting system of claim 2, further comprising a fourth mode, wherein said driver is configured power said second LED and operate said first LED in an off state.

4. The lighting system of claim 1, wherein said first light has a first correlated color temperature (CCT) and said second light has a second CCT different from said first CCT.

5. The lighting system of claim 1, wherein said first light has a color rendering index (CRI) greater than 90.

6. The lighting system of claim 1, wherein said first SPD and said second SPD are substantially white.

7. The lighting system of claim 6, wherein about 4% to about 25% of power of said first SPD is emitted within a wavelength range from about 390 nm to about 430 nm.

8. The lighting system of claim 1, wherein said first LED comprises a violet pump LED and at least one wavelength-converting material.

9. The lighting system of claim 8, wherein said second LED comprises a violet pump LED and at least one wavelength-converting material.

10. The lighting system of claim 8, wherein said second LED comprises a blue pump LED and at least one wavelength-converting material.

11. The lighting system of claim 10, wherein said second SPD is higher than said first SPD.

12. The lighting system of claim 1, further comprising said switch.

13. The lighting system of claim 1, wherein said switch is discrete from said driver.

14. The lighting system of claim 1, wherein said switch is a three-way mechanical switch.

15. The lighting system of claim 1, further comprises a retrofit lamp, wherein said first LED and said second LED are positioned within said retrofit lamp.

16. The lighting system of claim 14, wherein said retrofit lamp comprises a screw-in socket.

17. The lighting system of claim 14, wherein said driver is positioned within said retrofit lamp.

* * * * *